US009444222B2

(12) United States Patent
Sakaguchi et al.

(10) Patent No.: US 9,444,222 B2
(45) Date of Patent: Sep. 13, 2016

(54) TWO DIMENSIONAL PHOTONIC CRYSTAL VERTICAL CAVITY SURFACE EMITTING LASERS

(71) Applicant: ROHM CO., LTD., Kyoto (JP)

(72) Inventors: Takui Sakaguchi, Kyoto (JP); Seita Iwahashi, Kyoto (JP); Eiji Miyai, Kyoto (JP); Wataru Kunishi, Kyoto (JP); Dai Onishi, Kyoto (JP); Yoshikatsu Miura, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 76 days.

(21) Appl. No.: 14/149,368

(22) Filed: Jan. 7, 2014

(65) Prior Publication Data

US 2014/0348195 A1    Nov. 27, 2014

(30) Foreign Application Priority Data

Jan. 8, 2013 (JP) ................ 2013-001020
Jan. 10, 2013 (JP) ................ 2013-002348
Mar. 7, 2013 (JP) ................ 2013-045162
Dec. 27, 2013 (JP) ................ 2013-271854

(51) Int. Cl.
*H01S 5/10* (2006.01)
*H01S 5/183* (2006.01)
*H01S 5/42* (2006.01)

(52) U.S. Cl.
CPC ............ *H01S 5/105* (2013.01); *H01S 5/1835* (2013.01); *H01S 5/18319* (2013.01); *H01S 5/423* (2013.01); *H01S 2301/18* (2013.01)

(58) Field of Classification Search
CPC .. H01S 5/105; H01S 5/1835; H01S 5/18319; H01S 5/423; H01S 2301/18
See application file for complete search history.

(56) References Cited

U.S. PATENT DOCUMENTS

2013/0243026 A1*  9/2013  Noda ................ H01S 5/1234
                                                372/50.12
2014/0064310 A1*  3/2014  Chua ................... H01S 5/18
                                                372/45.01

FOREIGN PATENT DOCUMENTS

JP    2000-332351 A    11/2000
JP    2003-023193 A    1/2003
JP    2004-296538 A    10/2004

* cited by examiner

*Primary Examiner* — Armando Rodriguez
(74) *Attorney, Agent, or Firm* — Rabin & Berdo, P.C.

(57) ABSTRACT

The 2D-PC surface emitting laser includes: a PC layer; and a lattice point for forming resonant-state arranged in the photonic crystal layer, and configured so that a light wave in a band edge in photonic band structure in the PC layer is diffracted in a plane of the PC layer, and is diffracted in a surface vertical direction of the PC layer. The perturbation for diffracting the light wave in the surface vertical direction of the PC layer is applied to the lattice point for forming resonant-state. The term "perturbation" means that modulation is periodically applied to the lattice point for forming resonant-state. For example, the periodic modulation may be refractive index modulation, hole-diameter modulation, or hole-depth modulation.

18 Claims, 86 Drawing Sheets

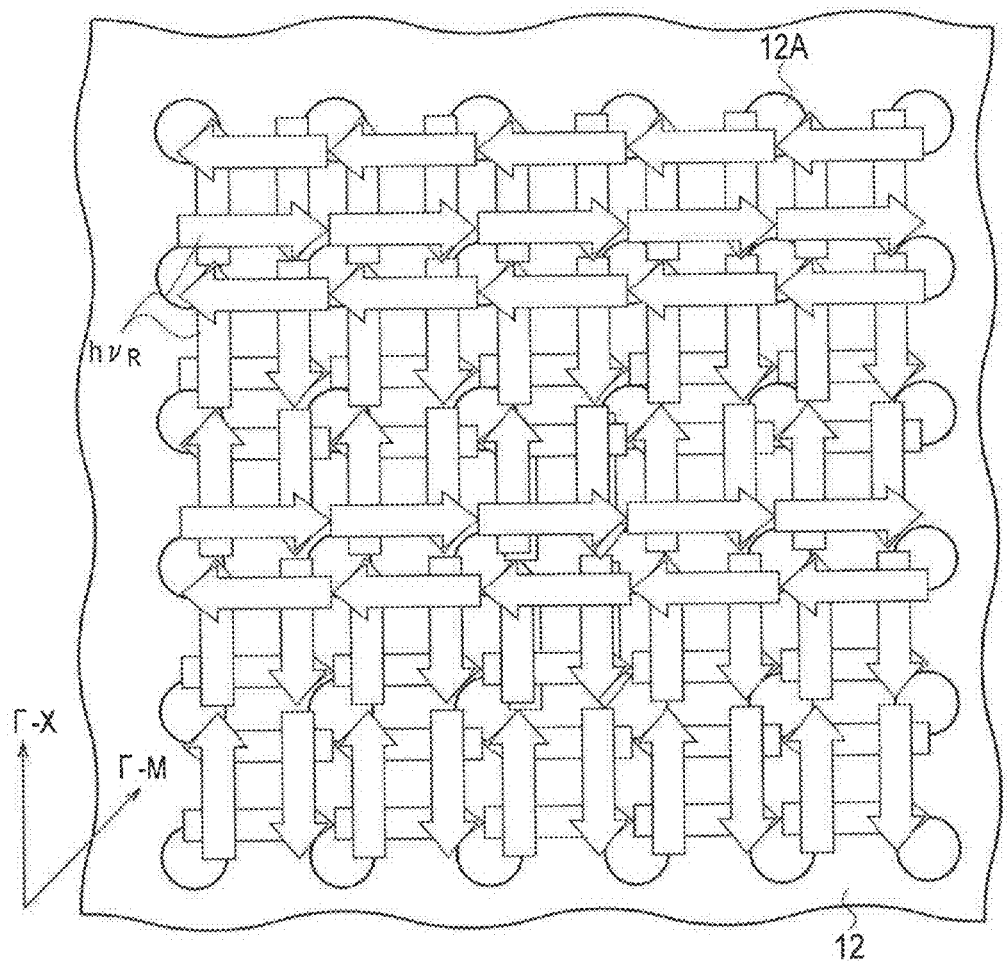
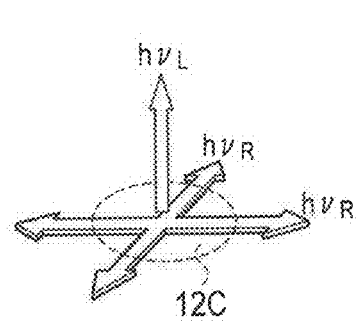
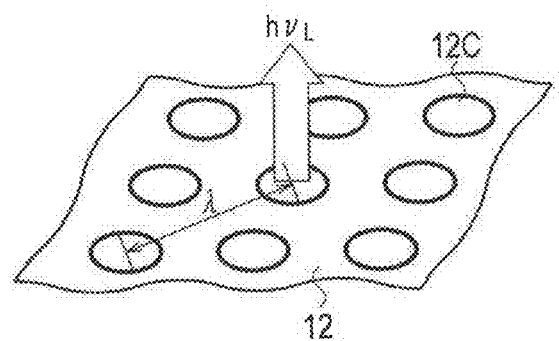

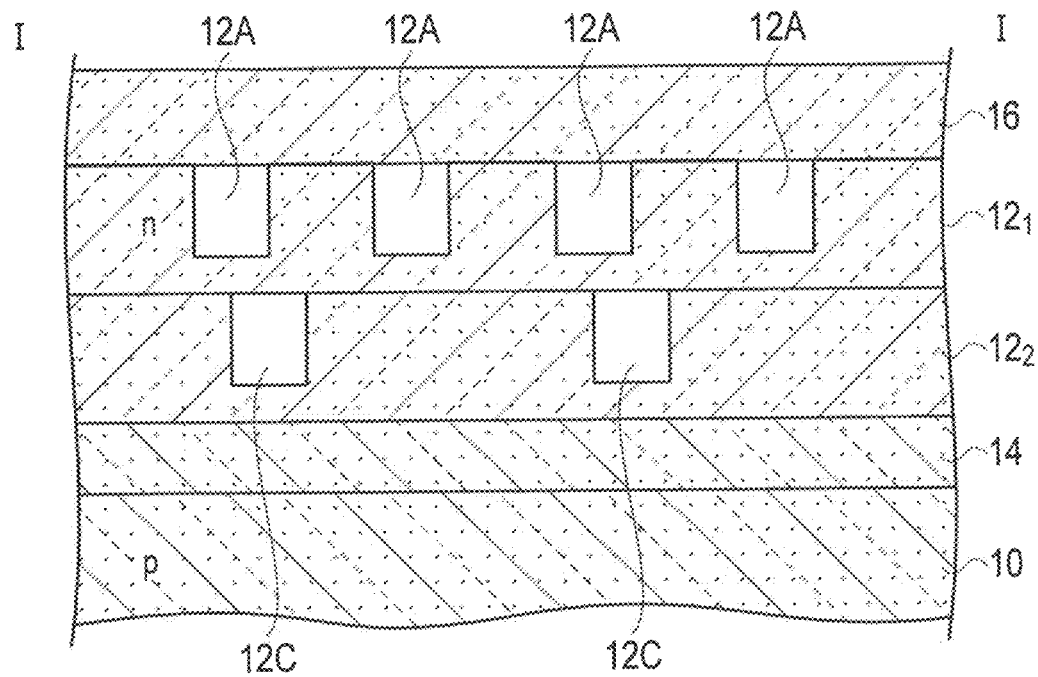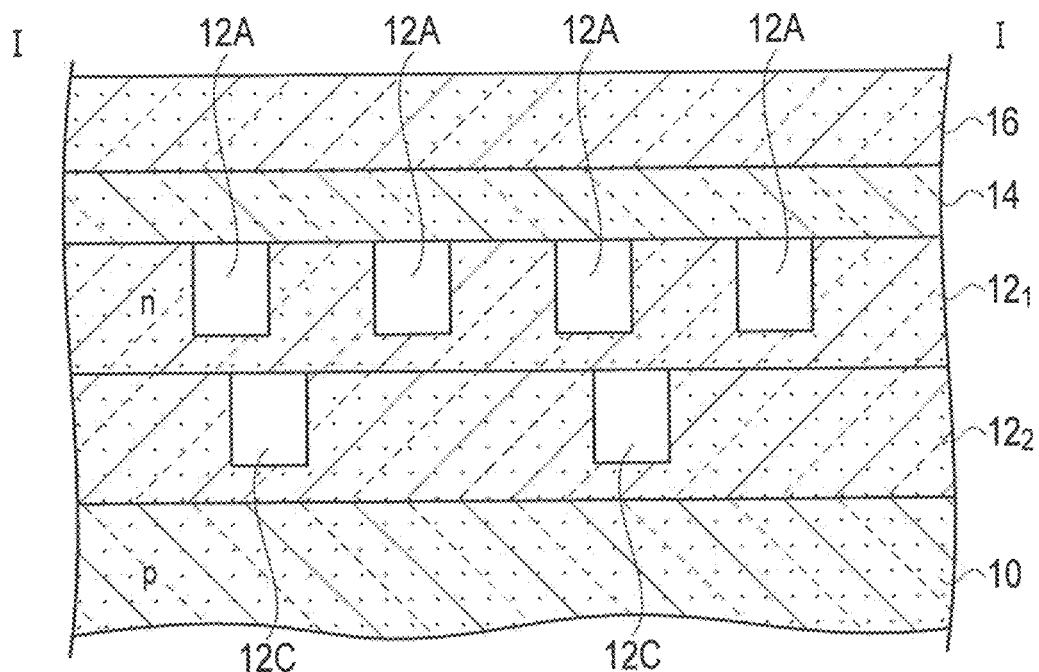

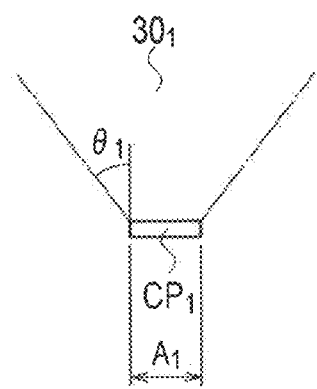
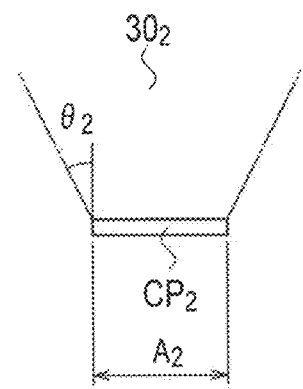
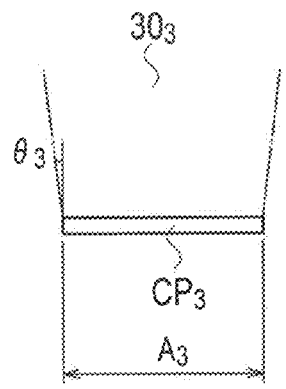
FIG. 11A   FIG. 11B   FIG. 11C
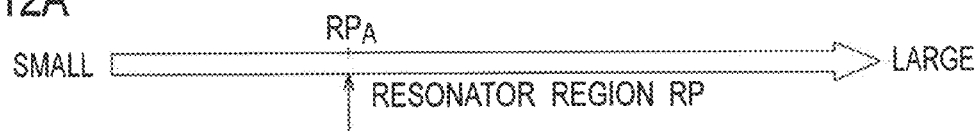

FIG. 17A
FIG. 17B
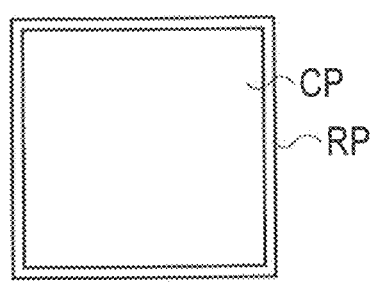
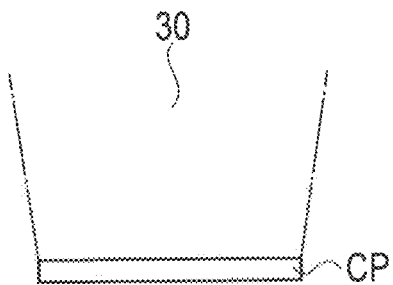
FIG. 17C
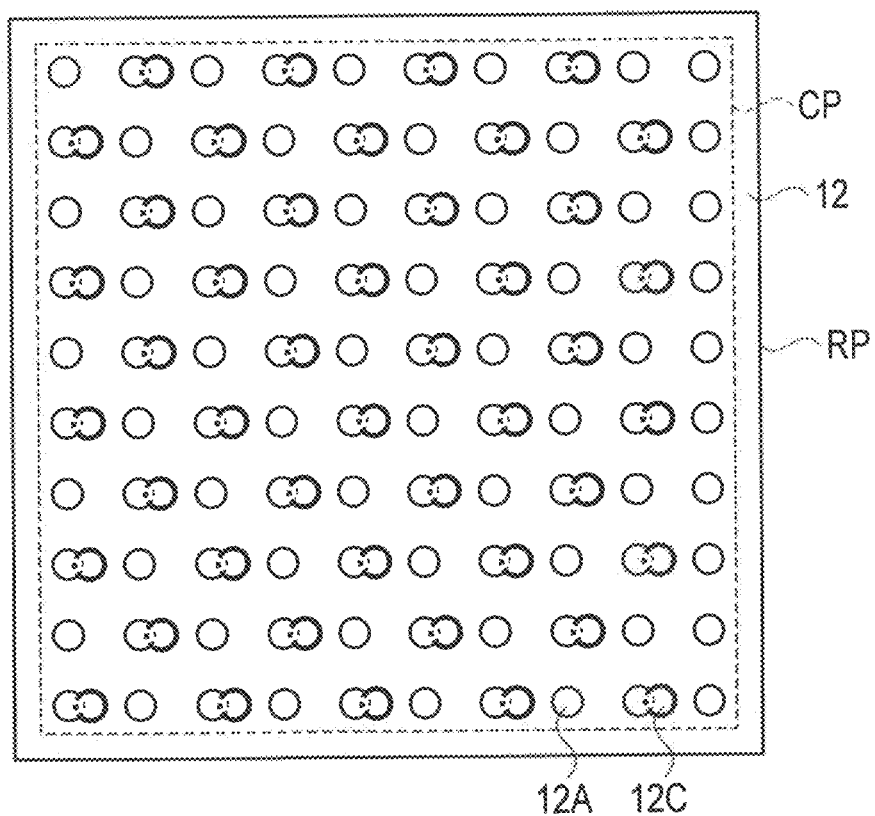

FIG. 27A
FIG. 27B
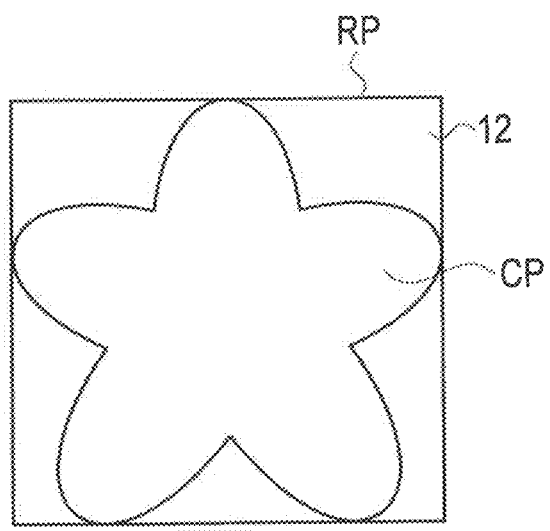
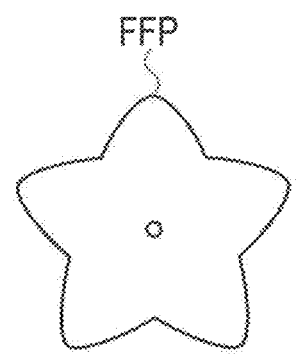

REAL SPACE

WAVE NUMBER SPACE

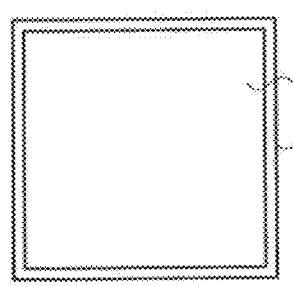
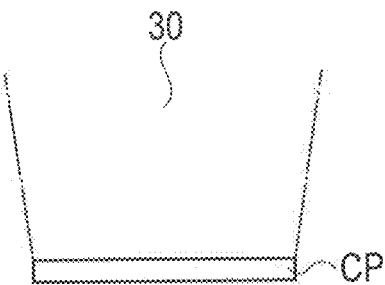
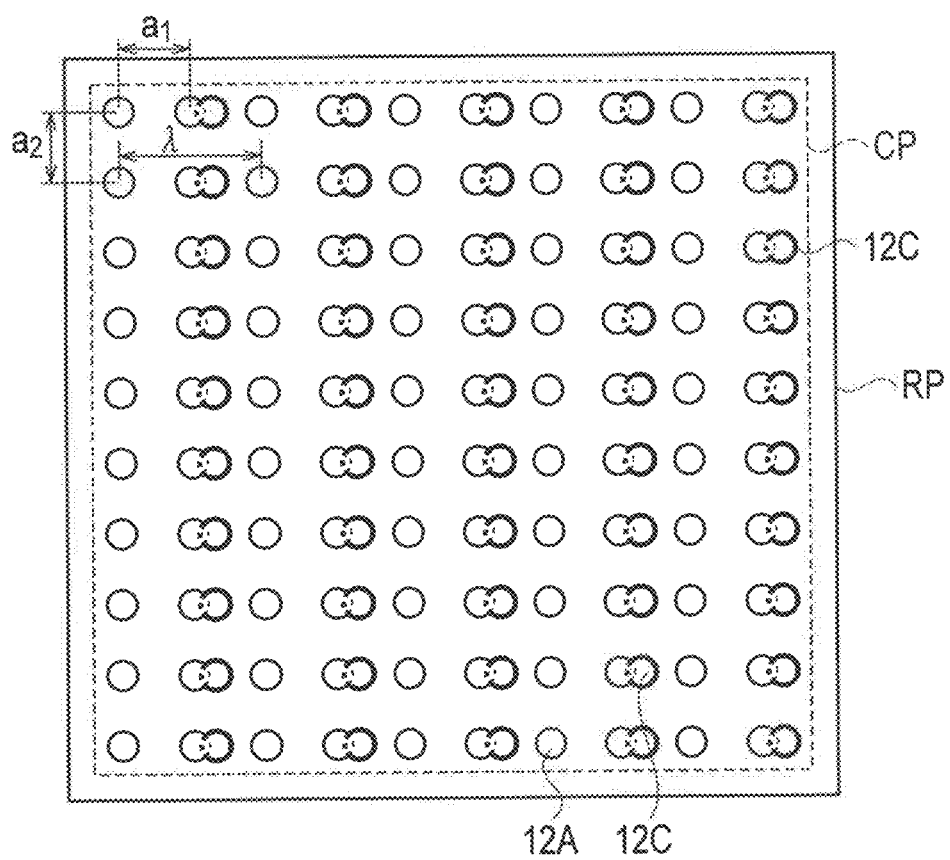

|   |                          | $a_x$(nm) | $a_y$(nm) | $d/d_1$    | s          | θ        | 2θ         |
|---|--------------------------|-----------|-----------|------------|------------|----------|------------|
| 1 | RECTANGULAR LATTICE X-POINT | 260 | 280 | 70nm/4nm | 0.96 | 7.6 | 15.2 |
| 2 | RECTANGULAR LATTICE X-POINT | 260 | 280 | 70nm/4nm | 0.98 | 3.8 | 7.6 |
| 3 | RECTANGULAR LATTICE X-POINT | 260 | 280 | 70nm/4nm | 0.96, 0.98 | 7.6, 3.8 | 15.2, 7.6 |

FIG. 109A
FIG. 109B
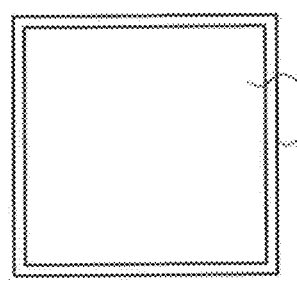
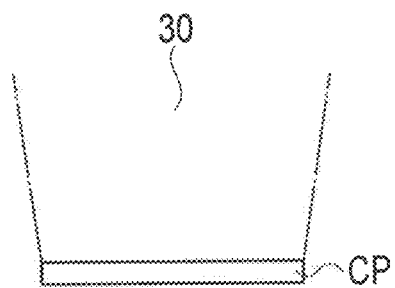
FIG. 109C
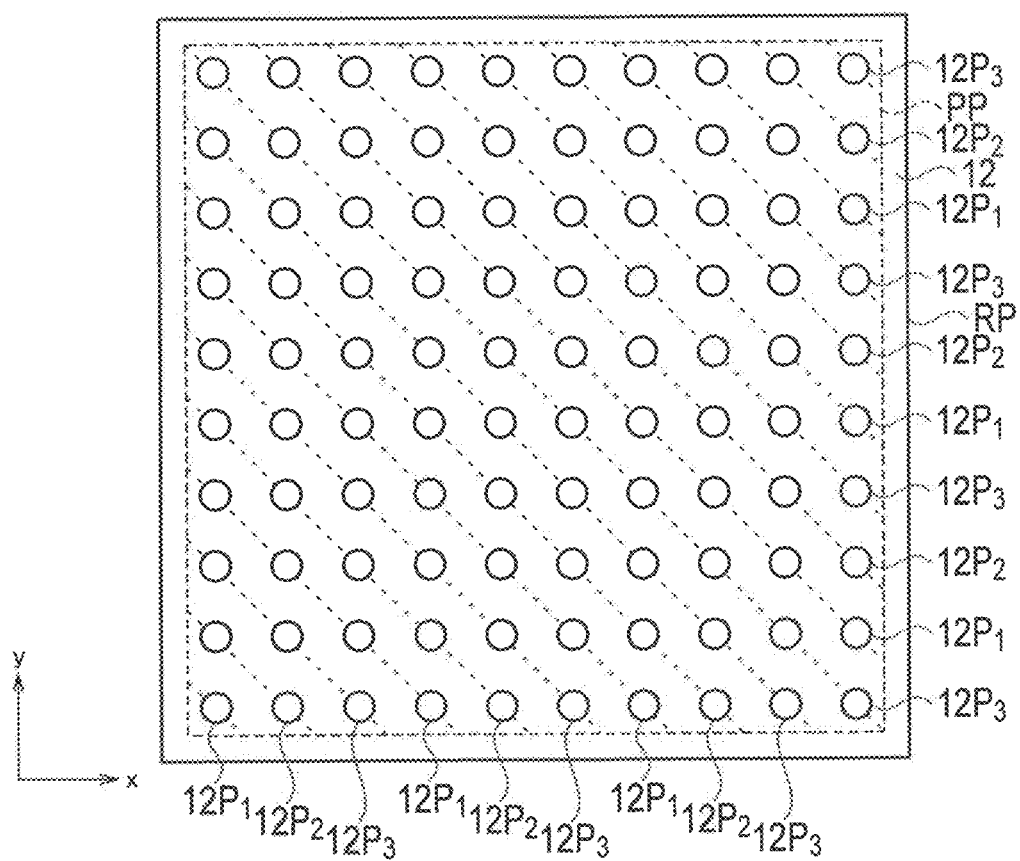

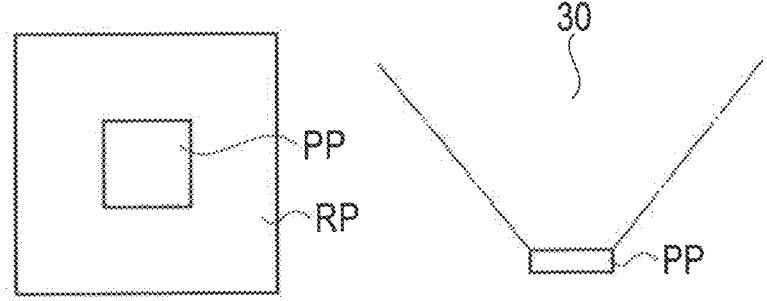
FIG. 110A
FIG. 110B
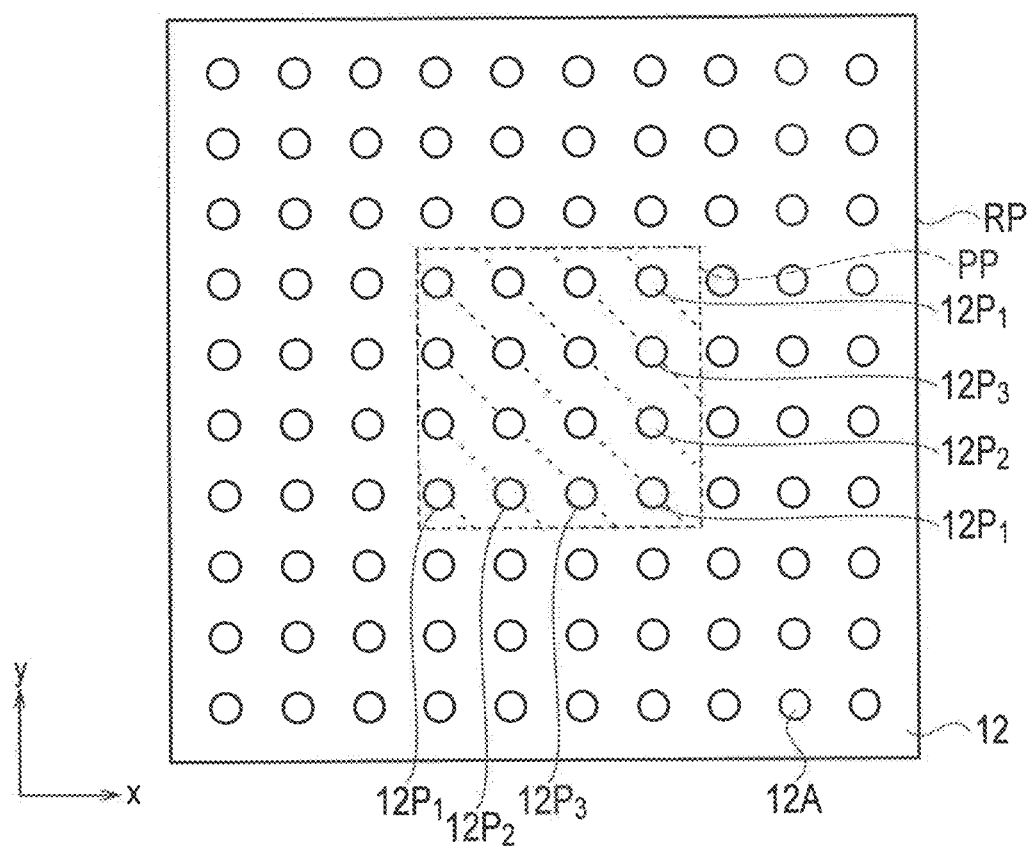
FIG. 110C

TWO DIMENSIONAL PHOTONIC CRYSTAL VERTICAL CAVITY SURFACE EMITTING LASERS

CROSS REFERENCE TO RELATED APPLICATIONS AND INCORPORATION BY REFERENCE

This application is based upon and claims the benefit of priority from prior Japanese Patent Application Nos. P2013-001020 filed on Jan. 8, 2013, P2013-002348 filed on January 10, P2013-045162 filed on March 7, and P2013-271854 filed on Dec. 27, 2013, the entire contents of which are incorporated herein by reference.

TECHNICAL FIELD

The present invention relates to a two-dimensional photonic crystal (2D-PC) surface emitting laser (SEL). The present invention relates to in particular a 2D-PC surface emitting laser which can control a beam spread angle and a beam emitting angle and shape of laser beams, while continuing a stable oscillation.

BACKGROUND ART

Conventional photonic crystal (PC) laser diodes (LD) have used an oscillation in a Γ-point (gamma-point) band edge of photonic band structure.

The Γ-point (gamma-point) oscillation has a function for forming standing waves for an oscillation of periodic structure in the PC, and a function for extracting the light as outputs, to a PC layer by diffracting the light in a surface vertical direction (e.g., refer to Patent Literatures 1-3.).

Citation List

Patent Literature 1: Japanese Patent Application Laying-Open Publication No. 2004-296538
Patent Literature 2: Japanese Patent Application Laying-Open Publication. No. 2000-332351
Patent Literature 3: Japanese Patent Application Laying-Open Publication No. 2003-23193

SUMMARY OF THE INVENTION

Technical Problem

Although a PC region (oscillation region) suitable for the conventional PC structure having oscillation experiences is approximately several 100 μm square, the spread angle is limited with approximately 1° in such a large region, and thereby applicability will become narrow.

For example, in order to extend the spread angle up to 10°, the oscillation region needs to be extended to equal to or less than approximately 10 μm. However, the conventional PC-LD structure is difficult to achieve such an oscillation region. Beams of PC laser reported until now have a small shape in two dimensions with approximately 1°-spread angle. This is a result of occurring theoretically due to extractions in a surface vertical direction from two-dimensional large area oscillations.

On the other hand, wide beam spread angles may be preferable depending on applications. However, the beam spread angle is uncontrollable in the structure using conventional square lattices or triangular lattices.

The inventors of the present application found out theoretically and also proved experimentally that the beam spread angle and shape of laser beams can be controlled with coupler arrangements.

The inventors of the present application found out theoretically and also proved experimentally that the beam spread angle can be controlled by forming PC lattice structure not with a square lattice or a triangular lattice but with a "rectangular lattice."

Moreover, the inventors of the present application found out theoretically and also proved experimentally that the beam emitting angle and the beam spread angle of laser beams can be controlled by applying perturbation to a lattice point for forming resonant-state (resonant-state-forming lattice point).

The object of the present invention is to provide a two-dimensional photonic crystal (2D-PC) surface emitting laser which can control a beam spread angle and shape of laser beams by using coupler arrangements, while continuing a stable oscillation.

Moreover, the object of the present invention is to provide a 2D-PC surface emitting laser which can control a beam spread angle, while continuing a stable oscillation with simplified structure having a rectangular lattice.

Moreover, the object of the present invention is to provide a 2D-PC surface emitting laser which can control a beam emitting angle and a beam spread angle and shape of laser beams by applying perturbation to a lattice point for forming resonant-state (resonant-state-forming lattice point), while continuing a stable oscillation with simplified structure.

Solution to Problem

According to one aspect of the present invention, there is provided a two-dimensional photonic crystal surface emitting laser comprising: a photonic crystal layer; and a lattice point for forming resonant-state arranged in the photonic crystal layer, the lattice point for forming resonant-state configured so that a light wave in a band edge in photonic band structure in the photonic crystal layer is diffracted in a plane of the photonic crystal layer, and is diffracted in a surface vertical direction of the photonic crystal layer, wherein perturbation for diffracting the light wave in the surface vertical direction of the photonic crystal layer is applied to the lattice point for forming resonant-state.

According to another aspect of the present invention, there is provided a two-dimensional photonic crystal surface emitting laser comprising: a photonic crystal layer; a lattice point for forming resonant-state periodically arranged in the photonic crystal layer, the lattice point for forming resonant-state configured so that a light wave in a band edge of photonic band structure in the photonic crystal layer is diffracted in a plane of the photonic crystal layer; and a lattice point for forming perturbation-state periodically arranged in the photonic crystal layer, the lattice point for forming perturbation-state configured so that the light wave in the band edge of the photonic band structure in the photonic crystal layer is diffracted in the plane of the photonic crystal layer, and is diffracted in a surface vertical direction of the photonic crystal layer, wherein perturbation for diffracting the light wave in the surface vertical direction of the photonic crystal layer is applied to a part of the lattice point for forming resonant-state, and thereby the lattice point for forming perturbation-state is formed.

According to still another aspect of the present invention, there is provided a two-dimensional photonic crystal surface emitting laser comprising: a photonic crystal layer; and a lattice point for forming resonant-state of a rectangular lattice arranged in the photonic crystal layer, the lattice point for forming resonant-state configured so that a light wave in a X-point band edge in photonic band structure in the photonic crystal layer is diffracted in a plane of the photonic crystal layer, and is diffracted in a surface vertical direction of the photonic crystal layer, wherein perturbation for diffracting the light wave in the surface vertical direction of the photonic crystal layer is applied to the lattice point for forming resonant-state, and a length of one side $a_2$ of the rectangular lattice is equal to ½ a wavelength in the medium where lattice constants of the rectangular lattice are $a_1$ and $a_2$.

According to yet another aspect of the present invention, there is provided a two-dimensional photonic crystal surface emitting laser comprising: a photonic crystal layer; a lattice point for forming resonant-state of a rectangular lattice arranged in the photonic crystal layer, the a lattice point for forming resonant-state configured so that a light wave in an X-point band edge in photonic band structure in the photonic crystal layer is diffracted in a plane of the photonic crystal layer; and a lattice point for forming perturbation-state configured so that the light wave in the X-point band edge in the photonic band structure in the photonic crystal layer is diffracted to a surface vertical direction of the photonic crystal layer, wherein perturbation for diffracting the light wave in the surface vertical direction of the photonic crystal layer is applied to a part of the lattice point for forming resonant-state, and thereby the lattice point for forming perturbation-state is formed, and a length of one side $a_2$ of the rectangular lattice is equal to ½ a wavelength in the medium where lattice constants of the rectangular lattice are $a_1$ and $a_2$.

According still yet another aspect of the present invention, there is provided a two-dimensional photonic crystal surface emitting laser comprising: a photonic crystal layer; a lattice point for forming resonant-state in a first rectangular lattice arranged in the photonic crystal layer, the lattice point for forming resonant-state configured so that a light wave in an X-point band edge in a photonic band structure in the photonic crystal layer is diffracted in a plane of the photonic crystal layer; and lattice point for forming perturbation-state configured so that the light wave in the X-point band edge in the photonic band structure in the photonic crystal layer is diffracted to a surface vertical direction of the photonic crystal layer, wherein perturbation for diffracting the light wave in the surface vertical direction of the photonic crystal layer is applied to a part of the lattice point for forming resonant-state, and thereby the lattice point for forming perturbation-state is formed, and the lattice point for forming perturbation-state is arranged in a second rectangular lattice differ from the first rectangular lattice, wherein lattice constants in an x direction and a y direction of the second rectangular lattice is equal to $a_1$ and a wavelength λ in the medium (=$2a_2$) with respect to lattice constants $a_1$ and $a_2$ in the x direction and the y direction of the first rectangular lattice.

Advantageous Effects of Invention

According to the present invention, there can be provided the 2D-PC surface emitting laser which can control the beam spread angle and shape of laser beams by using the coupler arrangements, while continuing the stable oscillation.

Moreover, according to the present invention, there can be provided the 2D-PC surface emitting laser which can control the beam spread angle, while continuing the stable oscillation with the simplified structure having the rectangular lattice.

Moreover, according to the present invention, there can be provided the 2D-PC surface emitting laser which can control the beam emitting angle and the beam spread angle and shape of the laser beams by applying the perturbation to the lattice point for forming resonant-state (resonant-state-forming lattice point), while continuing the stable oscillation with the simplified structure.

BRIEF DESCRIPTION OF DRAWINGS

FIG. 3A is a schematic explanatory diagram of an in-plane resonant mode of a 2D-PC layer, in the 2D-PC surface emitting laser according to the first embodiment.

FIG. 3B is a schematic diagram of a surface emission-type laser beam $hv_L$ and an intracavity laser beam $hv_R$ both which are emitted, in the 2D-PC surface emitting laser according to the first embodiment.

FIG. 3C is a schematic diagram of the surface emission-type laser beam $hv_L$ emitted from the 2D-PC layer having lattice points for coupler 12C, in the 2D-PC surface emitting laser according to the first embodiment.

FIG. 10A is a schematic cross-sectional structure diagram of a 2D-PC surface emitting laser according to a modified example 3 of the first embodiment taken in the line I-I of FIG. 5A.

FIG. 10B is a schematic cross-sectional structure diagram of a 2D-PC surface emitting laser according to a modified example 4 of the first embodiment taken in the line I-I of FIG. 5A.

FIG. 11A is a diagram showing a relationship between a width, a beam spread angle, and a beam spread region of a coupler region CP, in the 2D-PC surface emitting laser according to the first embodiment, and showing in particular an example of the width $A_1$, the beam spread angle $\theta_1$, and the beam spread region $30_1$ of the coupler region CP1.

FIG. 11B is a diagram showing the relationship between the width, the beam spread angle, and the beam spread region of the coupler region CP, in the 2D-PC surface emitting laser according to the first embodiment, and showing in particular an example of the width $A_2$, the beam spread angle $\theta_2$, and the beam spread region $30_2$ of the coupler region $CP_2$.

FIG. 11C is a diagram showing the relationship between the width, the beam spread angle, and the beam spread region of the coupler region CP, in the 2D-PC surface emitting laser according to the first embodiment, and showing in particular an example of the width $A_3$, the beam spread angle $\theta_3$, and the beam spread region $30_3$ of the coupler region $CP_3$.

FIG. 12A is a diagram showing a size relationship between resonator regions RP corresponding to FIGS. 11A, 11B and 11C, in the 2D-PC surface emitting laser according to the first embodiment.

FIG. 12B is a diagram showing a size relationship between the beam spread angles $\theta_0$ corresponding to FIGS. 11A, 11B and 11C, in the 2D-PC surface emitting laser according to the first embodiment.

FIG. 17A shows a Near Field Pattern (NFP) in the case where the size of the resonator region RP and the size of the coupler region CP in the 2D-PC layer applied to the M-point oscillation are nearly equal to each other, in the 2D-PC surface emitting laser according to the first embodiment.

FIG. 17B is a schematic diagram showing a beam spread region from the coupler region CP, in the 2D-PC surface emitting laser according to the first embodiment.

FIG. 17C shows an example of arrangement of the lattice points for resonator and the lattice points for coupler in the resonator region RP and the coupler region CP corresponding to FIG. 17A, in the 2D-PC surface emitting laser according to the first embodiment.

FIG. 27A shows an NFP in the case where five elliptic resonator regions CP intersecting at 72 degrees with each other are arranged in the resonator region RP in the 2D-PC layer applied to the M-point oscillation, in the 2D-PC surface emitting laser according to the first embodiment.

FIG. 27B shows an FFP corresponding to FIG. 27A, in the 2D-PC surface emitting laser according to the first embodiment.

FIG. 63A shows a Near Field Pattern (NFP) in the case where the size of the resonator region RP and the size of the coupler region CP in the 2D-PC layer applied to the X-point oscillation are nearly equal to each other, in the 2D-PC surface emitting laser according to the eighth embodiment.

FIG. 63B is a schematic diagram showing a beam spread region from the coupler region CP, in the 2D-PC surface emitting laser according to the eighth embodiment.

FIG. 63C shows an example of arrangement of the lattice points for resonator and the lattice points for coupler in the resonator region RP and the coupler region CP corresponding to FIG. 63A, in the 2D-PC surface emitting laser according to the eighth embodiment.

FIG. 64B is a schematic diagram showing a beam spread region from the coupler region CP, in the 2D-PC surface emitting laser according to the eighth embodiment.

FIG. 64C shows an example of arrangement of the lattice points for resonator 12A and the lattice point for coupler 12C in the resonator region RP and the coupler region CP corresponding to FIG. 64A.

Figure 65A:
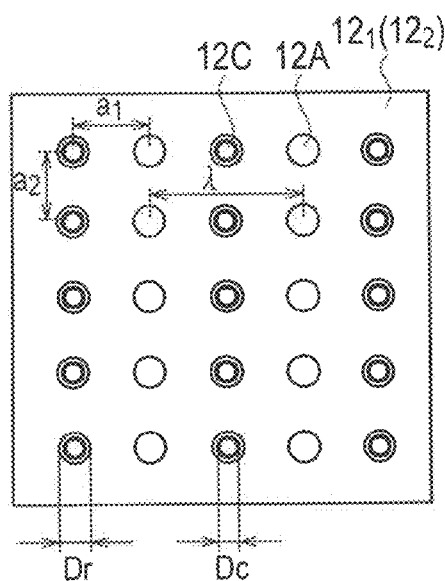

FIG. 65A shows an example of arrangement in the case where the diameter $D_r$ of the lattice points for resonator 12A and the diameter $D_c$ of the lattice points for coupler 12C in the 2D-PC layer applied to the X-point oscillation differ from each other, and shows in particular an example of being arranged so that $D_c <= D_r$ is satisfied at the same lattice position, in the 2D-PC surface emitting laser according to the eighth embodiment.

Figure 65B:
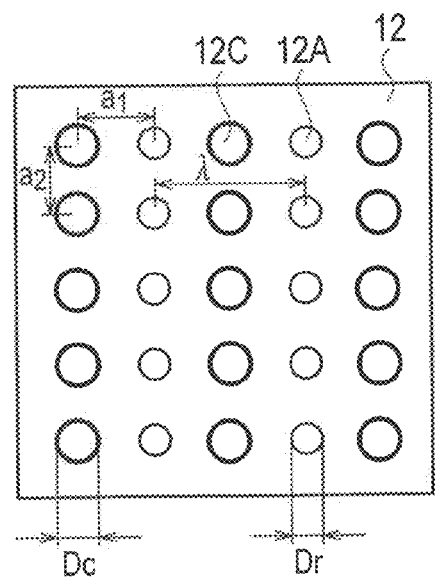

FIG. 65B shows an example of arrangement in the case where the diameter $D_r$ of the lattice points for resonator 12A and the diameter $D_c$ of the lattice points for coupler 12C in the 2D-PC layer applied to the X-point oscillation differ from each other, and shows in particular an example of being arranged so that $D_c > D_r$ is satisfied at the same lattice position, in the 2D-PC surface emitting laser according to the eighth embodiment.

Figure 66A:
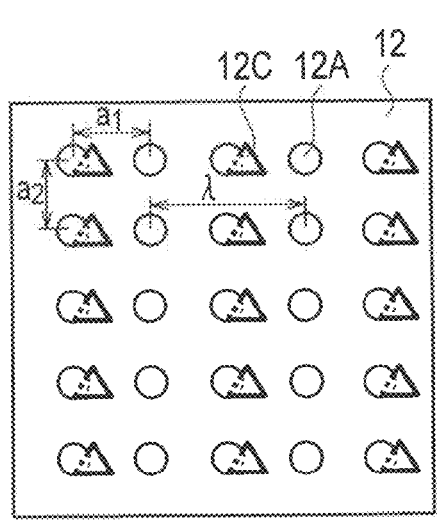

FIG. 66A shows an example of arrangement in the case where the shape of the lattice points for resonator 12A differs from the shape of the lattice points for coupler 12C in the 2D-PC layer applied to the X-point oscillation, and shows in particular an example that the shape of the lattice points for resonator 12A is a circular shape, and the shape of the lattice points for coupler 12C is a triangular shape, in the 2D-PC surface emitting laser according to the eighth embodiment.

Figure 66B:
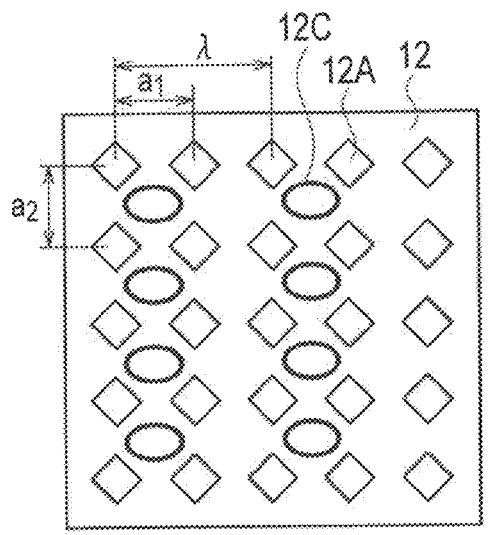

FIG. 66B shows an example of arrangement in the case where the shape of the lattice points for resonator 12A differs from the shape of the lattice points for coupler 12C in the 2D-PC layer applied to the X-point oscillation, and shows in particular an example that the shape of the lattice points for resonator 12A is a rhombus, and the shape of the lattice points for coupler 12C is an ellipse, in the 2D-PC surface emitting laser according to the eighth embodiment.

Figure 67:
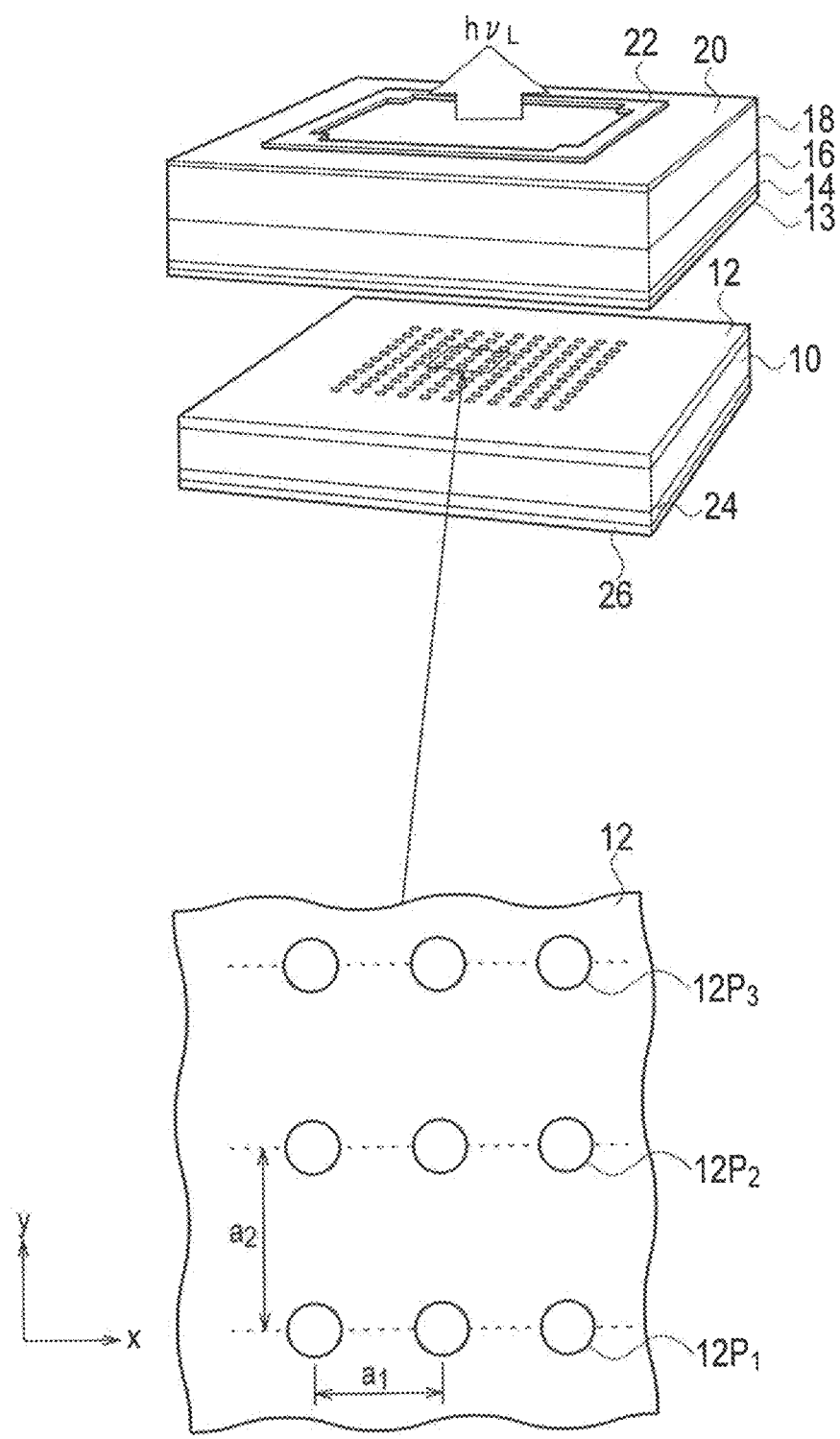

FIG. 67 is a schematic bird's-eye view structure diagram of a 2D-PC surface emitting laser according to a ninth embodiment.

Figure 68A:
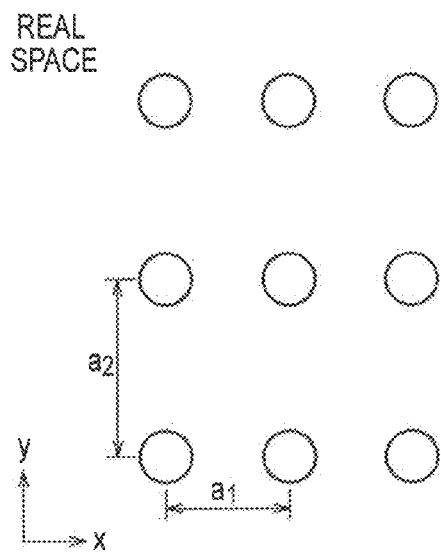

FIG. 68A shows real space of a rectangular lattice of a 2D-PC layer applied to the 2D-PC surface emitting laser according to the ninth embodiment.

Figure 68B:
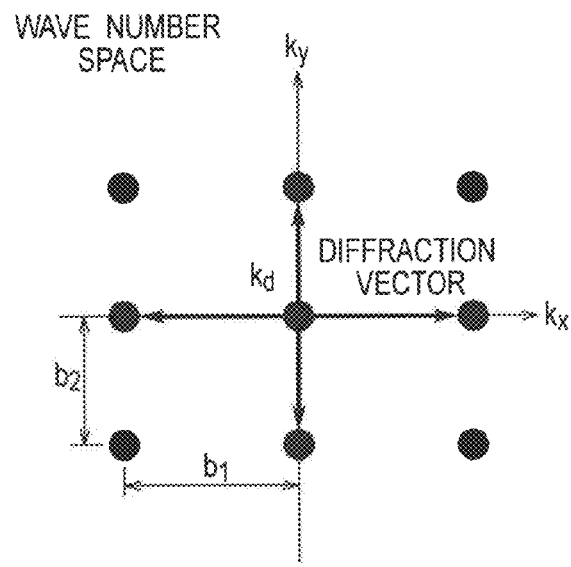

FIG. 68B shows wave number space corresponding to FIG. 68A.

Figure 69A:
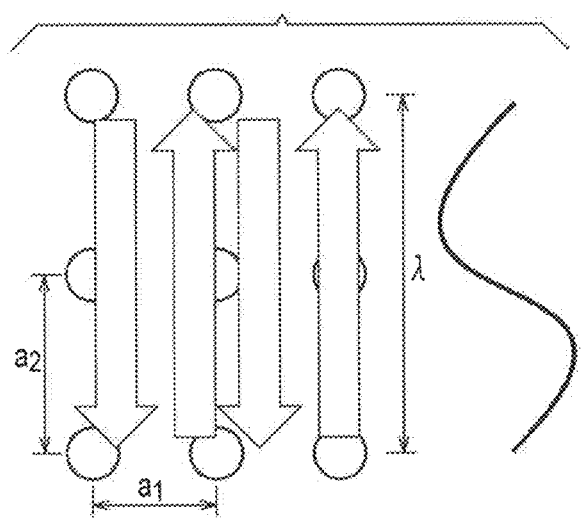

FIG. 69A is an operational principle diagram of surface light emission of the 2D-PC surface emitting laser in an example in the case where the 2D-PC layer has rectangular lattice points, and is in particular an explanatory diagram in the real space of the in-plane resonant state of the rectangular lattice in the 2D-PC layer.

Figure 69B:
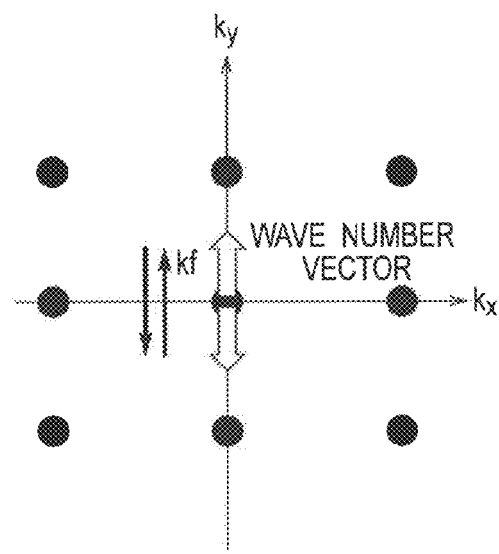

FIG. 69B is an explanatory diagram in the wave number space corresponding to FIG. 69A.

Figure 70A:
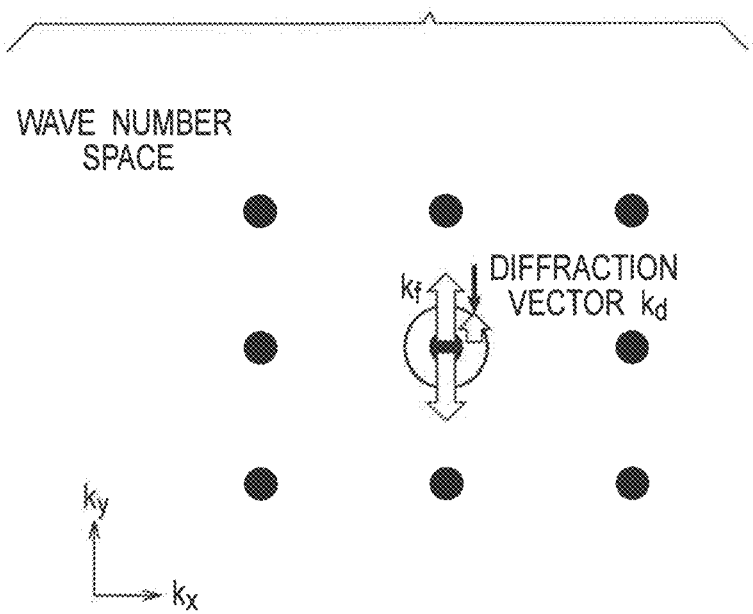

FIG. 70A is an explanatory diagram in the wave number space $k_x$-$k_y$ of a diffraction operation in the upward direction (z-axial direction), in the in-plane resonant state corresponding to FIG. 69.

Figure 70B:
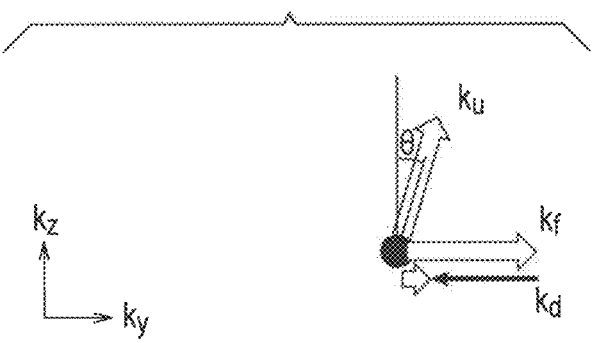

FIG. 70B is an explanatory diagram in the wave number space $k_z$-$k_y$ corresponding to FIG. 70A.

Figure 71A:
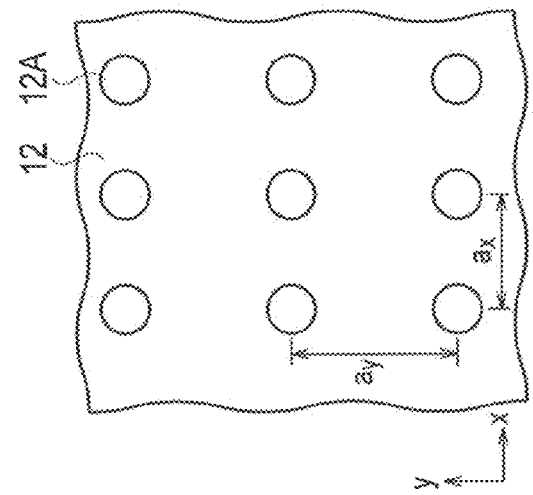

FIG. 71A shows a real space structural example of lattice points for forming resonant-state (resonant-state-forming lattice points) (square lattice) in a 2D-PC layer, in a 2D-PC surface emitting laser according to a comparative example.

Figure 71B:
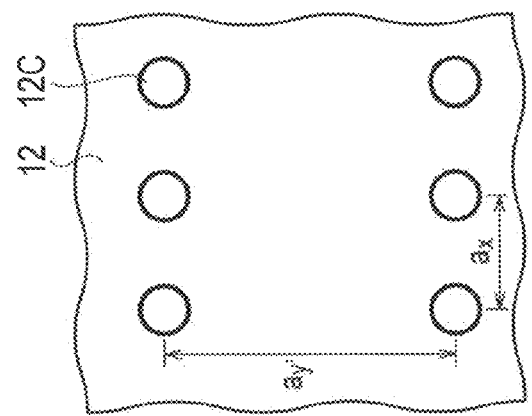

FIG. 71B shows a real space structural example of lattice points for light extraction in the 2D-PC layer.

Figure 71C:
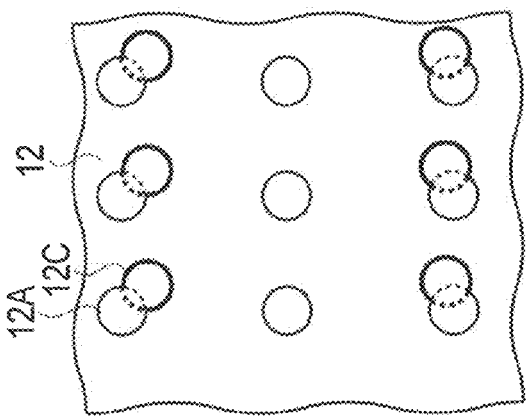

FIG. 71C shows a real space structural example in which the lattice points for forming resonant-state and the lattice point for light extraction are combined with each other.

Figure 71D:
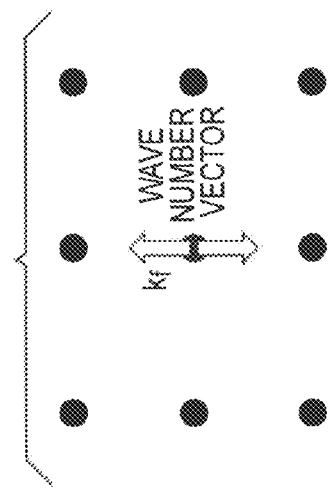

FIG. 71D shows the wave number space corresponding to FIG. 71A.

Figure 71E:
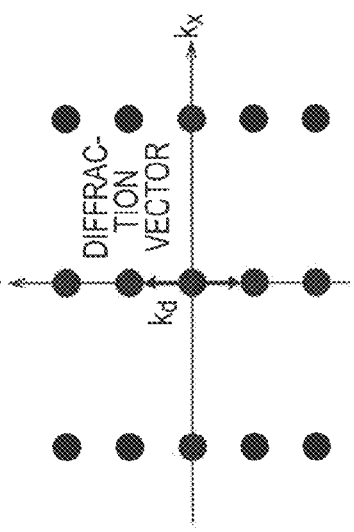

FIG. 71E shows the wave number space corresponding to FIG. 71C.

Figure 72C:
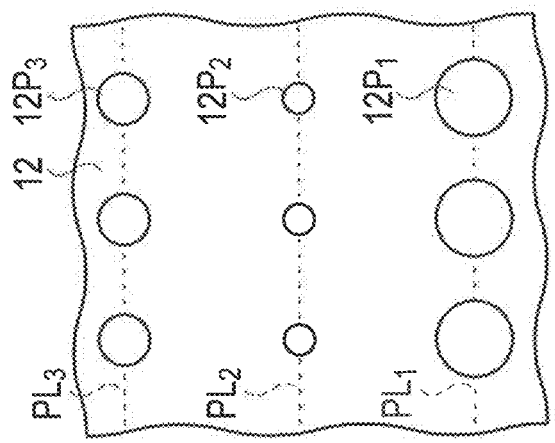
Figure 72B:
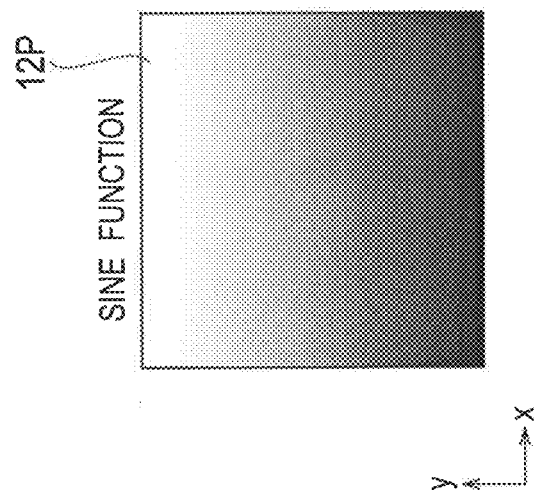
Figure 72A:
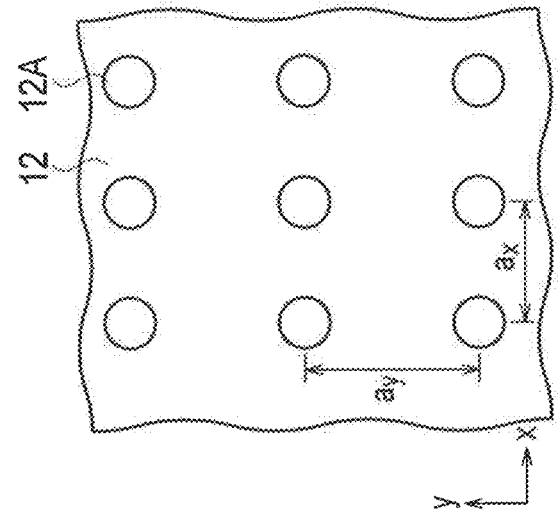

FIG. 72A shows a real space structural example of the lattice points for forming resonant-state (rectangular lattice) in the 2D-PC layer, in the 2D-PC surface emitting laser according to the ninth embodiment.

FIG. 72B is a conceptual diagram for illustrating an aspect that perturbation of a sine wave function is applied in y-axial direction to the lattice points for forming resonant-state (rectangular lattice) in the 2D-PC layer, in the 2D-PC surface emitting laser according to the ninth embodiment.

FIG. 72C is a conceptual diagram for illustrating an aspect that perturbation of hole-shape (hole-diameter) modulation is applied in y-axial direction to the lattice points for forming resonant-state (rectangular lattice) in the 2D-PC layer, in the 2D-PC surface emitting laser according to the ninth embodiment.

Figure 73A:
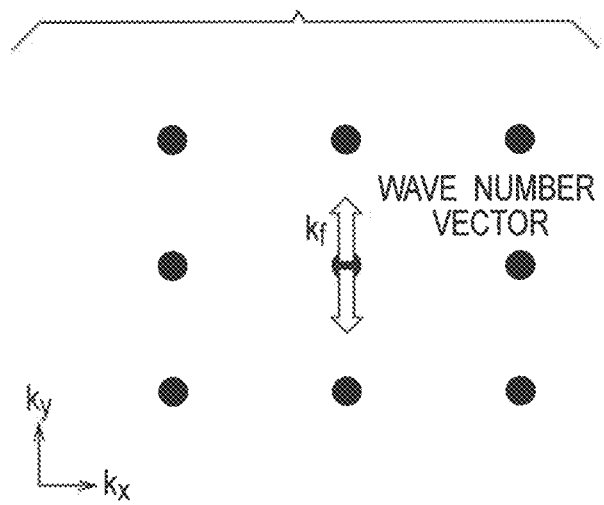

FIG. 73A shows the wave number space corresponding to FIG. 72A.

Figure 73B:
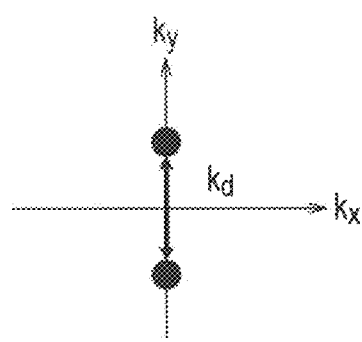

FIG. 73B shows the wave number space corresponding to FIG. 72B.

Figure 74:
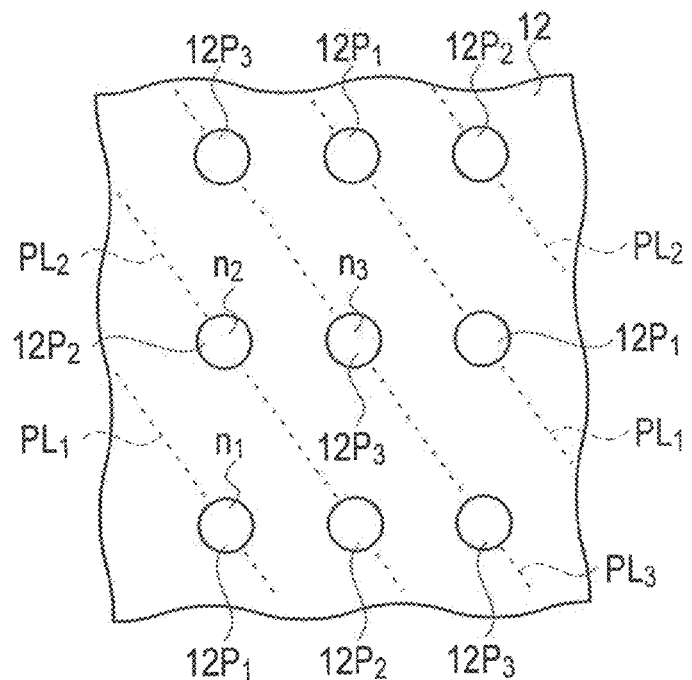

FIG. 74 shows a real space structural example for illustrating an aspect that perturbation of refractive index modulation is applied to the lattice points forming resonant-state (rectangular lattice) in the 2D-PC layer, in the 2D-PC surface emitting laser according to the ninth embodiment.

Figure 75:
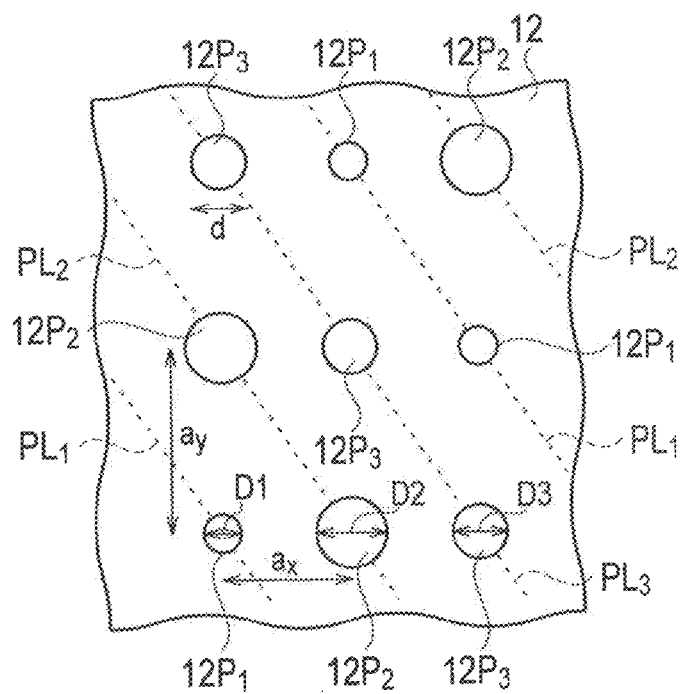

FIG. 75 is a real space structural example for illustrating an aspect that perturbation of hole-shape (hole-diameter) modulation is applied to the lattice points for forming resonant-state (rectangular lattice) in the 2D-PC layer, in the 2D-PC surface emitting laser according to the ninth embodiment.

Figure 76:
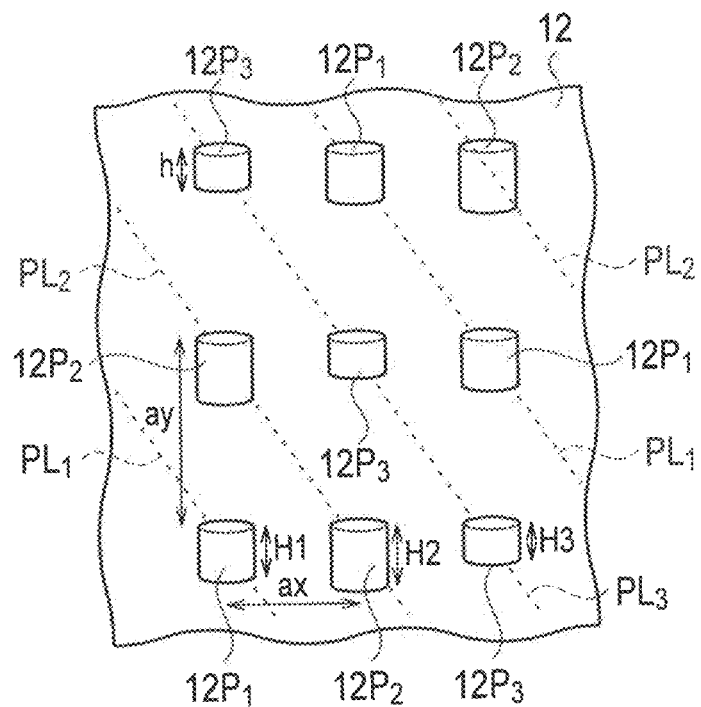

FIG. 76 shows a real space structural example for illustrating an aspect that perturbation of hole-depth modulation is applied to the lattice points for forming resonant-state (rectangular lattice) in the 2D-PC layer, in the 2D-PC surface emitting laser according to the ninth embodiment.

Figure 77:
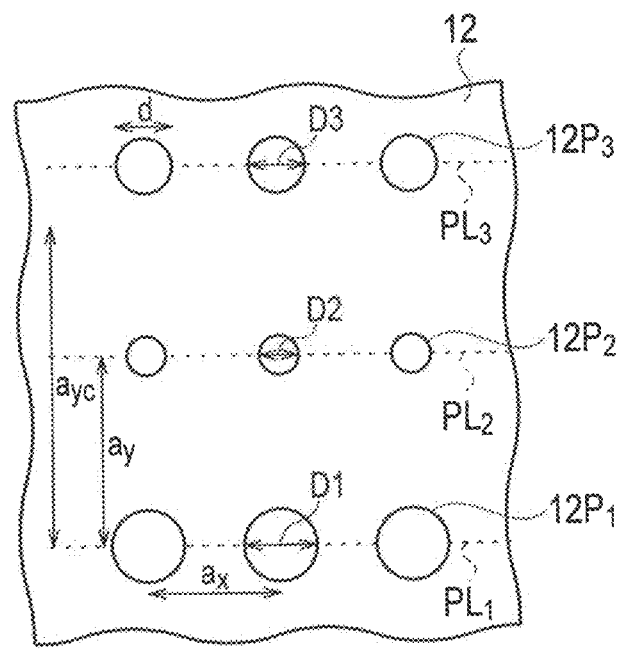

FIG. 77 shows a real space structural example in which perturbation of hole-shape (hole-diameter) modulation is applied in y-axial direction to the lattice points for forming resonant-state (rectangle lattice X-point) in the 2D-PC layer, in the 2D-PC surface emitting laser according to the ninth embodiment.

Figures 78, 79:
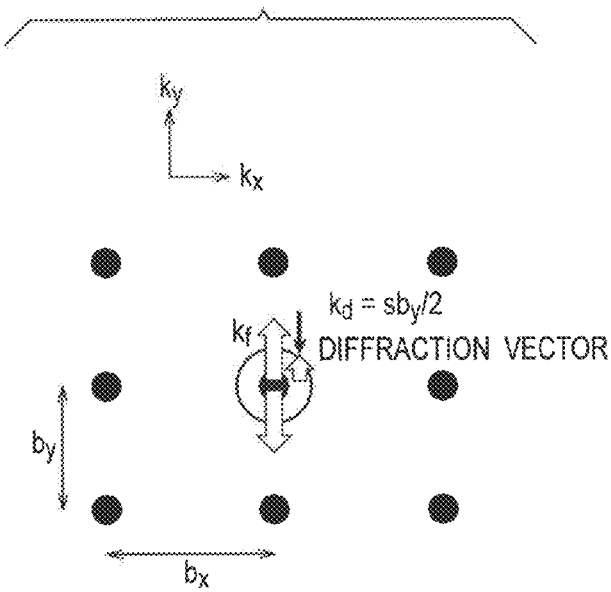

FIG. 78 shows the wave number space corresponding to FIG. 77.

FIG. 79 shows a value example of a lattice constant ($a_x$, $a_y$), a hole diameter $d_1$, a perturbation coefficient s ($=a_y/a_{yc}$) and abeam emitting angle θ, in the case of applying the perturbation of hole-shape (hole-diameter) modulation in y-axial direction to the lattice points for forming resonant-state (rectangle lattice X-point) in the 2D-PC layer, in the 2D-PC surface emitting laser according to the ninth embodiment.

Figure 80A:
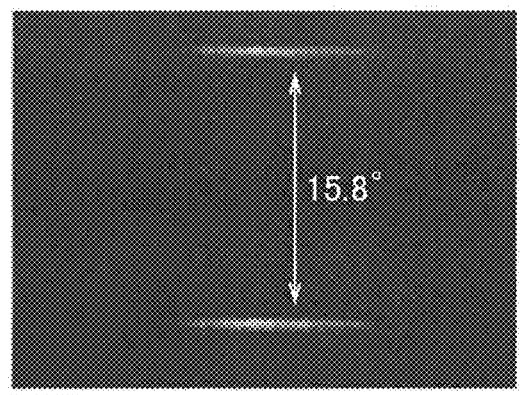

FIG. 80A shows an experimental result in the case of applying the perturbation of hole-shape (hole-diameter) modulation in y-direction to the lattice points for forming resonant-state (rectangle lattice X-point) in the 2D-PC layer, and shows in particular an FFP and the beam emitting angle θ at the time of the perturbation coefficient s=0.96, in the 2D-PC surface emitting laser according to the ninth embodiment.

Figure 80B:
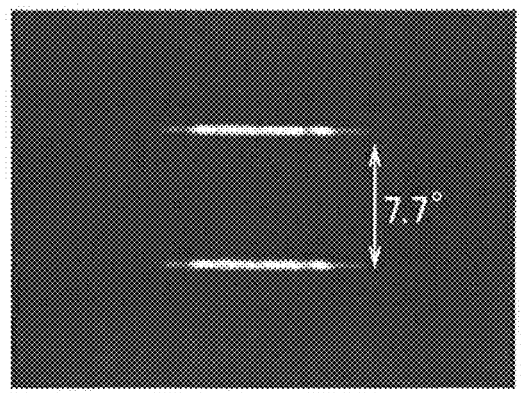

FIG. 80B shows an experimental result in the case of applying the perturbation of hole-shape (hole-diameter) modulation in y-axial direction to the lattice points for forming resonant-state (rectangle lattice X-point) in the 2D-PC layer, and shows in particular the FFP and the beam emitting angle θ at the time of the perturbation coefficient s=0.98, in the 2D-PC surface emitting laser according to the ninth embodiment.

Figure 80C:
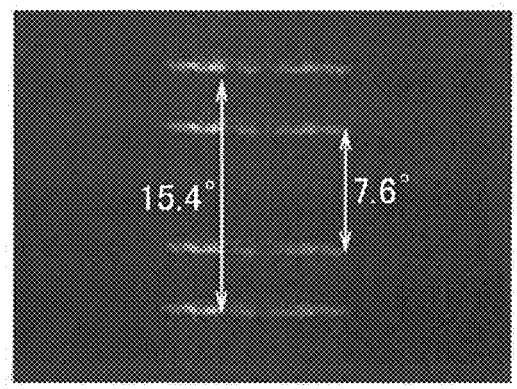

FIG. 80C shows an experimental result in the case of applying the perturbation of hole-shape (hole-diameter) modulation in y-axial direction to the lattice points for forming resonant-state (rectangle lattice X-point) in the 2D-PC layer, and shows in particular the FFP and the beam emitting angle θ at the time of the perturbation coefficient s=0.98, 0.96, in the 2D-PC surface emitting laser according to the ninth embodiment.

Figure 81:
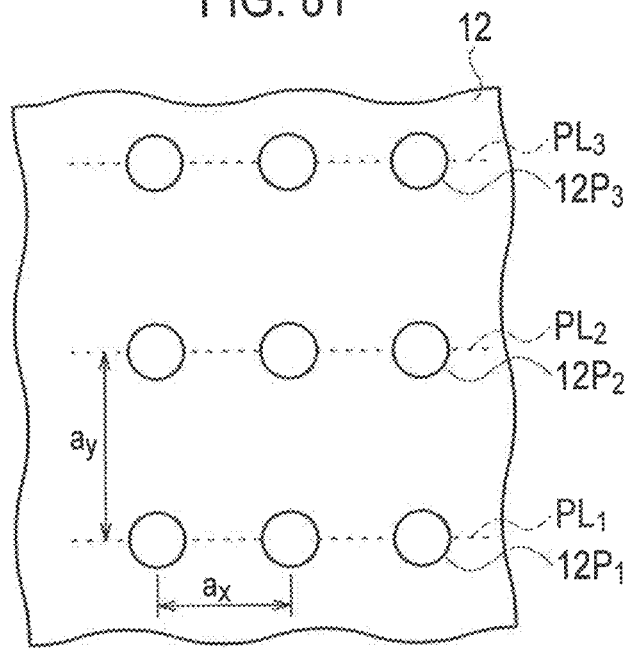

FIG. 81 shows a real space structural example in the case of applying the perturbation of hole-shape (hole-diameter) modulation in y-axial direction to the lattice points for forming resonant-state (rectangular lattice) in the 2D-PC layer, in the 2D-PC surface emitting laser according to the ninth embodiment.

Figure 82:
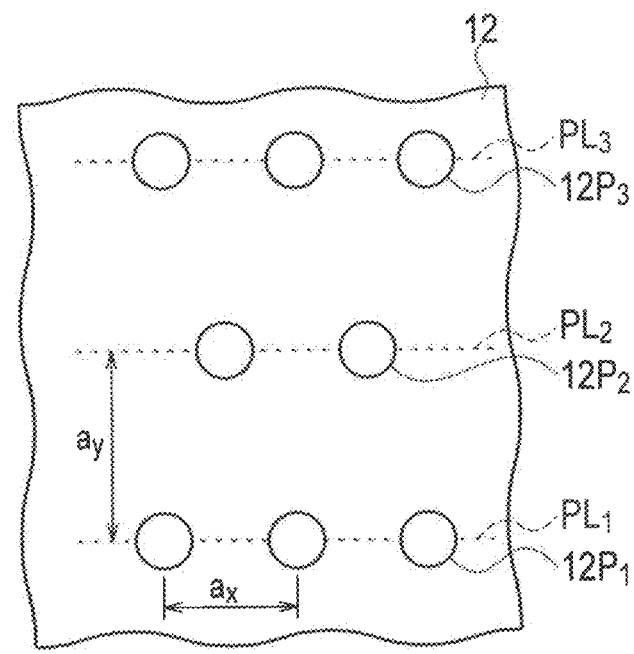

FIG. 82 shows a real space structural example in the case of applying the perturbation of hole-shape (hole-diameter) modulation in y-axial direction to the lattice points for forming resonant-state (face-centered rectangle lattice) in the 2D-PC layer, in the 2D-PC surface emitting laser according to the ninth embodiment.

Figure 83:
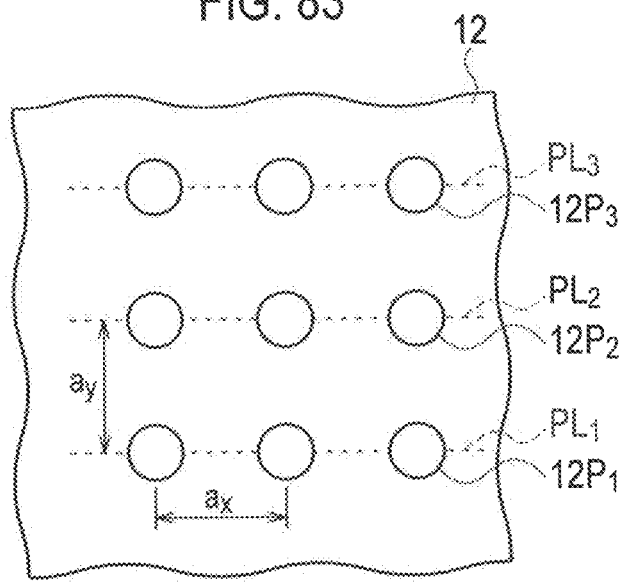

FIG. 83 shows a real space structural example in the case of applying the perturbation of hole-shape (hole-diameter) modulation in y-axial direction to the lattice points for forming resonant-state (square lattice) in the 2D-PC layer, in the 2D-PC surface emitting laser according to the ninth embodiment.

Figure 84:
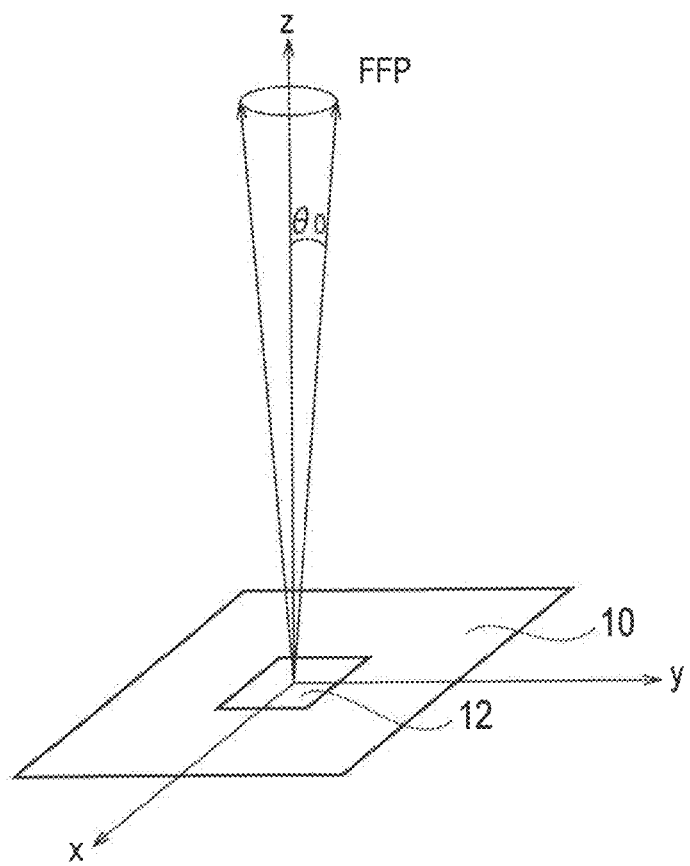

FIG. 84 is a schematic explanatory diagram showing the FFP of the lattice points for forming resonant-state (square lattice Γ-point (gamma-point)) in the 2D-PC layer, in the 2D-PC surface emitting laser according to a comparative example.

Figure 85:
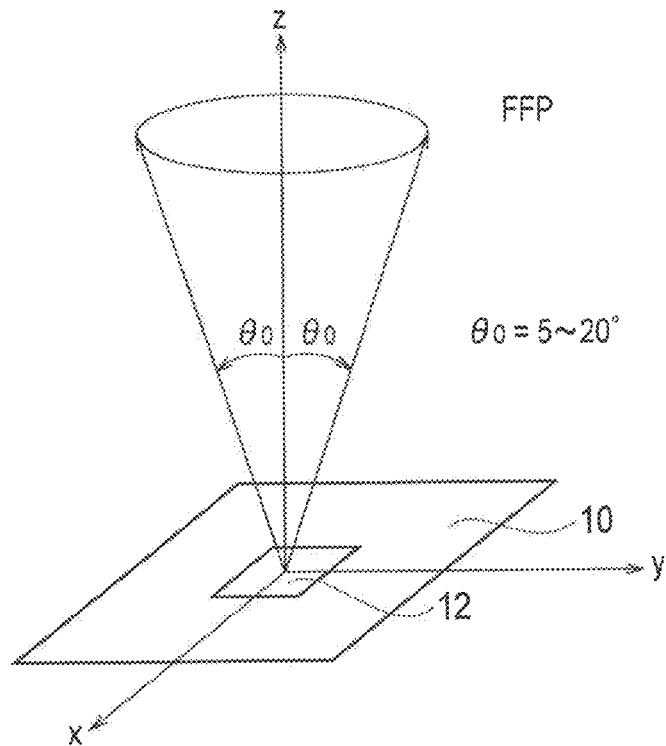

FIG. 85 is a schematic explanatory diagram showing the FFP of the lattice points for forming resonant-state (rectangular lattice Γ-point (gamma-point)) in the 2D-PC layer, in the 2D-PC surface emitting laser according to a comparative example.

Figure 86:
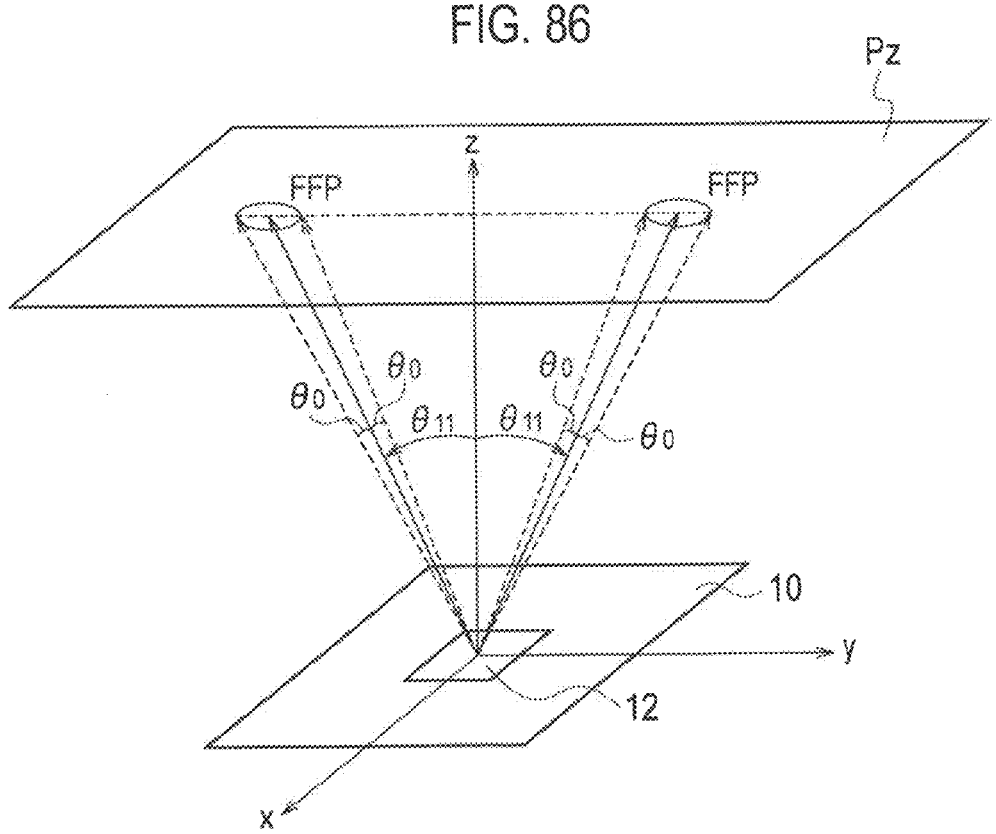

FIG. 86 is a schematic explanatory diagram showing the FFP in the case of superimposing the lattice point for light extraction on the lattice point for forming resonant-state (square lattice M-point) in the 2D-PC layer, in the 2D-PC surface emitting laser according to the comparative example.

Figure 87:
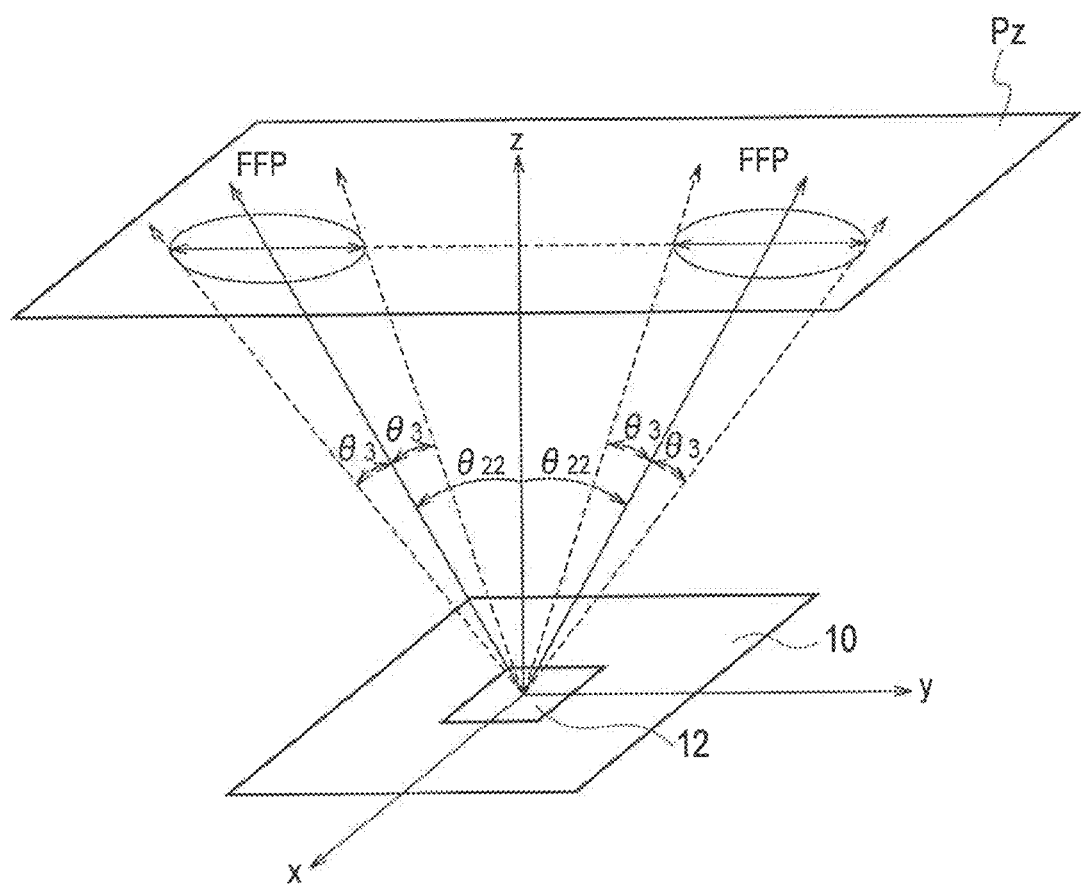

FIG. 87 shows a schematic explanatory diagram showing the FFP in which perturbation of hole-shape (hole-diameter) modulation is applied in y-axial direction to the lattice points for forming resonant-state (rectangle lattice X-point) in the 2D-PC layer, in the 2D-PC surface emitting laser according to the ninth embodiment.

Figure 88:
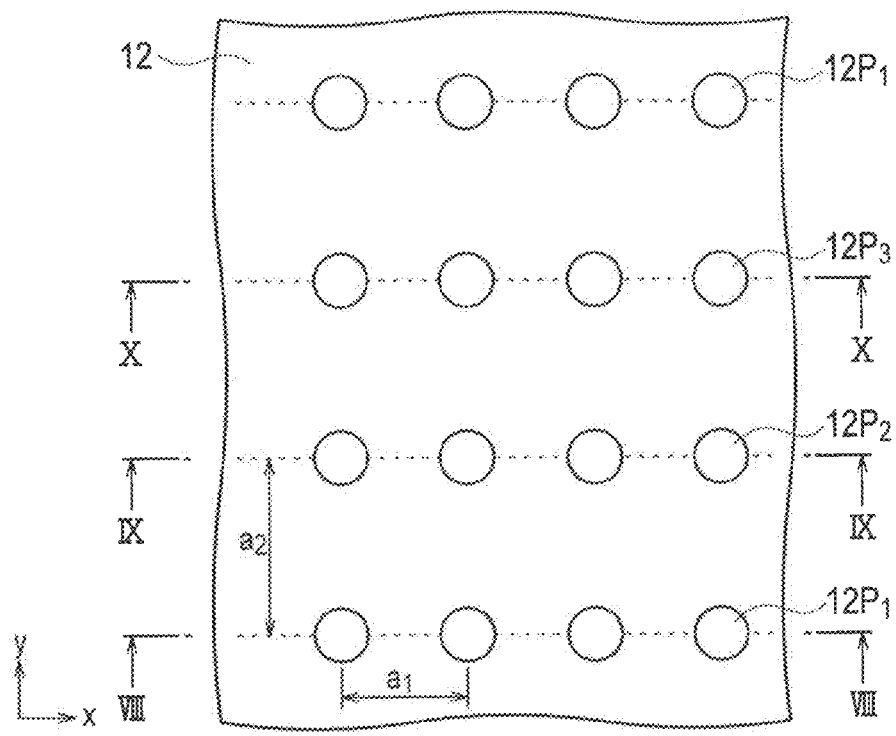

FIG. 88 is a schematic planar pattern configuration diagram of the lattice points for forming perturbation-state (perturbation-state-forming lattice) 12P in which the perturbation of hole-depth modulation is applied in y-axial direction to the lattice points for forming resonant-state (rectangular lattice) in the 2D-PC layer, in the 2D-PC surface emitting laser according to the ninth embodiment.

Figure 89A:
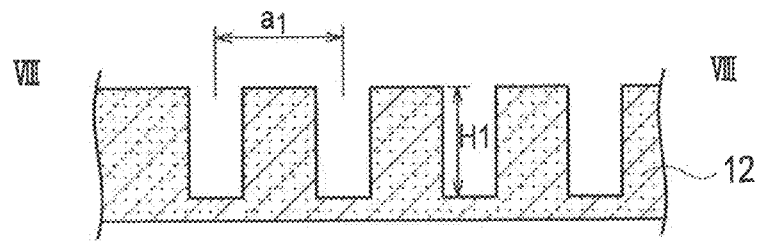

FIG. 89A is a schematic cross-sectional structure diagram taken in the line VIII-VIII of FIG. 88.

Figure 89B:
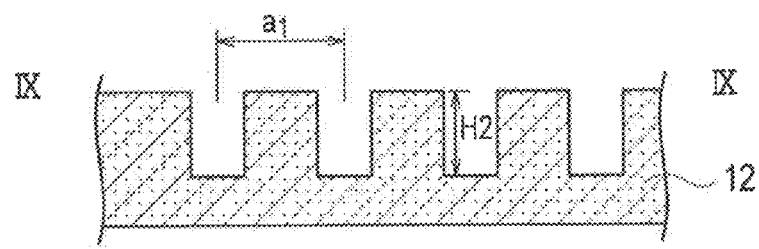

FIG. 89B is a schematic cross-sectional structure diagram taken in the line IX-IX of FIG. 88.

Figure 89C:
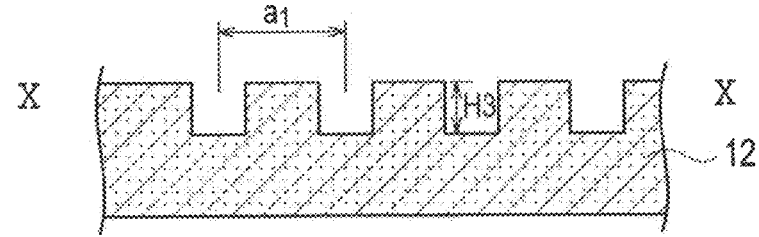

FIG. 89C is a schematic cross-sectional structure diagram taken in the line X-X of FIG. 88.

Figure 90:
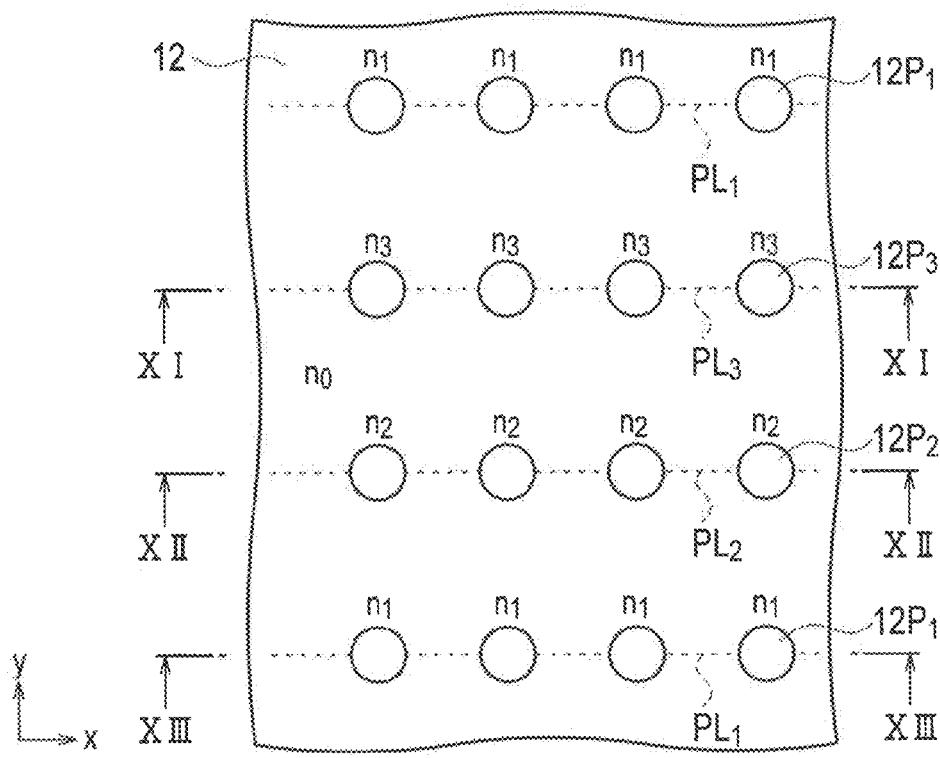

FIG. 90 is a schematic planar pattern configuration diagram of the lattice points for forming perturbation-state 12P in which the perturbation of refractive index modulation is applied in y-axial direction to the lattice points for forming resonant-state (rectangular lattice) in the 2D-PC layer, in the 2D-PC surface emitting laser according to the ninth embodiment.

Figure 91A:
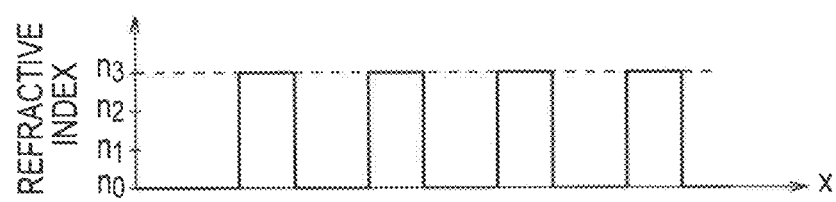

FIG. 91A shows an example of a refractive index profile in x-axial direction taken in the line XI-XI of FIG. 90.

Figure 91B:
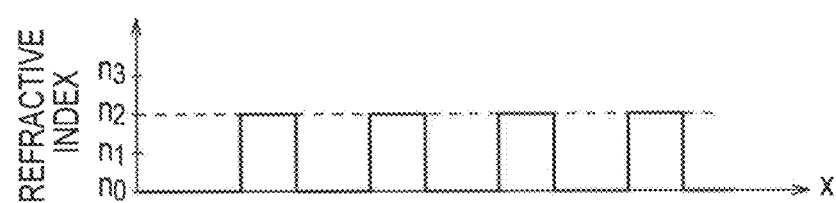

FIG. 91B shows an example of a refractive index profile in x-axial direction taken in the line XII-XII of FIG. 90.

Figure 91C:
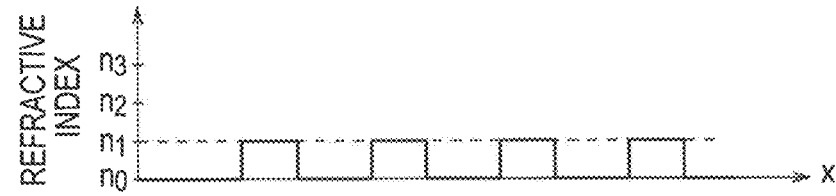

FIG. 91C shows an example of a refractive index profile in x-axial direction taken in the line XIII-XIII of FIG. 90.

Figure 92:
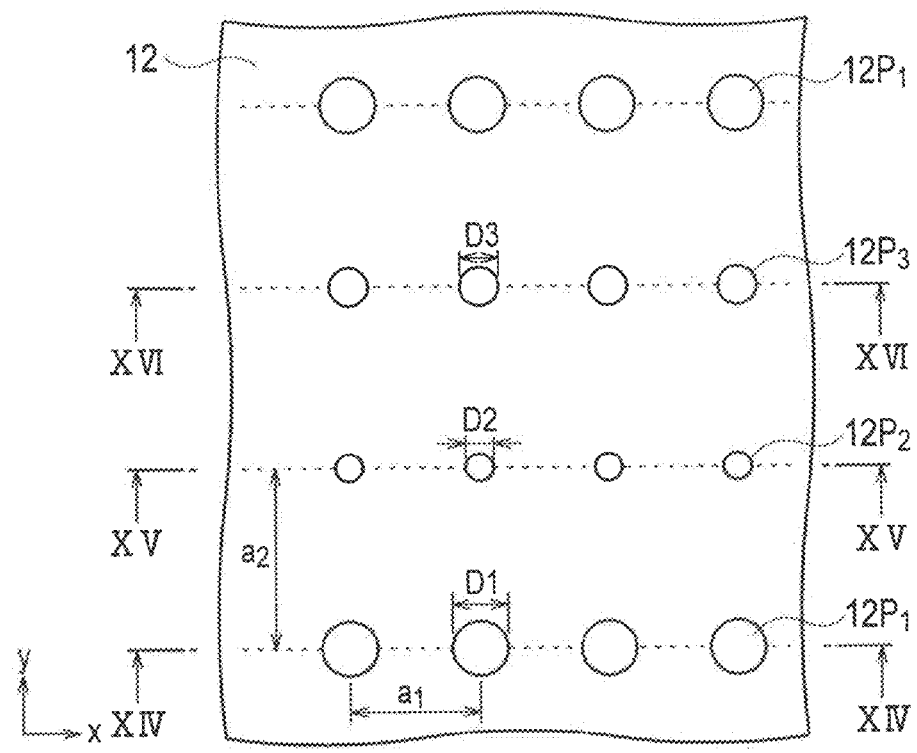

FIG. 92 is a schematic planar pattern configuration diagram of the lattice points for forming perturbation-state 12P in which the perturbation of hole-shape (hole-diameter) modulation is applied in y-axial direction to the lattice points for forming resonant-state (rectangular lattice) in the 2D-PC layer, in the 2D-PC surface emitting laser according to the ninth embodiment.

Figure 93A:
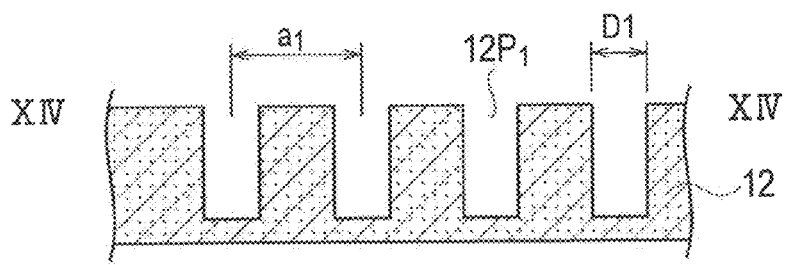

FIG. 93A is a schematic cross-sectional structure diagram taken in the line XIV-XIV of FIG. 92.

Figure 93B:
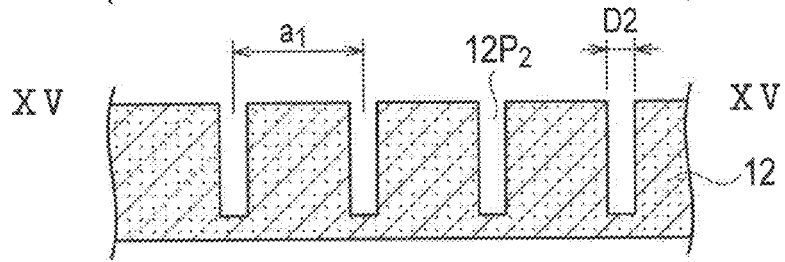

FIG. 93B is a schematic cross-sectional structure diagram taken in the line XV-XV of FIG. 92.

Figure 93C:
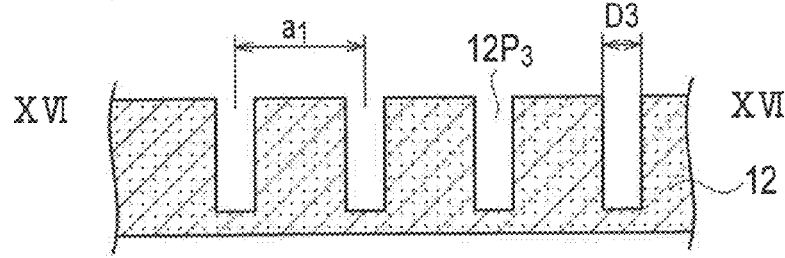

FIG. 93C is a schematic cross-sectional structure diagram taken in the line XVI-XVI of FIG. 92.

Figure 94A:
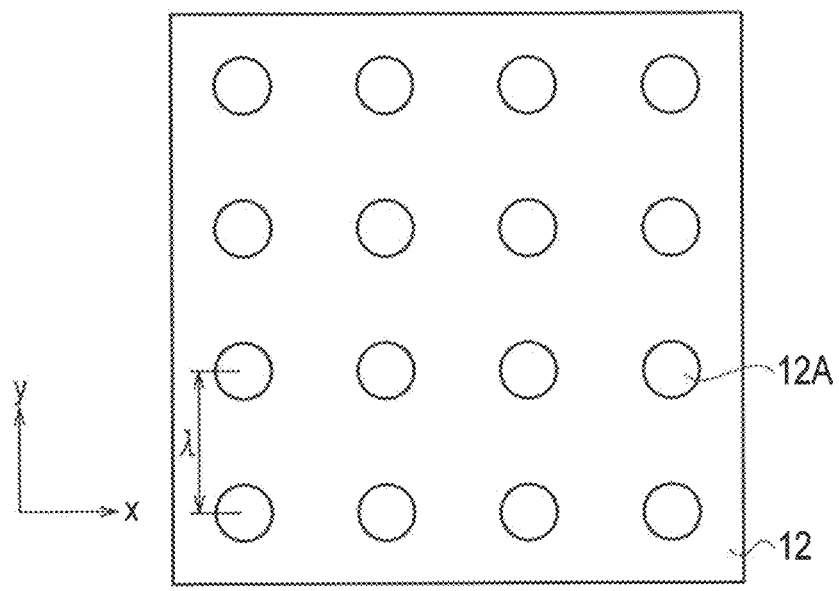

FIG. 94A is a schematic plane configuration diagram (an example of square lattice arrangement) of the lattice points for forming resonant-state in the 2D-PC layer applied to the Γ-point (gamma-point) oscillation, in the 2D-PC surface emitting laser according to the ninth embodiment.

Figure 94B:
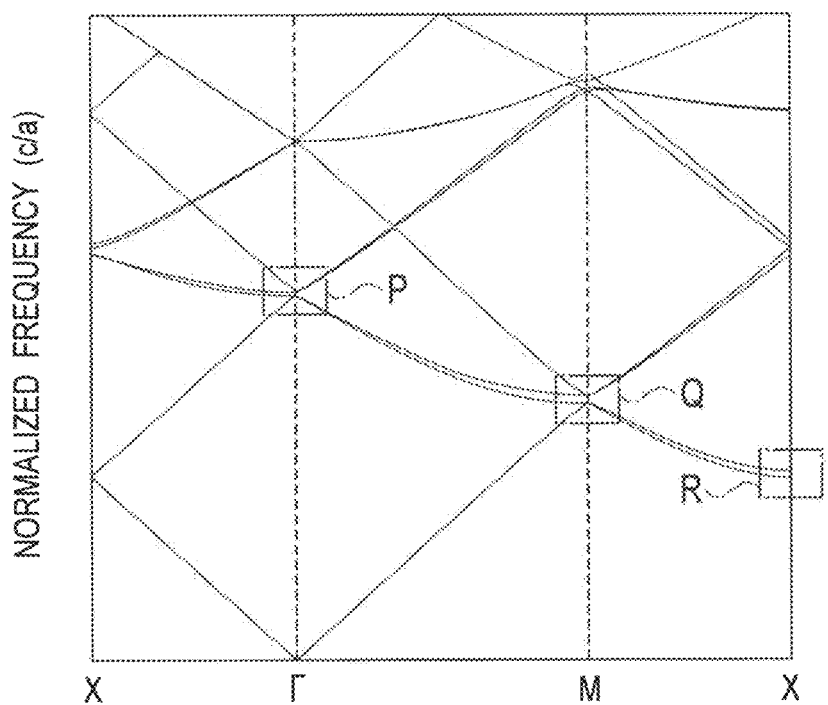

FIG. 94B is a diagram of 2D-PC band structure applied to the 2D-PC surface emitting laser according to the ninth embodiment.

Figure 95A:
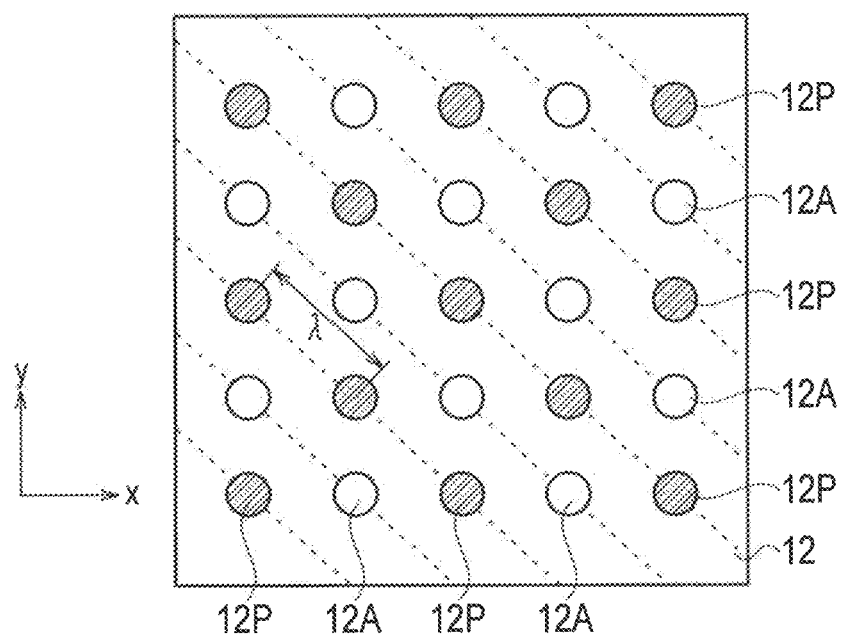

FIG. 95A is a schematic plane configuration diagram (an example of square lattice arrangement) of the lattice points for forming resonant-state in the 2D-PC layer applied to the M-point oscillation, and the lattice points for forming perturbation-state to which the perturbations, e.g. refractive index modulation, hole-shape (hole-diameter) modulation, hole-depth modulation, are applied thereto, in a 2D-PC surface emitting laser according to a tenth embodiment.

Figure 95B:
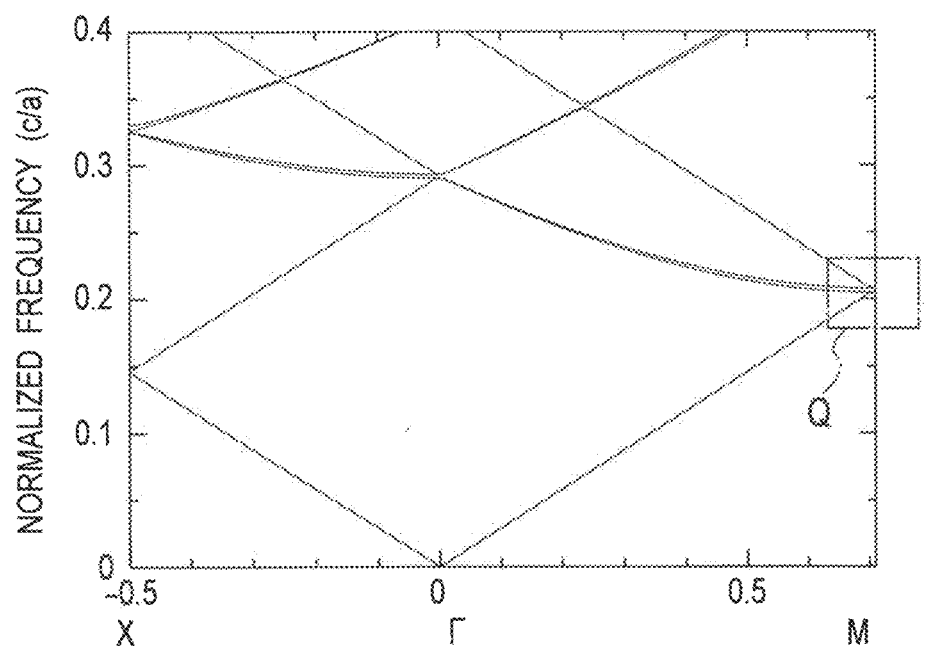

FIG. 95B is a diagram of 2D-PC band structure corresponding to FIG. 95A.

Figure 96A:
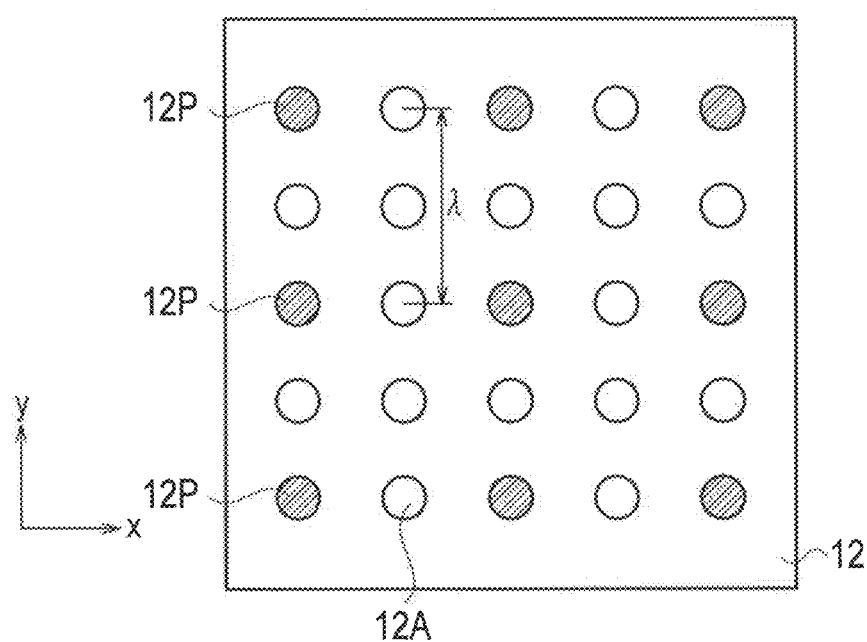

FIG. 96A is a schematic plane configuration diagram (an example of square lattice arrangement) of the lattice points for forming resonant-state and the lattice points for forming perturbation-state in the 2D-PC layer applied to the X-point oscillation, in the 2D-PC surface emitting laser according to the tenth embodiment.

Figure 96B:
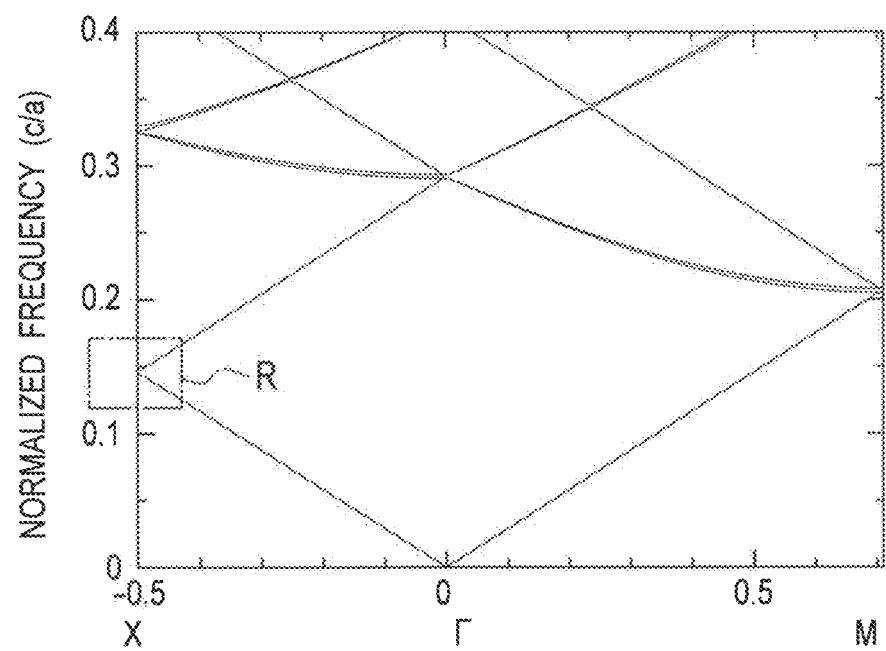

FIG. 96B is a diagram of 2D-PC band structure corresponding to FIG. 96A.

Figure 97A:
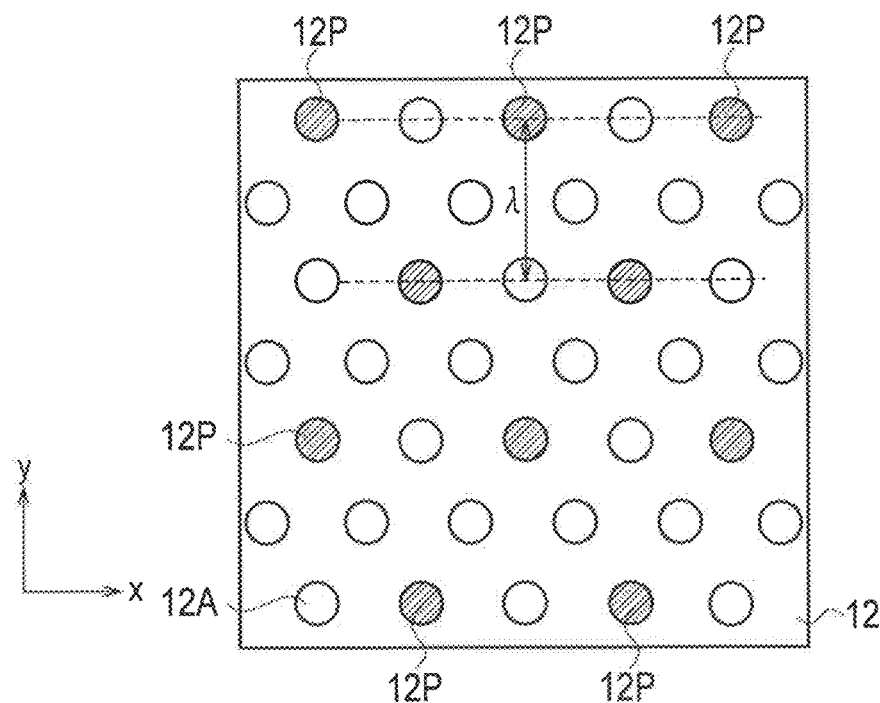

FIG. 97A is a schematic plane configuration diagram (an example of triangular lattice arrangement) of the lattice points for forming resonant-state and the lattice points for forming perturbation-state in the 2D-PC layer applied to the X-point oscillation, in the 2D-PC surface emitting laser according to the tenth embodiment.

Figure 97B:
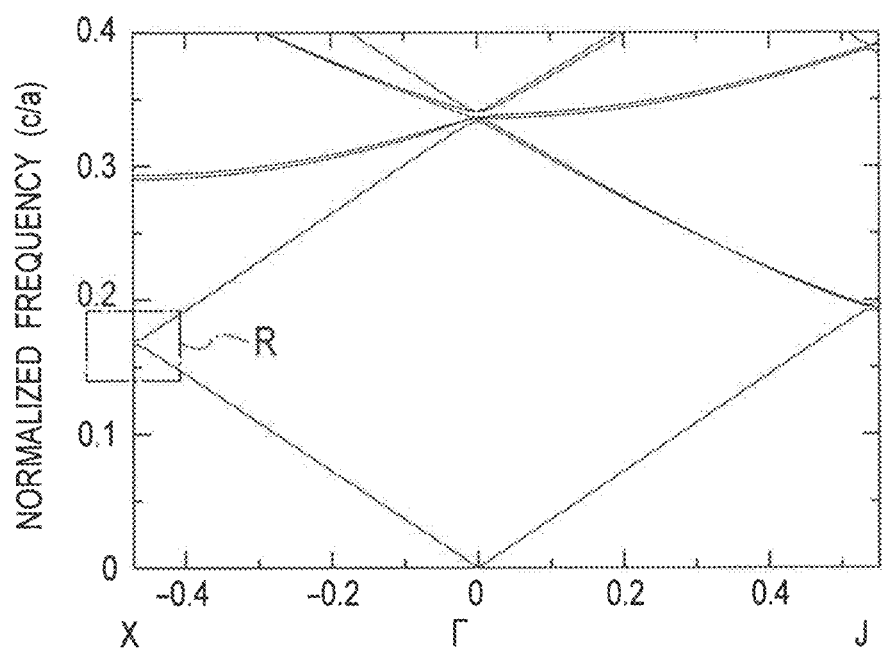

FIG. 97B is a diagram of 2D-PC band structure corresponding to FIG. 97A.

Figure 98A:
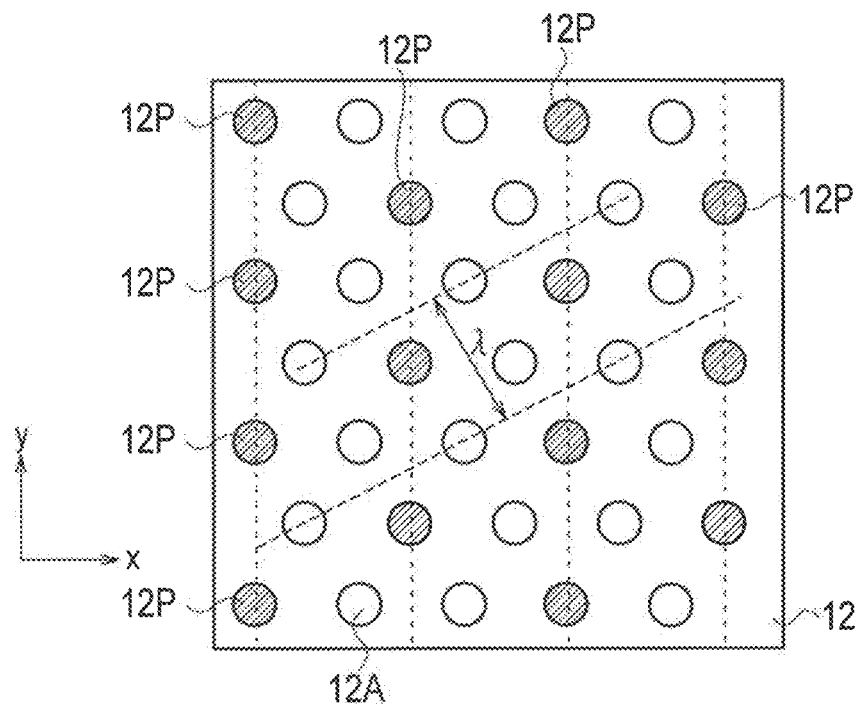

FIG. 98A is a schematic plane configuration diagram (an example of triangular lattice arrangement) of the lattice points for forming resonant-state and the lattice points for forming perturbation-state in the 2D-PC layer applied to the J-point oscillation, in the 2D-PC surface emitting laser according to the tenth embodiment.

Figure 98B:
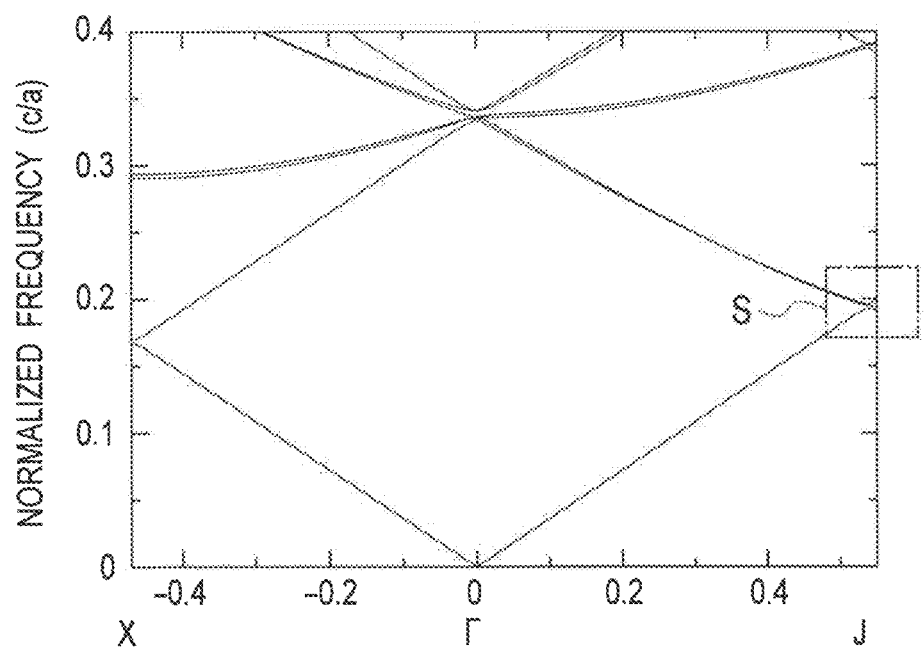

FIG. 98B is a diagram of 2D-PC band structure corresponding to FIG. 98A.

Figure 99A:
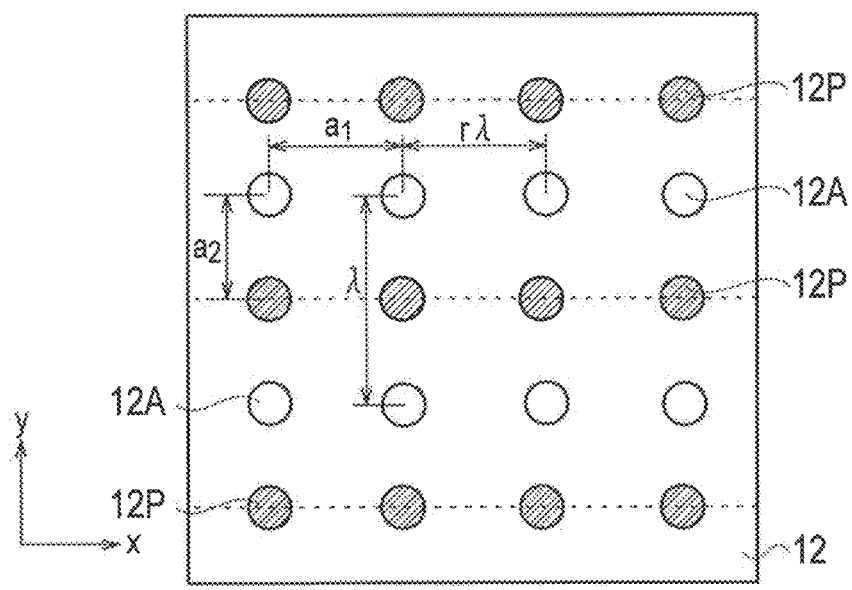

FIG. 99A is a schematic plane configuration diagram (an example of rectangle lattice arrangement where $a_1 > a_2$) of the lattice points for forming resonant-state and the lattice points for forming perturbation-state in the 2D-PC layer applied to the X-point oscillation, in the 2D-PC surface emitting laser according to the tenth embodiment.

Figure 99B:
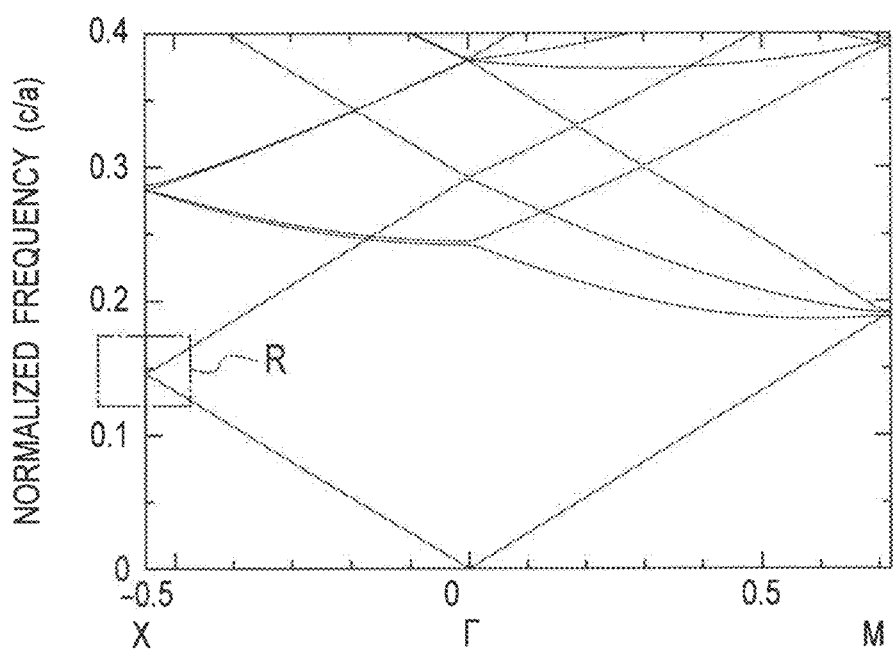

FIG. 99B is a diagram of 2D-PC band structure corresponding to FIG. 99A.

Figure 100A:
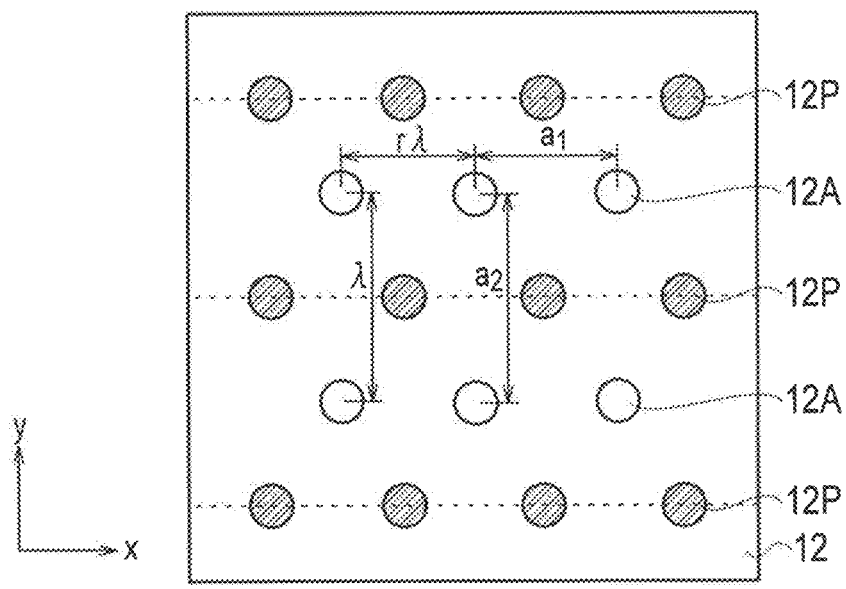

FIG. 100A is a schematic plane configuration diagram (an example of rhombic lattice arrangement) of the lattice points for forming resonant-state and the lattice points for forming perturbation-state in the 2D-PC layer applied to the X-point oscillation, in the 2D-PC surface emitting laser according to the tenth embodiment.

Figure 100B:
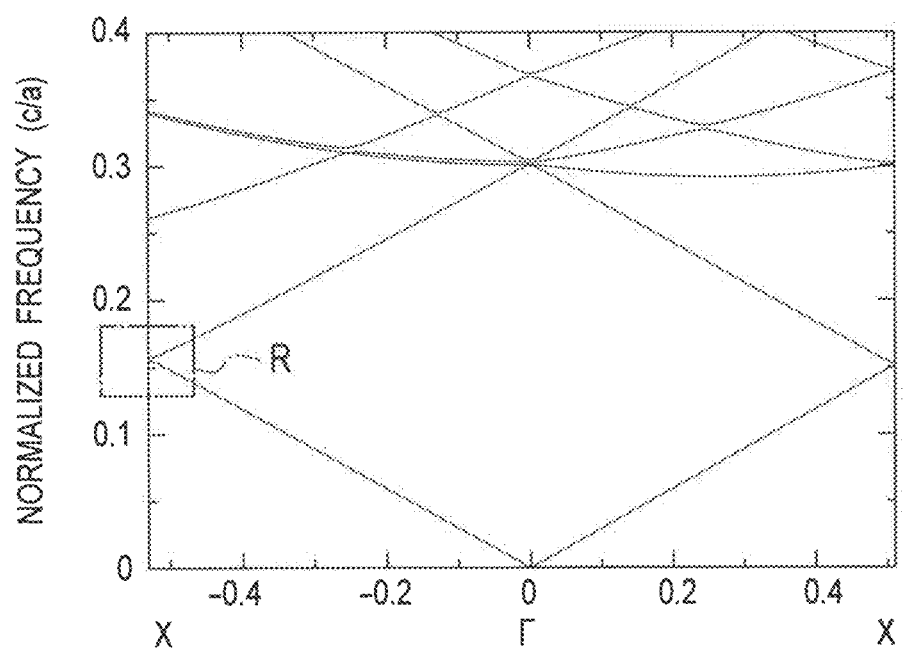

FIG. 100B is a diagram of 2D-PC band structure corresponding to FIG. 100A.

Figure 101A:
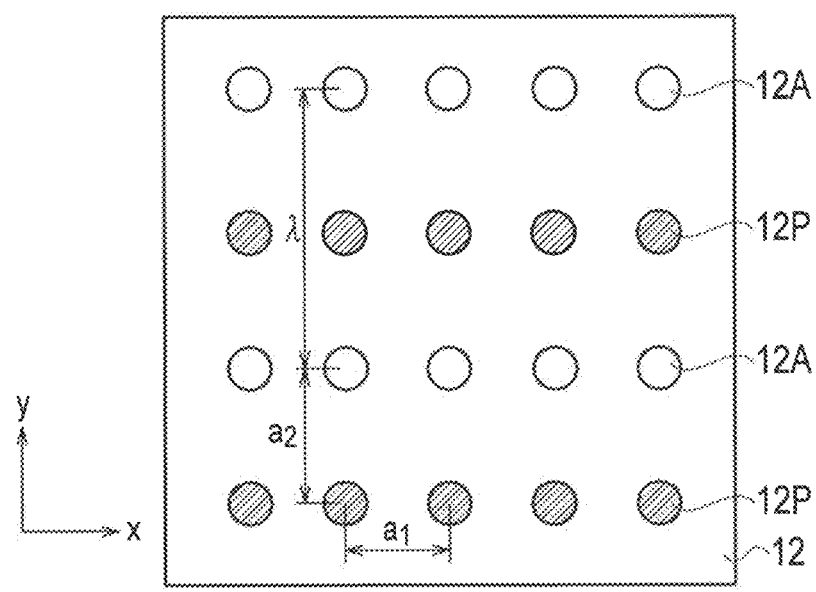

FIG. 101A is a schematic plane configuration diagram (an example of rectangle lattice arrangement where $a_1 < a_2$) of the lattice points for forming resonant-state and the lattice points for forming perturbation-state in the 2D-PC layer applied to the X-point oscillation, in the 2D-PC surface emitting laser according to the tenth embodiment.

Figure 101B:
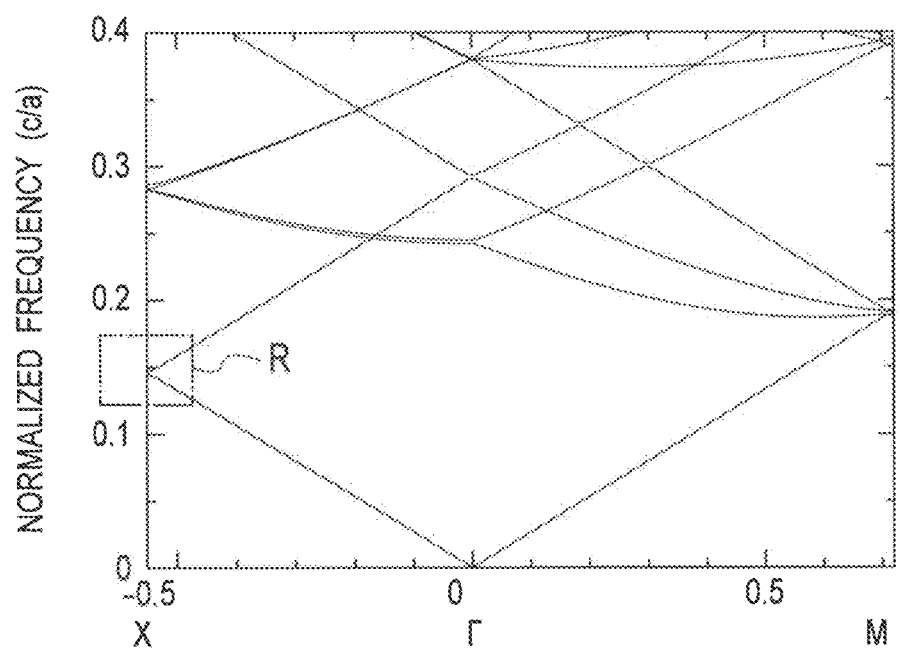

FIG. 101B shows a 2D-PC band structure corresponding to FIG. 101A, and showing in particular the relationship between the normalized frequency and the wave number.

Figure 102A:
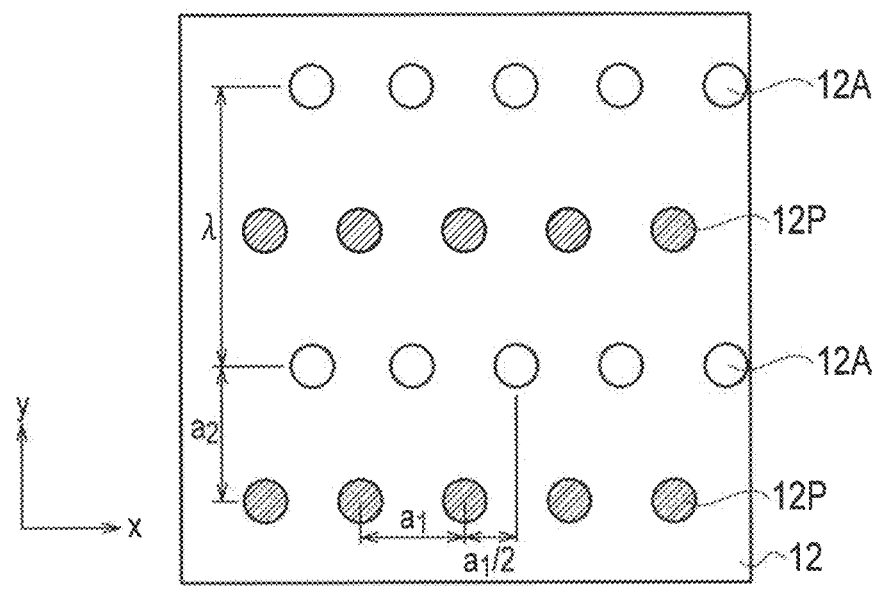

FIG. 102A is a schematic plane configuration diagram (an example of rhombic lattice arrangement) of the lattice points for forming resonant-state and the lattice points for forming perturbation-state in the 2D-PC layer applied to the X-point oscillation, in the 2D-PC surface emitting laser according to the tenth embodiment.

Figure 102B:
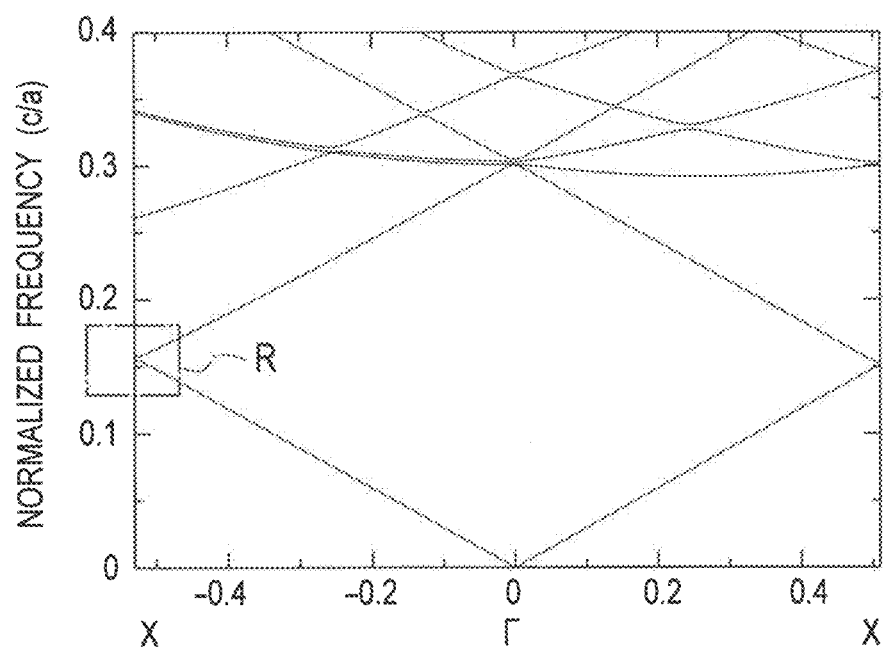

FIG. 102B is a diagram of 2D-PC band structure corresponding to FIG. 102A.

Figure 103:
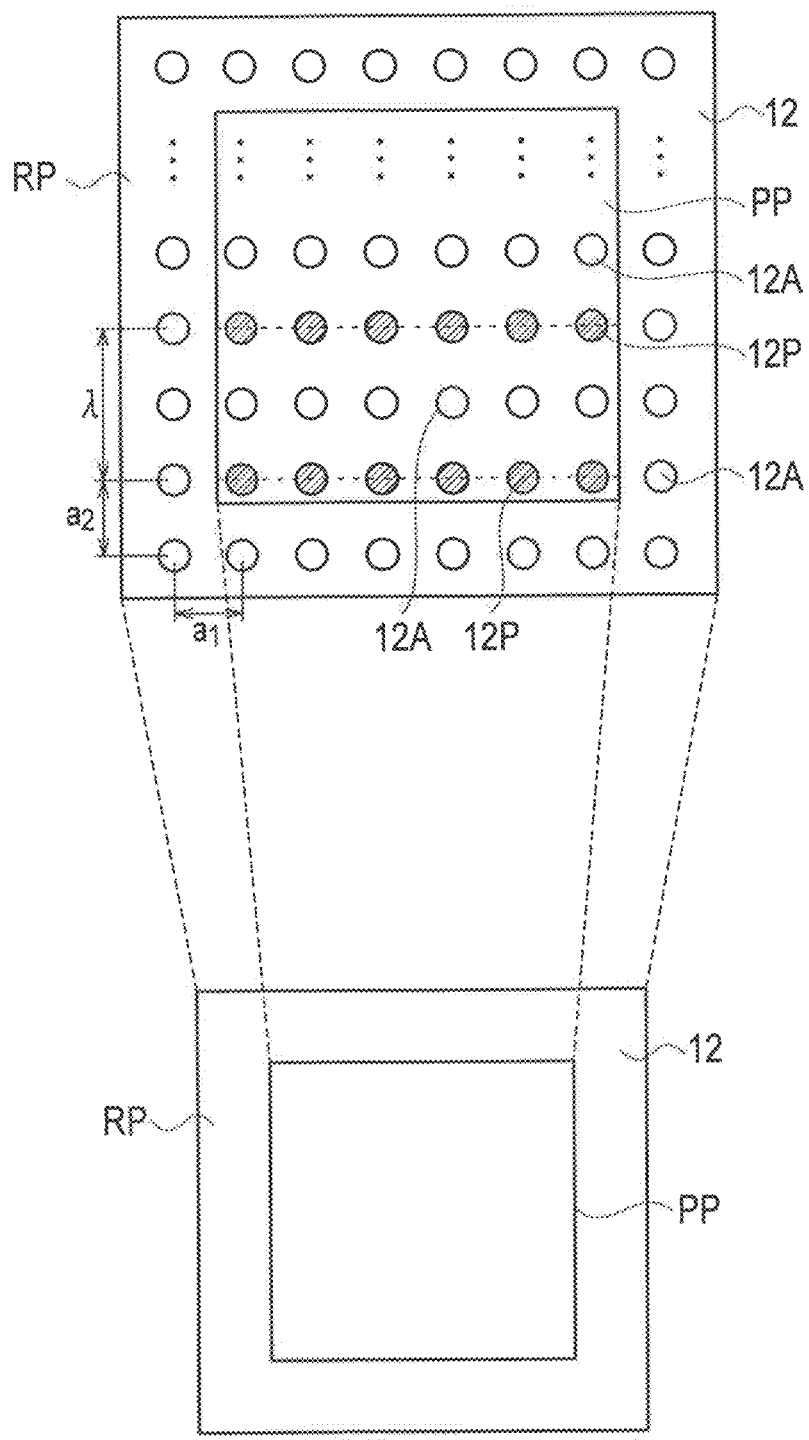

FIG. 103 shows an example of arrangement of the lattice points for forming resonant-state 12A and the lattice points for forming perturbation-state 12P in the resonator region RP and in the perturbation-state forming region PP in the 2D-PC layer applied to the X-point oscillation, in the 2D-PC surface emitting laser according to the tenth embodiment.

Figure 104A:
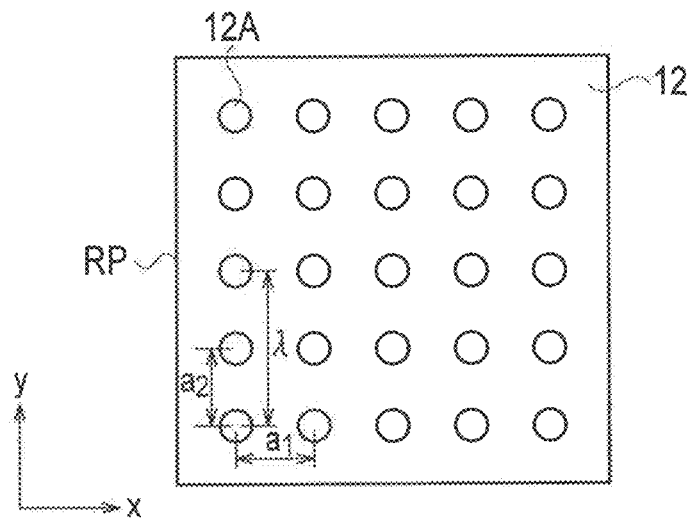

FIG. 104A shows an example of the lattice points for forming resonant-state 12A arranged in the PC layer 12, in the 2D-PC surface emitting laser according to the tenth embodiment.

Figure 104B:
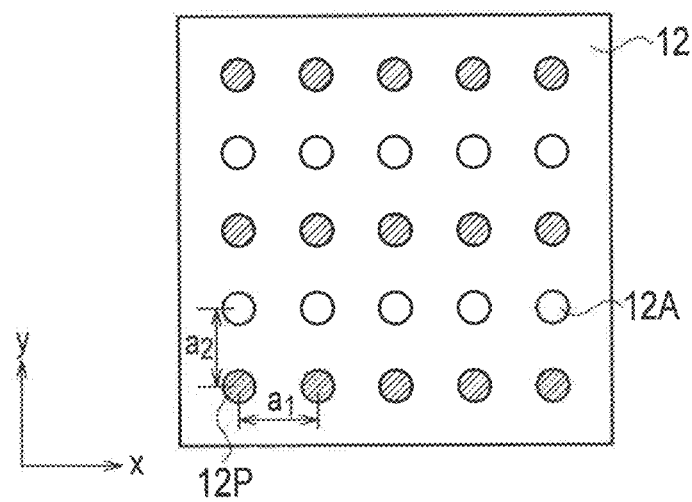

FIG. 104B shows an example of the lattice points for forming resonant-state 12A and the lattice point for forming perturbation-state 12P arranged in the same PC layer 12, in the 2D-PC surface emitting laser according to the tenth embodiment.

Figure 105A:
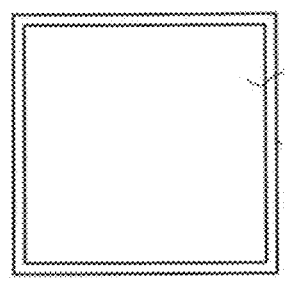

FIG. 105A shows an NFP in the case where the size of the resonator region RP and the size of the perturbation-state forming region PP in the 2D-PC layer applied to the X-point oscillation are nearly equal to each other, in the 2D-PC surface emitting laser according to the tenth embodiment.

Figure 105B:
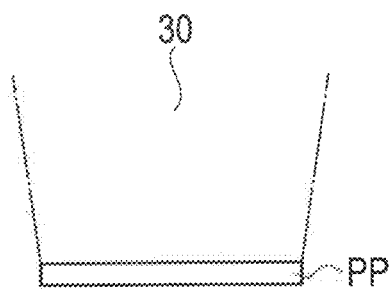

FIG. 105B is a schematic diagram showing a beam spread region from the perturbation-state forming region PP, in the 2D-PC surface emitting laser according to the tenth embodiment.

Figure 105C:
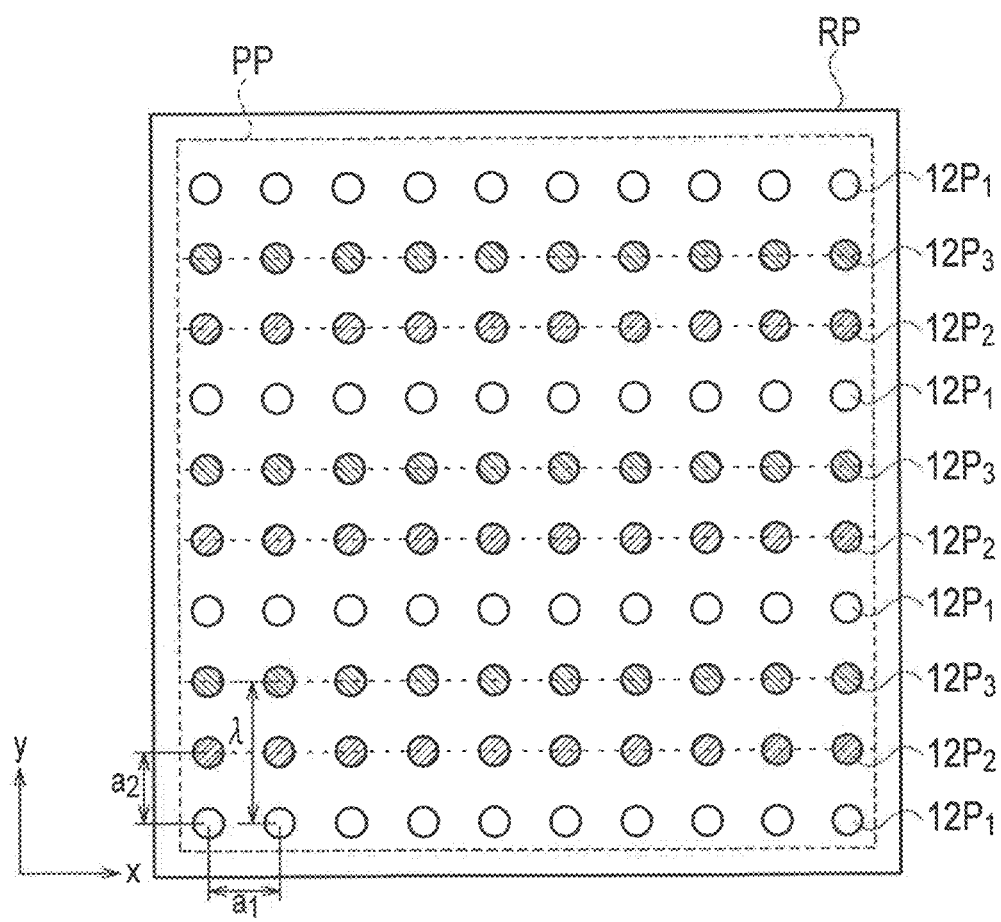

FIG. 105C shows areal space structural example in the case of applying the perturbation in y-axial direction to the lattice point for forming resonant-state in the resonator region RP and the perturbation-state forming region PP corresponding to FIG. 105A.

Figure 106A:
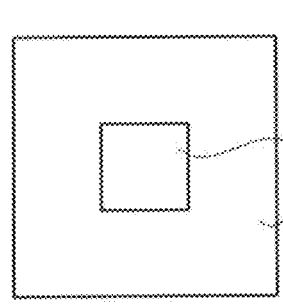

FIG. 106A shows an NFP in the case where the size of the resonator region RP and the size of the perturbation-state forming region PP in the 2D-PC layer applied to the X-point oscillation differ from each other, in the 2D-PC surface emitting laser according to the tenth embodiment.

Figure 106B:
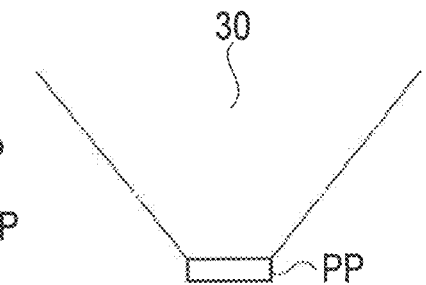

FIG. 106B is a schematic diagram showing a beam spread region from the perturbation-state forming region PP, in the 2D-PC surface emitting laser according to the tenth embodiment.

Figure 106C:
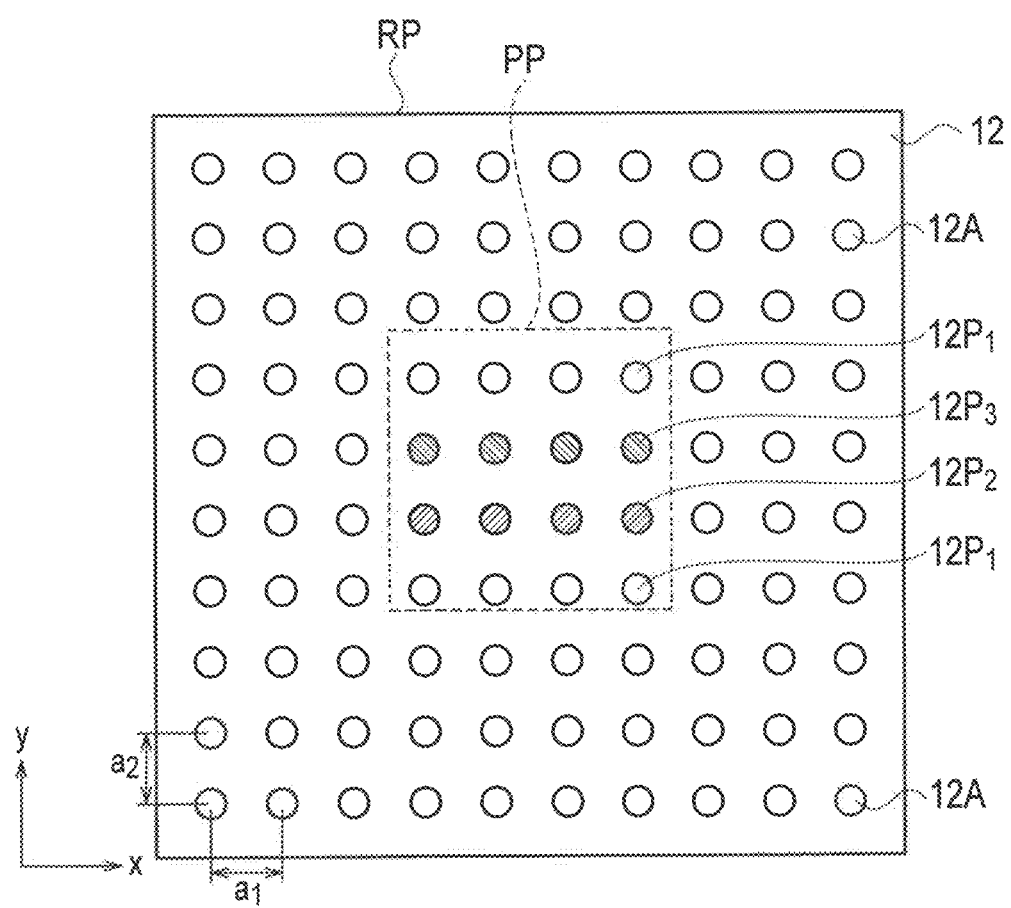

FIG. 106C shows a real space structural example in the case of applying the perturbation in y-axial direction to the lattice points for forming resonant-state in the perturbation-state forming region PP corresponding to FIG. 106A.

Figure 107:
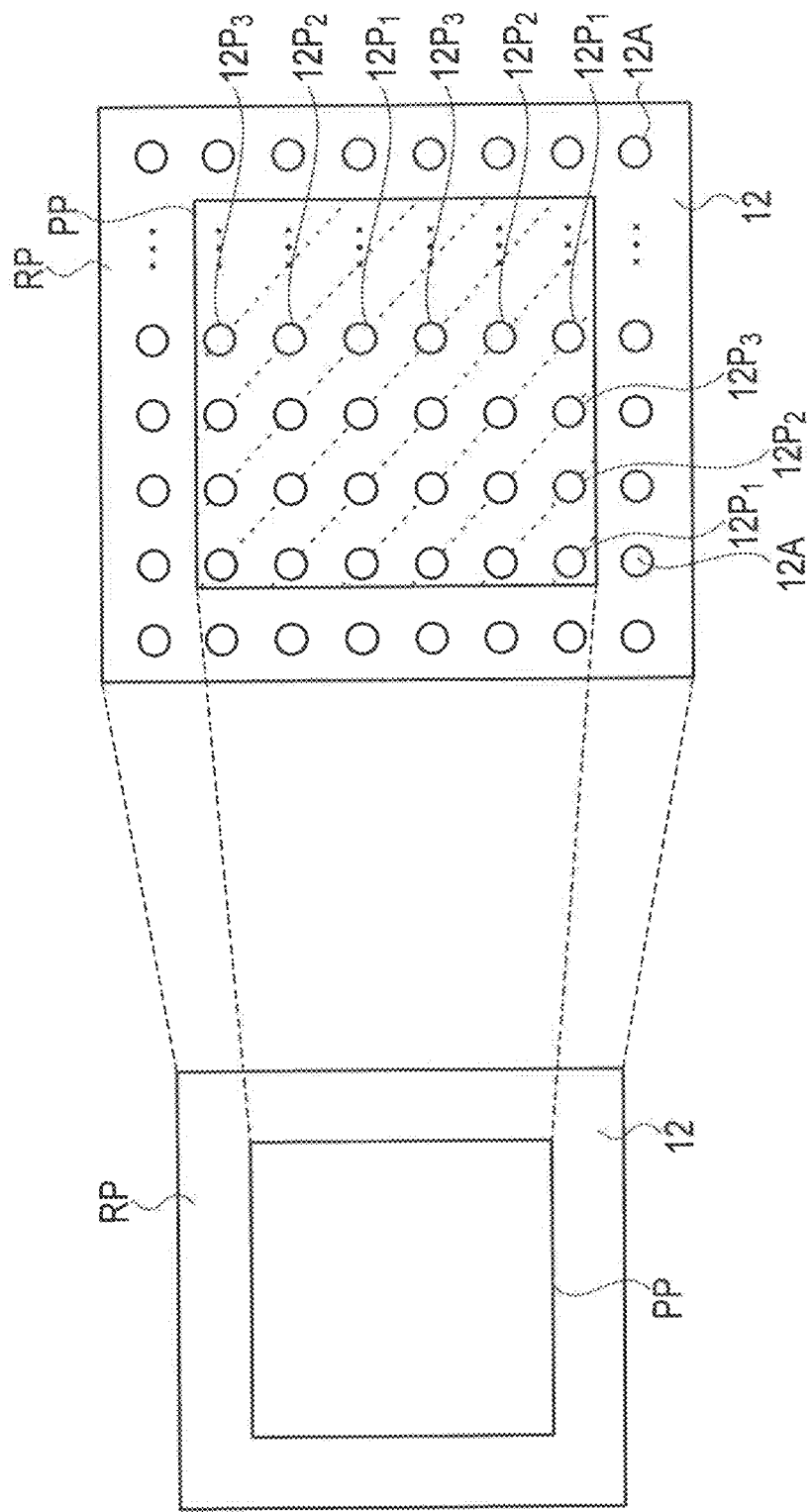

FIG. 107 shows an example of arrangement of the lattice points for forming resonant-state 12A and the lattice points for forming perturbation-state 12P in the resonator region RP and in the perturbation-state forming region PP in the 2D-PC layer applied to the M-point oscillation, in the 2D-PC surface emitting laser according to the tenth embodiment.

Figure 108A:
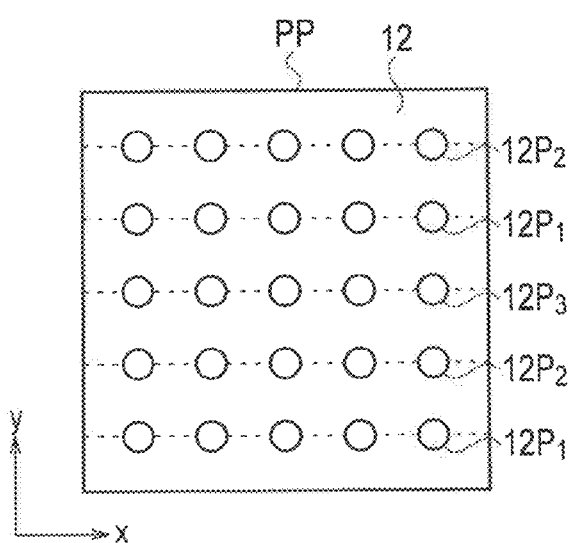

FIG. 108A shows a real space structural example in the case of applying the perturbation in y-axial direction to the lattice points for forming resonant-state in the 2D-PC layer, in the 2D-PC surface emitting laser according to the tenth embodiment.

Figure 108B:
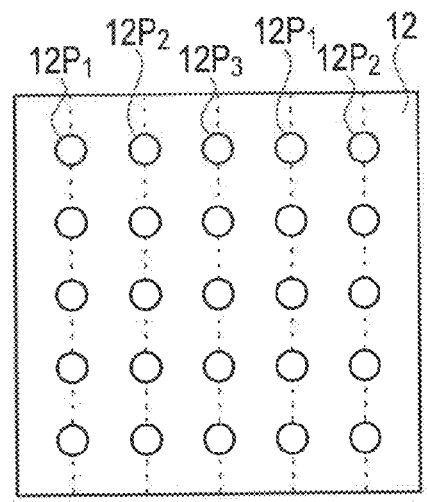

FIG. 108B shows a real space structural example in the case of applying the perturbation in X-axial direction to the lattice points for forming resonant-state in the 2D-PC layer, in the 2D-PC surface emitting laser according to the tenth embodiment.

Figure 108C:
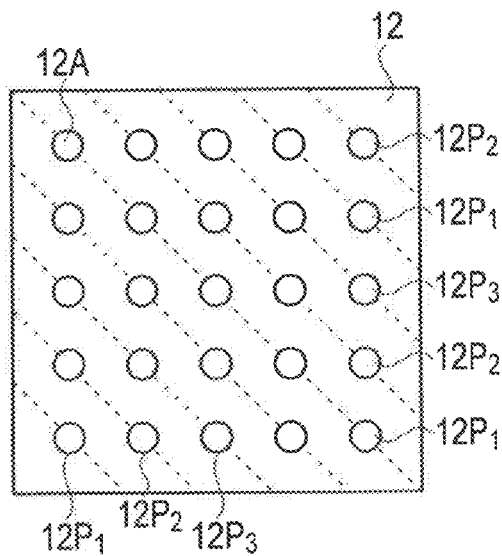

FIG. 108C shows a real space structural example in the case of applying the perturbation to the lattice points for forming resonant-state in the 2D-PC layer in plus 45-degree direction with respect to the x-axis, in the 2D-PC surface emitting laser according to the tenth embodiment.

Figure 108D:
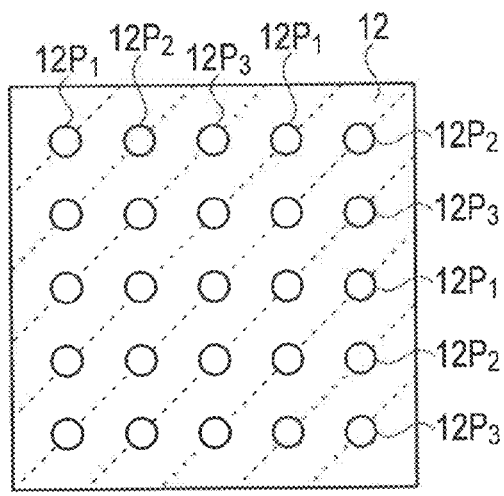

FIG. 108D shows a real space structural example in the case of applying the perturbation to the lattice points for forming resonant-state in the 2D-PC layer in minus 45-degree direction with respect to the x-axis, in the 2D-PC surface emitting laser according to the tenth embodiment.

FIG. 109A shows an NFP in the case where the size of the resonator region RP and the size of the perturbation-state forming region PP in the 2D-PC layer applied to the M-point oscillation are nearly equal to each other, in the 2D-PC surface emitting laser according to the tenth embodiment. p FIG. 109B is a schematic diagram showing a beam spread region from the perturbation-state forming region PP, in the 2D-PC surface emitting laser according to the tenth embodiment.

FIG. 109C shows areal space structural example in the case of applying the perturbation in plus 45-degree direction with respect to the x-axis to the lattice points for forming resonant-state in the resonator region RP and the perturbation-state forming region PP corresponding to FIG. 109A, in the 2D-PC surface emitting laser according to the tenth embodiment.

FIG. 110A shows an NFP in the case where the size of the resonator region RP and the size of the perturbation-state forming region PP in the 2D-PC layer applied to the M-point oscillation differ from each other, in the 2D-PC surface emitting laser according to the tenth embodiment.

FIG. 110B is a schematic diagram showing a beam spread region from the perturbation-state forming region PP, in the 2D-PC surface emitting laser according to the tenth embodiment.

FIG. 110C shows a real space structural example in the case of applying the perturbation in plus 45-degree direction with respect to the x-axis to the lattice points for forming resonant-state in the perturbation-state forming region PP corresponding to FIG. 111A, in the 2D-PC surface emitting laser according to the tenth embodiment.

Figure 111:
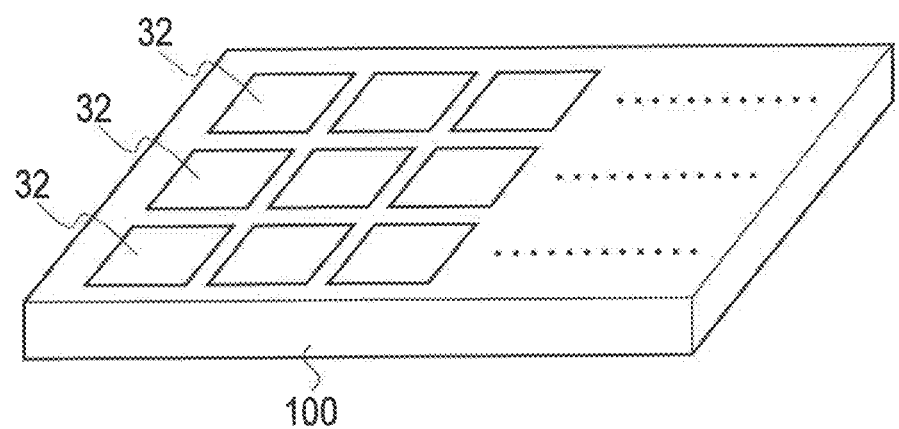

FIG. 111 shows a structural example of two-dimensional cell array for achieving high power output, in a 2D-PC surface emitting laser according to an eleventh embodiment.

Figure 112A:
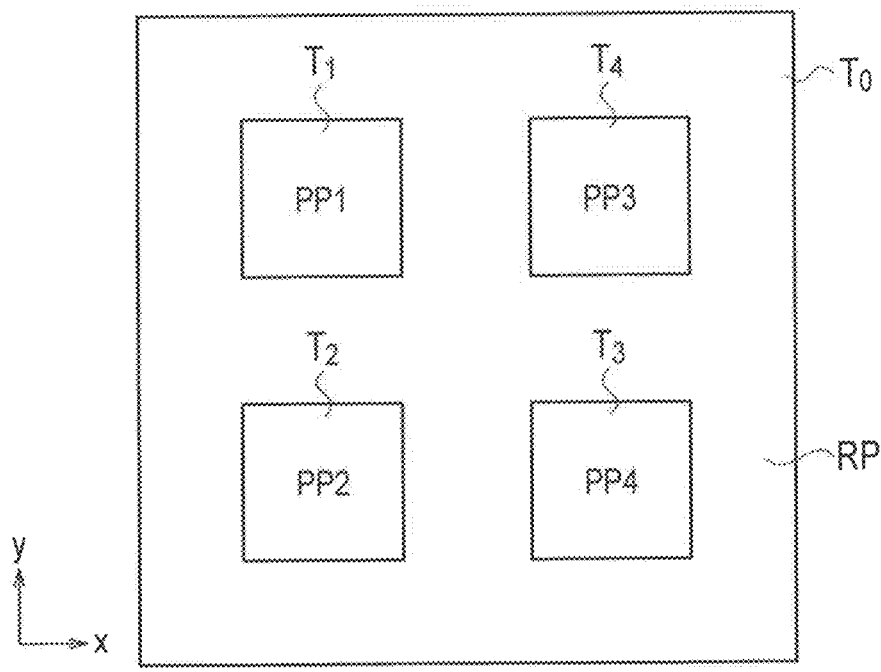

FIG. 112A shows a two-dimensional cell arrayed structural example that a basic pattern $T_0$ of the lattice point for forming resonant-state is arranged in a 2D-PC layer on a first cladding layer, and perturbation patterns $T_1$, $T_2$, $T_3$, $T_4$ of rectangular-shaped perturbation-state forming regions PP1, PP2, PP3, PP4 are arranged in the 2D-PC layer, in the 2D-PC surface emitting laser according to the eleventh embodiment.

Figure 112B:
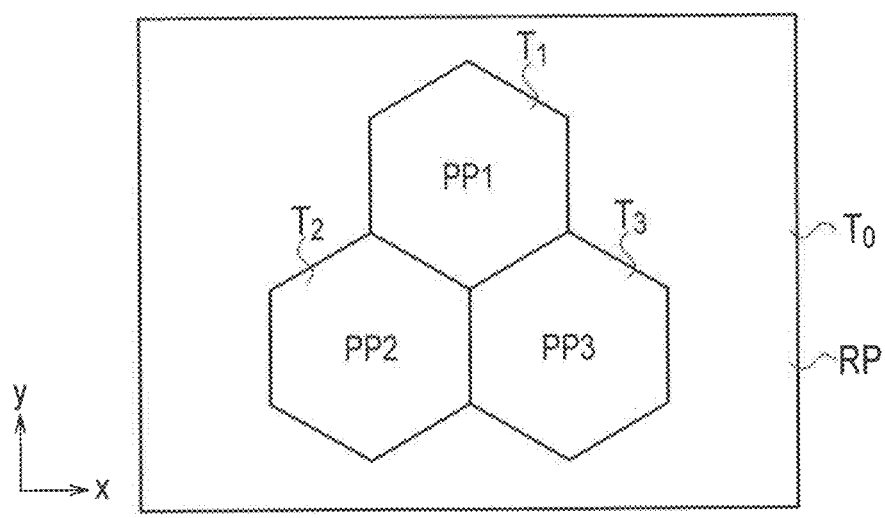

FIG. 112B shows a two-dimensional cell arrayed structural example that the basic pattern $T_0$ of the lattice point for forming resonant-state is arranged in the 2D-PC layer on the first cladding layer, and the perturbation patterns $T_1$, $T_2$, $T_3$, $T_4$ of hexagon-shaped perturbation-state forming regions PP1, PP2, PP3, PP4 are arranged in the 2D-PC layer, in the 2D-PC surface emitting laser according to the eleventh embodiment.

Figure 113:
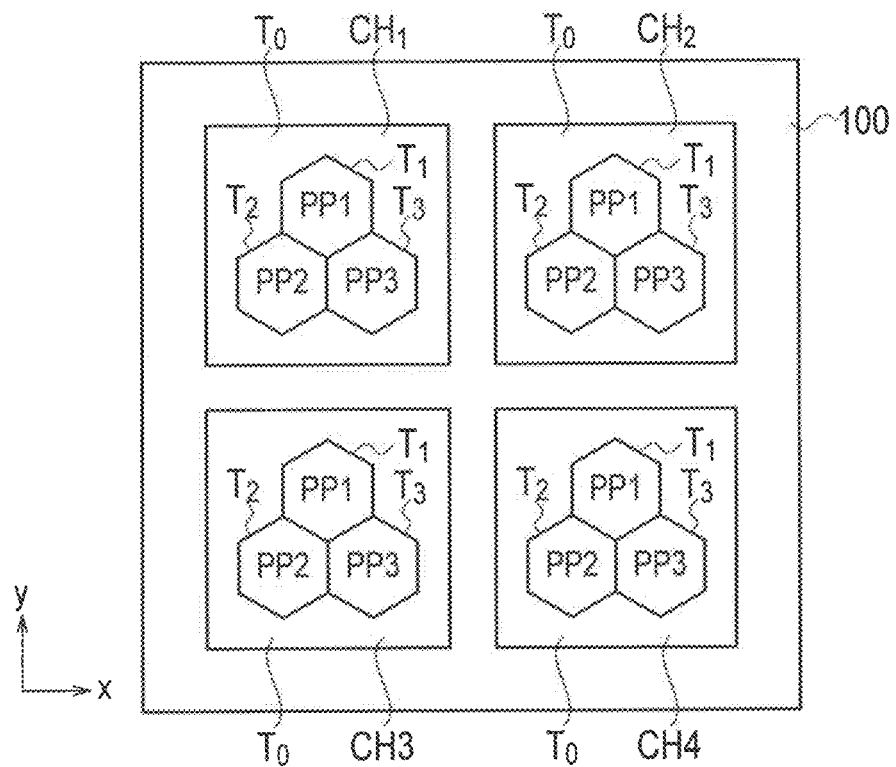

FIG. 113 shows a two-dimensional cell arrayed structural example that a plurality of chips each having the configuration shown in FIG. 112B are arranged on the same substrate, in the 2D-PC surface emitting laser according to the eleventh embodiment.

Figure 114:
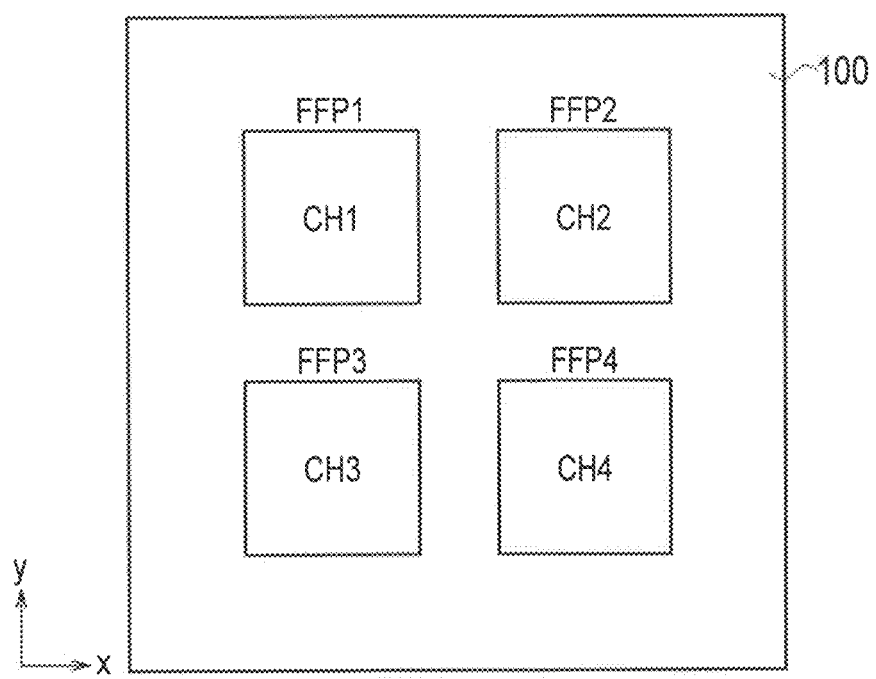

FIG. 114 shows a two-dimensional cell arrayed structural example of arranging a plurality of chips, of which the FFP differs from each other, on the same substrate, in the 2D-PC surface emitting laser according to the eleventh embodiment.

DESCRIPTION OF EMBODIMENTS

There will be described embodiments of the present invention, with reference to the drawings. In the following drawings, same blocks or elements are designated by same reference characters to eliminate redundancy and for simplicity. However, it should be known about that the drawings are schematic and are differ from an actual thing. Of course, the part from which the relation and ratio of a mutual size differ also in mutually drawings is included.

The embodiments to be described hereinafter exemplify the apparatus and method for a technical concept or spirit of the present invention; and do not specify dispositions, etc. of each component part as examples mentioned below. The embodiments of the present invention may be changed without departing from the spirit or scope of claims.

FIRST EMBODIMENT (Element Structure)

Figure 1:
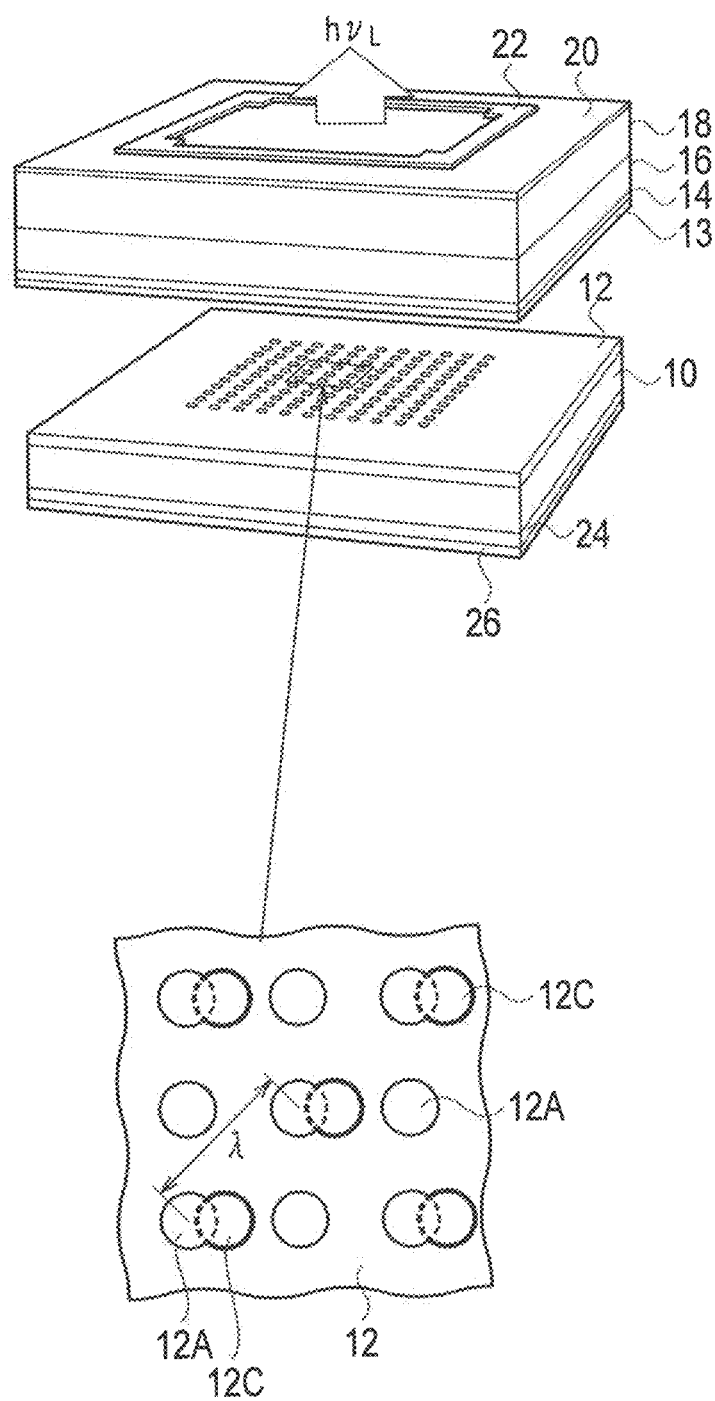
FIG. 1 is a schematic bird's-eye view structure diagram showing a two-dimensional photonic crystal (2D-PC) surface emitting laser according to a first embodiment.

FIG. 1 shows a schematic bird's-eye view structure of a two dimensional photonic crystal (2D-PC) surface emitting laser (SEL) according to a first embodiment.

As shown in FIG. 1, the 2D-PC surface emitting laser according to the first embodiment includes: a photonic crystal (PC) layer for forming standing wave 12; a lattice point for resonator 12A arranged in the PC layer for forming standing wave 12, and configured so that a light wave in an M-point band edge in photonic band structure in the PC layer for forming standing wave 12 is diffracted in a plane of the PC layer for forming standing wave 12; and a lattice point for coupler 12C configured so that the light wave in the M-point band edge in the photonic band structure in the PC layer for forming standing wave 12 is diffracted in a surface vertical direction of the PC layer for forming standing wave 12.

In the present embodiment, the lattice point for coupler 12C is arranged in the PC layer for forming standing wave 12.

Moreover, as shown in FIG. 1, the 2D-PC surface emitting laser according to the first embodiment includes: a substrate 24; a first cladding layer 10 disposed on the substrate 24; a second cladding layer 16 disposed on the first cladding layer 10; and an active layer 14 inserted between the first cladding layer 10 and the second cladding layer 16. In the present embodiment, the first cladding layer 10 may be formed of a p type semiconductor layer, and the second cladding layer 16 may be formed of an n type semiconductor layer. The electrical conductivity of the semiconductor layer may be reverse to each other.

As shown in FIG. 1, the 2D-PC surface emitting laser according to the first embodiment comprises: a contact layer 18 disposed on the second cladding layer 16; a window layer 20 disposed on a surface light emission region on the contact layer 18, and configured to extract a laser beam.; a window-like upper electrode 22 disposed on the window layer 20; and a lower electrode 26 disposed on a back side surface of the substrate 24.

As shown in FIG. 1, the PC layer for forming standing wave 12 may be inserted between the first cladding layer 10 and the second cladding layer 16 so as to be adjacent to the active layer 14 in a surface vertical direction of the active layer 14. In the present embodiment, the active layer 14 may be formed of a Multi-Quantum Well (MQW) layer, for example.

Moreover, as shown in FIG. 1, a carrier blocking layer 13 is inserted between the active layer 14 and the PC layer for forming standing wave 12 so that carriers may be effectively acquired in the active layer 14 composed of the MQW layer, and a carrier injection from the active layer 14 to the PC layer for forming standing wave 12 may be blocked. As materials of the 2D-PC surface emitting laser according to the first embodiment, the following materials are applicable, for example. That is, for example, GaInAsP/InP based materials are applicable in the case of wavelengths of 1.3 μm to 1.5 μm; InGaAs/GaAs based materials are applicable in the case of an infrared light with a wavelength of 900 nm; GaAlAs/GaAs based or GaInNAs/GaAs based materials are applicable in the case of an infrared light/near-infrared light with wavelengths of 800 to 900 nm; GaAlInAs/InP based materials are applicable in the case of wavelengths of 1.3 μm to 1.67 μm; AlGaInP/GaAs based materials are applicable in the case of a wavelength of 0.65 μm; and GaInN/GaN based materials are applicable in the case of a blue light.

Figure 2:
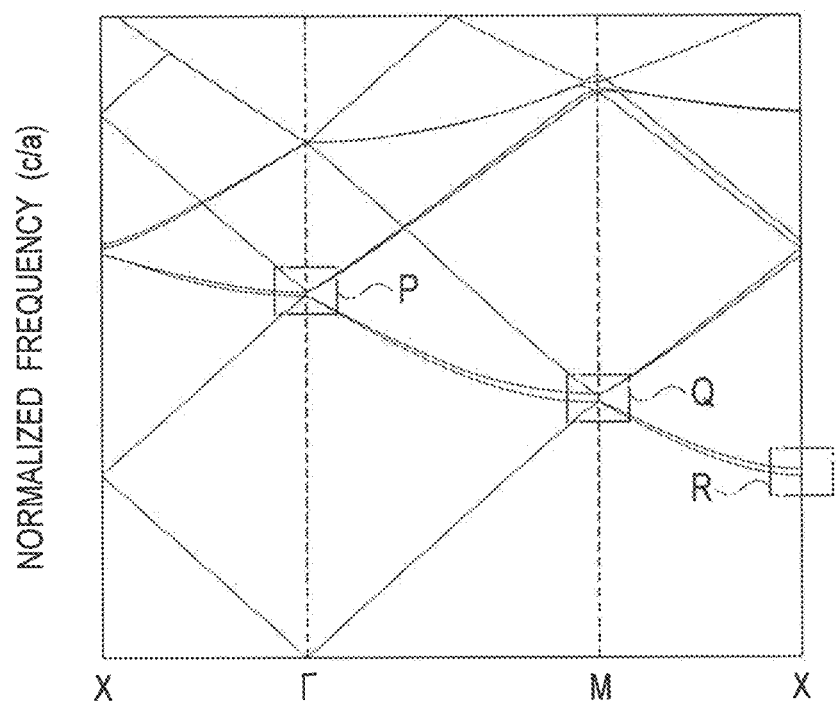
FIG. 2 is a diagram of 2D-PC band structure applied to the 2D-PC surface emitting laser according to the first embodiment.

FIG. 2 shows a relationship between normalized frequencies [unit: c/a] and a wave number vector, in 2D-PC band structure applied to the 2D-PC surface emitting laser according to the first embodiment.

In the photonic band structure, a portion of which the inclination is 0 is called a band edge. In the band edge, the photonic crystal functions as an optical resonator, since a group velocity of light becomes 0 and then a standing wave is formed.

In the 2D-PC surface emitting laser according to the first embodiment, an oscillation in an M-point band edge (near the region Q shown in FIG. 2) in the photonic band structure of the PC layer for forming standing wave 12 is used.

In the PC layer for forming standing wave 12, the lattice point for resonator 12A is applied to diffraction in-plane of the PC layer for forming standing wave 12. On the other hand, the lattice point for coupler 12C is applied to diffraction in the surface vertical direction of the PC layer for forming standing wave 12.

FIG. 3A shows a schematic explanatory diagram of an in-plane resonant mode of the 2D-PC layer 12, in the 2D-PC surface emitting laser according to the first embodiment. FIG. 3A shows an aspect that a two-dimensional large area resonator is formed by a multiplexed in-plane resonant mode using the lattice point for resonator 12A in 2D-PC layer 12 as a cavity.

Figure 4:
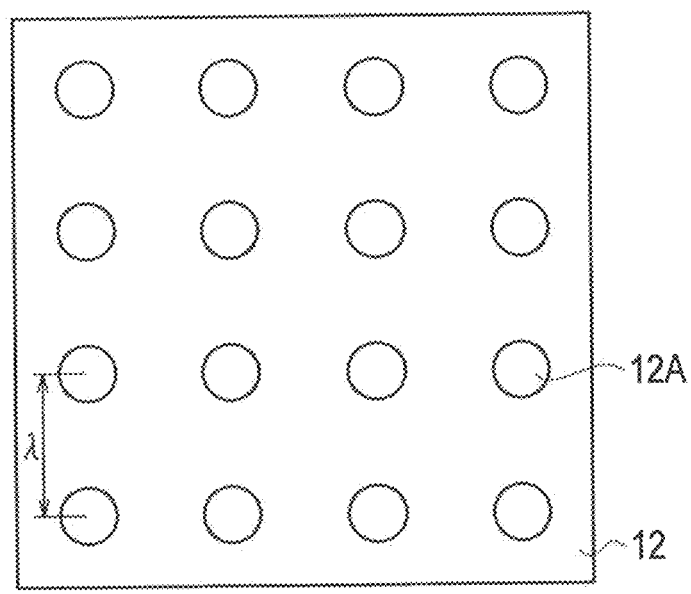
FIG. 4 is a schematic plane configuration diagram of the lattice points for resonator (an example of square lattice arrangement) in the 2D-PC layer applied to a Γ-point (gamma-point) oscillation, in the 2D-PC surface emitting laser according to a comparative example.

In a 2D-PC surface emitting laser according to a comparative example, a schematic plane configuration of the lattice point for resonator 12A in the 2D-PC layer 12 applied to a Γ-point (gamma-point) oscillation is arranged in a square lattice, as shown in FIG. 4.

In the oscillation band edge using Γ-point (gamma-point) band edge (near the region P shown in FIG. 2), since the lattice point for resonator 12A has a function of both the resonator and the coupler in the PC layer for forming standing wave 12, a surface emission-type laser beam $hv_L$ can be extracted in the surface vertical direction of the PC layer for forming standing wave 12 even in the configuration shown in FIG. 3A.

On the other hand, it becomes possible to extract the light by superposing and introducing the PC structure having the coupler function, since it has only the function of resonator in the M-point oscillation band edge and the X-point oscillation band edge.

The 2D-PC surface emitting laser according to the first embodiment uses oscillations in the M-point band edge of the photonic band structure. In the oscillations, although the periodic structure of the photonic crystal has only a function of standing wave form for the oscillation, the light can be extracted by disposing periodic structure (coupler) for diffracting the light in the same plane as the periodic structure.

In addition, the 2D-PC surface emitting laser according to the first embodiment can operate in a single mode stable in a large area. More specifically, in the 2D-PC surface emitting laser according to the first embodiment, the single mode is maintainable also in a large area since electromagnetic field distribution is defined by the two-dimensional periodic structure composed of the lattice point for resonator 12A and the lattice point for coupler 12C formed in the PC layer for forming standing wave 12. Accordingly, it is easy to perform processing for collecting a watt-class output laser light into one small point through a lens.

For example, in FIG. 1, the sizes of the PC layer for forming standing wave 12 are approximately 700 μm×approximately 700 μm.

Moreover, in an example of a Near Field Pattern (NFP), oscillations can also be achieved from large area oscillations of approximately 100-μm square to super-large area oscillations of an approximately several 100-μm square. Room-temperature continuous oscillations with a wavelength of approximately 950 nm are obtained with Full Width at Half Maximum (FWHM) of approximately 0.16 nm in an oscillation on spectrum. An optical power of 2.7 W is obtained by pulse driving of 1 kHz-50 ns in a single mode.

Although the lattice point for coupler 12C is not shown in FIG. 3A, the surface emission-type laser beam $hv_L$ is emitted in a vertical direction with respect to the PC layer 12.

The surface emission-type laser beam $hv_L$ and the intracavity laser beam $hv_R$ which are emitted are illustrated as shown in FIG. 3B. The surface emission-type laser beam $hv_L$ is emitted in the vertical direction with respect to the PC layer 12 as coupling of four waves of the intracavity laser beam $hv_R$ in the plane of the PC layer 12.

Figure 5A:
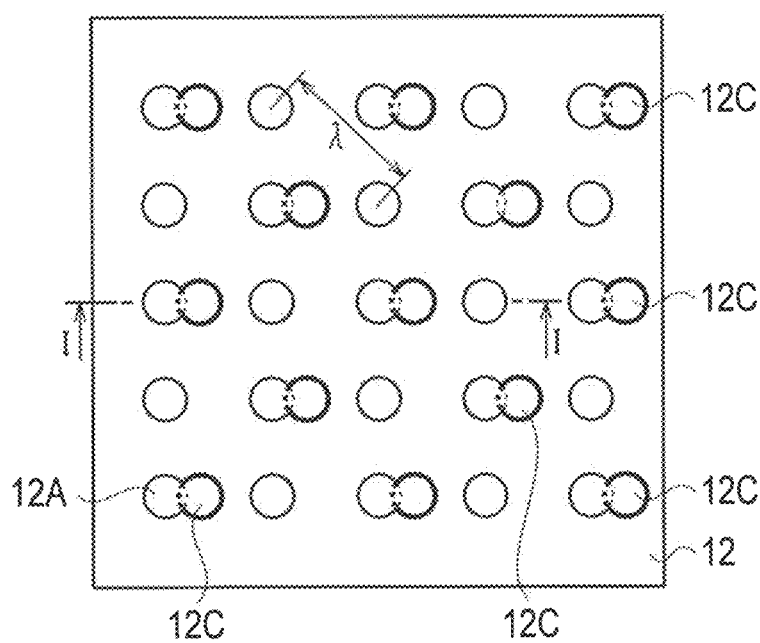
FIG. 5A is a schematic plane configuration diagram of lattice points for resonator and lattice points for coupler (an example of square lattice arrangement), in the 2D-PC layer applied to an M-point oscillation, in the 2D-PC surface emitting laser according to the first embodiment.

As shown in FIG. 5A, a schematic plane configuration of the lattice points for resonator 12A and the lattice points for coupler 12C in the 2D-PC layer 12 applied to the M-point oscillation is arranged in a square lattice shape, in the 2D-PC surface emitting laser according to the first embodiment. Moreover, FIG. 5B shows a relationship between the normalized frequency and the wave number vector, in the 2D-PC band structure corresponding to FIG. 5A.

Figure 5B:
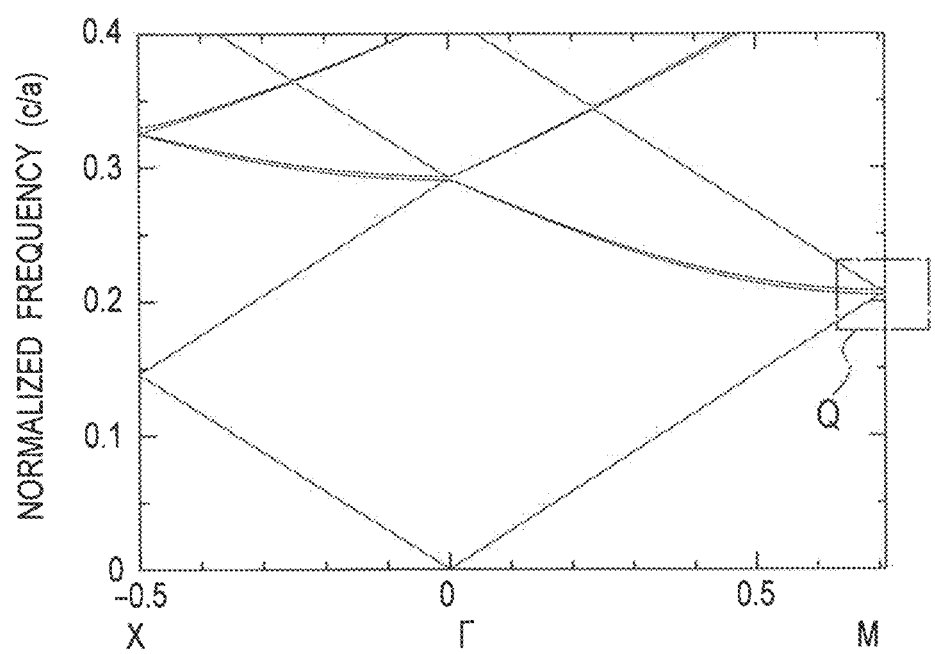
FIG. 5B is a diagram of the 2D-PC band structure corresponding to that of FIG. 5A, in the 2D-PC surface emitting laser according to the first embodiment.

In the 2D-PC surface emitting laser according to the first embodiment, as shown in FIGS. 5A and 5B, the lattice points for resonator 12A for diffracting the light wave in the M-point band edge in the photonic band structure of the PC layer for forming standing wave 12 are arranged in a square lattice shape, the lattice point for coupler 12C is arranged in a face-centered square lattice shape having a lattice constant twice the lattice constant of the square lattice shape, and the pitch in a diagonal direction of the lattice points for coupler 12C is equal to a wavelength λ in the medium of the PC layer 12.

Figure 6:
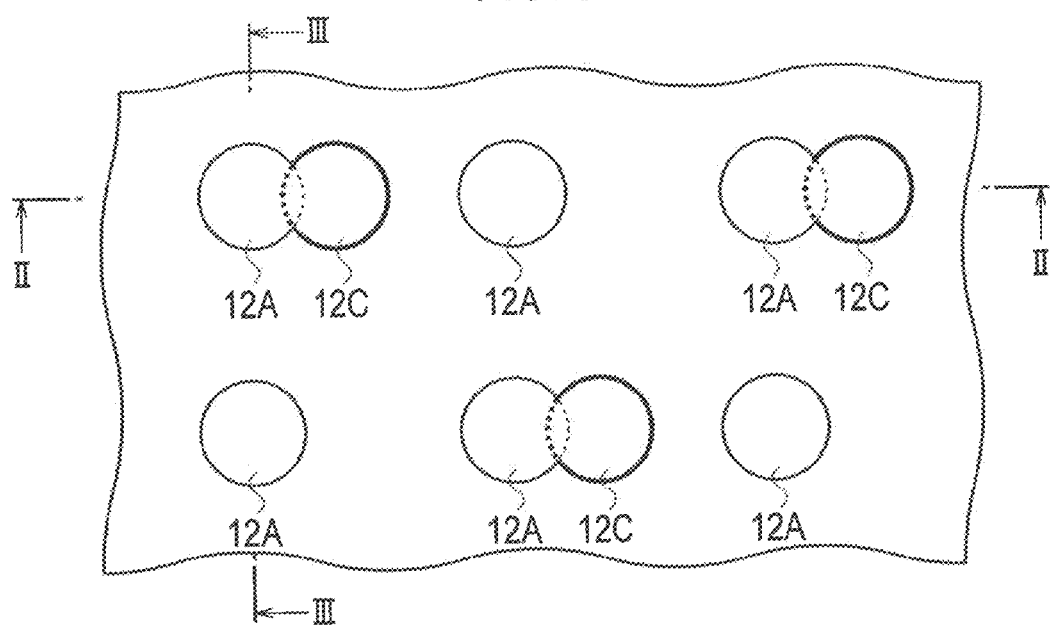
FIG. 6 is an enlarged schematic plane configuration diagram of the lattice points for resonator and the lattice points for coupler (an example of square lattice arrangement), in the 2D-PC layer applied to the M-point oscillation, in the 2D-PC surface emitting laser according to the first embodiment.
Figure 7A:
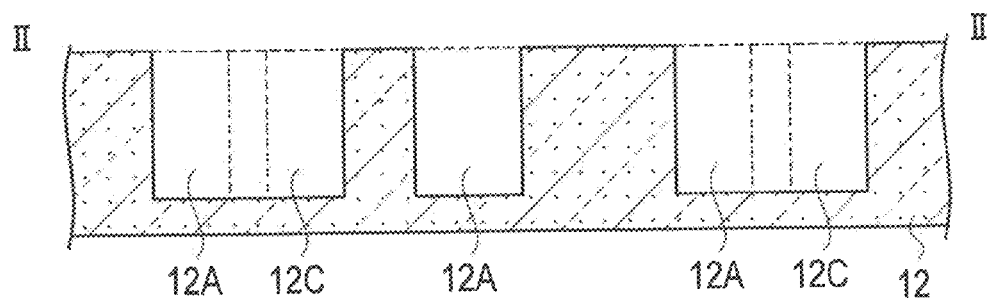
FIG. 7A is a schematic cross-sectional structure diagram taken in the line II-II of FIG. 6.
Figure 7B:
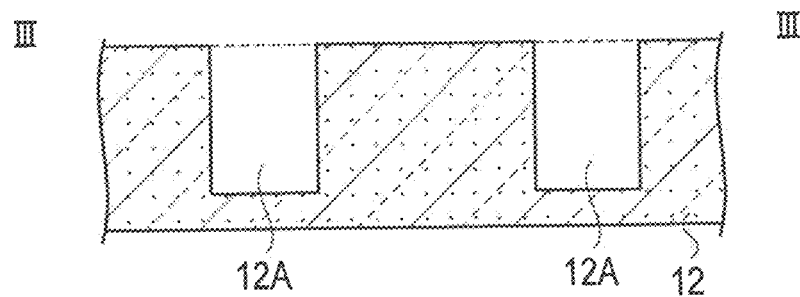
FIG. 7B is a schematic cross-sectional structure diagram taken in the line III-III of FIG. 6.

In the 2D-PC surface emitting laser according to the first embodiment, FIG. 6 shows a schematic plane configuration (an example of square lattice arrangement) to which the lattice points for resonator 12A and the lattice points for coupler 12C in the 2D-PC layer 12 applied to the M-point oscillation are enlarged, FIG. 7A shows a schematic cross-sectional structure taken in the line II-II of FIG. 6, and FIG. 7B shows a schematic cross-sectional structure taken in the line III-III of FIG. 6.

In the 2D-PC surface emitting laser according to the first embodiment, the lattice point for resonator 12A and the lattice point for coupler 12C in the 2D-PC layer 12 applied to the M-point oscillation can be formed as a hole, as shown in FIGS. 7A and 7B.

The lattice point for resonator 12A and the lattice point for coupler 12C can be arranged in a pitch of an approximately period of light, for example. For example, supposing that the hole is fulfilled with an air, the pitch of the air/semiconductor is can be arranged in a period of approximately 400 nm in the optical communication band, and can be arranged in a period of approximately 230 nm in the blue light.

Moreover, the diameter and the depth of the lattice point for resonator 12A and the lattice point for coupler 12C currently made as an experiment are respectively approximately 120 nm and approximately 115 nm, for example, and the pitch thereof is approximately 286 nm, for example. Such numerical examples can be appropriately modified in accordance with materials composing the substrate 10 and the active layer 14, materials of the 2D-PC layer 12, a wavelength in the medium, etc.

For example, in the 2D-PC surface emitting laser according to the first embodiment to which GaAs/AlGaAs based materials are applied, the wavelength λ in the medium of the 2D-PC layer 12 is from approximately 200 nm to approximately 300 nm, and output laser light wavelengths are from approximately 900 nm to approximately 915 nm.

In addition, the lattice point for resonator 12A and the lattice point for coupler 12C may be filled up with semiconductor layers differing in the refractive index, for example, instead of being formed as an air hole. For example, the lattice point may be formed by filling up a GaAs layer with an AlGaAs layer. For example, during a fabricating process for welding the 2D-PC layer 12, if the hole shape of the lattice point for resonator 12A and the lattice point for coupler 12C becomes deformed, it is effective to fill up with the semiconductor layers differing in the refractive index in order to avoid such a deformation.

Figure 8:
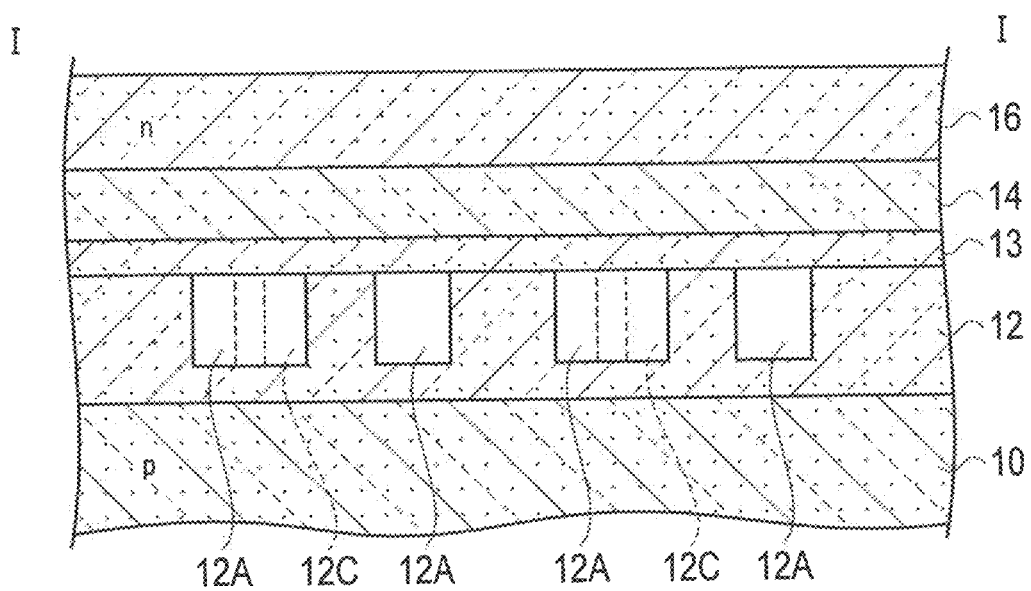
FIG. 8 is a schematic cross-sectional structure diagram of the 2D-PC surface emitting laser according to the first embodiment taken in the line I-I of FIG. 5A.

FIG. 8 shows a schematic cross-sectional structure of the 2D-PC surface emitting laser according to the first embodiment taken in the line I-I of FIG. 5A.

More specifically, the 2D-PC surface emitting laser according to the first embodiment includes: a substrate (reference numeral 24 in FIG. 1); a first cladding layer 10 disposed on the substrate (24); a second cladding layer 16 disposed on the first cladding layer 10; and an active layer 14 inserted between the first cladding layer 10 and the second cladding layer 16, wherein the PC layer for forming standing wave 12 may be inserted between the first cladding layer 10 and the active layer 14 so as to be adjacent to the active layer 14 in a surface vertical direction of the active layer 14. Moreover, as shown in FIG. 8, a carrier blocking layer 13 is inserted between the PC layer for forming standing wave 12 and the active layer 14.

Modified Example 1

Figure 9A:
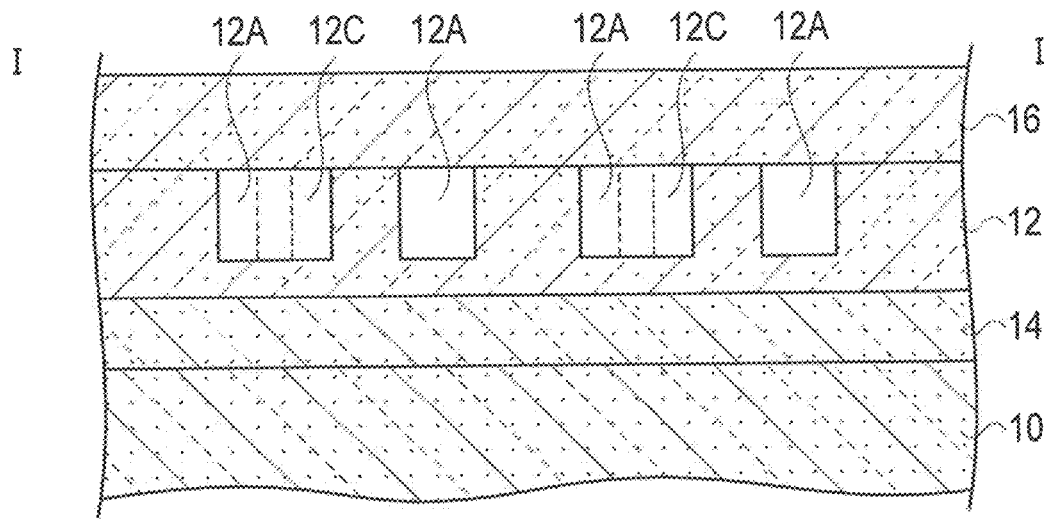
FIG. 9A is a schematic cross-sectional structure diagram of a 2D-PC surface emitting laser according to a modified example 1 of the first embodiment taken in the line I-I of FIG. 5A.

FIG. 9A shows a schematic cross-sectional structure of a 2D-PC surface emitting laser according to a modified example 1 of the first embodiment taken in the line I-I of FIG. 5A.

More specifically, as shown in FIG. 9A, in the 2D-PC surface emitting laser according to a modified example 1 of the first embodiment, the PC layer for forming standing wave 12 may be inserted between the second cladding layer 16 and the active layer 14 so as to be adjacent to the active layer 14 in the surface vertical direction of the active layer 14. Although illustration is omitted in FIG. 10A, the carrier blocking layer 13 may be inserted between the PC layer for forming standing wave 12 and the active layer 14 in the same manner as FIG. 8.

(Modified Example 2)

Figure 9B:
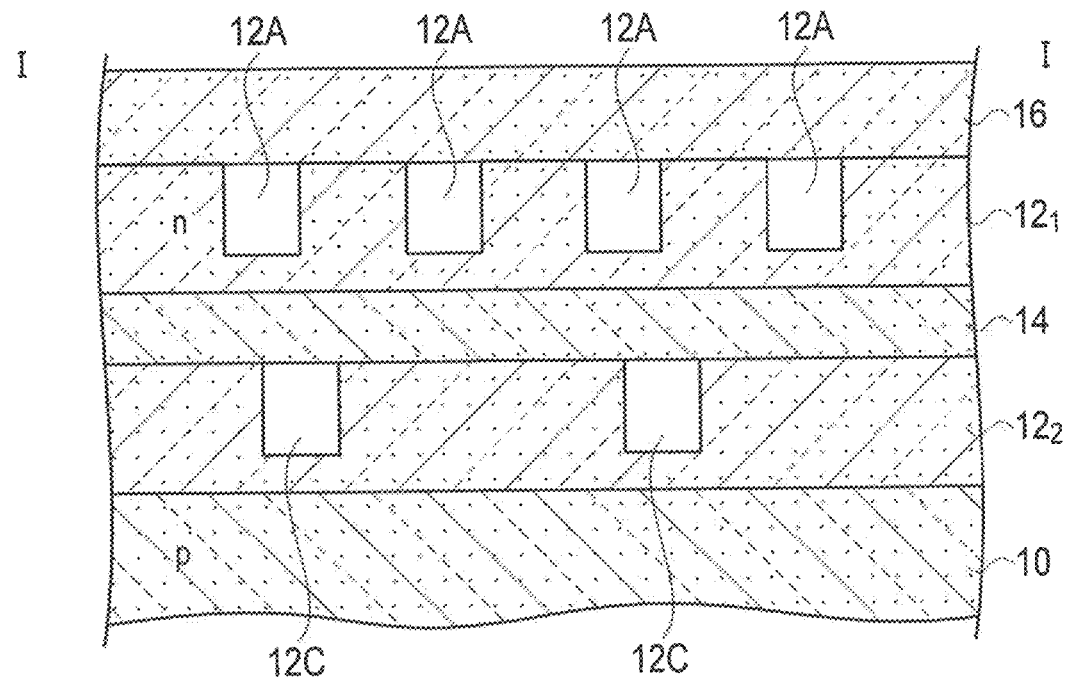
FIG. 9B is a schematic cross-sectional structure diagram of a 2D-PC surface emitting laser according to a modified example 2 of the first embodiment taken in the line I-I of FIG. 5A.

FIG. 9B shows a schematic cross-sectional structure of a 2D-PC surface emitting laser according to a modified example 2 of the first embodiment taken in the line I-I of FIG. 5A.

More specifically, as shown in FIG. 9B, the 2D-PC surface emitting laser according to the modified example 2 of the first embodiment further includes a PC layer for forming standing wave $12_1$ and a PC layer for emitting light $12_2$ laminated in the PC layer for forming standing wave $12_1$, and the lattice point for coupler 12C may be disposed in the PC layer for emitting light $12_2$.

As shown in FIG. 9B, the 2D-PC surface emitting laser according to the modified example 2 of the first embodiment includes: a substrate (reference numeral 24 in FIG. 1); a first cladding layer 10 disposed on the substrate (24); a second cladding layer 16 disposed on the first cladding layer 10; and an active layer 14 inserted between the first cladding layer 10 and the second cladding layer 16, wherein the PC layer for forming standing wave $12_1$ and the PC layer for emitting light $12_2$ are inserted between the first cladding layer 10 and the second cladding layer 16 in the surface vertical direction of the active layer 14 so as to sandwich the active layer 14.

Although the illustration is omitted in FIG. 9B, the carrier blocking layer 13 may be disposed respectively between the PC layer for forming standing wave $12_1$ and the active layer 14 and between the PC layer for emitting light $12_2$ and the active layer 14, in the same manner as FIG. 8.

In FIG. 9B, the laminating sequence of the PC layer for forming standing wave $12_1$ and the PC layer for emitting light $12_2$ may be reversed. Thereby the PC layer for emitting light $12_2$ may be inserted between the active layer 14 and the second cladding layer 16, and the PC layer for forming standing wave $12_1$ may be inserted between the active layer 14 and the first cladding layer 10. Since the PC layer for emitting light $12_2$ in which the lattice point for coupler 12C is disposed can be disposed in a position near the light extracting direction, the light extracting efficiency can also be improved.

(Modified Example 3)

FIG. 10A shows a schematic cross-sectional structure of a 2D-PC surface emitting laser according to a modified example 3 of the first embodiment taken in the line I-I of FIG. 5A.

More specifically, in the 2D-PC surface emitting laser according to the modified example 3 of the first embodiment, the PC layer for forming standing wave $12_1$ and the PC layer for emitting light $12_2$ may be inserted between the second cladding layer 16 and the active layer 14 so as to be adjacent to the active layer 14 in the surface vertical direction of the active layer 14. Moreover, although the illustration is omitted in FIG. 10A, the carrier blocking layer 13 may be inserted between the PC layer for emitting light $12_2$ and the active layer 14, in the same manner as FIG. 8.

In FIG. 10A, the laminating sequence of the PC layer for forming standing wave $12_1$ and the PC layer for emitting light $12_2$ may be reversed so that the PC layer for forming standing wave $12_1$ may be disposed on the active layer 14, and the PC layer for emitting light $12_2$ may be disposed in the PC layer for forming standing wave 121. If the PC layer for forming standing wave $12_1$ is disposed at a position near the active layer 14, the standing wave form operation can be executed more effectively. Moreover, since the PC layer for emitting light $12_2$ in which the lattice point for coupler 12C is disposed can be disposed in a position near the light extracting direction, the light extracting efficiency can also be improved.

(Modified Example 4)

FIG. 10B shows a schematic cross-sectional structure of a 2D-PC surface emitting laser according to a modified example 4 of the first embodiment taken in the line I-I of FIG. 5A.

More specifically, in the 2D-PC surface emitting laser according to the modified example 4 of the first embodiment, the PC layer for forming standing wave $12_1$ and the PC layer for emitting light $12_2$ may be inserted between the first cladding layer 10 and the active layer 14 so as to be adjacent to the active layer 14 in the surface vertical direction of the active layer 14. Moreover, although illustration is omitted in FIG. 10B, the carrier blocking layer 13 may be inserted between the PC layer for forming standing wave $12_1$ and the active layer 14 in the same manner as FIG. 8.

Moreover, in FIG. 10A, the laminating sequence of the PC layer for forming standing wave $12_1$ and the PC layer for emitting light $12_2$ may be reversed, and thereby the PC layer for emitting light $12_2$ may be disposed adjacent to the active layer 14. Since the PC layer for emitting light $12_2$ in which the lattice point for coupler 12C is disposed can be disposed in a position near the light extracting direction, the light extracting efficiency can also be improved.

(Control of Beam Spread Angle: Resonator Region RP and Coupler Region CP)

The resonator region RP is a region where the lattice point for resonator 12A is assigned in the PC layers for forming standing wave 12, $12_1$, and the coupler region CP is a region where the lattice point for coupler 12C is assigned in the PC layer for forming standing wave 12 or the PC layer for emitting light $12_2$.

The relationship between the width A, the beam spread angle, and the beam spread region of the coupler region CP is illustrated as schematically shown in FIGS. 11A, 11B and 11C, in the 2D-PC surface emitting laser according to the first embodiment. More specifically, an example of the width $A_1$, the beam spread angle $\theta_1$, and the beam spread region $30_1$ of the coupler region $CP_1$ are illustrated as shown in FIG. 11A, an example of the width $A_2$, the beam spread angle $\theta_2$, and the beam spread region $30_2$ of the coupler region $CP_2$ are illustrated as shown in FIG. 11B, and an example of the width $A_3$, the beam spread angle $\theta_3$, and the beam spread region $30_3$ of the coupler region $CP_3$ is illustrated as shown in FIG. 11C. In the present embodiment, the size relationship between the widths of the coupler region is expressed with $A_1<A_2<A_3$, the size of the coupler region $CP_1$ is relatively smaller than others, and the size of the coupler region $CP_3$ is relatively larger than others. Moreover, $\theta_1>\theta_2>\theta_3$ is satisfied in the size relationship between the beam spread angles specifying the beam spread regions $30_1, 30_2, 30_3$.

In the 2D-PC surface emitting laser according to the first embodiment, the size relationship between the resonator regions RP corresponding to FIGS. 11A, 11B and 11C is illustrated as shown in FIG. 12A, and the size relationship of the beam spread angles corresponding thereto is illustrated as shown in FIG. 12B. More specifically, the beam spread angle $\theta_0$ becomes small as the size of the resonator region RP becomes large.

Figure 13A:
FIG. 13A is a diagram showing a size relationship between resonator regions RP in the 2D-PC layer applied to the Γ-point (gamma-point) oscillation, and showing in particular an example of $RP_1$, in the 2D-PC surface emitting laser according to the comparative example.
Figure 13B:
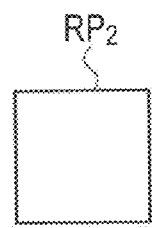
FIG. 13B is a diagram showing a size relationship between resonator regions RP in the 2D-PC layer applied to the Γ-point (gamma-point) oscillation, and showing in particular an example of $RP_2$, in the 2D-PC surface emitting laser according to the comparative example.
Figure 13C:
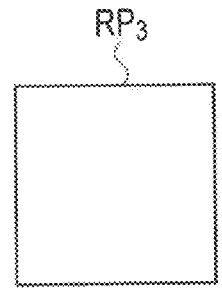
FIG. 13C is a diagram showing a size relationship between resonator regions RP in the 2D-PC layer applied to the Γ-point (gamma-point) oscillation, and showing in particular an example of $RP_3$, in the 2D-PC surface emitting laser according to the comparative example.

FIG. 13A shows an example of the $RP_1$, FIG. 13B shows an example of the $RP_2$, and FIG. 13C shows an example of the $RP_3$ in the size relationship between the resonator regions RP in the 2D-PC layer applied to the Γ-point (gamma-point) oscillation, in the 2D-PC surface emitting laser according to the comparative example.

Figure 14A:
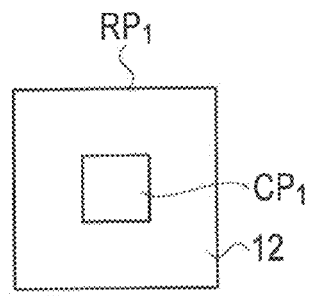
FIG. 14A is a diagram showing a size relationship between the resonator regions RP and the coupler regions CP in the 2D-PC layer applied to the M-point oscillation, and showing in particular an example of $RP_1$ and $CP_1$, in the 2D-PC surface emitting laser according to the first embodiment.
Figure 14B:
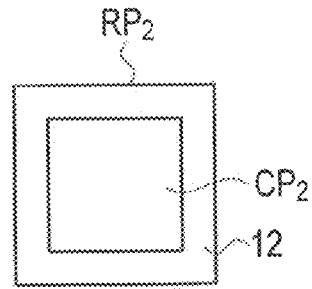
FIG. 14B is a diagram showing a size relationship between the resonator regions RP and the coupler regions CP in the 2D-PC layer applied to the M-point oscillation, and showing in particular an example of $ARP_2$ and $CP_2$, in the 2D-PC surface emitting laser according to the first embodiment.
Figure 14C:
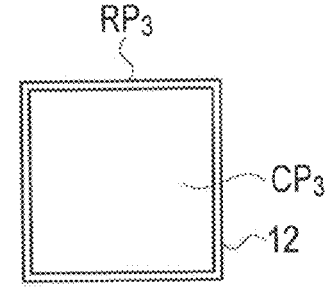
FIG. 14C is a diagram showing a size relationship between the resonator regions RP and the coupler regions CP in the 2D-PC layer applied to the M-point oscillation, and showing in particular an example of $ARP_3$ and $CP_3$, in the 2D-PC surface emitting laser according to the first embodiment.

On the other hand, FIG. 14A shows an example of the $RP_1$ and the $CP_1$, FIG. 14B shows an example of the $RP_2$ and the $CP_2$, and FIG. 14C shows an example of the $RP_3$ and the $CP_3$ in the size relationship between the resonator regions RP and the coupler regions CP in the 2D-PC layer applied to the M-point oscillation, in the 2D-PC surface emitting laser according to the first embodiment.

The oscillation of the 2D-PC surface emitting laser requires a resonator region having a fixed area or more. Therefore, if the beam spread angle θ is enlarged in the case of the Γ-point (gamma-point) oscillation according to the comparative example, the resonator region $RP_A$ required for an oscillation cannot be ensured. More specifically, since the 2D-PC surface emitting laser according to the comparative example uses the Γ-point (gamma-point) oscillation, the size of the resonator region RP is equal to the size of the coupler region CP in that condition. Accordingly, if the size of the resonator region RP is reduced in order to enlarge the beam spread angle θ, it becomes impossible to oscillate in the range of $RP<RP_A$ in the size relationship between the resonator regions RP since the resonator region $RP_A$ required for the oscillation cannot not be ensured, as shown in FIG. 12A.

(Arrangement Relationship Between Coupler and Resonator)

Figure 15:
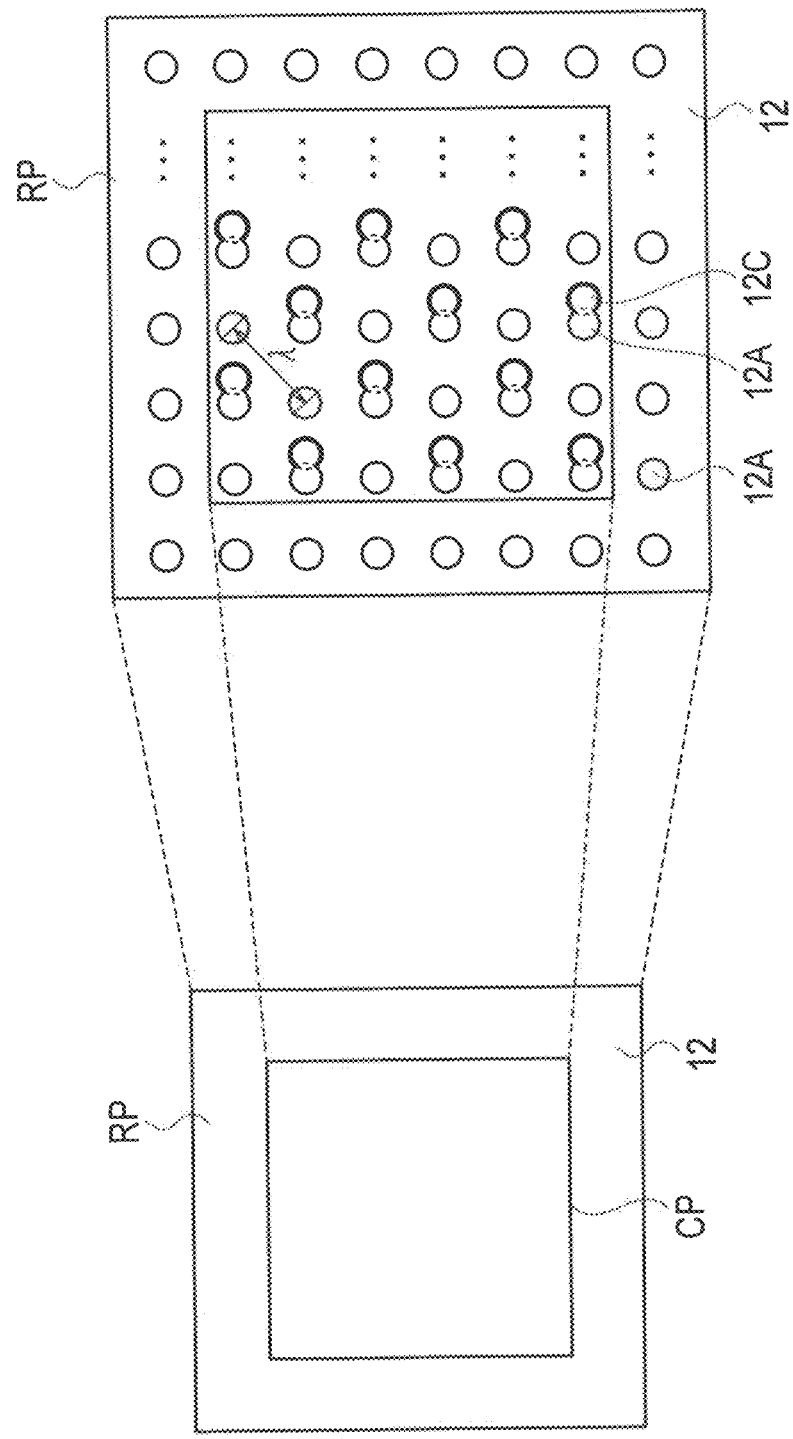
FIG. 15 shows an example of arrangement of lattice points for resonator 12A and lattice points for coupler 12C in the resonator region RP the coupler region CP in the 2D-PC layer applied to the M-point oscillation, in the 2D-PC surface emitting laser according to the first embodiment.

In the 2D-PC surface emitting laser according to the first embodiment, FIG. 15 shows an example of arrangement of the lattice points for resonator 12A and the lattice points for coupler 12C in the resonator region RP and the coupler region CP in the 2D-PC layer 12 applied to the M-point oscillation.

Figure 16A:
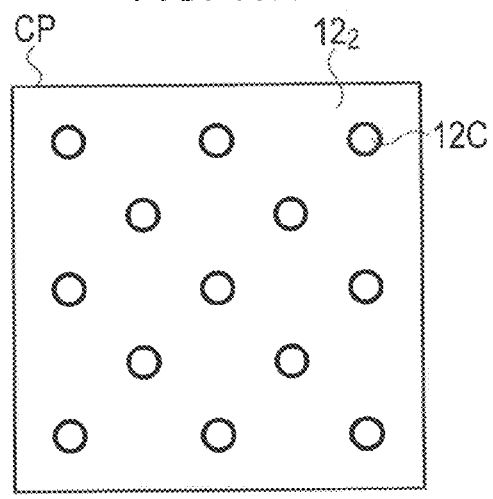
FIG. 16A shows an example of arrangement of the lattice points for coupler 12C in the PC layer for emitting light $12_2$, in the 2D-PC surface emitting laser according to the first embodiment.
Figure 16B:
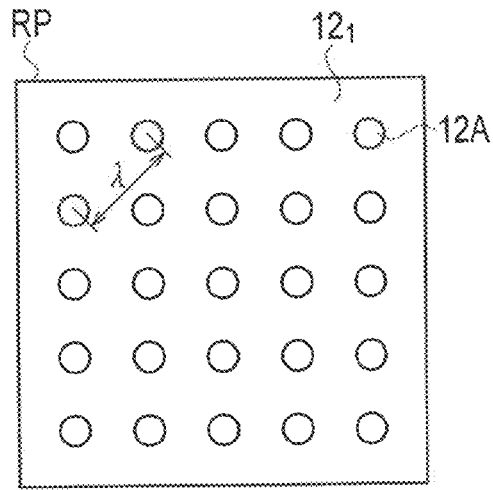
FIG. 16B shows an example of arrangement of the lattice points for resonator 12A in the PC layer for forming standing wave $12_1$, in the 2D-PC surface emitting laser according to the first embodiment.

Moreover, FIG. 16A shows an example of arrangement of the lattice points for coupler 12C in the PC layer for emitting light $12_2$, and FIG. 16B shows an example of arrangement of the lattice points for resonator 12A in the PC layer for forming standing wave $12_1$, in the 2D-PC surface emitting laser according to the first embodiment. Moreover, FIG. 16C shows an example that the lattice points for resonator 12A and the lattice points for coupler 12C are arranged in the same PC layer 12, FIG. 16D shows another example that the lattice points for resonator 12A and the lattice points for coupler 12C are arranged in the same PC layer 12, and FIG. 16E shows still another example that the lattice points for resonator 12A and the lattice points for coupler 12C are arranged in the same PC layer 12.

Figure 16C:
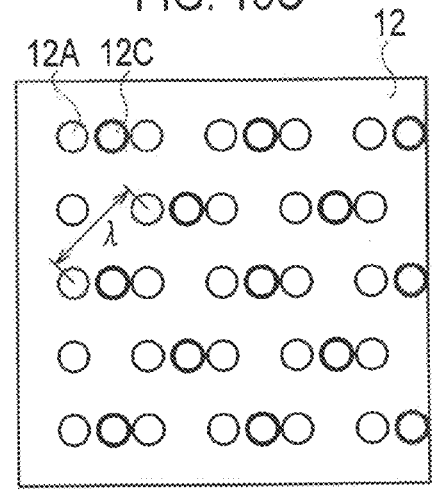
FIG. 16C shows an example of arrangement of the lattice points for resonator 12A and the lattice points for coupler 12C in the same PC layer 12, in the 2D-PC surface emitting laser according to the first embodiment.
Figure 16D:
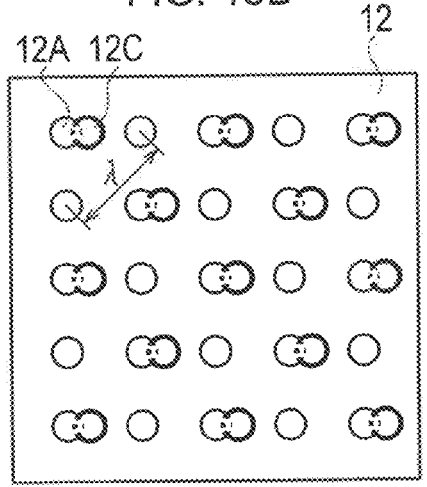
FIG. 16D shows another example of arrangement of the lattice points for resonator 12A and the lattice points for coupler 12C in the same PC layer 12, in the 2D-PC surface emitting laser according to the first embodiment.
Figure 16E:
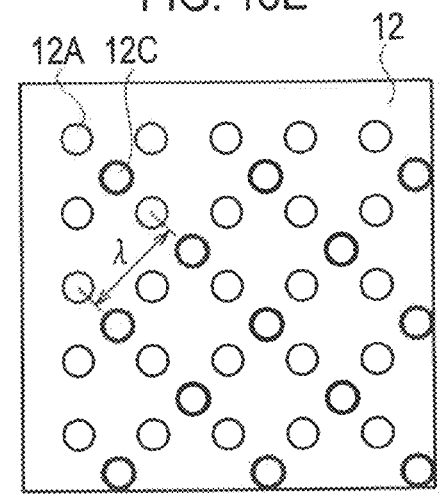
FIG. 16E shows still another example of arrangement of the lattice points for resonator 12A and the lattice points for coupler 12C in the same PC layer 12, in the 2D-PC surface emitting laser according to the first embodiment.

The arrangement relationship between the lattice points for coupler 12C and the lattice points for resonator 12A can be freely set up, in the 2D-PC surface emitting laser according to the first embodiment, as shown in FIGS. 16C to 16E. The LD characteristics (output, threshold value, etc.) vary depending on the arrangement relationship between the lattice points for coupler 12C and the lattice points for resonator 12A.

(Beam Shape Control with Coupler Arrangement)

FIG. 17A shows a Near Field Pattern (NFP) in the case where the size of the resonator region RP and the size of the coupler region CP in the 2D-PC layer applied to the M-point oscillation are nearly equal to each other, FIG. 17B shows the beam spread region 30 from the coupler region CP, and FIG. 17C shows an example of arrangement of the lattice points for resonator and the lattice points for coupler in the resonator region RP and the coupler region CP corresponding to FIG. 17A, in the 2D-PC surface emitting laser according to the first embodiment.

Figure 18A:
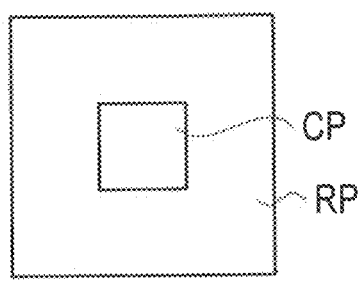
FIG. 18A shows an NFP in the case where the size of the resonator region RP and the size of the coupler region CP in the 2D-PC layer applied to the M-point oscillation are differ from each other, in the 2D-PC surface emitting laser according to the first embodiment.
Figure 18B:
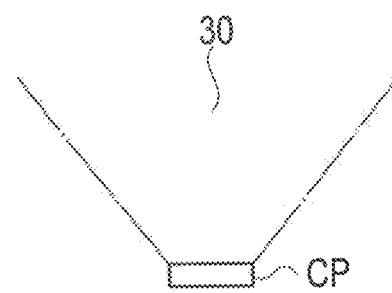
FIG. 18B is a schematic diagram showing a beam spread region from the coupler region CP, in the 2D-PC surface emitting laser according to the first embodiment.
Figure 18C:
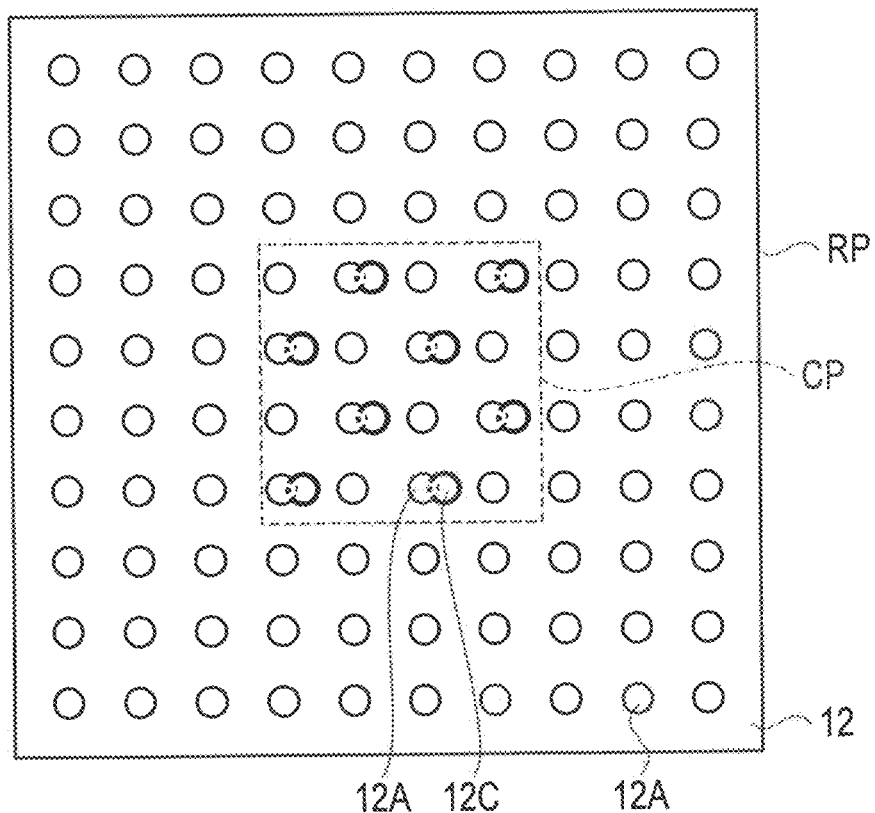
FIG. 18C shows an example of arrangement of the lattice points for resonator and the lattice points for coupler in the resonator region RP and the coupler region CP corresponding to FIG. 18A, in the 2D-PC surface emitting laser according to the first embodiment.

Moreover, FIG. 18A shows an NFP in the case where the size of the resonator region RP and the size of the coupler region CP in the 2D-PC layer 12 applied to the M-point oscillation are differ from each other, FIG. 18B shows the beam spread region 30 from the coupler region CP, and FIG.

18C shows an example of arrangement of the lattice points for resonator and the lattice points for coupler in the resonator region RP and the coupler region CP corresponding to FIG. 18A, in the 2D-PC surface emitting laser according to the first embodiment.

More specifically, in the 2D-PC surface emitting laser according to the first embodiment, the resonator and the coupler can be designed separately, and the beam shape of the surface emission-type laser beam can be modified variously by modifying only the arrangement of the coupler, continuing the stable oscillation.

According to the 2D-PC surface emitting laser according to the first embodiment, the size and the shape of the light emitting surface of laser beam can be adjusted by varying the coupler region CP in which the lattice point for coupler 12C is arranged while continuing the stable oscillation, while maintaining the size of the resonator region RP in which the lattice point for resonator 12A is arranged.

(Example of Generation of other Various Beams)

Figure 19A:
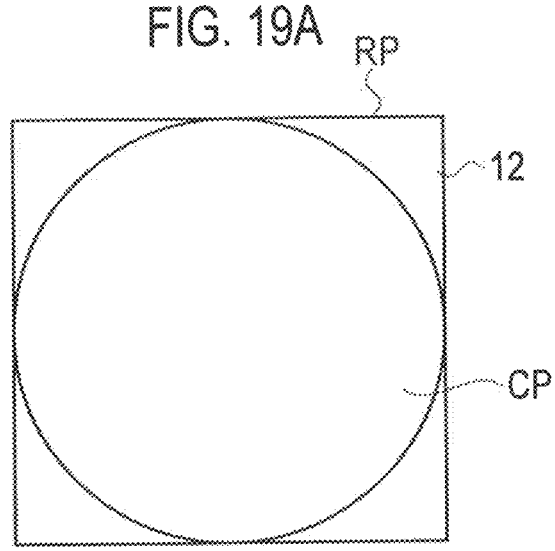
FIG. 19A shows an NFP in the case where a relatively large circular coupler region CP is arranged in the resonator region RP in the 2D-PC layer applied to the M-point oscillation, in the 2D-PC surface emitting laser according to the first embodiment.
Figure 19B:
FIG. 19B shows a Far Field Pattern (FFP) corresponding to FIG. 19A, in the 2D-PC surface emitting laser according to the first embodiment.

In the 2D-PC surface emitting laser according to the first embodiment, FIG. 19A shows an NFP in the case where a relatively large circular coupler region CP is arranged in the resonator region RP of the 2D-PC layer 12 applied to the M-point oscillation, and FIG. 19B shows an FFP corresponding to FIG. 19A.

Figure 20A:
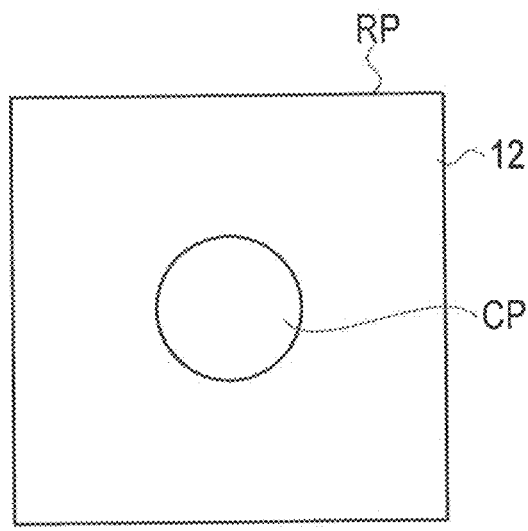
FIG. 20A shows an NFP in the case where a relatively small circular coupler region CP is arranged in the resonator region RP, in the 2D-PC surface emitting laser according to the first embodiment.
Figure 20B:
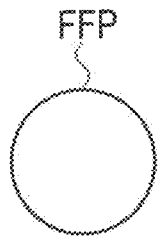
FIG. 20B shows an FFP corresponding to FIG. 20A, in the 2D-PC surface emitting laser according to the first embodiment.

Moreover, FIG. 20A shows an NFP in the case where a relatively small circular coupler region CP is arranged in the resonator region RP, and FIG. 20B shows an FFP corresponding to FIG. 20A.

Figure 21A:
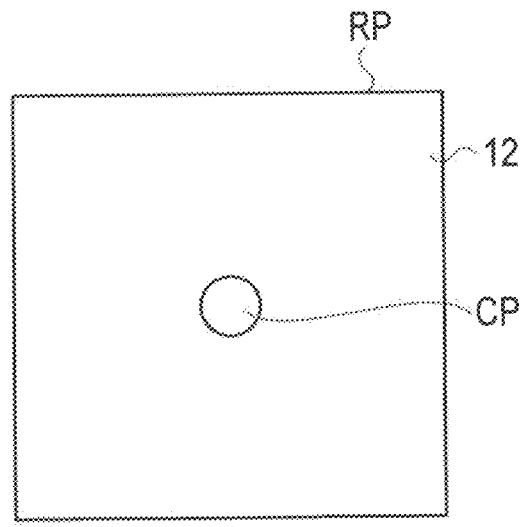
FIG. 21A shows an NFP in the case where a relatively micro circular coupler region CP is arranged in the resonator region RP in the 2D-PC layer applied to the M-point oscillation, in the 2D-PC surface emitting laser according to the first embodiment.
Figure 21B:
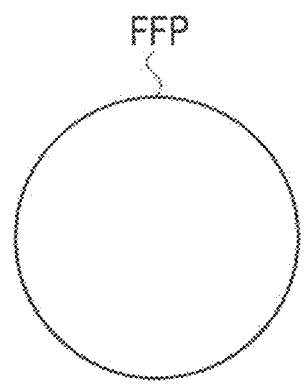
FIG. 21B shows an FFP corresponding to FIG. 21A, in the 2D-PC surface emitting laser according to the first embodiment.

Moreover, FIG. 21A shows an NFP in the case where a relatively micro circular coupler region CP is arranged in the resonator region RP, and FIG. 21B shows an FFP corresponding to FIG. 21A.

Figure 22A:
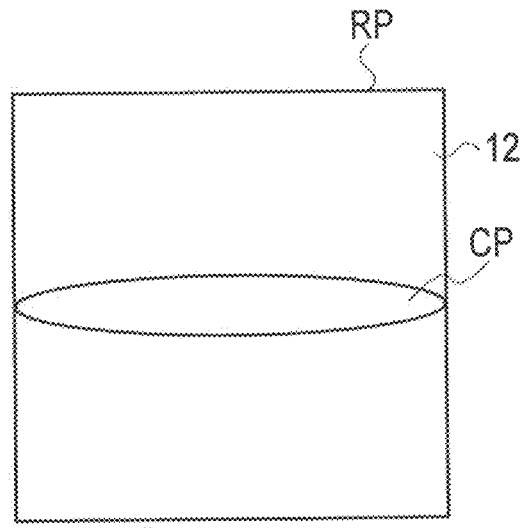
FIG. 22A shows an NFP in the case where a relatively large elliptic resonator region CP is arranged in the resonator region RP in the 2D-PC layer applied to the M-point oscillation, in the 2D-PC surface emitting laser according to the first embodiment.
Figure 22B:
FIG. 22B shows an FFP corresponding to FIG. 22A, in the 2D-PC surface emitting laser according to the first embodiment.

Moreover, FIG. 22A shows an NFP in the case where a relatively large elliptic resonator region CP is arranged in the resonator region RP, and FIG. 22B shows an FFP corresponding to FIG. 22A.

Figure 23A:
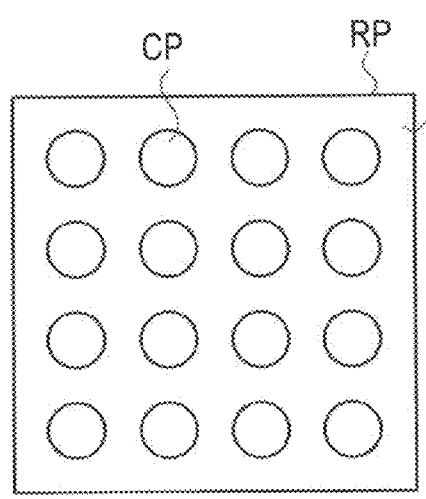
FIG. 23A shows an NFP in the case where a plurality of relatively small circular coupler regions CP is arranged in the resonator region RP in the 2D-PC layer applied to the M-point oscillation, in the 2D-PC surface emitting laser according to the first embodiment.
Figure 23B:
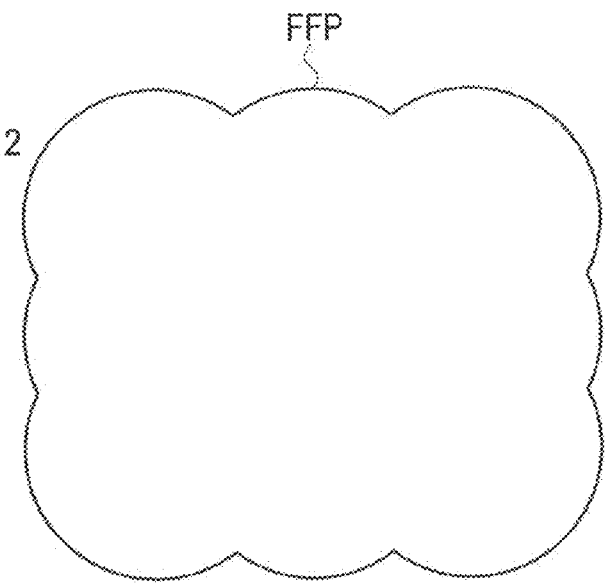
FIG. 23B shows an FFP corresponding to FIG. 23A, in the 2D-PC surface emitting laser according to the first embodiment.

Moreover, FIG. 23A shows an NFP in the case where a plurality of relatively small circular coupler regions CP is arranged in the resonator region RP, and FIG. 23B shows an FFP corresponding to FIG. 23A.

Figure 24A:
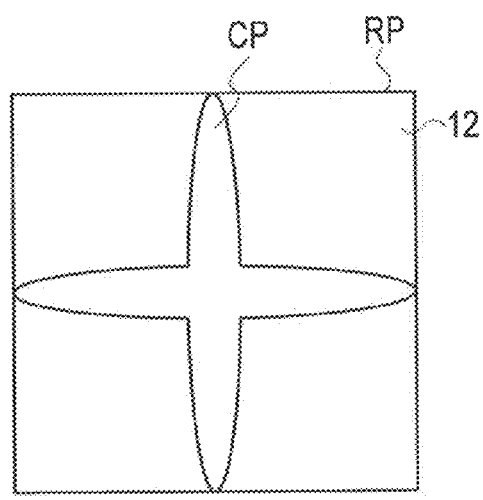
FIG. 24A shows an NFP in the case where two elliptic resonator regions CP perpendicularly intersecting with each other are arranged in the resonator region RP in the 2D-PC layer applied to the M-point oscillation, in the 2D-PC surface emitting laser according to the first embodiment.
Figure 24B:
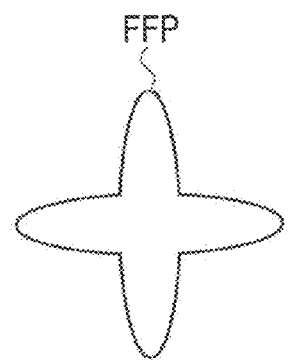
FIG. 24B shows an FFP corresponding to FIG. 24A, in the 2D-PC surface emitting laser according to the first embodiment.

Moreover, FIG. 24A shows an NFP in the case where two elliptic resonator regions CP perpendicularly intersecting with each other are arranged in the resonator region RP, and FIG. 24B shows an FFP corresponding to FIG. 24A.

Figure 25A:
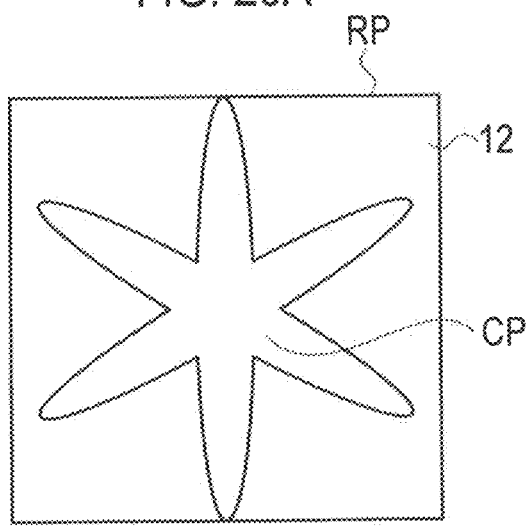
FIG. 25A shows an NFP in the case where three elliptic resonator regions CP intersecting at 60 degrees with each other are arranged in the resonator region RP in the 2D-PC layer applied to the M-point oscillation, in the 2D-PC surface emitting laser according to the first embodiment.
Figure 25B:
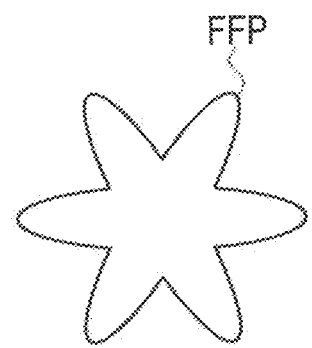
FIG. 25B shows an FFP corresponding to FIG. 25A, in the 2D-PC surface emitting laser according to the first embodiment.

Moreover, FIG. 25A shows an NFP in the case where three elliptic resonator regions CP intersecting at 60 degrees with each other are arranged in the resonator region RP, and FIG. 25B shows an FFP corresponding to FIG. 25A.

Figure 26A:
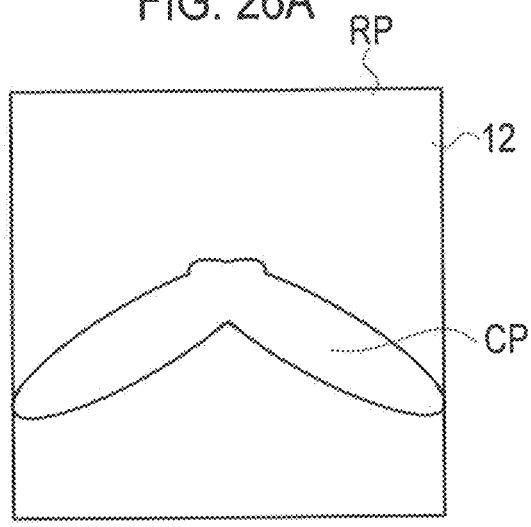
FIG. 26A shows an NFP in the case where two elliptic resonator regions CP intersecting at 120 degrees with each other are arranged in the resonator region RP in the 2D-PC layer applied to the M-point oscillation, in the 2D-PC surface emitting laser according to the first embodiment.
Figure 26B:
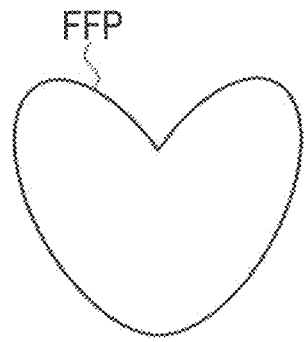
FIG. 26B shows an FFP corresponding to FIG. 26A, in the 2D-PC surface emitting laser according to the first embodiment.

Moreover, FIG. 26A shows an NFP in the case where two elliptic resonator regions CP intersecting at 120 degrees with each other are arranged in the resonator region RP, and FIG. 26B shows an FFP corresponding to FIG. 26A.

Moreover, FIG. 27A shows an NFP in the case where five elliptic resonator regions CP intersecting at 72 degrees with each other are arranged in the resonator region RP, and FIG. 27B shows an FFP corresponding to FIG. 27A.

According to the 2D-PC surface emitting laser according to the first embodiment, as shown in FIGS. 19-27, it is possible to adjust the size and the shape of the light emitting surface of laser beams by relatively varying the size of the coupler region CP, while maintaining the size of the oscillation region, in the oscillation of the M-point band edge in the photonic band structure. As an example of the size of NFP, various sizes of the NFP, e.g., several tens of μm square, several hundred of μm square, 1 mm square, can be formed, and the FFP corresponding thereto can also be formed in the same manner as the NFP.

According to the 2D-PC surface emitting laser according to the first embodiment, since the beam spread angle θ and the shape of laser beam are determined with the size and the shape of the light emitting surface of laser beam, the beam spread angle and the shape of laser beam can be controlled. As the periodic structure for optical amplification is maintained, the oscillation can be performed even if varying the size and the shape of the coupler region CP.

Since the beam spread angle θ and the shape of laser beam are determined with the size and the shape of the light emitting surface, when extending the beam spread angle θ of laser beam, for example, only the size of coupler region CP may be made small relatively, while the size of the resonator region RP of optical amplification is maintained in that condition. Moreover, when the shape of laser beam is made into a rectangle, only the shape of the coupler region CP may also be made into a rectangle.

In particular, since the 2D-PC surface emitting laser according to the first embodiment can control the beam spread angle θ and the shape of laser beam, various shapes as shown in FIGS. 19-27 can be used for lens-free markers etc.

Since the spread angle and the shape of laser beam can be varied by using the 2D-PC surface emitting laser according to the first embodiment, the applicability can be expanded. For example, the 2D-PC surface emitting laser according to the first embodiment is applicable to wide applicable fields, e.g. light sources for laser beam printers, laser beam sources for distance sensors, laser beam sources for automatic focusing, laser beam sources for pickup of advanced optical discs, laser pointers, laser scan displays, bar code scanners, scan display built-in mobile devices, laser knives built-in capsule, Digital Versatile Discs (DVD), Blu-ray Discs (BD), communication apparatuses between chips, etc.

According to the 2D-PC surface emitting laser according to the first embodiment, the beam spread angle θ can be extended by making the size of the coupler region CP relatively smaller, while maintaining the size of the resonator region RP required for the M-point oscillation in that condition.

According to the first embodiment, there can be provided the 2D-PC surface emitting laser which can control the beam spread angle and shape of laser beams by using the coupler arrangements.

SECOND EMBODIMENT

The 2D-PC surface emitting laser according to the second embodiment uses oscillations in the X-point band edge of the photonic band structure. In the oscillations, although the periodic structure of the photonic crystal has only a function of optical amplification for the oscillation, the light can be extracted by disposing periodic structure (coupler) for diffracting the light in the same plane as the periodic structure.

Figure 28A:
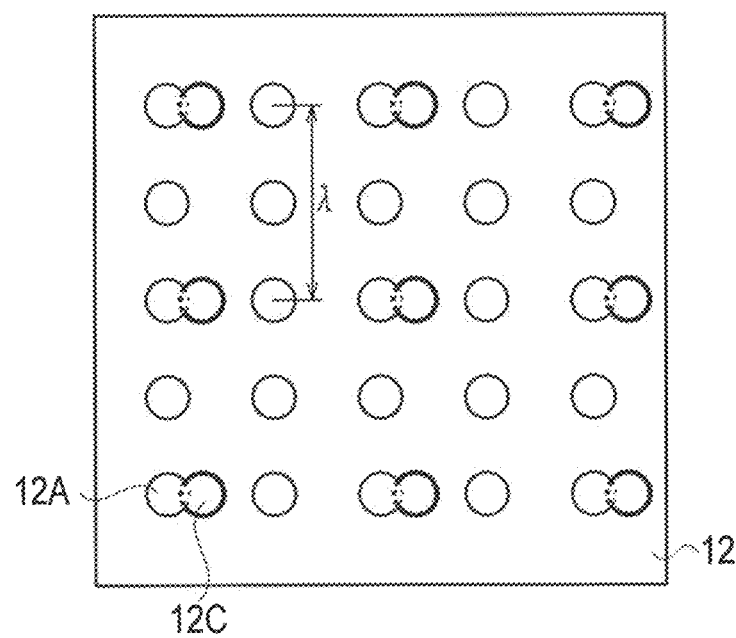
FIG. 28A is a schematic plane configuration diagram of lattice points for resonator and lattice points for coupler (an example of square lattice arrangement) in a 2D-PC layer applied to an X-point oscillation, in a 2D-PC surface emitting laser according to a second embodiment.
Figure 28B:
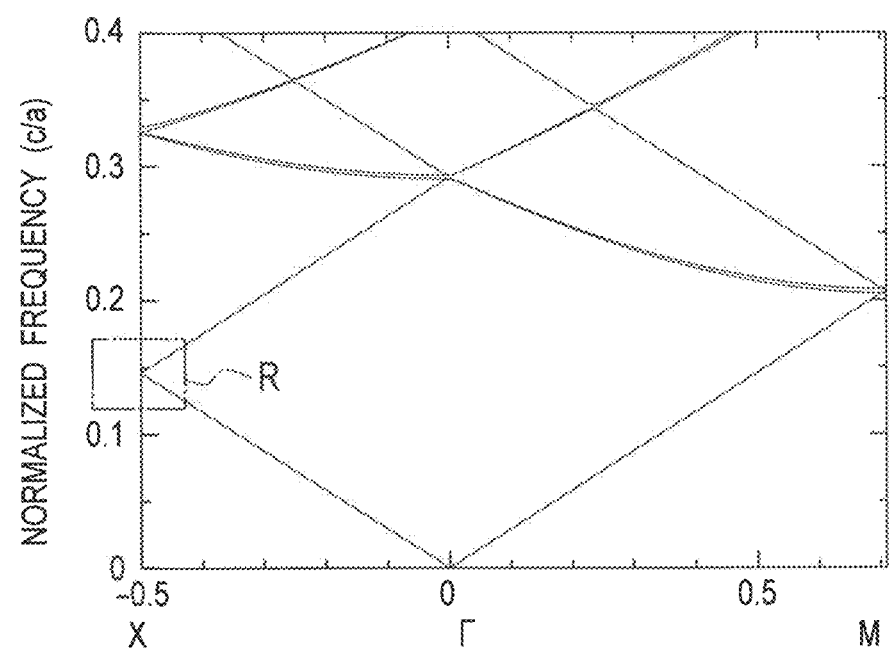
FIG. 28B is a diagram of 2D-PC band structure corresponding to FIG. 28A.

As shown in FIG. 28A, a schematic plane configuration of the lattice points for resonator 12A and the lattice points for coupler 12C in the 2D-PC layer 12 applied to the X-point oscillation is arranged in a square lattice shape, in the 2D-PC surface emitting laser according to the second embodiment. Moreover, FIG. 28B shows a relationship between the normalized frequency (c/a) and the wave number vector, in the 2D-PC band structure corresponding to FIG. 28A.

In the 2D-PC surface emitting laser according to the second embodiment, an oscillation in the X-point band edge (near the region R shown in FIG. 28) in the photonic band structure of the PC layer for forming standing wave 12 is used, corresponding to an embodiment of the square lattice (X-point oscillation).

As shown in FIG. 28A, the 2D-PC surface emitting laser according to the second embodiment includes: a PC layer for forming standing wave 12; a lattice point for resonator 12A arranged in the PC layer for forming standing wave 12, and configured so that a light wave in an X-point band edge in photonic band structure in the PC layer for forming standing wave 12 is diffracted in a plane of the PC layer for forming standing wave 12; and a lattice point for coupler 12C configured so that the light wave in the X-point band edge in the photonic band structure in the PC layer for forming standing wave 12 is diffracted in a surface vertical direction of the PC layer for forming standing wave 12.

In the 2D-PC surface emitting laser according to the second embodiment, as shown in FIG. 28A, the lattice point for resonator 12A is arranged in a first square lattice shape, the lattice point for coupler 12C is arranged in a second square lattice shape having a lattice constant twice the lattice constant of the first square lattice, and the lattice constant of the lattice point for coupler 12C is equal to the wavelength $\lambda$ in the medium of the PC layer.

Other configurations are the same as those of the first embodiment and its modified examples 1-4.

According to the 2D-PC surface emitting laser according to the second embodiment, the beam spread angle $\theta$ can be extended by making the size of the coupler region CP relatively smaller, while maintaining the size of the resonator region RP required for the X-point oscillation in that condition.

According to the second embodiment, there can be provided the 2D-PC surface emitting laser which can control the beam spread angle and shape of laser beams by using the coupler arrangements.

THIRD EMBODIMENT

The 2D-PC surface emitting laser according to the third embodiment uses oscillations in the X-point band edge of the photonic band structure. In the oscillations, although the periodic structure of the photonic crystal has only a function of optical amplification for the oscillation, the light can be extracted by disposing periodic structure (coupler) for diffracting the light in the same plane as the periodic structure.

Figure 29A:
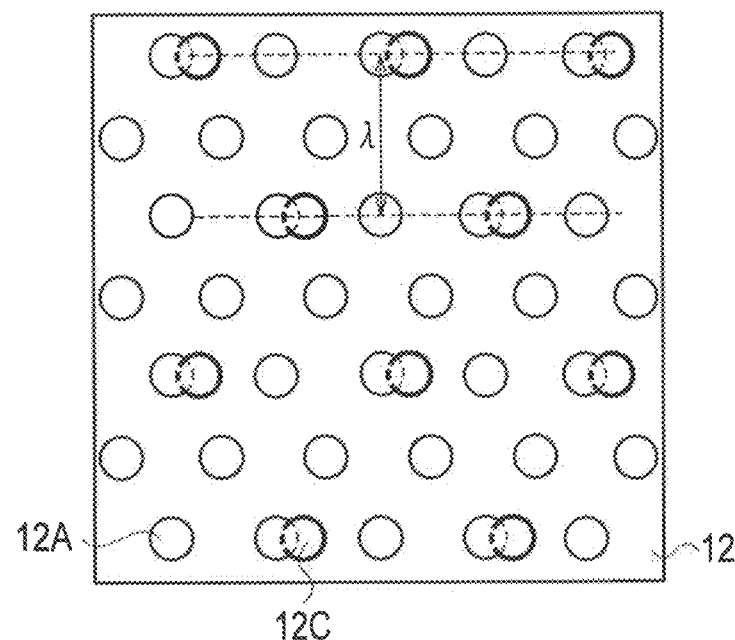
FIG. 29A is a schematic plane configuration diagram of lattice points for resonator and lattice points for coupler (an example of triangular lattice arrangement) in a 2D-PC layer applied to an M-point oscillation, in a 2D-PC surface emitting laser according to a third embodiment.
Figure 29B:
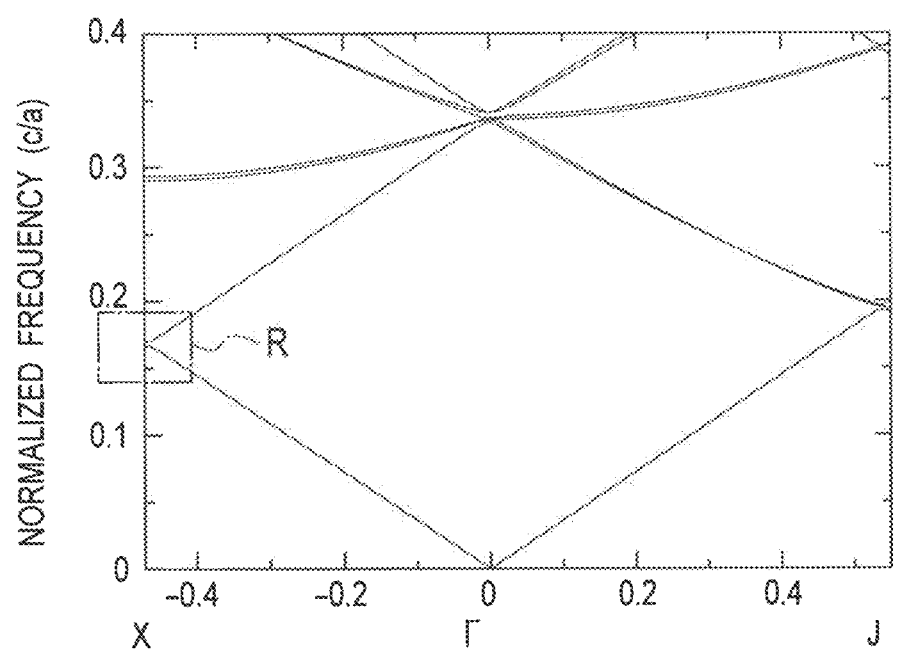
FIG. 29B is a diagram of 2D-PC band structure corresponding to FIG. 29A.

As shown in FIG. 29A, a schematic plane configuration of the lattice points for resonator 12A and the lattice points for coupler 12C in the 2D-PC layer 12 applied to the X-point oscillation is arranged in a triangular lattice shape, in the 2D-PC surface emitting laser according to the third embodiment. Moreover, FIG. 29B shows a relationship between the normalized frequency (c/a) and the wave number vector, in the 2D-PC band structure corresponding to FIG. 29A.

In the 2D-PC surface emitting laser according to the third embodiment, an oscillation in the X-point band edge (near the region R shown in FIG. 29) in the photonic band structure of the PC layer for forming standing wave 12 is used, corresponding to an embodiment of the triangular lattice (X-point oscillation).

As shown in FIG. 29A, the 2D-PC surface emitting laser according to the third embodiment includes: a PC layer for forming standing wave 12; a lattice point for resonator 12A arranged in the PC layer for forming standing wave 12, and configured so that a light wave in an X-point band edge in photonic band structure in the PC layer for forming standing wave 12 is diffracted in a plane of the PC layer for forming standing wave 12; and a lattice point for coupler 12C configured so that the light wave in the X-point band edge in the photonic band structure in the PC layer for forming standing wave 12 is diffracted in a surface vertical direction of the PC layer for forming standing wave 12.

In the 2D-PC surface emitting laser according to the third embodiment, as shown in FIG. 29A, the lattice point for resonator 12A is arranged in a first triangular lattice shape, the lattice point for coupler 12C is arranged in a second triangular lattice shape twice the pitch of the first triangular lattice, the height in the planar view of the second triangular lattice is equal to the wavelength $\lambda$ in the medium of the PC layer 12.

Other configurations are the same as those of the first embodiment and its modified examples 1-4.

According to the 2D-PC surface emitting laser according to the third embodiment, the beam spread angle $\theta$ can be extended by making the size of the coupler region CP relatively smaller, while maintaining the size of the resonator region RP required for the X-point oscillation in that condition.

According to the third embodiment, there can be provided the 2D-PC surface emitting laser which can control the beam spread angle and shape of laser beams by using the coupler arrangements, while continuing the stable oscillation.

FOURTH EMBODIMENT

The 2D-PC surface emitting laser according to the fourth embodiment uses oscillations in the J-point band edge of the photonic band structure. In the oscillations, although the periodic structure of the photonic crystal has only a function of optical amplification for the oscillation, the light can be extracted by disposing periodic structure (coupler) for diffracting the light in the same plane as the periodic structure.

Figure 30A:
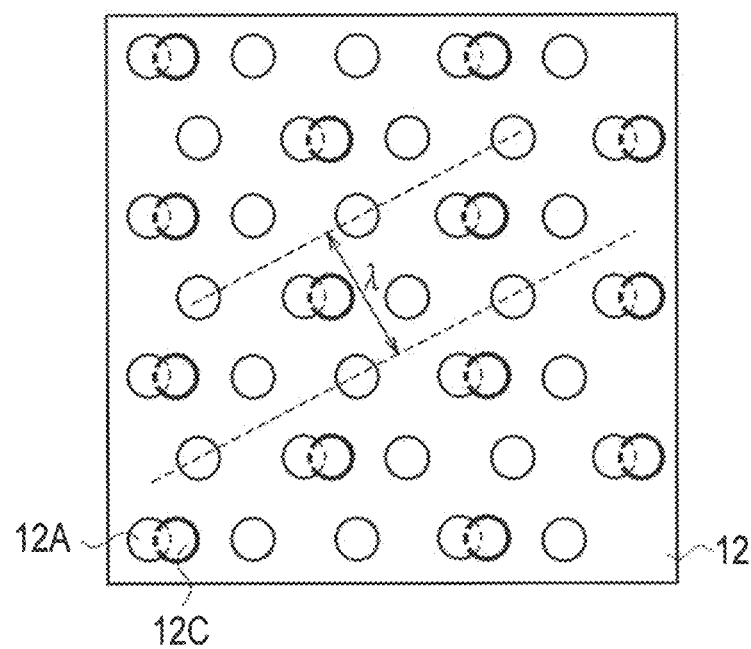
FIG. 30A is a schematic plane configuration diagram of lattice points for resonator and lattice points for coupler (an example of triangular lattice arrangement) in a 2D-PC layer applied to a J-point oscillation, in a 2D-PC surface emitting laser according to a fourth embodiment.

As shown in FIG. 30A, a schematic plane configuration of the lattice points for resonator 12A and the lattice points for coupler 12C in the 2D-PC layer 12 applied to the J-point oscillation is arranged in a triangular lattice shape, in the 2D-PC surface emitting laser according to the fourth embodiment. Moreover, FIG. 30B shows a relationship between the normalized frequency (c/a) and the wave number vector, in the 2D-PC band structure corresponding to FIG. 30A.

In the 2D-PC surface emitting laser according to the fourth embodiment, an oscillation in the J-point band edge (near the region S shown in FIG. 30) in the photonic band structure of the PC layer for forming standing wave 12 is used, corresponding to an embodiment of the triangular lattice (J-point oscillation).

Figure 30B:
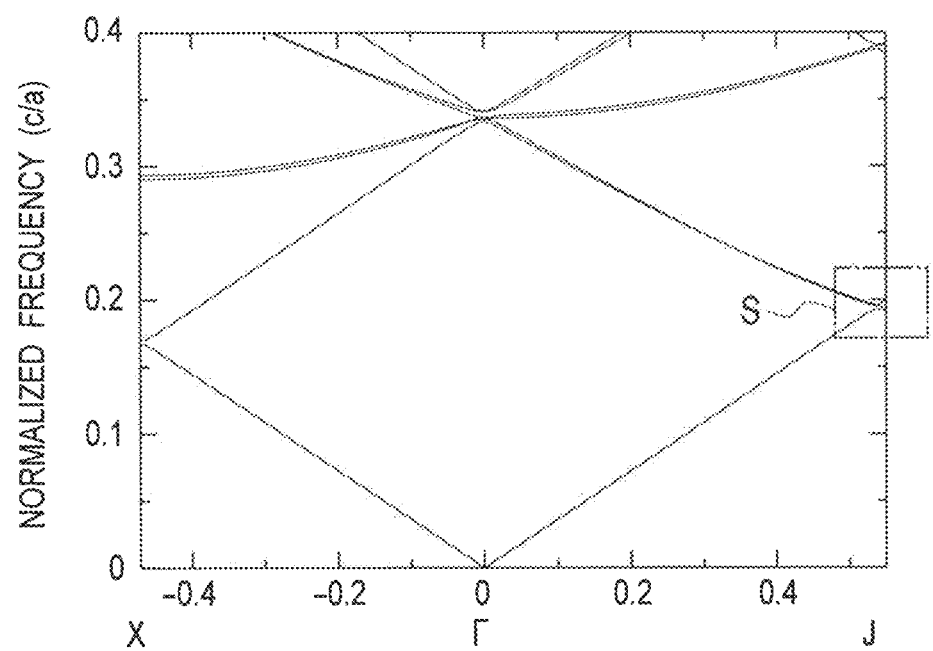
FIG. 30B is a diagram of 2D-PC band structure corresponding to FIG. 30A.

As shown in FIGS. 30A and 30B, the 2D-PC surface emitting laser according to the fourth embodiment includes: a PC layer for forming standing wave 12; a lattice point for resonator 12A arranged in the PC layer for forming standing wave 12, and configured so that a light wave in an J-point band edge in photonic band structure in the PC layer for forming standing wave 12 is diffracted in a plane of the PC layer for forming standing wave 12; and a lattice point for coupler 12C configured so that the light wave in the J-point band edge in the photonic band structure in the PC layer for forming standing wave 12 is diffracted in a surface vertical direction of the PC layer for forming standing wave 12. In the 2D-PC surface emitting laser according to the fourth embodiment, as shown in FIG. 30A, the lattice point for resonator 12A is arranged in a first triangular lattice shape, the lattice point for coupler 12C is arranged in a face-centered triangular lattice shape 3 times the pitch of the first triangular lattice, the length of one side of the face-centered triangular lattice is equal to twice the wavelength λ in the medium of the PC layer 12.

Other configurations are the same as those of the first embodiment and its modified examples 1-4.

According to the 2D-PC surface emitting laser according to the fourth embodiment, the beam spread angle θ can be extended by making the size of the coupler region CP relatively smaller, while maintaining the size of the resonator region RP required for the J-point oscillation in that condition.

According to the fourth embodiment, there can be provided the 2D-PC surface emitting laser which can control the beam spread angle and shape of laser beams by using the coupler arrangements, while continuing the stable oscillation.

FIFTH EMBODIMENT

Figure 31A:
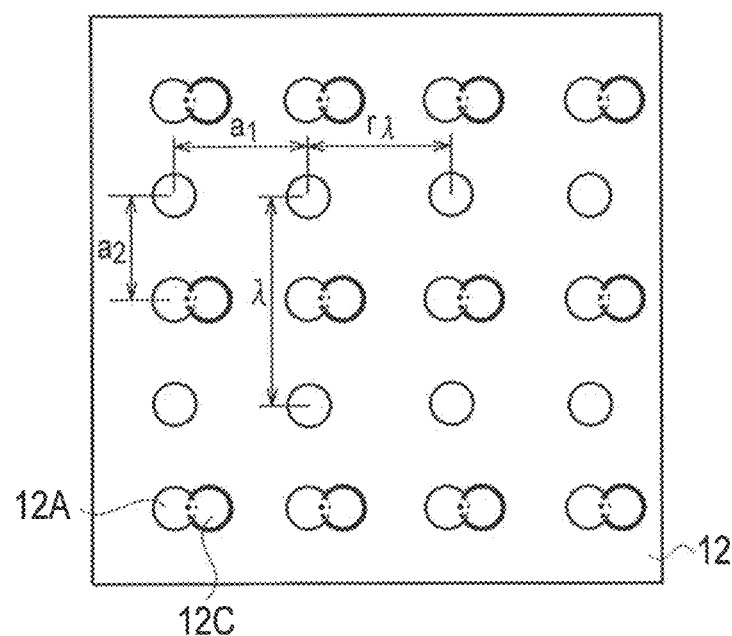
FIG. 31A is a schematic plane configuration diagram of lattice points for resonator and lattice points for coupler (an example of rectangle lattice arrangement) in a 2D-PC layer applied to the X-point oscillation, in a 2D-PC surface emitting laser according to a fifth embodiment.

As shown in FIG. 31A, a schematic plane configuration of the lattice points for resonator and the lattice points for coupler in the 2D-PC layer applied to the X-point oscillation is arranged in a rectangular lattice shape, in the 2D-PC surface emitting laser according to the fifth embodiment. Moreover, FIG. 31B shows a relationship between the normalized frequency (c/a) and the wave number vector, in the 2D-PC band structure corresponding to FIG. 31A.

In the 2D-PC surface emitting laser according to the fifth embodiment, an oscillation in the X-point band edge (near the region R shown in FIG. 31) in the photonic band structure of the PC layer for forming standing wave 12 is used, corresponding to an embodiment of the rectangular lattice (X-point oscillation).

Figure 31B:
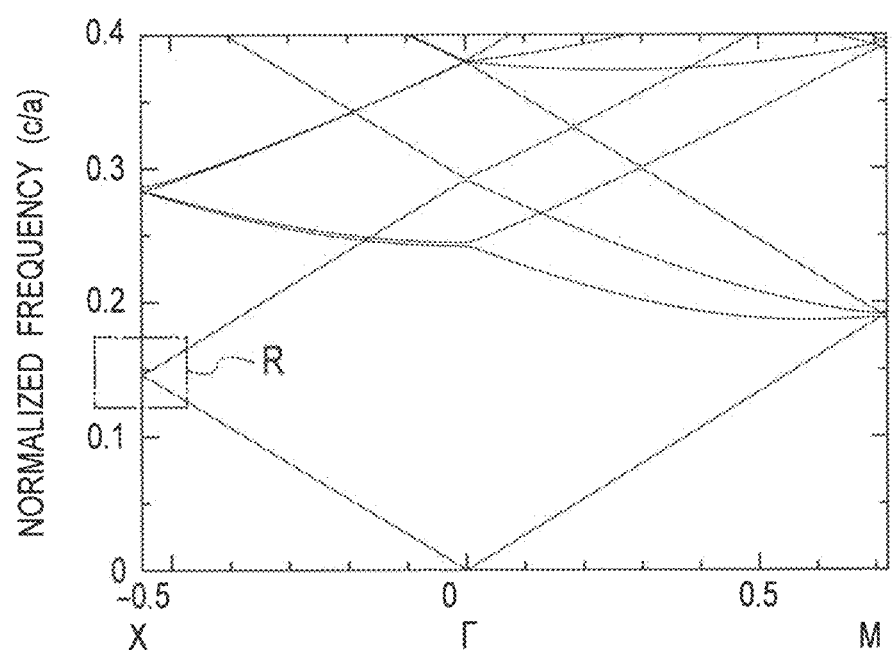
FIG. 31B is a diagram of 2D-PC band structure corresponding to FIG. 31A.

As shown in FIGS. 31A and 31B, the 2D-PC surface emitting laser according to the fifth embodiment includes: a PC layer for forming standing wave 12; a lattice point for resonator 12A arranged in the PC layer for forming standing wave 12, and configured so that a light wave in an X-point band edge in photonic band structure in the PC layer for forming standing wave 12 is diffracted in a plane of the PC layer for forming standing wave 12; and a lattice point for coupler 12C configured so that the light wave in the X-point band edge in the photonic band structure in the PC layer for forming standing wave 12 is diffracted in a surface vertical direction of the PC layer for forming standing wave 12.

In the 2D-PC surface emitting laser according to the fifth embodiment, the lattice point for resonator 12A is arranged in a first rectangular lattice shape having lattice constants $a_1$ and $a_2$ as shown in FIG. 31A, and the lattice point for coupler 12C is arranged in a second rectangular lattice shape differ from the first rectangular lattice shape. In the present embodiment, the lattice constants of the second rectangular lattice is equal to r-times the wavelength λ in the medium and to the wavelength λ in the medium, with respect to the aspect ratio $r=a_1/a_2$ (where $r \neq 1$) defined with the lattice constants $a_1$ and $a_2$ of the first rectangular lattice.

Other configurations are the same as those of the first embodiment and its modified examples 1-4.

According to the 2D-PC surface emitting laser according to the fifth embodiment, the beam spread angle $\theta_0$ can be extended by making the size of the coupler region CP relatively smaller, while maintaining the size of the resonator region RP required for the X-point oscillation in that condition.

According to the fifth embodiment, there can be provided the 2D-PC surface emitting laser which can control the beam spread angle and shape of laser beams by using the coupler arrangements, while continuing the stable oscillation.

SIXTH EMBODIMENT

Figure 32A:
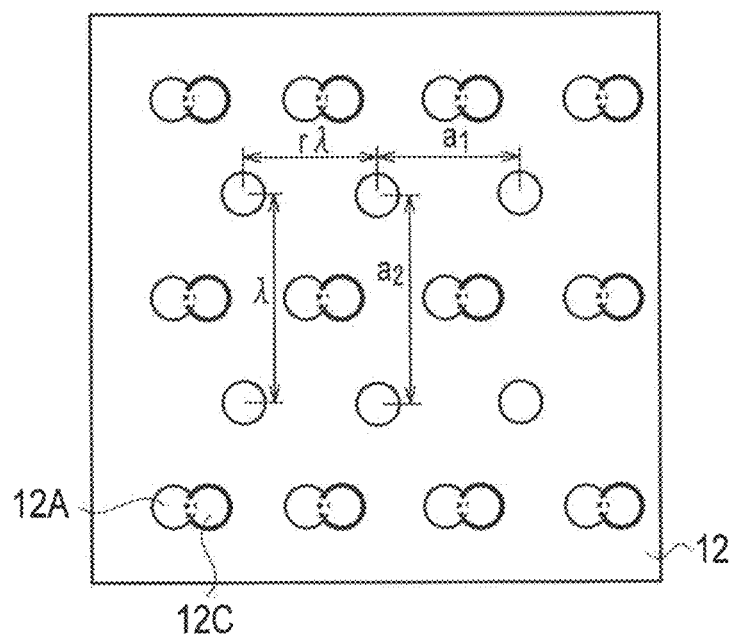
FIG. 32A is a schematic plane configuration diagram of lattice points for resonator and lattice points for coupler (an example of rhombic lattice arrangement) in a 2D-PC layer applied to the X-point oscillation, in a 2D-PC surface emitting laser according to a sixth embodiment.

As shown in FIG. 32A, a schematic plane configuration of the lattice points for resonator 12A and the lattice points for coupler 12C in the 2D-PC layer 12 applied to the X-point oscillation is arranged in a rhombic lattice shape, in the 2D-PC surface emitting laser according to the sixth embodiment. Moreover, FIG. 32B shows a relationship between the normalized frequency (c/a) and the wave number vector, in the 2D-PC band structure corresponding to FIG. 32A.

In the 2D-PC surface emitting laser according to the sixth embodiment, an oscillation in the X-point band edge (near the region R shown in FIG. 32) in the photonic band structure of the PC layer for forming standing wave 12 is used, corresponding to an embodiment of the rhombic lattice (X-point oscillation).

Figure 32B:
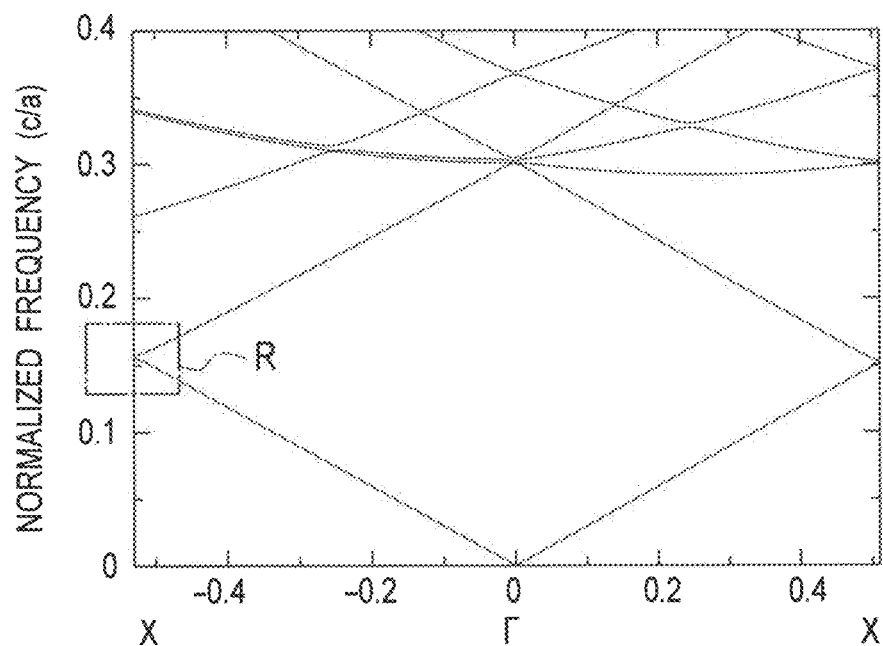
FIG. 32B is a diagram of 2D-PC band structure corresponding to FIG. 32A.

As shown in FIGS. 32A and 32B, the 2D-PC surface emitting laser according to the sixth embodiment includes: a PC layer for forming standing wave 12; a lattice point for resonator 12A arranged in the PC layer for forming standing wave 12, and configured so that a light wave in an X-point band edge in photonic band structure in the PC layer for forming standing wave 12 is diffracted in a plane of the PC layer for forming standing wave 12; and a lattice point for coupler 12C configured so that the light wave in the X-point band edge in the photonic band structure in the PC layer for forming standing wave 12 is diffracted in a surface vertical direction of the PC layer for forming standing wave 12.

In the 2D-PC surface emitting laser according to the sixth embodiment, the lattice point for resonator 12A is arranged in a face-centered rectangle lattice shape having lattice constants $a_1$ and $a_2$ as shown in FIG. 32A, and the lattice point for coupler 12C is arranged in a rectangular lattice shape. In the present embodiment, the lattice constants of the rectangular lattice is equal to r-times the wavelength λ in the medium and to the wavelength λ in the medium, with respect to the aspect ratio $r=a_1/a_2$ (where $r \neq 1$) defined with the lattice constants $a_1$ and $a_2$ of the face-centered rectangle lattice.

Other configurations are the same as those of the first embodiment and its modified examples 1-4.

According to the 2D-PC surface emitting laser according to the sixth embodiment, the beam spread angle $\theta_0$ can be extended by making the size of the coupler region CP relatively smaller, while maintaining the size of the resonator region RP required for the X-point oscillation in that condition.

According to the sixth embodiment, there can be provided the 2D-PC surface emitting laser which can control the beam spread angle and shape, while continuing the stable oscillation.

(Relationship Between Diameter $D_r$ of Lattice Point for Resonator 12A, and Diameter $D_c$ of Lattice Point for Coupler 12C)

Figure 33A:
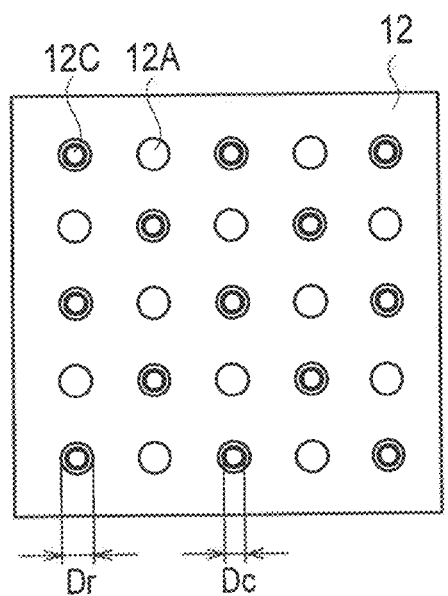
FIG. 33A shows an example of arrangement in the case where a diameter $D_r$ of the lattice points for resonator 12A differs from a diameter $D_c$ of the lattice points for coupler 12C, and shows in particular an example of being arranged so that $D_c <= D_r$ is satisfied at the same lattice position.
Figure 33B:
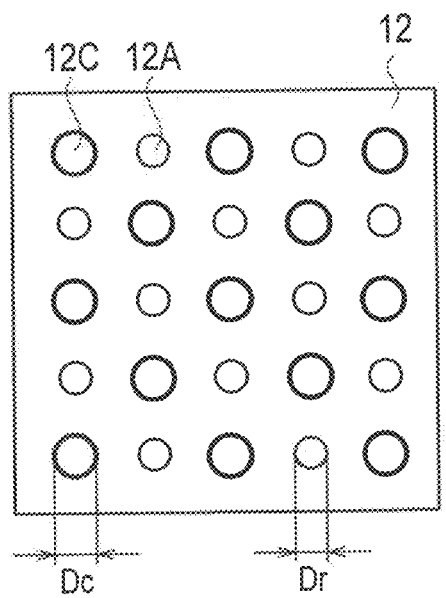
FIG. 33B shows an example of arrangement in the case where a diameter $D_r$ of the lattice points for resonator 12A differs from a diameter $D_c$ of the lattice points for coupler 12C, and shows in particular an example of being arranged so that $D_c > D_r$ is satisfied at the same lattice position.

FIG. 33A shows an example of arrangement in the case where a diameter $D_r$ of the lattice points for resonator 12A differs from a diameter $D_c$ of the lattice points for coupler 12C, and shows in particular an example of being arranged so that $D_c <= D_r$ is satisfied at the same lattice position, and FIG. 33B shows an example of being arranged so that $D_c > D_r$ is satisfied at the same lattice position.

The oscillation is possible also in any relationship between the diameter $D_r$ of the lattice point for resonator 12A and the diameter $D_c$ of the lattice point for coupler 12C.

However, as shown in FIG. 33A, if a hole of the lattice point for coupler 12C and a hole of the lattice point for resonator 12A overlap fully in the case of $D_c <= D_r$, it cannot function as a laser diode since the light cannot be extracted, although the resonance has occurred in the laser.

Moreover, the lattice point for resonator 12A and the lattice point for coupler 12C may have a circular shape as shown in FIG. 33B, and the diameter $D_c$ of the lattice point for coupler 12C may be formed larger than the diameter $D_r$ of the lattice point for resonator 12A.

On the other hand, in the case of forming respectively the lattice point for coupler 12C and the lattice point for resonator 12A in the different 2D-PC layers, there is no above-mentioned limitation.

In the 2D-PC surface emitting laser according to the first embodiment, the lattice point for resonator 12A and the lattice point for coupler 12C may have an arbitrary shape, and the lattice point for coupler 12C may be formed larger than the lattice point for resonator 12A.

FIGS. 33A and 33B show examples of the 2D-PC layer 12 applied to the M-point oscillation, and correspond to the 2D-PC surface emitting laser according to the first embodiment. However, the relationship between the diameter $D_r$ of the lattice point for resonator 12A and the diameter $D_c$ of the lattice point for coupler 12C is similarly satisfied in the second to sixth embodiments.

(Shape of Lattice Point (Hole))

Figure 34A:
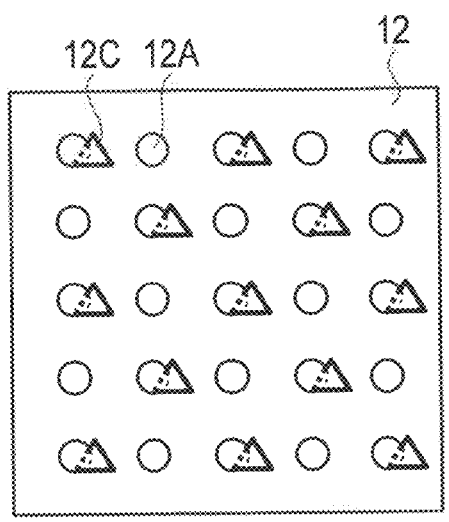
FIG. 34A shows an example of arrangement in the case where the shape of the lattice points for resonator 12A differs from the shape of the lattice points for coupler 12C, and shows in particular an example that the shape of the lattice points for resonator 12A is a circular shape, and the shape of the lattice points for coupler 12C is a triangular shape.
Figure 34B:
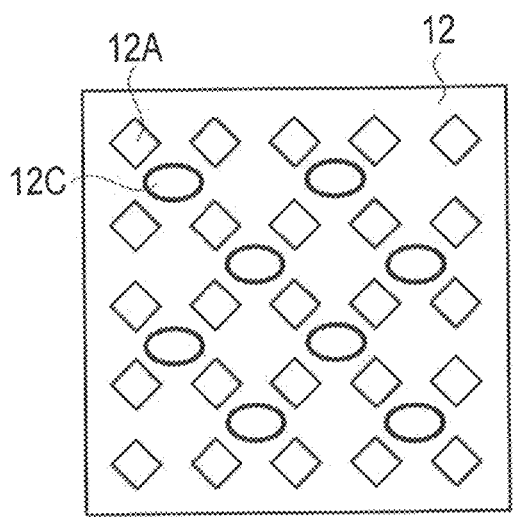
FIG. 34B shows an example of arrangement in the case where the shape of the lattice points for resonator 12A differs from the shape of the lattice points for coupler 12C, and shows in particular an example that the shape of the lattice points for resonator 12A is a rhombus, and the shape of the lattice point for coupler 12C is an ellipse.

In an example of arrangement in the case where the shape of the lattice points for resonator 12A differs from the shape of the lattice points for coupler 12C, FIG. 34A shows an example that the shape of the lattice points for resonator 12A is a circular shape, and the shape of the lattice points for coupler 12C is a triangular shape, and FIG. 34B shows an example of that the shape of the lattice points for resonator 12A is a rhombus, and the shape of the lattice point for coupler 12C is an ellipse.

The lattice point for resonator 12A and the lattice point for coupler 12C may have a shape of any one of a polygonal shape, circular shape, an ellipse, or an oval shape. In the present embodiment, the polygonal shape includes a triangle, a square, a pentagon, a hexagon, an octagon, and the like.

Moreover, the shape of the lattice point for coupler 12C and the shape of the lattice point for resonator 12A may differ from each other as follows. Moreover, a direction of the shape of the lattice point may be inclined. If the direction of the shape of the lattice point is inclined, the laser characteristics will be affected, e.g. the beam shape varies.

FIGS. 34A and 34B show examples of the 2D-PC layer 12 applied to the M-point oscillation, and correspond to the 2D-PC surface emitting laser according to the first embodiment. However, the relationship between the hole shape of the lattice point for resonator 12A and the hole shape of the lattice point for coupler 12C is similarly satisfied in the second to sixth embodiments.

As explained above, according to the embodiments of the present invention, there can be provided the 2D-PC surface emitting laser which can control the beam spread angle and shape of laser beams by using the coupler arrangements.

SEVENTH EMBODIMENT (Element Structure)

Figure 35:
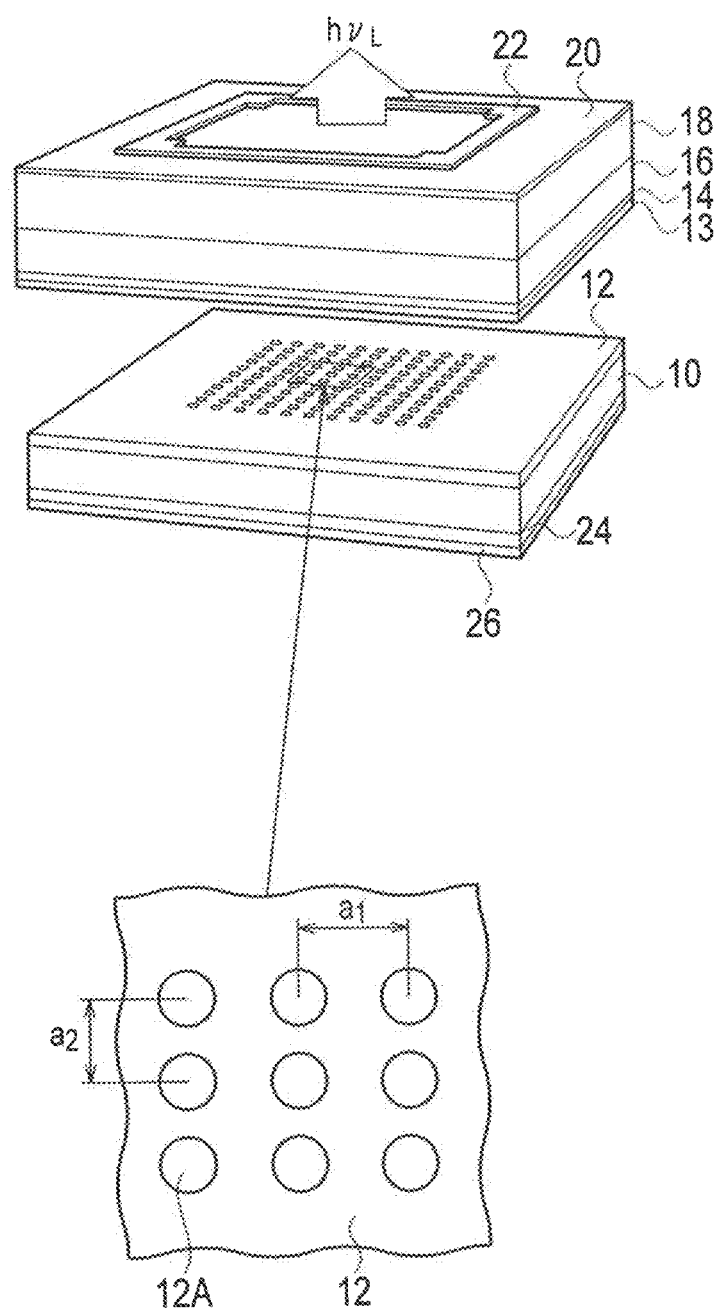
FIG. 35 is a schematic bird's-eye view structure diagram of a 2D-PC surface emitting laser according to a seventh embodiment.

FIG. 35 shows a schematic bird's-eye view structure of a 2D-PC surface emitting laser according to a seventh embodiment.

As shown in FIG. 35, the 2D-PC surface emitting laser according to the seventh embodiment includes: a PC layer for forming standing wave 12; and a lattice point for resonator 12A arranged in the PC layer for forming standing wave 12, and configured so that the light wave in the Γ-point (gamma-point) band edge in the photonic band structure in the PC layer for forming standing wave 12 is diffracted in the plane of the PC layer for forming standing wave 12, and is diffracted in a surface vertical direction of the PC layer for forming standing wave 12. In the present embodiment, the length of one side $a_1$ of the rectangular lattice is equal to the wavelength in the medium where the lattice constants of the rectangular lattice are $a_1$ and $a_2$.

Moreover, the aspect ratio $r=a1/a2$ defined with the lattice constants $a_1$ and $a_2$ may be set as $0.5 < r < 1.5$ (where $r \neq 1$).

Moreover, as shown in FIG. 35, the 2D-PC surface emitting laser according to the seventh embodiment includes: a substrate 24; a first cladding layer 10 disposed on the substrate 24; a second cladding layer 16 disposed on the first cladding layer 10; and an active layer 14 inserted between the first cladding layer 10 and the second cladding layer 16. In the present embodiment, the first cladding layer 10 may be formed of a p type semiconductor layer, and the second cladding layer 16 may be formed of an n type semiconductor layer. The electrical conductivity of the semiconductor layer may be reverse to each other.

As shown in FIG. 35, the 2D-PC surface emitting laser according to the seventh embodiment comprises: a contact layer 18 disposed on the second cladding layer 16; a window layer 20 disposed on a surface light emission region on the contact layer 18, and configured to extract a laser beam; a window-like upper electrode 22 disposed on the window layer 20; and a lower electrode 26 disposed on a back side surface of the substrate 24.

As shown in FIG. 35, the PC layer for forming standing wave 12 may be inserted between the first cladding layer 10 and the second cladding layer 16 so as to be adjacent to the active layer 14 in a surface vertical direction of the active layer 14. In the present embodiment, the active layer 14 may be formed of a multi-quantum well (MQW) layer, for example.

Moreover, as shown in FIG. 35, a carrier blocking layer 13 is inserted between the active layer 14 and the PC layer for forming standing wave 12 so that carriers may be effectively acquired in the active layer 14 composed of the MQW layer, and a carrier injection from the active layer 14 to the PC layer for forming standing wave 12 may be blocked. As materials of the 2D-PC surface emitting laser according to the seventh embodiment, the following materials are applicable, for example. That is, for example, GaInAsP/InP based materials are applicable in the case of wavelengths of 1.3 μm to 1.5 μm; InGaAs/GaAs based materials are applicable in the case of an infrared light with a wavelength of 900 nm; GaAlAs/GaAs based or GaInNAs/GaAs based materials are applicable in the case of an infrared light/near-infrared light with wavelengths of 800 to 900 nm; GaAlInAs/InP based materials are applicable in the case of wavelengths of 1.3 μm to 1.67 μm; AlGaInP/GaAs based materials are applicable in the case of a wavelength of 0.65 μm; and GaInN/GaN based materials are applicable in the case of a blue light.

Figure 36:
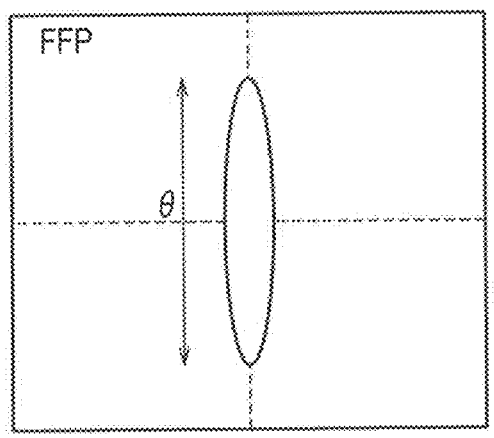
FIG. 36 shows an example of an FFP of vertically long beam structure emitted from the 2D-PC surface emitting laser according to the seventh embodiment.

FIG. 36 shows an example of an FFP of vertically long beam structure emitted from the 2D-PC surface emitting laser according to the seventh embodiment.

In the 2D-PC surface emitting laser according to the seventh embodiment, the length of one side of the rectangular lattice ($a_1 = \lambda$) being equal to the wavelength in the medium is introduced as PC lattice structure which can control the beam spread angle $\theta_0$ for emitting a line beam. It became possible to extend the beam spread angle $\theta_0$ by introducing such a rectangular lattice, while continuing the two-dimensional oscillation. If the beam spread angle $\theta_0$ is controllable, the range of applicability will widen, thereby improving the value as a beam scanning laser.

The relationship between the normalized frequencies [unit:c/a] and the wave number is similarly illustrated as FIG. 2, in the 2D-PC band structure applied to the 2D-PC surface emitting laser according to the seventh embodiment.

In the photonic band structure, a portion of which the inclination is 0 is called a band edge. In the band edge, the photonic crystal functions as an optical resonator, since a group velocity of light becomes 0 and then a standing wave is formed.

The 2D-PC surface emitting laser according to the seventh embodiment uses an oscillation in the $\Gamma$-point (gamma-point) band edge (near the region P shown in FIG. 2) in the photonic band structure of the PC layer for forming standing wave 12.

In the PC layer for forming standing wave 12, the lattice point for resonator 12A is applied to diffraction in the plane of the PC layer for forming standing wave 12, and is also applied to the diffraction to the surface vertical direction, in the $\Gamma$-point (gamma-point) band edge oscillation.

Figure 37A:
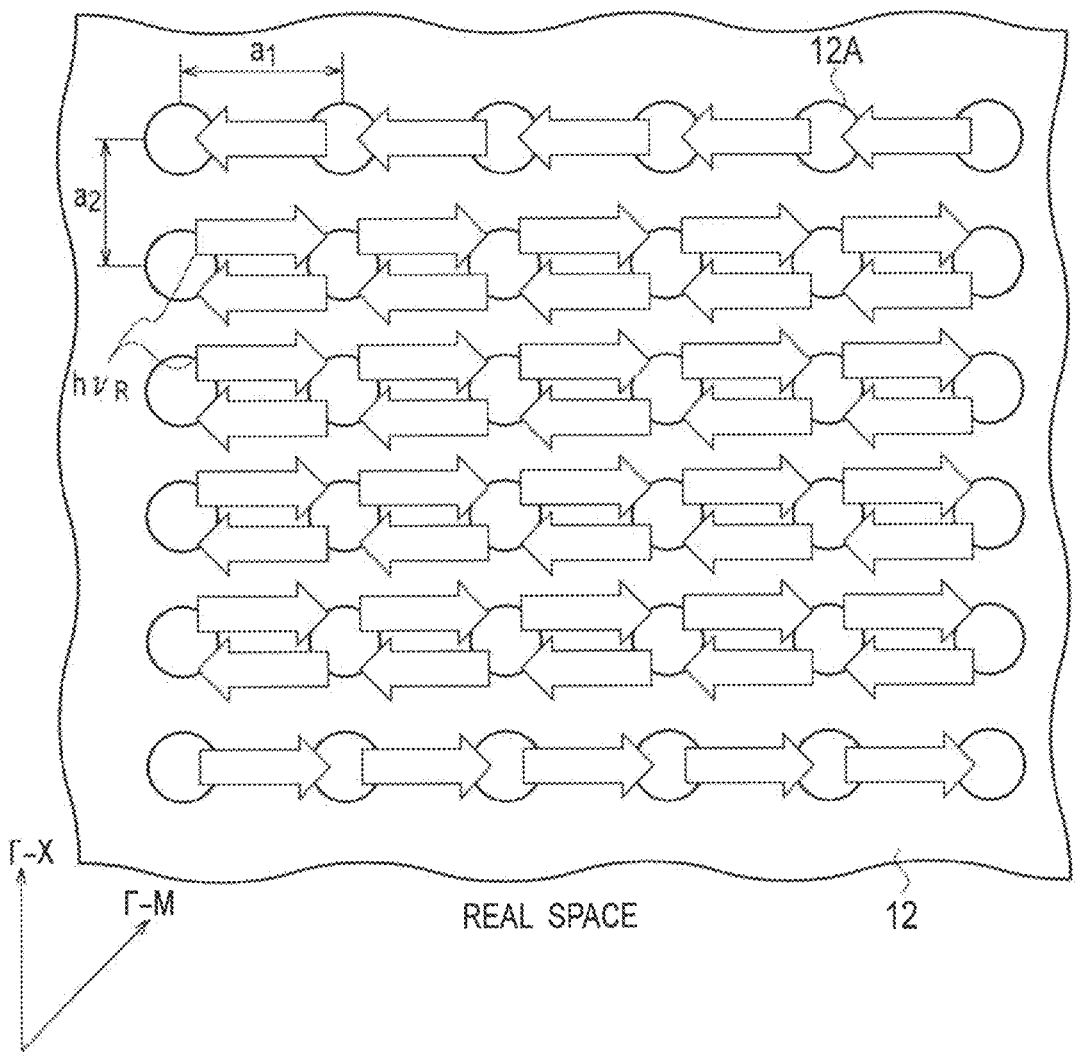
FIG. 37A is a schematic explanatory diagram of an in-plane resonant mode of a 2D-PC layer, in the 2D-PC surface emitting laser according to the seventh embodiment.

FIG. 37A shows a schematic explanatory diagram of the in-plane resonant mode in the $\Gamma$-point (gamma-point) oscillation of the 2D-PC layer 12, in the 2D-PC surface emitting laser according to the seventh embodiment. FIG. 37A shows an aspect that a two-dimensional large area resonator is formed by a multiplexed in-plane resonant mode using the lattice point for resonator 12A in 2D-PC layer 12 as a cavity.

Since the lattice point for resonator 12A has functions of both of the resonator and the coupler in the PC layer for forming standing wave 12, in the oscillation band edge using the $\Gamma$-point (gamma-point) band edge (near the region P shown in FIG. 3), the surface emission-type laser beam $h\nu_L$ can be extracted in the surface vertical direction of the PC layer for forming standing wave 12, while maintaining the configuration shown in FIG. 37A.

In addition, the 2D-PC surface emitting laser according to the seventh embodiment can operate in a single mode stable in a large area. More specifically, in the 2D-PC surface emitting laser according to the seventh embodiment, the single mode is maintainable also in a large area since electromagnetic field distribution is defined by the two-dimensional periodic structure composed of the lattice point for resonator 12A formed in the PC layer for forming standing wave 12. Accordingly, ii is easy to perform processing for collecting a watt-class output laser light into one small point through a lens.

For example, in FIG. 35, the sizes of the PC layer for forming standing wave 12 are approximately 700 µm×approximately 700 µm.

Figure 37B:
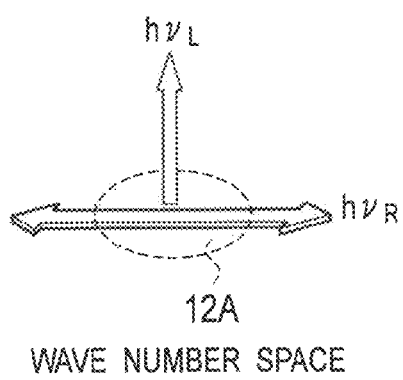
FIG. 37B is a schematic diagram of a surface emission-type laser beam $hv_L$ and an intracavity laser beam $hv_R$ both which are emitted, in the 2D-PC surface emitting laser according to the seventh embodiment.

The surface emission-type laser beam $h\nu_L$ and the intracavity laser beam $h\nu_R$ which are emitted are illustrated as shown in FIG. 37B. The surface emission-type laser beam $h\nu_L$ is emitted in the vertical direction with respect to the PC layer 12 as a plurality of waves of the intracavity laser beam $h\nu_R$ in the plane of the PC layer 12 is coupled and resonated.

Figure 38:
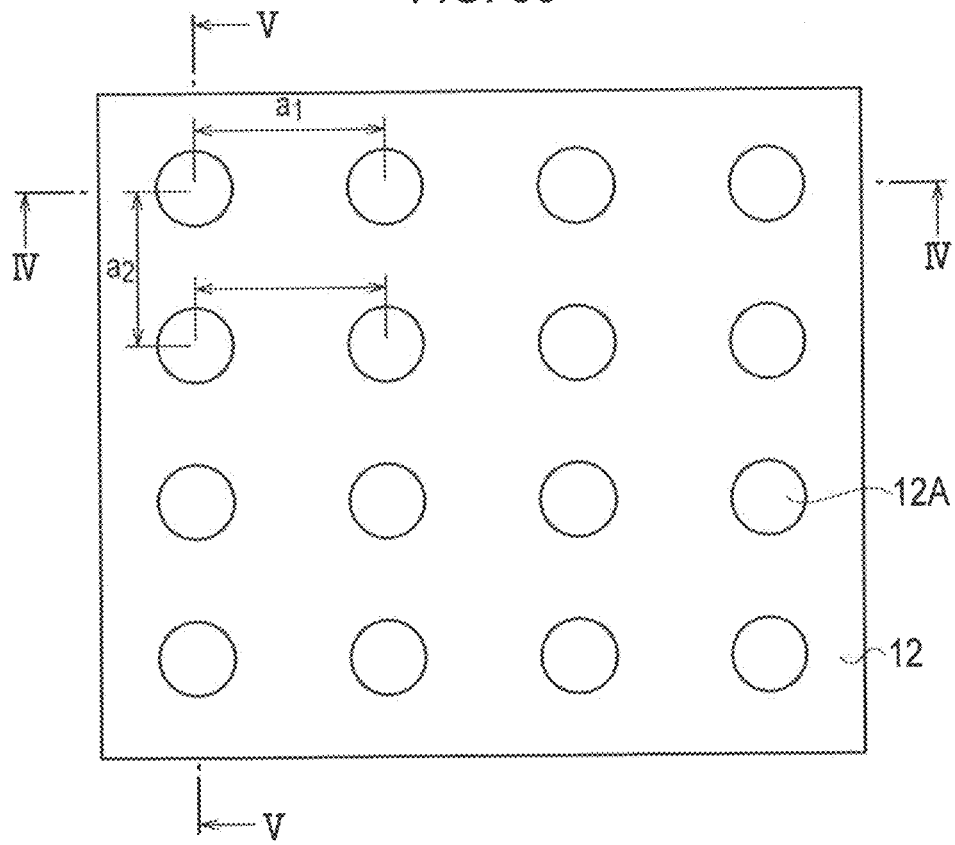
FIG. 38 is a schematic plane configuration diagram of lattice points for resonator (an example of rectangle lattice arrangement) in a 2D-PC layer applied to a Γ-point (gamma-point) oscillation, in the 2D-PC surface emitting laser according to the seventh embodiment.

In the 2D-PC surface emitting laser according to the seventh embodiment, the lattice points for resonator 12A of the 2D-PC layer 12 applied to the $\Gamma$-point (gamma-point) oscillation are arranged in a rectangular lattice shape of which the lattice constants are $a_1$ and $a_2$, as shown in FIG. 38. In the present embodiment, the length of one side $a_1$ of the rectangular lattice is equal to the wavelength $\lambda$ in the medium.

Figure 39A:
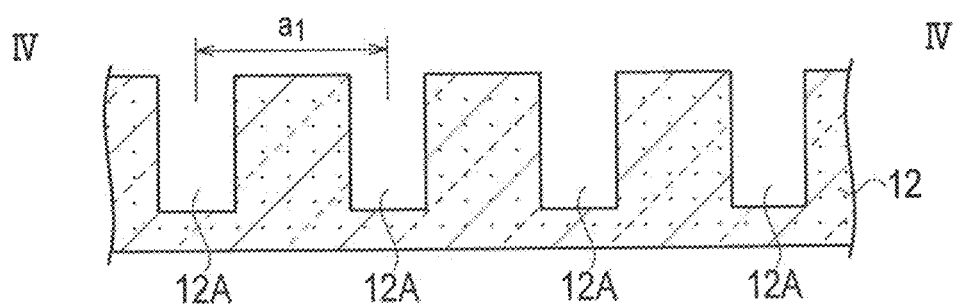
FIG. 39A is a schematic cross-sectional structure diagram taken in the line IV-IV of FIG. 38.
Figure 39B:
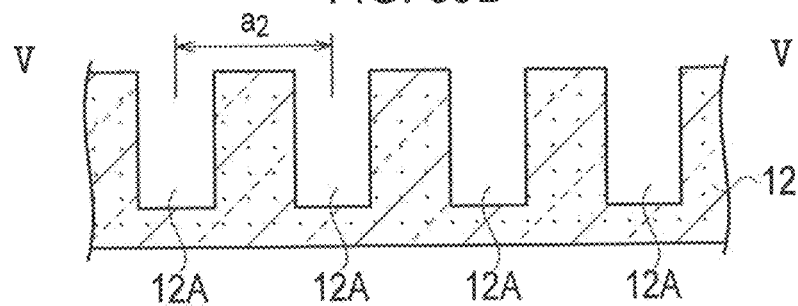
FIG. 39B is a schematic cross-sectional structure diagram taken in the line V-V of FIG. 38.

Moreover, FIG. 39A illustrates a schematic cross-sectional structure taken in the line I-I of FIG. 38, and FIG. 39B shows a schematic cross-sectional structure taken in the line II-II of FIG. 38.

In the 2D-PC surface emitting laser according to the seventh embodiment, the lattice point for resonator 12A in the 2D-PC layer 12 applied to the $\Gamma$-point (gamma-point) oscillation can be formed as a hole, as shown in FIGS. 39A and 39B.

Moreover, the diameter and the depth of the lattice point for resonator 12A currently made as an experiment are respectively approximately 120 nm and approximately 115 nm, for example, and the pitch thereof is approximately 280 nm, for example. Such numerical examples can be appropriately modified in accordance with materials composing the substrate 10 and the active layer 14, materials of the 2D-PC layer 12, a wavelength in the medium, etc.

For example, in the 2D-PC surface emitting laser according to the seventh embodiment to which GaAs/AlGaAs based materials are applied, the wavelength $\lambda$ in the medium of the 2D-PC layer 12 is from approximately 200 nm to approximately 300 nm, and output laser light wavelengths are from approximately 900 nm to approximately 915 nm.

In addition, the lattice point for resonator 12A may be filled up with a semiconductor layer differing in the refractive index, for example, instead of being formed as an air hole. For example, the lattice point may be formed by filling up a GaAs layer with an AlGaAs layer.

For example, during a fabricating process for welding the 2D-PC layer 12, if the hole shape of the lattice point for resonator 12A and the lattice point for coupler 12C becomes deformed, it is effective to fill up with the semiconductor layers differing in the refractive index in order to avoid such a deformation.

Figure 40:
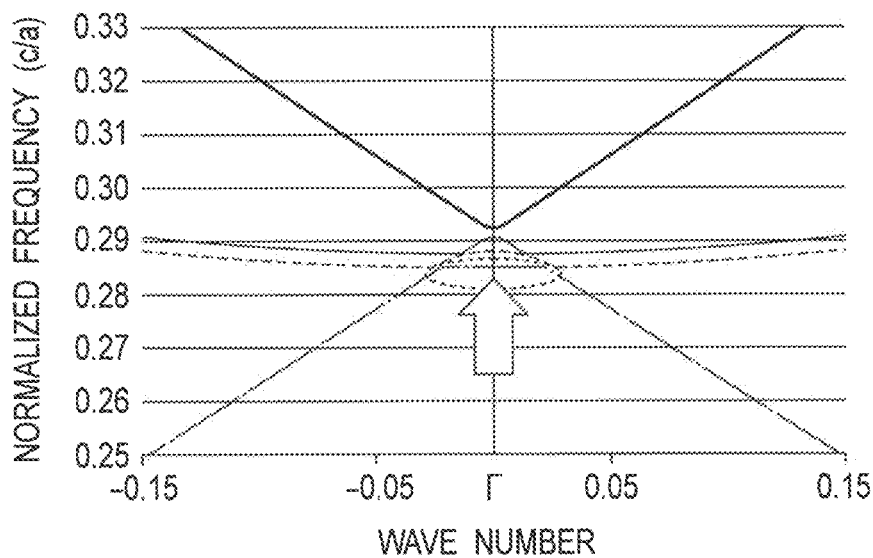
FIG. 40 shows a diagram showing a relationship between normalized frequencies (c/a) and the wave number in band structure in the case of an aspect ratio r=1.015 in the rectangular lattice Γ-point (gamma-point) oscillation, in the 2D-PC surface emitting laser according to the seventh embodiment.

FIG. 40 shows a diagram showing the relationship between the normalized frequencies (c/a) and the wave number, in the band structure in the case of the aspect ratio r=1.015 in the rectangular lattice $\Gamma$-point (gamma-point) oscillation, in the 2D-PC surface emitting laser according to the seventh embodiment.

Figure 41:
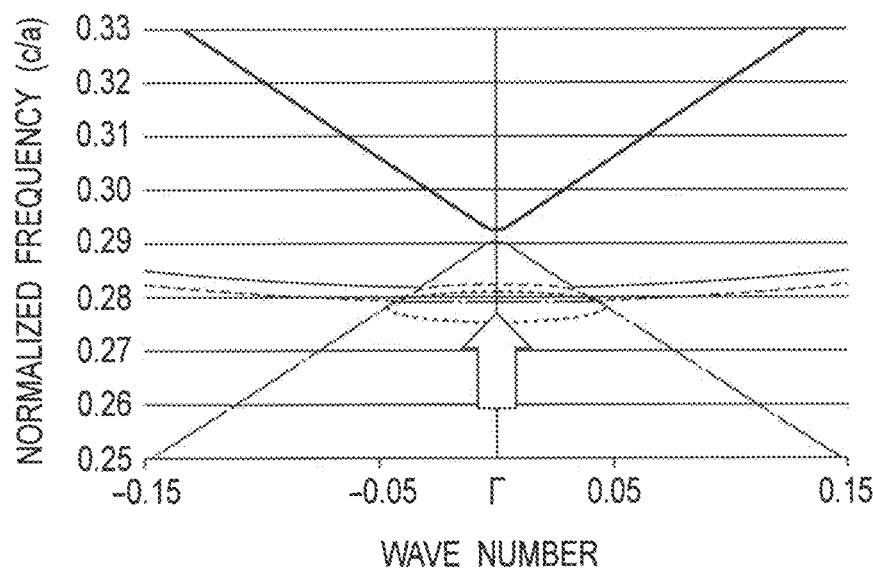
FIG. 41 shows a diagram showing the relationship between normalized frequencies (c/a) and the wave number in the band structure in the case of the aspect ratio r=1.03 in the rectangular lattice Γ-point (gamma-point) oscillation, in the 2D-PC surface emitting laser according to the seventh embodiment.
Figure 42:
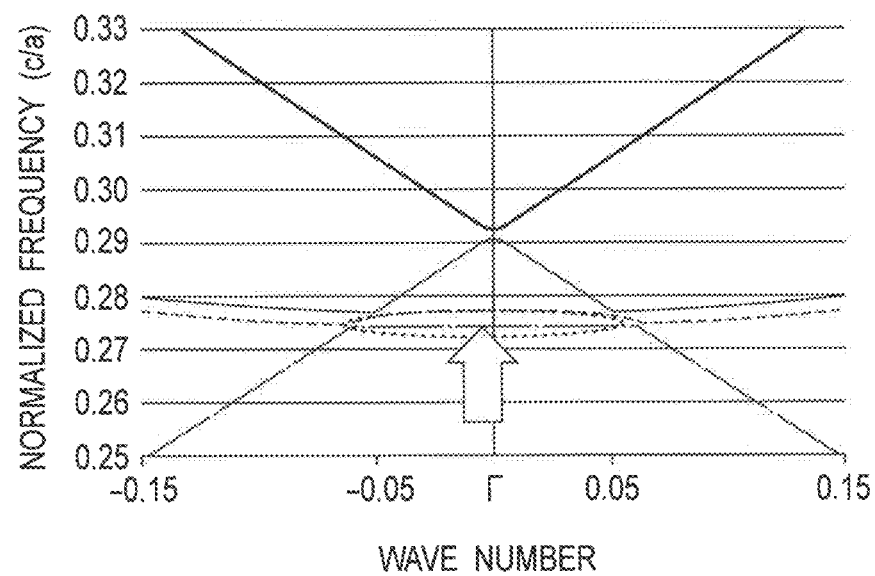
FIG. 42 shows a diagram showing the relationship between normalized frequencies (c/a) and the wave number in the band structure in the case of the aspect ratio r=1.045 in the rectangular lattice Γ-point (gamma-point) oscillation, in the 2D-PC surface emitting laser according to the seventh embodiment.

Moreover, FIG. 41 shows a band structure in the case of the aspect ratio r=1.03 in the rectangular lattice $\Gamma$-point (gamma-point) oscillation, and FIG. 42 shows a band structure in the case of the aspect ratio r=1.045 in the rectangular lattice $\Gamma$-point (gamma-point) oscillation.

In the 2D-PC surface emitting laser according to the seventh embodiment, as shown with the arrow in FIGS. 40-42, the rectangular lattice $\Gamma$-point (gamma-point) oscillation has a spread of the wave number k, and the spread of the wave number k can be controlled with a value of the aspect ratio r ($=a_1/a_2$) (where r≠1). More specifically, since the wave number k corresponds to a radiation angle, and thereby the beam spread angle $\theta_0$ can be controlled.

Figure 43:
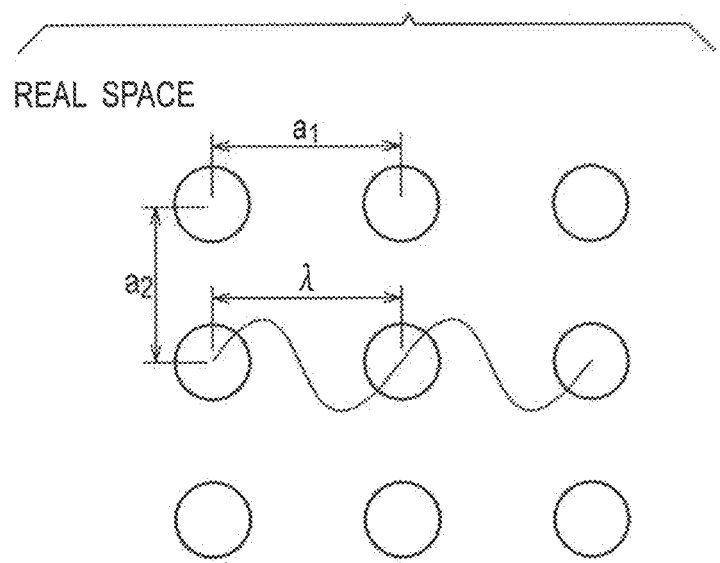
FIG. 43 shows real space of the lattice points of the rectangular lattice for resonator, in the 2D-PC surface emitting laser according to the seventh embodiment.
Figure 44:
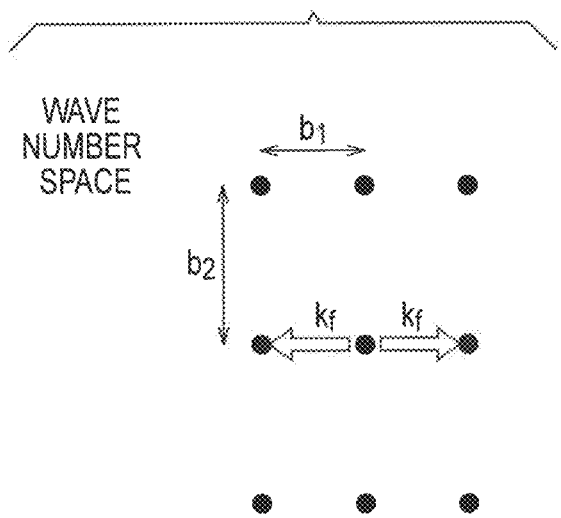
FIG. 44 shows wave number space of the lattice points of the rectangular lattice for resonator, in the 2D-PC surface emitting laser according to the seventh embodiment.

In the 2D-PC surface emitting laser according to the seventh embodiment, FIG. 43 shows the real space of the lattice point for resonator 12A of the rectangular lattice, and FIG. 44 shows the wave number space of the rectangular lattice.

In FIG. 43, the lattice constant $a_1$ is equal to the wavelength $\lambda$ in the medium of the 2D-PC layer 12, and the aspect ratio r is $a_1/a_2$ (where r≠1). Moreover, in FIG. 44, $b_1=2\pi/a_1$ and $b_2=2\pi/a_2$ are satisfied, and $k_f$ denotes the wave number vector of the fundamental wave.

In the 2D-PC surface emitting laser according to the seventh embodiment, the wavelength of the resonant mode needs to overlap with a gain peak of the active layer 14 in order to perform the Γ-point (gamma-point) oscillation of the lattice point for resonator 12A of the rectangular lattice in the 2D-PC layer 12. More specifically, in the Γ-point (gamma-point), since the wave number $k_f$ of the fundamental wave corresponds to the central wavelength ($\lambda_{PC}$) in the medium of the active layer gain, the relationship expressed with the following equation is obtained.

$$k_f=|b_1|=|(2\pi/a_1,0)|2\pi/a_1=2\pi/\lambda_{PC} \quad (1)$$

Therefore, the relationship between the lattice constant $a_1$ and the central wavelength $\lambda_{PC}$ are given with the following equation.

$$a_1=\lambda_{PC}=\lambda_{air}/n_{eff} \quad (2)$$

In the 2D-PC surface emitting laser according to the seventh embodiment, the central wavelength of the active layer in the air is $\lambda_{air}$=940 nm, and the effective refractive index $n_{eff}$=3.4.

(Experimental Result)

Figure 45:
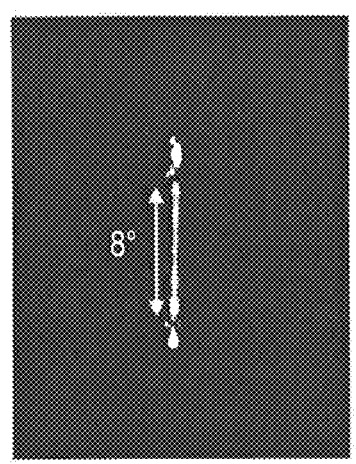
FIG. 45 shows a measurement experiment result of an FFP in the case of the aspect ratio r=1.015 in the rectangular lattice Γ-point (gamma-point) oscillation, in the 2D-PC surface emitting laser according to the seventh embodiment.
Figure 46:
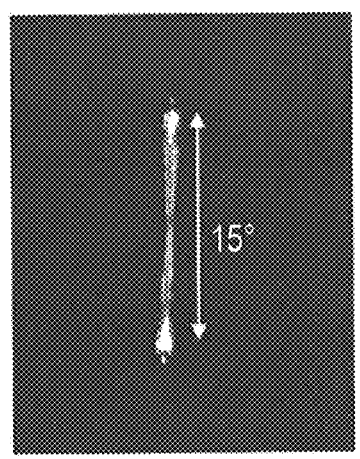
FIG. 46 shows a measurement experiment result of an FFP in the case of the aspect ratio r=1.03 in the rectangular lattice Γ-point (gamma-point) oscillation, in the 2D-PC surface emitting laser according to the seventh embodiment.
Figure 47:
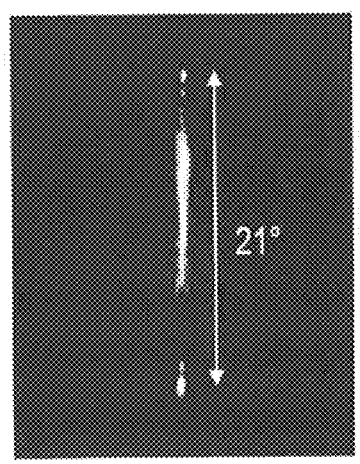
FIG. 47 shows a measurement experiment result of an FFP in the case of the aspect ratio r=1.045 in the rectangular lattice Γ-point (gamma-point) oscillation, in the 2D-PC surface emitting laser according to the seventh embodiment.

In the 2D-PC surface emitting laser according to the seventh embodiment, FIG. 45 shows a measurement experiment result of an FFP in the case of the aspect ratio r=1.015 in the rectangular lattice Γ-point (gamma-point) oscillation, FIG. 46 shows a measurement experiment result of an FFP in the case of the aspect ratio r=1.03 in the rectangular lattice Γ-point (gamma-point) oscillation, and FIG. 47 shows a measurement experiment result of an FFP in the case of the aspect ratio r=1.045 in the rectangular lattice Γ-point (gamma-point) oscillation.

In the 2D-PC surface emitting laser according to the seventh embodiment, as shown in the arrows in FIGS. 45-47, the beam spread angles $\theta_0$ of 8°, 15°, and 21° are respectively obtained.

In the 2D-PC surface emitting laser according to the seventh embodiment, the beam spread angle $\theta_0$ of the rectangular lattice Γ-point (gamma-point) oscillation can be controlled with the value of the aspect ratio r ($=a_1/a_2$) (where r≠1) as shown in FIGS. 45-47. In particular, the longitudinal beam spread angle can be controlled with the value of the aspect ratio r ($=a_1/a_2$) (where r≠1) of the rectangular lattice.

Figure 48A:
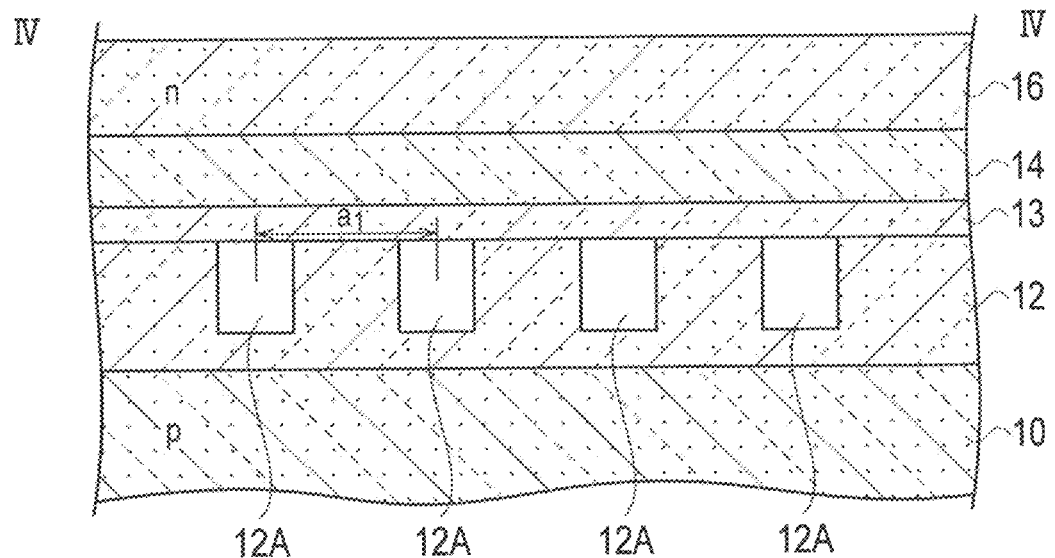
FIG. 48A is a schematic cross-sectional structure diagram of the 2D-PC surface emitting laser according to the seventh embodiment taken in the line IV-IV of FIG. 38.
Figure 48B:
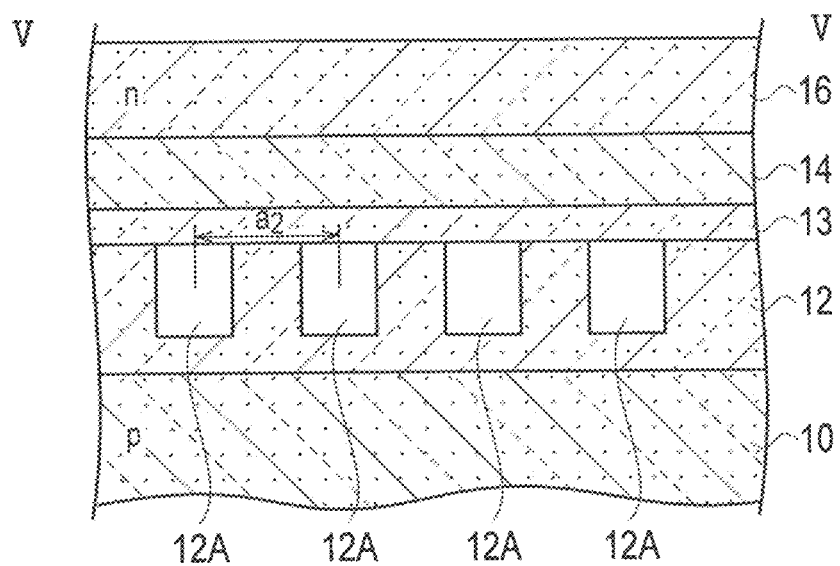
FIG. 48B is a schematic cross-sectional structure diagram of the 2D-PC surface emitting laser according to the seventh embodiment taken in the line V-V of FIG. 38.

FIG. 48A shows a schematic cross-sectional structure of the 2D-PC surface emitting laser according to the seventh embodiment taken in the line I-I of FIG. 38, and FIG. 48B shows a schematic cross-sectional structure of the 2D-PC surface emitting laser according to the seventh embodiment taken in the line I-I of FIG. 38.

More specifically, as shown in FIGS. 48A and 48B, the 2D-PC surface emitting laser according to the seventh embodiment includes: a substrate (reference numeral 24 in FIG. 1); a first cladding layer 10 disposed on the substrate (24); a second cladding layer 16 disposed on the first cladding layer 10; and an active layer 14 inserted between the first cladding layer 10 and the second cladding layer 16, wherein the PC layer for forming standing wave 12 may be inserted between the first cladding layer 10 and the active layer 14 so as to be adjacent to the active layer 14 in the surface vertical direction of the active layer 14. Moreover, as shown in FIGS. 48A and 48B, a carrier blocking layer 13 may be inserted between the PC layer for forming standing wave 12 and the active layer 14.

(Modified Example)

Figure 49A:
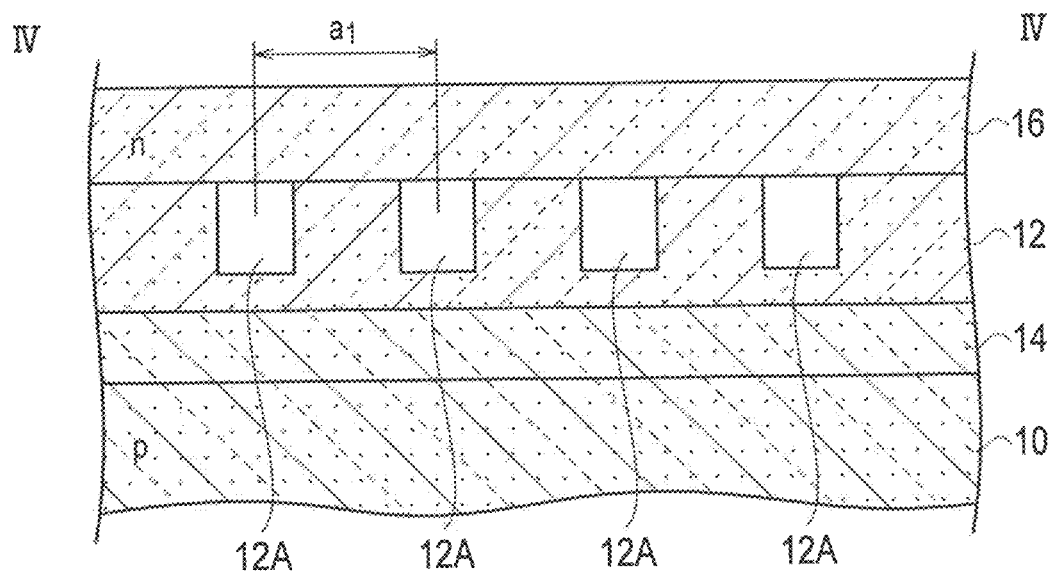
FIG. 49A is a schematic cross-sectional structure diagram of a 2D-PC surface emitting laser according to a modified example of the seventh embodiment taken in the line IV-IV of FIG. 38.
Figure 49B:
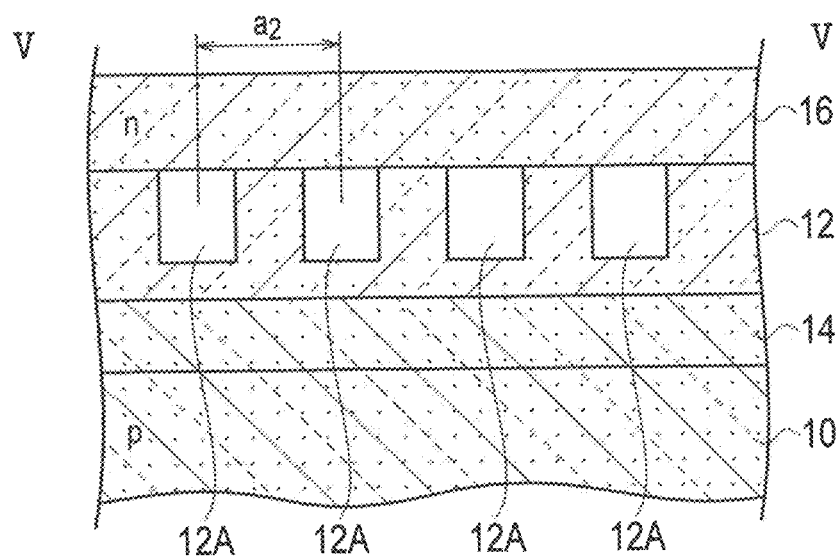
FIG. 49B is a schematic cross-sectional structure diagram of the 2D-PC surface emitting laser according to the modified example of the seventh embodiment taken in the line V-V of FIG. 38.

FIG. 49A shows a schematic cross-sectional structure of the 2D-PC surface emitting laser according to an modified example of the seventh embodiment taken in the line I-I of FIG. 38, and FIG. 49B shows a schematic cross-sectional structure taken in the line II-II of FIG. 38.

More specifically, in the 2D-PC surface emitting laser according to the modified example of the seventh embodiment, the PC layer for forming standing wave 12 may be inserted between the second cladding layer 16 and the active layer 14 so as to be adjacent to the active layer 14 in the surface vertical direction of the active layer 14, as shown in FIGS. 49A and 49B.

According to the seventh embodiment and its modified example, there can be provided the 2D-PC surface emitting laser emitting the line beam.

According to the seventh embodiment and its modified example, there can be provided the 2D-PC surface emitting laser of which the beam spread angle of the Γ-point (gamma-point) oscillation can be controlled with the aspect ratio of the rectangular lattice.

EIGHTH EMBODIMENT

In the same manner as FIG. 35, a 2D-PC surface emitting laser according to an eighth embodiment includes: a substrate 24; a first cladding layer 10 disposed on the substrate 24; a second cladding layer 16 disposed on the first cladding layer 10; and an active layer 14 inserted between the first cladding layer 10 and the second cladding layer 16.

Furthermore, in the same manner as FIG. 35, the 2D-PC surface emitting laser according to the eighth embodiment includes: a contact layer 18 arranged on the second cladding layer 16; a window layer 20 disposed on a surface light emission region on the contact layer 18, and configured to extract a laser beam; a window-like upper electrode 22 disposed on the window layer 20; and a lower electrode 26 disposed on a back side surface of the substrate 24.

In the same manner as FIG. 35, the PC layer for forming standing wave 12 may be inserted between the first cladding layer 10 and the second cladding layer 16 so as to be adjacent to the active layer 14 in a surface vertical direction of the active layer 14. In the present embodiment, the active layer 14 may be formed of an MQW layer, for example.

Furthermore, in the same manner as FIG. 35, a carrier blocking layer 13 is inserted between the active layer 14 and the PC layer for forming standing wave 12 so that carriers may be effectively acquired in the active layer 14 composed of the MQW layer, and a carrier injection from the active layer 14 to the PC layer for forming standing wave 12 may be blocked. As materials of the 2D-PC surface emitting laser according to the eighth embodiment, the following materials are applicable, for example. That is, for example, GaInAsP/InP based materials are applicable in the case of wavelengths of 1.3 μm to 1.5 μm; InGaAs/GaAs based materials are applicable in the case of an infrared light with a wavelength of 900 nm; GaAlAs/GaAs based or GaInNAs/GaAs based materials are applicable in the case of an infrared light/near-infrared light with wavelengths of 800 to 900 nm; GaAlInAs/InP based materials are applicable in the case of wavelengths of 1.3 μm to 1.67 μm; AlGaInP/GaAs based materials are applicable in the case of a wavelength of 0.65 μm; and GaInN/GaN based materials are applicable in the case of a blue light.

An example of FFP of vertically long beam structure emitted from the 2D-PC surface emitting laser according to the eighth embodiment is the same as that of FIG. 36.

In the 2D-PC surface emitting laser according to the eighth embodiment, the length of one side of the rectangular lattice ($a_1=\lambda/2$) being equal to ½ the wavelength in the medium is introduced as PC lattice structure which can control the beam spread angle $\theta_0$ for emitting a line beam.

The 2D-PC surface emitting laser according to the eighth embodiment uses light waves in the X-point band edge of the photonic band structure.

In the light wave in the X-point band edge, although the periodic structure of the photonic crystal has only a function of standing wave form for the oscillation, the light can be extracted by disposing periodic structure (coupler) for diffracting the light in the same plane as the periodic structure. It became possible to extend the beam spread angle $\theta_0$ by introducing such a rectangular lattice, while continuing the two-dimensional oscillation. If the beam spread angle $\theta_0$ is controllable, the range of applicability will widen, thereby improving the value as a beam scanning laser.

Figure 50:
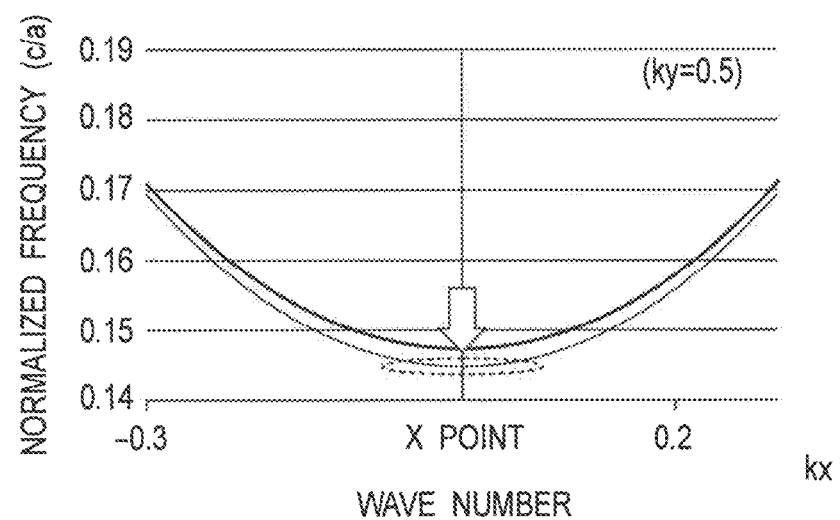
FIG. 50 shows a diagram showing the relationship between normalized frequencies (c/a) and the wave number in the band structure in the rectangular lattice X-point oscillation, in a 2D-PC surface emitting laser according to a eighth embodiment.

FIG. 50 shows the relationship between the normalized frequencies (c/a) and the wave number in the band structure in the rectangular lattice X-point oscillation, in the 2D-PC surface emitting laser according to the eighth embodiment.

Figure 51:
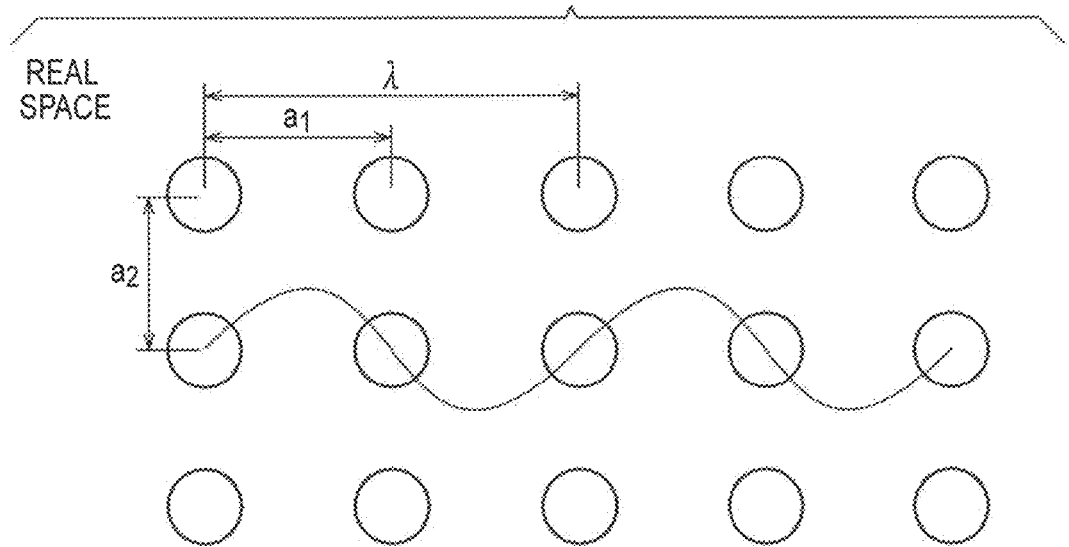
FIG. 51 shows real space of the lattice points of the rectangular lattice for resonator, in the 2D-PC surface emitting laser according to the eighth embodiment.
Figure 52:
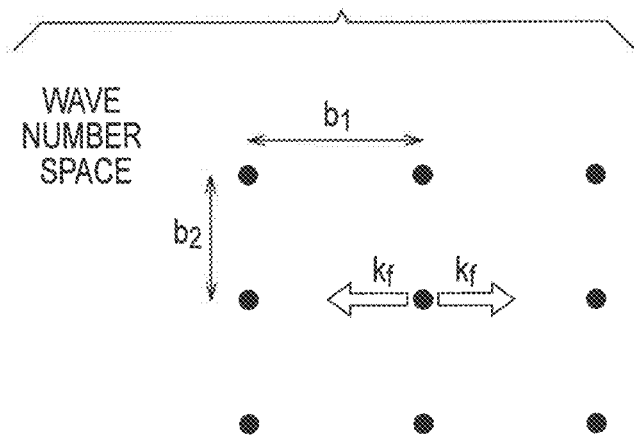
FIG. 52 shows wave number space of the lattice points of the rectangular lattice for resonator, in the 2D-PC surface emitting laser according to the eighth embodiment.

In the 2D-PC surface emitting laser according to the eighth embodiment, FIG. 51 shows the real space of the lattice point of the rectangular lattice for resonator, and FIG. 52 shows the wave number space of the rectangular lattice for resonator.

In FIG. 51, the lattice constant $a_1$ is equal to ½ the wavelength λ in the medium of the 2D-PC layer 12, and the aspect ratio $r=a_1/a_2$ (where $r\neq 1$). Moreover, in FIG. 52, $b_1=2\pi/a_1$ and $b_2=2\pi/a_2$ are satisfied, and $k_f$ denotes the wave number vector of the fundamental wave.

In the 2D-PC surface emitting laser according to the eighth embodiment, in order to perform the X-point oscillation of the lattice point for resonator 12A of the rectangular lattice in the 2D-PC layer 12, the wavelength of the resonant mode needs to overlap with a gain peak of the active layer 14. More specifically, in the rectangular lattice X-point, since the wave number $k_f$ of the fundamental wave corresponds to the central wavelength ($\lambda_{PC}$) in the medium of the active layer gain, the relationship expressed with the following equation is obtained.

$$k_f=|\tfrac{1}{2}\cdot b_1|=|\tfrac{1}{2}\cdot(2\pi/a_1,0)|\pi/a_1=2\pi/\lambda_{PC} \quad (3)$$

Therefore, the relationship between the lattice constant $a_1$ and the central wavelength $\lambda_{PC}$ are given with the following equation.

$$a_1=\tfrac{1}{2}\cdot\lambda_{PC}=\tfrac{1}{2}\cdot\lambda_{air}/n_{eff} \quad (4)$$

On the other hand, the PC structure for light-emitting forms two-dimensional lattice structure so that there is a reciprocal lattice vector $k_{G\uparrow}$ in which the size $|k_\uparrow+k_{G\uparrow}|$ of a light wave number vector $k_T$ amplified by the PC structure for forming standing wave and a wave number vector $\Delta k_\uparrow=k_\uparrow+k_{G\uparrow}$ which is the sum of the reciprocal lattice vector $k_{G\uparrow}$ in the PC structure for light-emitting becomes smaller than $|k_\uparrow|/n_{eff}$, in the reciprocal lattice vector k space.

In this case, the wave number vector $\Delta k_\uparrow$ expresses a wave number vector after the light having the wave number vector $k_\uparrow$ is diffracted in the PC structure for light-emitting (i.e., the direction of the wave number vector is changed).

Thus, the light amplified in the PC structure for forming standing wave is diffracted in the PC structure for light-emitting, and the wave number vector $\Delta k_\uparrow$ of the diffracted light exists in the light cone.

Therefore, the light in the 2D-PC layer is emitted to outside, without generating the total reflection in the interface between the 2D-PC layer and the outside, and thereby the laser beam is obtained. In that case, since the wave number component in a direction parallel to the 2D-PC layer is continued in the above-mentioned interface, the laser beam is emitted at vertical to the 2D-PC layer if the size $|\Delta k_\uparrow|$ of the wave number vector of the scattered light is 0. In the case of $|\Delta k_\uparrow|$ is non-zero, an inclined beam having an inclined angle corresponding to the size and the direction of the wave number vector $\Delta k_\uparrow$ of the scattered light is obtained.

Figure 53:
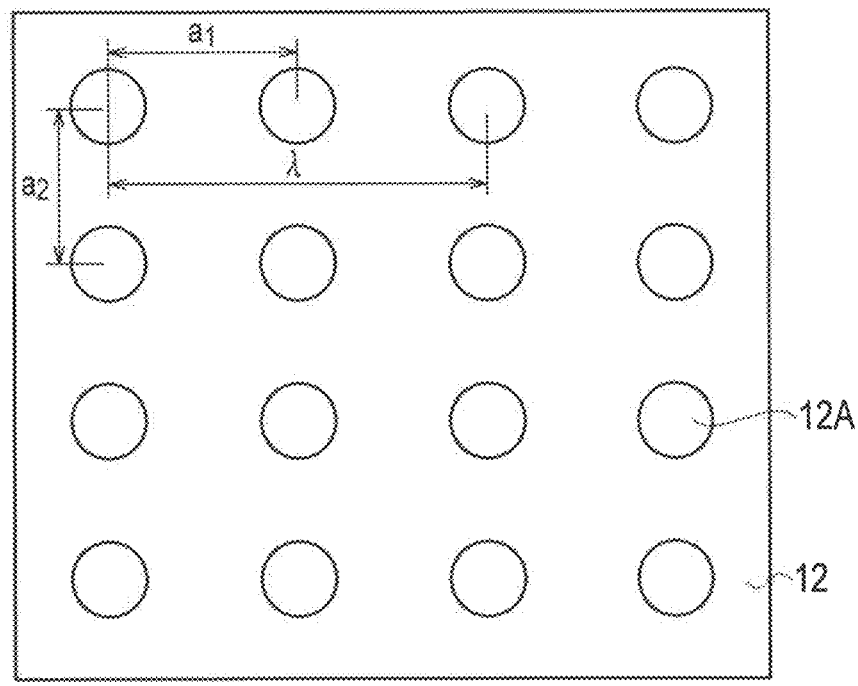
FIG. 53 is a schematic plane configuration diagram of the lattice points for resonator (an example of rectangle lattice arrangement) in the 2D-PC layer applied to the X-point oscillation, in the 2D-PC surface emitting laser according to the eighth embodiment.

In the 2D-PC surface emitting laser according to the eighth embodiment, the lattice points for resonator 12A of the 2D-PC layer 12 applied to the X-point oscillation is arranged in a rectangular lattice shape, as shown in FIG. 53.

Figure 54:
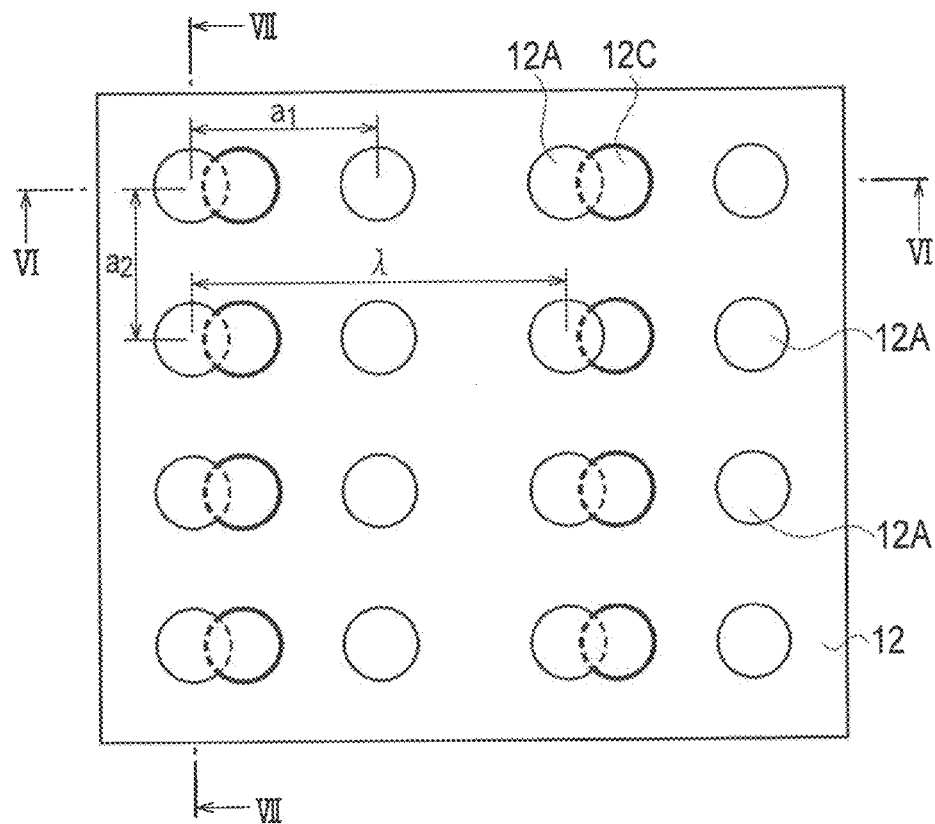
FIG. 54 is a schematic plane configuration diagram of the lattice points for resonator and the lattice points for coupler (an example of rectangle lattice arrangement) in the 2D-PC layer applied to the X-point oscillation, in the 2D-PC surface emitting laser according to the eighth embodiment.

In the 2D-PC surface emitting laser according to the eighth embodiment, FIG. 54 shows a schematic plane configuration of the lattice point for resonator 12A and the lattice point for coupler 12C in the 2D-PC layer 12 applied to an X-point oscillation.

Figure 55A:
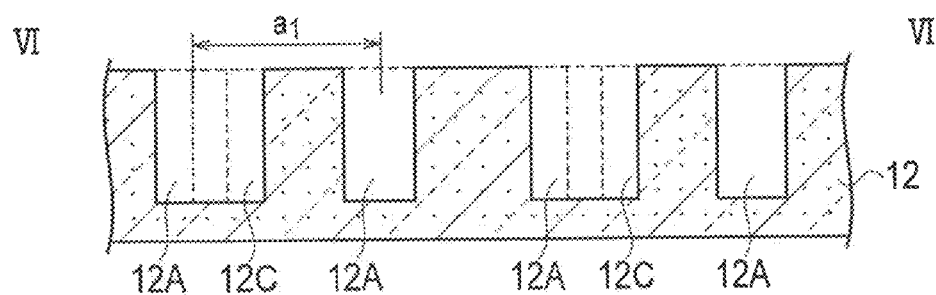
FIG. 55A is a schematic cross-sectional structure diagram taken in the line VI-VI of FIG. 54.
Figure 55B:
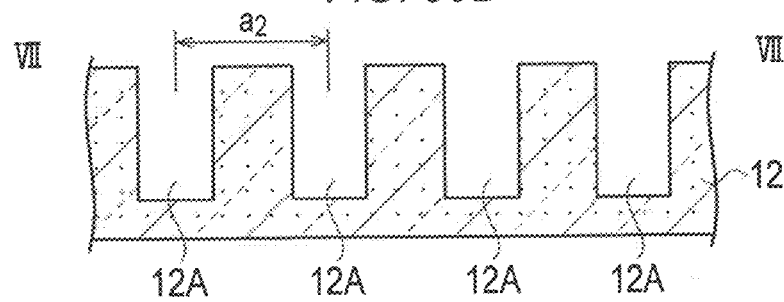
FIG. 55B is a schematic cross-sectional structure diagram taken in the line VII-VII of FIG. 54.

Moreover, FIG. 55A illustrates a schematic cross-sectional structure taken in the line of FIG. 54, and FIG. 55B shows a schematic cross-sectional structure taken in the line VII-VII of FIG. 54.

As shown in FIG. 55A, the 2D-PC surface emitting laser according to the eighth embodiment includes: a PC layer for forming standing wave 12; a rectangular lattice point for resonator 12A arranged in the PC layer for forming standing wave 12, and configured so that a light wave in an X-point band edge in photonic band structure in the PC layer for forming standing wave 12 is diffracted in a plane of the PC layer for forming standing wave 12; and a lattice point for coupler 12C configured so that the light wave in the X-point band edge in the photonic band structure in the PC layer for forming standing wave 12 is diffracted in a surface vertical direction of the PC layer for forming standing wave 12. In the present embodiment, the length of one side $a_1$ of the rectangular lattice is equal to ½ the wavelength λ the medium where the lattice constants of the rectangular lattice are $a_1$ and $a_2$.

In the 2D-PC surface emitting laser according to the eighth embodiment, each and every lattice systems can be conceived as the lattice point for coupler 12C, and the periods does not need to be matched with each other. As the lattice system and the period of the lattice point for coupler 12C are changed, the emitting direction and angle are also changed.

In the 2D-PC surface emitting laser according to the eighth embodiment, although the lattice constant $a_1$ is equal to ½ the wavelength λ in the medium, in particular the range of the lattice constant $a_2$ is not limited, in the rectangular lattice of the lattice point for resonator 12A. However, if an actual structure is assumed, it is preferable that the following equation is satisfied.

$$0.5\times a_1 < a_2 < 3\times a_1 \quad (5)$$

Moreover, In the 2D-PC surface emitting laser according to the eighth embodiment, the lattice point for coupler 12C is arranged in the PC layer for forming standing wave 12.

In the 2D-PC surface emitting laser according to the eighth embodiment, the lattice point for resonator 12A and the lattice point for coupler 12C in the 2D-PC layer 12 applied to the X-point oscillation can be formed as a hole, as shown in FIGS. 55A and 55B.

Moreover, the diameter and the depth of the lattice point for resonator 12A and the lattice point for coupler 12C currently made as an experiment are respectively approximately 120 nm and approximately 115 nm, for example, and the pitch thereof is approximately 280 nm, for example. Such numerical examples can be appropriately modified in accordance with materials composing the substrate 10 and the active layer 14, materials of the 2D-PC layer 12, the wavelength in the medium, etc.

For example, in the 2D-PC surface emitting laser according to the eighth embodiment to which GaAs/AlGaAs based materials are applied, The wavelength λ in the medium of the 2D-PC layer 12 is from approximately 200 nm to approximately 300 nm, and output laser light wavelengths are from approximately 900 nm to approximately 915 nm.

In addition, the lattice point for resonator 12A and the lattice point for coupler 12C may be filled up with a semiconductor layer differing in the refractive index, for example, instead of being formed as an air hole. For example, the lattice point may be formed by filling up a GaAs layer with an AlGaAs layer. For example, during a fabricating process for welding the 2D-PC layer 12, if the hole shape of the lattice point for resonator 12A and the lattice point for coupler 12C becomes deformed, it is effective to fill up with the semiconductor layers differing in the refractive index in order to avoid such a deformation.

Figure 56A:
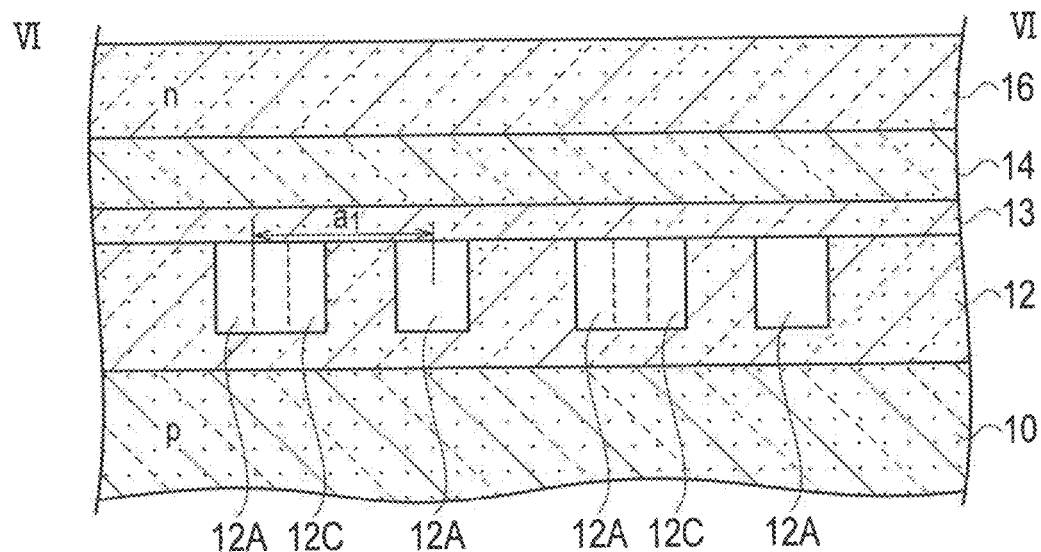
FIG. 56A is a schematic cross-sectional structure diagram of the 2D-PC surface emitting laser according to the eighth embodiment taken in the line VI-VI of FIG. 54.
Figure 56B:
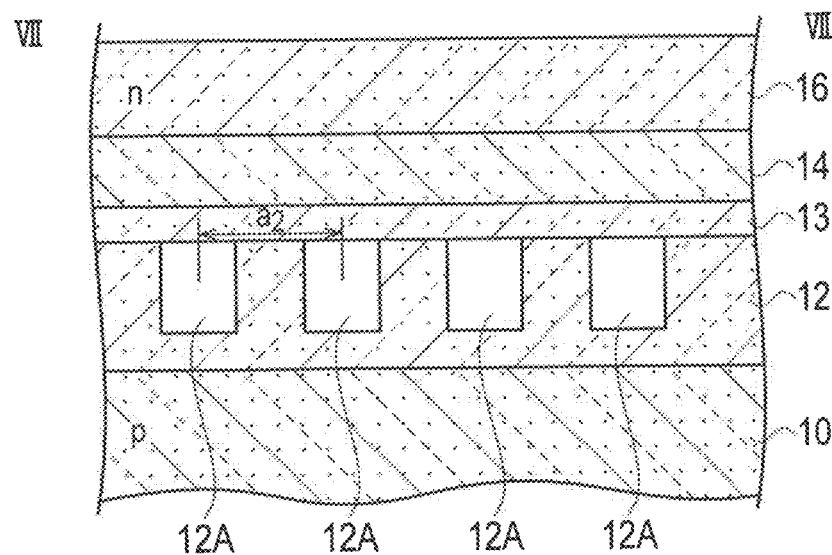
FIG. 56B is a schematic cross-sectional structure diagram of the 2D-PC surface emitting laser according to the eighth embodiment taken in the line VII-VII of FIG. 54.

FIG. 56A shows a schematic cross-sectional structure of the 2D-PC surface emitting laser according to the eighth embodiment taken in the line VI-VI of FIG. 54, and FIG. 56B shows a schematic cross-sectional structure of the 2D-PC surface emitting laser according to the eighth embodiment taken in the line VII-VII of FIG. 54.

More specifically, the 2D-PC surface emitting laser according to the eighth embodiment includes: a substrate (reference numeral 24 in FIG. 35); a first cladding layer 10 disposed on the substrate (24); a second cladding layer 16 disposed on the first cladding layer 10; and an active layer 14 inserted between the first cladding layer 10 and the second cladding layer 16, wherein the PC layer for forming standing wave 12 may be disposed between the first cladding layer 10 and the active layer 14 so as to be adjacent to the active layer 14 in the surface vertical direction of the active layer 14. Moreover, as shown in FIG. 41, a carrier blocking layer 13 is inserted between the PC layer for forming standing wave 12 and the active layer 14.

(Modified Example 1)

Figure 57A:
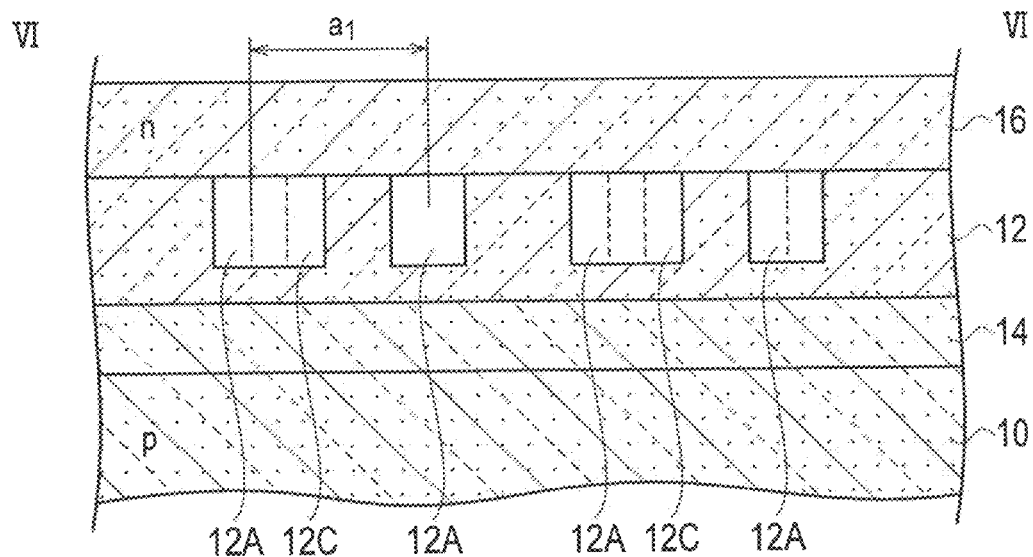
FIG. 57A is a schematic cross-sectional structure diagram of a 2D-PC surface emitting laser according to the modified example 1 of the eighth embodiment taken in the line VI-VI of FIG. 54.
Figure 57B:
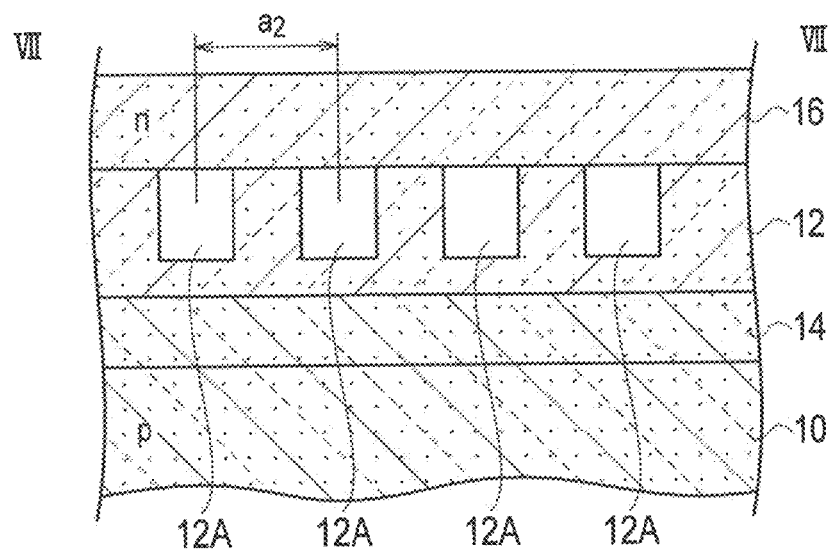
FIG. 57B is a schematic cross-sectional structure diagram of a 2D-PC surface emitting laser according to the modified example 1 of the eighth embodiment taken in the line VII-VII of FIG. 54.

FIG. 57A shows a schematic cross-sectional structure of the 2D-PC surface emitting laser according to an modified example 1 of the eighth embodiment taken in the line VI-VI of FIG. 54, and FIG. 57B shows a schematic cross-sectional structure of the 2D-PC surface emitting laser according to the modified example 1 of the eighth embodiment taken in the line VII-VII of FIG. 54.

More specifically, in the 2D-PC surface emitting laser according to the modified example of the eighth embodiment, the PC layer for forming standing wave 12 may be inserted between the second cladding layer 16 and the active layer 14 so as to be adjacent to the active layer 14 in the surface vertical direction of the active layer 14, as shown in FIGS. 57A and 57B. Although the illustration is omitted in FIGS. 57A and 57B, the carrier blocking layer 13 may be inserted between the PC layer for forming standing wave 12 and the active layer 14, in the same manner as FIG. 56.

(Modified Example 2)

Figure 58A:
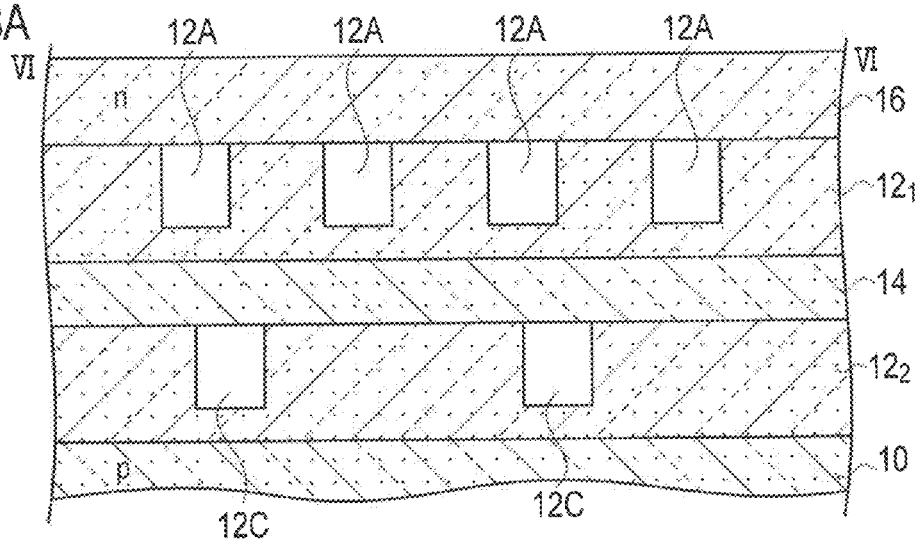
FIG. 58A is a schematic cross-sectional structure diagram of a 2D-PC surface emitting laser according to a modified example 2 of the eighth embodiment taken in the line VI-VI of FIG. 54.

FIG. 58A shows a schematic cross-sectional structure of the 2D-PC surface emitting laser according to a modified example 2 of the eighth embodiment taken in the line VI-VI of FIG. 54.

More specifically, as shown in FIG. 58A, the 2D-PC surface emitting laser according to the modified example 2 of the eighth embodiment further includes a PC layer for forming standing wave $12_1$ and a PC layer for emitting light $12_2$ laminated in the PC layer for forming standing wave $12_1$, wherein the lattice point for coupler 12C may be disposed in the PC layer for emitting light $12_2$.

As shown in FIG. 58A, the 2D-PC surface emitting laser according to the modified example 2 of the eighth embodiment includes: a substrate (reference numeral 24 in FIG. 35); a first cladding layer 10 disposed on the substrate (24); a second cladding layer 16 disposed on the first cladding layer 10; and an active layer 14 inserted between the first cladding layer 10 and the second cladding layer 16, wherein the PC layer for forming standing wave $12_1$ and the PC layer for emitting light $12_2$ are disposed between the first cladding layer 10 and the second cladding layer 16 in the surface vertical direction of the active layer 14 so as to sandwich the active layer 14.

Although the illustration is omitted in FIG. 58A, the carrier blocking layer 13 may be disposed respectively between the PC layer for forming standing wave $12_1$ and the active layer 14 and between the PC layer for emitting light $12_2$ and the active layer 14, in the same manner as FIG. 56.

Moreover, in FIG. 58A, the laminating sequence of the PC layer for forming standing wave $12_1$ and the PC layer for emitting light $12_2$ may be reversed, and thereby the PC layer for emitting light $12_2$ may be inserted between the active layer 14 and the second cladding layer 16, and the PC layer for forming standing wave $12_1$ may be inserted between the active layer 14 and the first cladding layer 10. Since the PC layer for emitting light $12_2$ in which the lattice point for coupler 12C is disposed can be disposed in a position near the light extracting direction, the light extracting efficiency can also be improved.

(Modified Example 3)

Figure 58B:
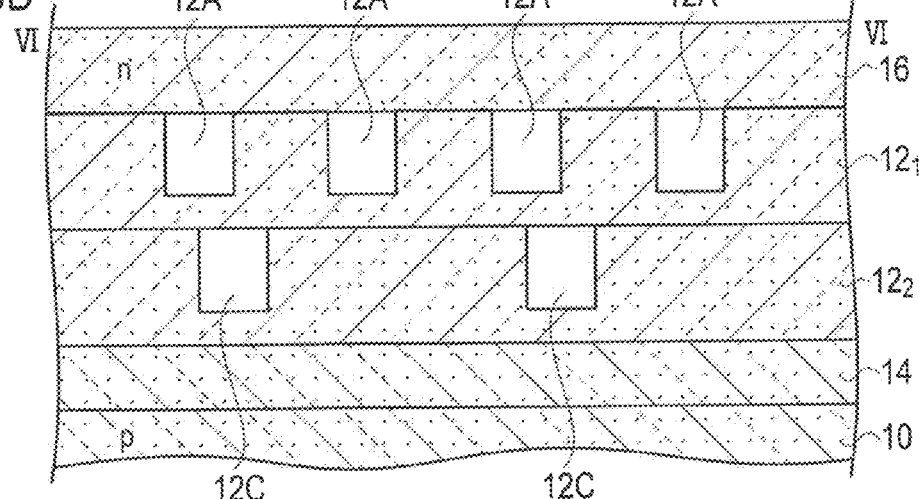
FIG. 58B is a schematic cross-sectional structure diagram of a 2D-PC surface emitting laser according to a modified example 3 of the eighth embodiment taken in the line VI-VI of FIG. 54.

FIG. 58B shows a schematic cross-sectional structure of the 2D-PC surface emitting laser according to a modified example 3 of the eighth embodiment taken in the line VI-VI of FIG. 54.

More specifically, in the 2D-PC surface emitting laser according to the modified example 3 of the eighth embodiment, the PC layer for forming standing wave $12_1$ and the PC layer for emitting light $12_2$ may be disposed between the second cladding layer 16 and the active layer 14 so as to be adjacent to the active layer 14 in the surface vertical direction of the active layer 14. Moreover, although the illustration is omitted in FIG. 58B, the carrier blocking layer 13 may be inserted between the PC layer for emitting light $12_2$ and the active layer 14, in the same manner as FIG. 56.

Moreover, in FIG. 58B, the laminating sequence of the PC layer for forming standing wave $12_1$ and the PC layer for emitting light $12_2$ may be reversed so that the PC layer for forming standing wave $12_1$ may be arranged on the active layer 14, and the PC layer for emitting light $12_2$ may be arranged in the PC layer for forming standing wave $12_1$. Since the wavelength of the resonant mode can be superposed near the gain peak of the active layer 14 if the PC layer for forming standing wave $12_1$ is arranged at a position near the active layer 14, the standing wave forming operation can be executed more effectively. Moreover, since the PC layer for emitting light $12_2$ in which the lattice point for coupler 12C is disposed can be disposed in a position near the light extracting direction, the light extracting efficiency can also be improved.

(Modified Example 4)

Figure 58C:
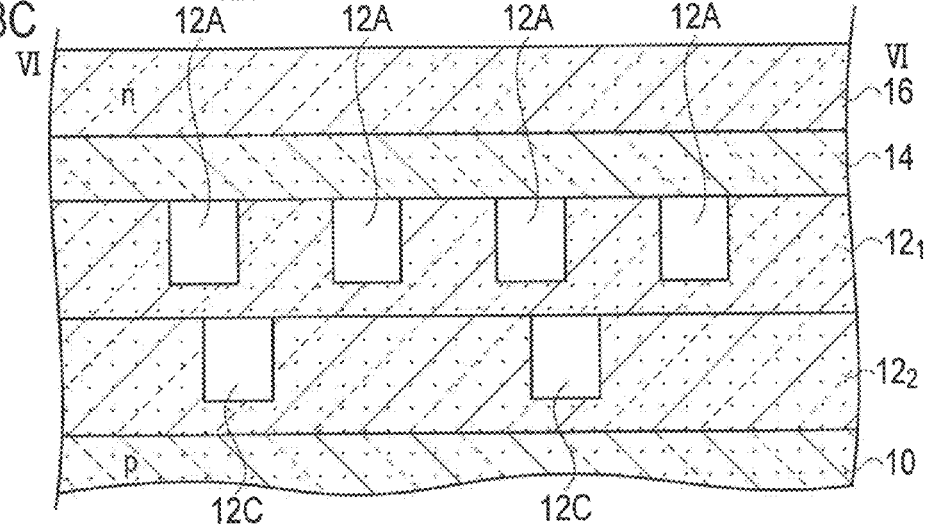
FIG. 58C is a schematic cross-sectional structure diagram of a 2D-PC surface emitting laser according to a modified example 4 of the eighth embodiment taken in the line VI-VI of FIG. 54.

FIG. 58C shows a schematic cross-sectional structure of the 2D-PC surface emitting laser according to a modified example 4 of the eighth embodiment taken in the line VI-VI of FIG. 54.

More specifically, in the 2D-PC surface emitting laser according to the modified example 4 of the eighth embodiment, the PC layer for forming standing wave $12_1$ and the PC layer for emitting light $12_2$ may be inserted between the first cladding layer 10 and the active layer 14 so as to be adjacent to the active layer 14 in the surface vertical direction of the active layer 14. Moreover, although illustration is omitted in FIG. 58C, the carrier blocking layer 13 may be inserted between the PC layer for forming standing wave $12_1$ and the active layer 14 in the same manner as FIG. 56.

Moreover, in FIG. 58C, the laminating sequence of the PC layer for forming standing wave $12_1$ and the PC layer for emitting light $12_2$ may be reversed, and thereby the PC layer for emitting light $12_2$ may be disposed adjacent to the active layer 14. Since the PC layer for emitting light $12_2$ in which the lattice point for coupler 12C is disposed can be disposed in a position near the light extracting direction, the light extracting efficiency can also be improved.

(Modified Example 5)

Figure 59A:
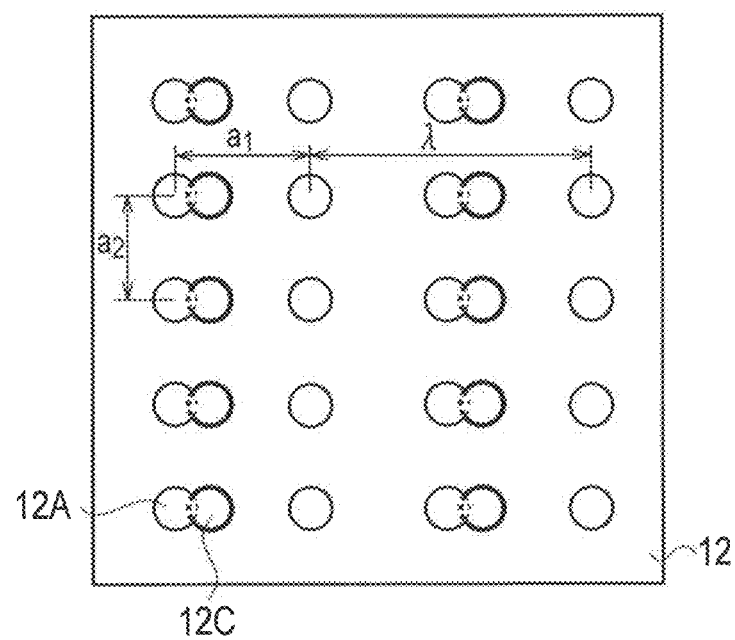
FIG. 59A is a schematic plane configuration diagram of the lattice points for resonator and the lattice points for coupler (an example of rectangle lattice arrangement) in the 2D-PC layer applied to the X-point oscillation, in a 2D-PC surface emitting laser according to a modified example 5 of the eighth embodiment.

In a 2D-PC surface emitting laser according to a modified example 5 of the eighth embodiment, FIG. 59A shows a schematic plane configuration of the lattice point for resonator 12A and the lattice point for coupler 12C in the 2D-PC layer 12 applied to an X-point oscillation. Moreover, FIG. 59B shows a relationship between the normalized frequency (c/a) and the wave number, in the 2D-PC band structure corresponding to FIG. 59A.

In the 2D-PC surface emitting laser according to the modified example 5 of the eighth embodiment, the oscillation in the X-point band edge (near the region R shown in FIG. 59B) in the photonic band structure of the PC layer for forming standing wave 12 is used, corresponding to an embodiment of the rectangular lattice (X-point oscillation).

Figure 59B:
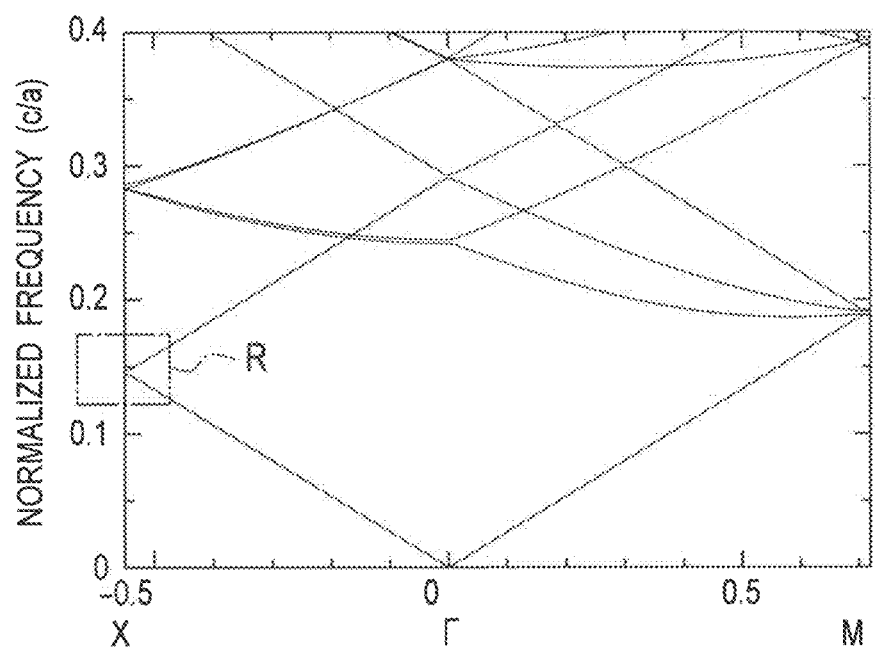
FIG. 59B shows the relationship between the normalized frequency (c/a) and the wave number in the band structure of the 2D-PC corresponding to FIG. 59A.

As shown in FIGS. 59A and 59B, the 2D-PC surface emitting laser according to the modified example 5 of the eighth embodiment includes: a PC layer for forming standing wave 12; a lattice point for resonator 12A arranged in the PC layer for forming standing wave 12, and configured so that a light wave in an X-point band edge in photonic band structure in the PC layer for forming standing wave 12 is diffracted in a plane of the PC layer for forming standing wave 12; and a lattice point for coupler 12C configured so that the light wave in the X-point band edge in the photonic band structure in the PC layer for forming standing wave 12 is diffracted in a. surface vertical direction of the PC layer for forming standing wave 12.

In the 2D-PC surface emitting laser according to the modified example 5 of the eighth embodiment, the lattice point for resonator 12A is arranged in a first rectangular lattice shape having lattice constants $a_1$ and $a_2$ as shown in FIG. 59A, and the lattice point for coupler 12C is arranged in a second rectangular lattice shape differ from the first rectangular lattice shape. In the present embodiment, the lattice constants in the x direction and the y direction of the second rectangular lattice shape is equal to the wavelength in the medium $2a_1$ and $a_2$ with respect to the lattice constants $a_1$ and $a_2$ in the x direction and the y direction of the first rectangular lattice shape.

Other configurations are the same as that of the eighth embodiment and its modified examples 1-4.

(Modified Example 6)

Figure 60A:
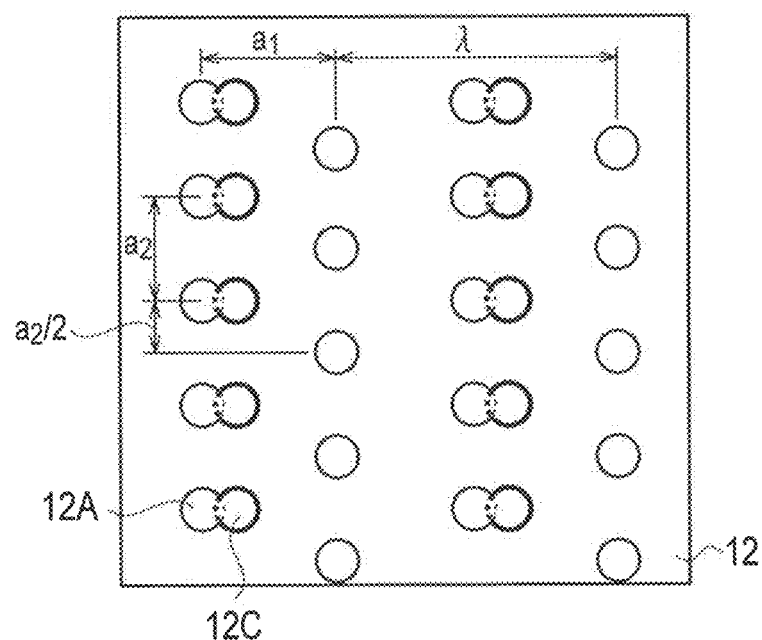
FIG. 60A is a schematic plane configuration diagram of the lattice points for resonator and the lattice points for coupler (an example of rhombic lattice arrangement) in the 2D-PC layer applied to the X-point oscillation, in a 2D-PC surface emitting laser according to a modified example 6 of the sixth embodiment.

In a 2D-PC surface emitting laser according to a modified example 6 of the eighth embodiment, the lattice points for resonator 12A of the 2D-PC layer 12 applied to the X-point oscillation is arranged in a rhombic lattice shape, as shown in FIG. 60A. Moreover, FIG. 60B shows a relationship between the normalized frequency (c/a) and the wave number, in the 2D-PC band structure corresponding to FIG. 60A.

In the 2D-PC surface emitting laser according to the modified example 6 of the eighth embodiment, the oscillation in the X-point band edge (near the region R shown in FIG. 60B) in the photonic band structure of the PC layer for forming standing wave 12 is used, corresponding to an embodiment of the rhombic lattice (X-point oscillation).

Figure 60B:
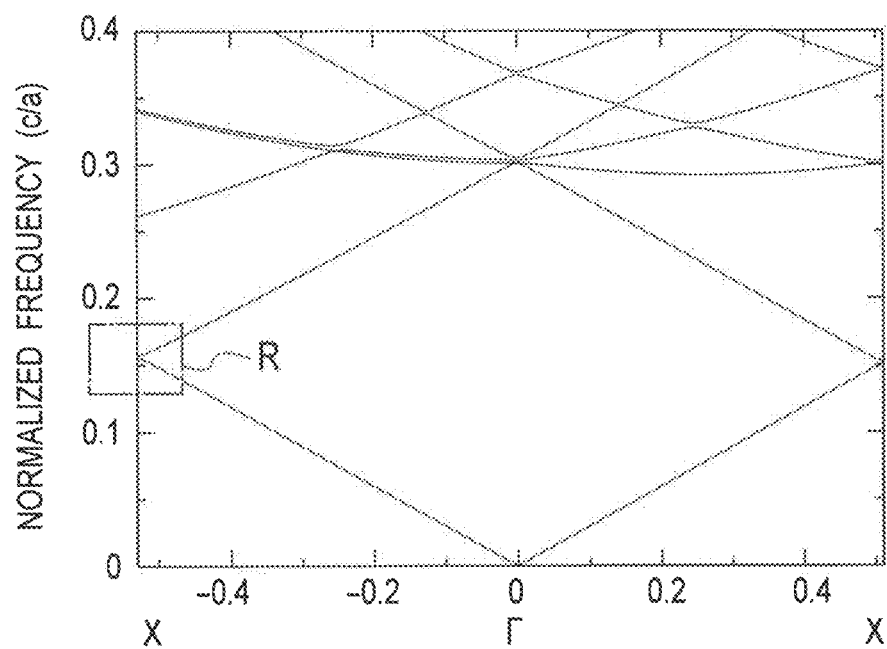
FIG. 60B is a diagram of the 2D-PC band structure corresponding to FIG. 60A.

As shown in FIGS. 60A and 60B, the 2D-PC surface emitting laser according to the modified example 6 of the eighth embodiment includes: a PC layer for forming standing wave 12; a lattice point for resonator 12A arranged in the PC layer for forming standing wave 12, and configured so that a light wave in an X-point band edge in photonic band structure in the PC layer for forming standing wave 12 is diffracted in a plane of the PC layer for forming standing wave 12; and a lattice point for coupler 12C configured so that the light wave in the X-point band edge in the photonic band structure in the PC layer for forming standing wave 12 is diffracted in a surface vertical direction of the PC layer for forming standing wave 12.

In the 2D-PC surface emitting laser according to the modified example 6 of the eighth embodiment, the lattice point for resonator 12A is arranged in a rhombic lattice shape having lattice constants $a_1$ and $a_2$ as shown in FIG. 60A, and the lattice point for coupler 12C is arranged in a rectangular lattice shape. In the present embodiment, the lattice constant of the rectangular lattice is equal to the wavelength $\lambda$ in the medium and $a_2$ with respect to the lattice constants $a_1$ and $a_2$ of the rhombic lattice.

Other configurations are the same as that of the eighth embodiment and its modified examples 1-4.

According to the eighth embodiment and its modified examples 1-6, there can be provided the 2D-PC surface emitting laser emitting the line beam.

According to the eighth embodiment and its modified examples 1-6, there can be provided the 2D-PC surface emitting laser of which the beam spread angle can be controlled with the aspect ratio r ($=a_1/a_2$) (where r≠1) of the rectangular lattice.

According to the eighth embodiment and its modified examples 1-6, there can be provided the 2D-PC surface emitting laser which can control the beam spread angle.

(Control of Beam Spread Angle: Resonator Region RP and Coupler Region CP)

The resonator region RP is a region where the lattice point for resonator 12A is assigned in the PC layers for forming standing wave 12, $12_1$, and the coupler region CP is a region where the lattice point for coupler 12C is assigned in the PC layer for forming standing wave 12 or the PC layer for emitting light $12_2$.

The relationship between the width A, the beam spread angle, and the beam spread region of the coupler region CP is illustrated as schematically shown in FIGS. 11A, 11B and 11C, in the 2D-PC surface emitting laser according to the eighth embodiment. More specifically, an example of the width $A_1$, the beam spread angle $\theta_1$, and the beam spread region $30_1$ of the coupler region $CP_1$ are illustrated as shown in FIG. 11A, an example of the width $A_2$, the beam spread angle $\theta_2$, and the beam spread region $30_2$ of the coupler region $CP_2$ are illustrated as shown in FIG. 11B, and an example of the width $A_3$, the beam spread angle $\theta_3$, and the beam spread region $30_3$ of the coupler region CP3 is illustrated as shown in FIG. 11C. In the present embodiment, the size relationship between the widths of the coupler region is expressed with $A_1 < A_2 < A_3$, the size of the coupler region $CP_1$ is relatively smaller than others, and the size of the coupler region $CP_3$ is relatively larger than others. Moreover, $\theta_1 > \theta_2 > \theta_3$ is satisfied in the size relationship between the beam spread angles specifying the beam spread regions $30_1$, $30_2$, $30_3$.

In the 2D-PC surface emitting laser according to the eighth embodiment, the size relationship between the resonator regions RP corresponding to FIGS. 11A, 11B and 11C is illustrated as shown in the same manner as FIG. 12A, and the size relationship of the beam spread angles corresponding thereto is illustrated as shown in the same manner as FIG. 12B. More specifically, the beam spread angle $\theta_0$ becomes small as the size of the resonator region RP becomes large.

In the 2D-PC surface emitting laser according to the comparative example, an example of the $RP_1$ is similarly illustrated as FIG. 13A, an example of the $RP_2$ is similarly illustrated as FIG. 13B, and an example of the $RP_3$ is similarly illustrated as FIG. 13C, in the diagram showing the relationship of the size of the resonator region RP in the 2D-PC layer applied to the square lattice Γ-point (gamma-point) oscillation.

On the other hand, in the 2D-PC surface emitting laser according to the eighth embodiment, in the diagram showing the relationship between the size of the resonator region RP and the size of the coupler region CP in the 2D-PC layer applied to the X-point oscillation, an example of the $RP_1$ and $CP_1$ is similarly illustrated as FIG. 14A, an example of the $RP_2$ and $CP_2$ is similarly illustrated as FIG. 14B, and an example of the $RP_3$ and $CP_3$ is similarly illustrated as FIG. 14C.

The oscillation of the 2D-PC surface emitting laser requires a resonator region having a fixed area or more. Therefore, if the beam spread angle $\theta_0$ is enlarged in the case of the square lattice Γ-point (gamma-point) oscillation according to the comparative example, the resonator region $RP_A$ required for an oscillation cannot be ensured. More specifically, since the 2D-PC surface emitting laser according to the comparative example uses the square lattice Γ-point (gamma-point) oscillation, the size of the resonator region RP is equal to the size of the coupler region CP in that condition. Accordingly, if the size of the resonator region RP is reduced in order to enlarge the beam spread angle $\theta_0$, It becomes impossible to oscillate in the range of RP<$RP_A$ in the size relationship between the resonator regions RP since the resonator region $RP_A$ required for the oscillation cannot not be ensured, as shown in FIG. 12A.

(Arrangement Relationship Between Coupler and Resonator)

Figure 61:
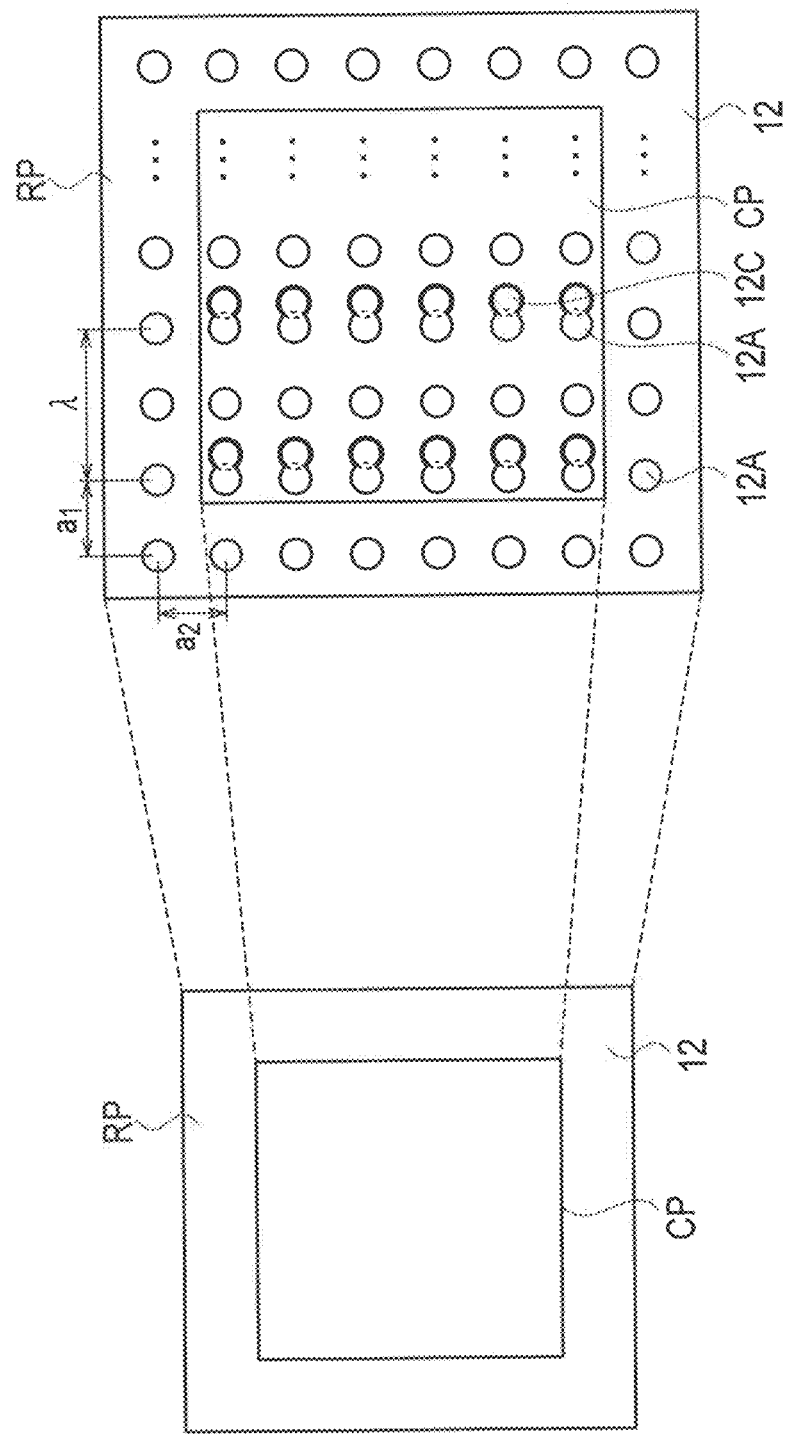
FIG. 61 shows an example of arrangement of the lattice points for resonator 12A and the lattice points for coupler 12C in the resonator region RP the coupler region CP in the 2D-PC layer applied to the X-point oscillation, in the 2D-PC surface emitting laser according to the eighth embodiment.

In the 2D-PC surface emitting laser according to the modified example 5 of the eighth embodiment, FIG. 61 shows an example of arrangement of the lattice points for resonator 12A and the lattice points for coupler 12C in the resonator region RP and the coupler region CP in the 2D-PC layer 12 applied to the X-point oscillation.

Figure 62A:
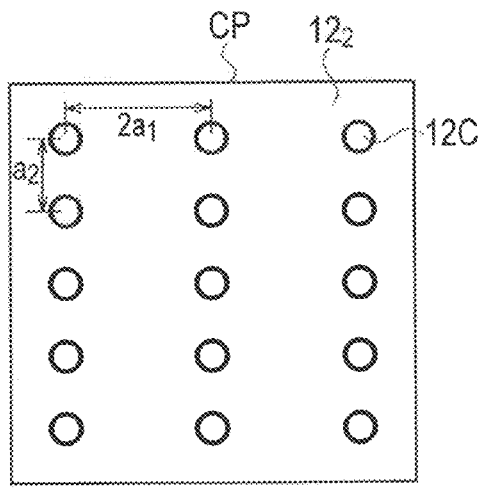
FIG. 62A shows an example of arrangement of the lattice points for coupler 12C in the PC layer for emitting light 12$_2$, in the 2D-PC surface emitting laser according to the eighth embodiment.
Figure 62B:
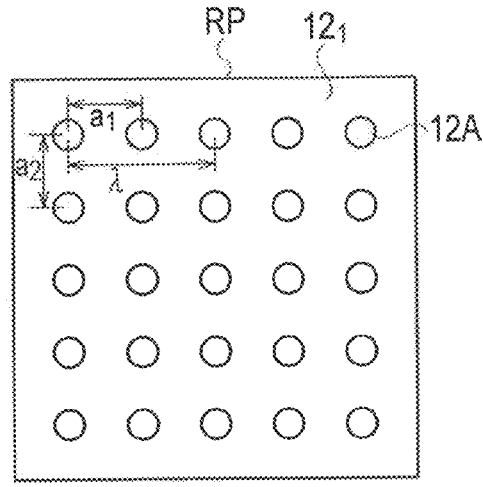
FIG. 62B shows an example of arrangement of the lattice points for resonator 12A in the PC layer for forming standing wave $12_1$, in the 2D-PC surface emitting laser according to the eighth embodiment.
Figure 62C:
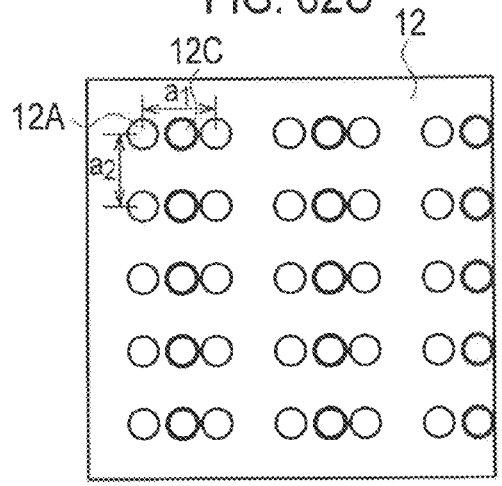
FIG. 62C shows an example of arrangement of the lattice points for resonator 12A and the lattice points for coupler 12C in the same PC layer 12, in the 2D-PC surface emitting laser according to the eighth embodiment.
Figure 62D:
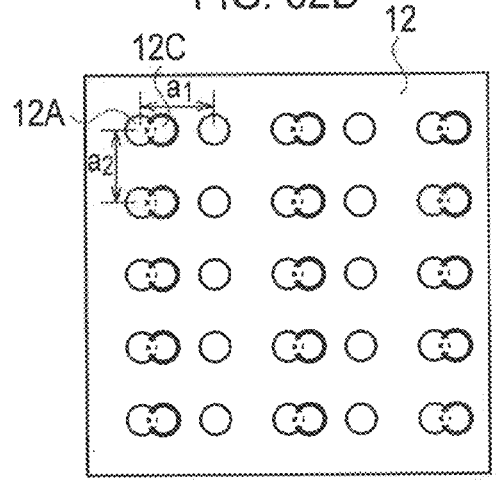
FIG. 62D shows another example of arrangement of the lattice points for resonator 12A and the lattice points for coupler 12C in the same PC layer 12, in the 2D-PC surface emitting laser according to the eighth embodiment.
Figure 62E:
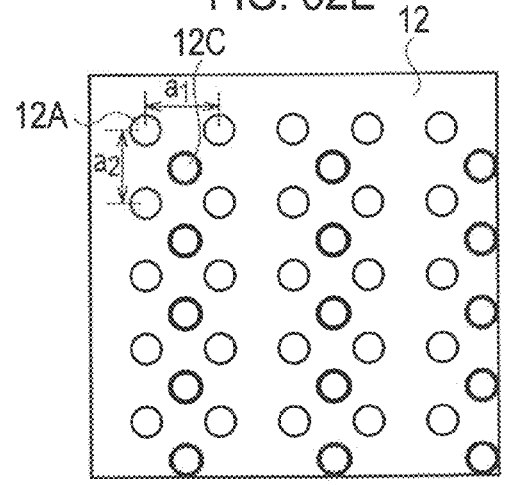
FIG. 62E shows still another example of arrangement of the lattice points for resonator 12A and the lattice points for coupler 12C in the same PC layer 12, in the 2D-PC surface emitting laser according to the eighth embodiment.
Figure 62F:
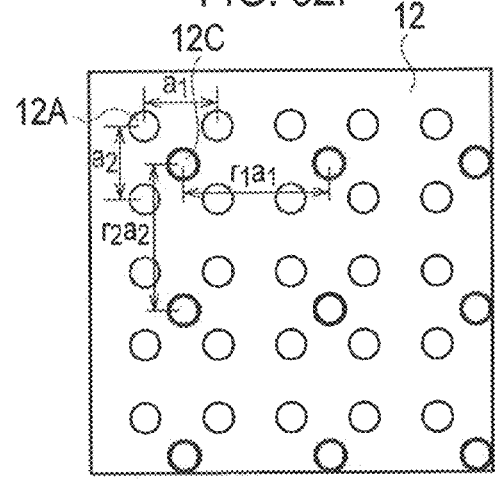
FIG. 62F shows yet another example of arrangement of the lattice points for resonator 12A and the lattice points for coupler 12C in the same PC layer 12, in the 2D-PC surface emitting laser according to the eighth embodiment.

Moreover, FIG. 62A shows an example of arrangement of the lattice points for coupler 12C in the PC layer for emitting light $12_2$, in the 2D-PC surface emitting laser according to the modified example 5 of the eighth embodiment. In the present embodiment, as for the pitches between the lattice points for coupler 12C, the longitudinal direction is $2a_1$ and the lengthwise direction is $a_2$. FIG. 62B shows an example of arrangement of the lattice points for resonator 12A in the PC layer for forming standing wave $12_1$. In the present embodiment, the wavelength in the medium is equal to $2a_1$. Moreover, FIG. 62C shows an example that the lattice points for resonator 12A and the lattice points for coupler 12C are arranged in the same PC layer 12, FIG. 62D shows another example that the lattice points for resonator 12A and the lattice points for coupler 12C are arranged in the same PC layer 12, and FIG. 62E shows still another example that the lattice points for resonator 12A and the lattice points for coupler 12C are arranged in the same PC layer 12. Moreover, FIG. 62F shows still another example that the lattice points for resonator 12A and the lattice points for coupler 12C are arranged in the same PC layer 12. FIG. 62F shows a generalized example and the lattice point for coupler 12C can be arbitrarily arranged in the present embodiment, the pitch between the lattice points for coupler 12C is expressed with the longitudinal direction $a_3 = r_1 a_1$ and the lengthwise direction $a_4 = r_2 a_2$ (where $r_1 \neq 1$, $r_2 \neq 1$), for example.

The arrangement relationship between the lattice points for coupler 12C and the lattice points for resonator 12A can be freely set up, in the 2D-PC surface emitting laser according to the modified example 5 of the eighth embodiment, as shown in FIGS. 62C to 62F. The LD characteristics (output, threshold value, etc.) vary depending on the arrangement relationship between the lattice points for coupler 12C and the lattice points for resonator 12A.

Although the examples shown in FIGS. 61 and 62 are examples of the 2D-PC layer 12 applied to the X-point oscillation and correspond to the 2D-PC surface emitting laser according to the modified example 5 of the eighth embodiment, it is applicable similarly to other eighth embodiments.

(Beam Spread Angle Control with Coupler Arrangement)

In the 2D-PC surface emitting laser according to the eighth embodiment, FIG. 63A shows an NFP in the case of the size of the resonator region RP and the size of the coupler region CP in the 2D-PC layer 12 applied to the X-point oscillation are nearly equal to each other, FIG. 63B shows the beam spread region 30 from the coupler region CP, and FIG. 63C shows an example of arrangement of the lattice points for resonator and the lattice points for coupler in the resonator region RP and the coupler region CP corresponding to FIG. 63A.

Figure 64A:
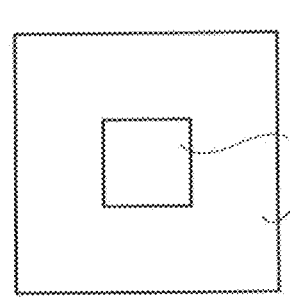
FIG. 64A shows an NFP in the case where the size of the resonator region RP and the size of the coupler region CP in the 2D-PC layer applied to the X-point oscillation are differ from each other, in the 2D-PC surface emitting laser according to the eighth embodiment.
Figure 64B:
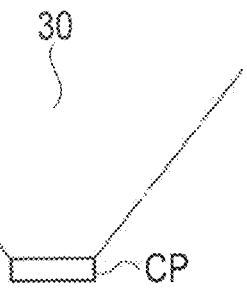
Figure 64C:
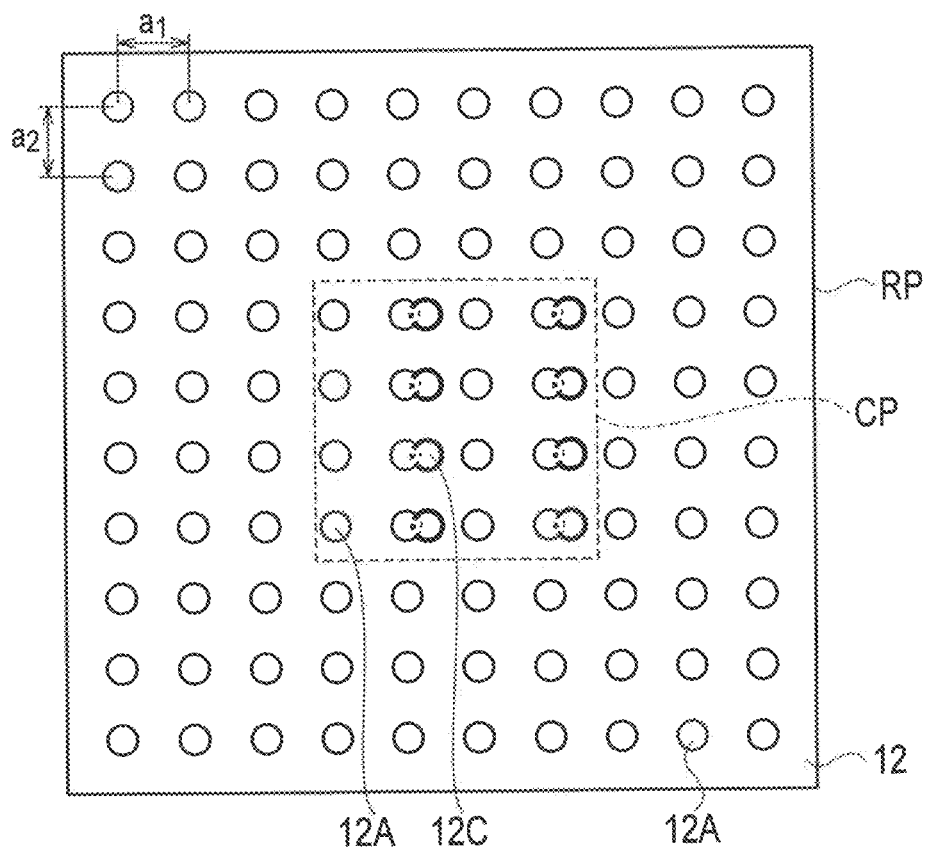

In the 2D-PC surface emitting laser according to the eighth embodiment, FIG. 64A shows an NFP in the case of the size of the resonator region RP and the size of the coupler region CP in the 2D-PC layer 12 applied to the X-point oscillation are different from each other, FIG. 64B shows the beam spread region 30 from the coupler region CP, and FIG. 64C shows an example of arrangement of the lattice points for resonator and the lattice points for coupler in the resonator region RP and the coupler region CP corresponding to FIG. 64A.

More specifically, in the 2D-PC surface emitting laser according to the eighth embodiment, the resonator and the coupler can be designed separately, and the beam spread angle $\theta_0$ of the surface emission-type laser beam can be modified variously by modifying only the arrangement of the coupler, continuing the stable oscillation.

According to the 2D-PC surface emitting laser according to the eighth embodiment, the beam spread angle $\theta_0$ of the surface emission-type laser beam can be adjusted by varying the coupler region CP in which the lattice point for coupler 12C is arranged while continuing the stable oscillation, while maintaining the size of the resonator region RP in which the lattice point for resonator 12A is arranged.

(Relationship Between Diameter $D_r$ of Lattice Point for Resonator 12A, and Diameter $D_c$ of Lattice Point for Coupler 12C)

FIG. 65A shows an example of arrangement in the case where a diameter $D_r$ of the lattice points for resonator 12A differs from a diameter $D_c$ of the lattice points for coupler 12C, and shows in particular an example of being arranged so that $D_c <= D_r$ is satisfied at the same lattice position, and FIG. 65B shows an example of being arranged so that $D_c > D_r$ is satisfied at the same lattice position.

The oscillation is possible also in any relationship between the diameter $D_r$ of the lattice point for resonator 12A and the diameter $D_c$ of the lattice point for coupler 12C. However, as shown in FIG. 65A, if a hole of the lattice point for coupler 12C and a hole of the lattice point for resonator 12A overlap fully in the case of $D_c <= D_r$, it cannot function as a laser diode since the light cannot be extracted, although the resonance has occurred in the laser.

Moreover, the lattice point for resonator 12A and the lattice point for coupler 12C may have a circular shape as shown in FIG. 65E, and the diameter $D_c$ of the lattice point for coupler 12C may be formed larger than the diameter $D_r$ of the lattice point for resonator 12A.

On the other hand, in the case of forming respectively the lattice point for coupler 12C and the lattice point for resonator 12A in the different 2D-PC layers, there is no above-mentioned limitation.

In the 2D-PC surface emitting lasers according to the seventh to eighth embodiments, the lattice point for resonator 12A and the lattice point for coupler 12C may have an arbitrary shape, and the lattice point for coupler 12C may be formed larger than the lattice point for resonator 12A.

However, the relationship between the diameter $D_r$ of the lattice point for resonator 12A and the diameter $D_c$ of the lattice point for coupler 12C is similarly satisfied in the other examples of the eighth embodiment.

(Shape of Lattice Point (Hole))

In an example of arrangement in the case where the shape of the lattice points for resonator 12A differs from the shape of the lattice points for coupler 12C, FIG. 66A shows an example that the shape of the lattice points for resonator 12A is a circular shape, and the shape of the lattice points for coupler 12C is a triangular shape, and FIG. 66B shows an example of that the shape of the lattice points for resonator 12A is a rhombus, and the shape of the lattice point for coupler 12C is an ellipse.

The lattice point for resonator 12A and the lattice point for coupler 12C may have a shape of any one of a polygonal shape, circular shape, an ellipse, or an oval shape. In the present embodiment, the polygonal shape includes a triangle, a square, a pentagon, a hexagon, an octagon, and the like.

Moreover, the shape of the lattice point for coupler 12C and the shape of the lattice point for resonator 12A may differ from each other as follows. Moreover, a direction of the shape of the lattice point may be inclined. If the direction of the shape of the lattice point is inclined, the laser characteristics will be affected, e.g. the laser beam is output in an oblique direction.

Although the examples shown in FIGS. 66A and 66B are examples of the 2D-PC layer 12 applied to the X-point oscillation and correspond to the 2D-PC surface emitting laser according to the modified example 5 of the eighth embodiment, the relationship between the hole shape of the lattice point for resonator 12A and the hole shape of the lattice point for coupler 12C is similarly satisfied in the other examples of the eighth embodiment.

As explained above, according to the embodiments of the present invention, there can be provided the 2D-PCl surface emitting laser which can control a beam spread angle of the laser beam.

NINTH EMBODIMENT (Element Structure)

As shown in FIG. 67, the 2D-PC surface emitting laser according to the ninth embodiment includes: a PC layer 12; and a lattice point for forming resonant-state (resonant-state-forming lattice point) 12A arranged in the PC layer 12, and configured so that a light wave in a band edge in photonic band structure in the PC layer 12 is diffracted in a plane of the PC layer 12 and is diffracted in a surface vertical direction of the PC layer 12.

In the present embodiment, perturbation for diffracting the light wave in the surface vertical direction of the PC layer 12 is applied to the lattice point for forming resonant-state 12A. The lattice point for forming resonant-state 12A to which the perturbation is applied is expressed by a lattice point for forming perturbation-state (perturbation-state-forming lattice) 12P. The lattice point for forming perturbation-state 12P is arranged in the PC layer 12.

The term "perturbation" used therein means that modulation is periodically applied to the PC layer 12 which forms periodic structure in the lattice point for forming resonant-state 12A. Moreover, the periodic modulation may be refractive index modulation, for example. Moreover, the periodic modulation may be hole-diameter modulation, for example. Moreover, the periodic modulation may be hole-depth modulation, for example. Moreover, the periodic modulation may be both of the hole-depth modulation and the hole-depth modulation, for example.

It is theoretically preferable to apply the perturbation to the "refractive index" of the lattice point for forming resonant-state 12A formed in the PC layer 12. Moreover, the similar effect is obtained by applying the perturbation to the "hole diameter" or the "hole depth", or both. In the example shown in FIG. 67, the perturbation of refractive index modulation is applied in a y-axial direction of the rectangular lattice having the lattice constant $(a_1, a_2)$ to the lattice points for forming perturbation-state $12P_1$, $12P_2$, $12P_3$, ..., periodically arranged.

In the 2D-PC surface emitting laser according to the ninth embodiment, a square lattice, a rectangular lattice, a face-centered rectangle lattice, a triangular lattice, etc. are applicable as a lattice pattern of the lattice point for forming resonant-state 12A.

In the 2D-PC surface emitting laser according to the ninth embodiment, various band edge oscillations can be achieved by applying the perturbation to the lattice point for forming resonant-state 12A which forms the periodic structure in the PC layer 12. For example, Γ-point (gamma-point), X point, and J-point oscillations are achieved in the square lattice and the rectangular lattice, and the Γ-point (gamma-point), X point and M-point oscillation are achieved in the face-centered rectangle lattice and the triangular lattice.

As shown in FIG. 67, the 2D-PC surface emitting laser according to the ninth embodiment includes: a substrate 24; a first cladding layer 10 disposed on the substrate 24; a second cladding layer 16 disposed on the first cladding layer 10; and an active layer 14 inserted between the first cladding layer 10 and the second cladding layer 16. In the present embodiment, the first cladding layer 10 may be formed of a p type semiconductor layer, and the second cladding layer 16 may be formed of an n type semiconductor layer. The electrical conductivity of the semiconductor layer may be reverse to each other.

Furthermore, as shown in FIG. 67, the 2D-PC surface emitting laser according to the ninth embodiment comprises: a contact layer 18 disposed on the second cladding layer 16;

a window layer 20 disposed on a surface light emission region on the contact layer 18, and configured to extract a laser beam; a window-like upper electrode 22 disposed on the window layer 20; and a lower electrode 26 disposed on a back side surface of the substrate 24.

As shown in FIG. 67, the PC layer 12 may be inserted between the first cladding layer 10 and the second cladding layer 16 so as to be adjacent to the active layer 14 in a surface vertical direction of the active layer 14. In the present embodiment, the active layer 14 may be formed of an MQW layer, for example.

Moreover, the PC layer 12 may be inserted between the first cladding layer 10 and the active layer 14, as shown in FIG. 67.

Moreover, as shown in FIG. 67, a carrier blocking layer 13 is inserted between the active layer 14 and the PC layer 12 so that carriers may be effectively acquired in the active layer 14 composed of the MQW layer, and a carrier injection from the active layer 14 to the PC layer 12 may be blocked.

Moreover, the PC layer 12 may be inserted between the second cladding layer 16 and the active layer 14.

As materials of the 2D-PC surface emitting laser according to the ninth embodiment, the following materials are applicable, for example. That is, for example, GaInAsP/InP based materials are applicable in the case of wavelengths of 1.3 μm to 1.5 μm; InGaAs/GaAs based materials are applicable in the case of an infrared light with a wavelength of 900 nm; GaAlAs/GaAs based or GaInNAs/GaAs based materials are applicable in the case of an infrared light/near-infrared light with wavelengths of 800 to 900 nm; GaAlInAs/InP based materials are applicable in the case of wavelengths of 1.3 μm to 1.67 μm; AlGaInP/GaAs based materials are applicable in the case of a wavelength of 0.65 μm; and GaInN/GaN based materials are applicable in the case of a blue light.

FIG. 68A shows the in-plane resonant mode of the 2D-PC layer 12 in the 2D-PC surface emitting laser according to the ninth embodiment, and FIG. 68B shows the wave number space corresponding to the Fourier transform of the real space of FIG. 68A. The lattice constant of the rectangular lattice is expressed by $(a_1, a_2)$ as shown in FIG. 68A, and the reciprocal lattice constant is expressed by $(b_1, b_2)$ as shown in FIG. 68B. The diffraction vector $k_d$ in the reciprocal lattice points is expressed as shown in FIG. 68B.

(Principle of Surface Light Emission)

The principle of the surface light emission of the 2D-PC surface emitting laser will now be explained as an example in the case where the 2D-PC layer 12 has the lattice point of rectangular lattice.

In the 2D-PC surface emitting laser, FIG. 69A shows an explanatory diagram in the real space of the in-plane resonant state of the rectangular lattice in the 2D-PC layer 12, and FIG. 69B shows an explanatory diagram in the wave number space corresponding to FIG. 69A. In the present embodiment, the length of one side $a_2$ of the rectangular lattice is equal to ½ the wavelengths λ in the medium, in the example shown in FIG. 69A. In the in-plane resonant state shown in FIG. 69A, the wave number vector $k_{f\uparrow}$ is expressed as shown in FIG. 69B.

In the in-plane resonant state corresponding to FIG. 69, FIG. 70A shows an explanatory diagram in the wave number space $k_x$-$k_y$ of the diffraction operation in an upward direction (z-axial direction), and FIG. 70B shows an explanatory diagram in the wave number space $k_z$-$k_y$ corresponding to FIG. 70A. The wave number vector $k_{f\uparrow}$ and the diffraction vector $k_{d\uparrow}$ have difference $|k_f$-$k_d|$ in the wave number space $k_x$-$k_y$ as shown in FIG. 70A, and the surface emission-type laser beam can be emitted on the wave number space $k_y$-$k_z$ plane in a vector $k_{u\uparrow}$ direction to which only a beam emitting angle θ inclined from the z axis, corresponding to the above-mentioned difference.

(Comparative Example)

FIG. 71A shows a real space structural example of a lattice points for forming resonant-state (resonant-state-forming lattice points) (square lattice) in a 2D-PC layer, in a 2D-PC surface emitting laser according to a comparative example. A real space structural example of the lattice point for light extraction 12C in the 2D-PC layer 12 is expressed as shown in FIG. 71E. FIG. 71C shows a real space structural example in which the lattice point for forming resonant-state 12A and the lattice point for light extraction 12C in the 2D-PC layer 12 are combined with each other.

Moreover, FIG. 71D shows the wave number space corresponding to FIG. 71A, and FIG. 71E shows the wave number space corresponding to FIG. 71C.

The lattice point for light extraction 12C is arranged in the same plane as the lattice point for forming resonant-state 12A and, and has periodic structure different from the fundamental structure of the lattice point for forming resonant-state 12A.

The dielectric constant $\epsilon(r_\uparrow)$ in which the lattice point for forming resonant-state 12A and the lattice point for light extraction 12C are combined with each other is expressed by the following equation:

$$\epsilon(r_\uparrow) = \epsilon_{0,a}(r_\uparrow) + \epsilon_{1,a}(r_\uparrow) \qquad (6)$$

where $\epsilon_{0,a}(r_\uparrow)$ is the dielectric constant of the lattice point for forming resonant-state 12A in the 2D-PC layer 12, and $\epsilon_{1,a}(r_\uparrow)$ is the dielectric constant of the lattice point for light extraction 12C. Moreover, since the dielectric constant epsilon $\epsilon(r_\uparrow)$ has periodic structure, it is expressed by the following equation:

$$\epsilon_a(r_\uparrow) = \epsilon_a(r_\uparrow = a_\uparrow) \qquad (7)$$

where $[a_\uparrow]$ expresses the period related to the lattice.

In the comparative example, since the lattice point for forming resonant-state 12A and the lattice points for light extraction 12C, e.g. the X-point resonator, are used as different lattices, the lattice point for light extraction 12C significantly affects the resonant-state form. For example, unnecessary dispersion, a resonant mode which is not intended, etc. may occur by introducing the lattice point for light extraction 12C.

(Introduction of Perturbation)

Accordingly, in the 2D-PC surface emitting laser according to the ninth embodiment, the perturbation is applied to the lattice point for forming resonant-state 12A as a method of extracting light without using the lattice for light extraction. There is clearly little influence on the resonant-state form by introducing the perturbation, compared with structure where newly superposes an alternative lattice.

In the 2D-PC surface emitting laser according to the ninth embodiment, FIG. 72A shows the real space structural example of the lattice point for forming resonant-state (rectangular lattice) 12A in the 2D-PC layer 12, and FIG. 72B shows a conceptual diagram for explaining an aspect that the perturbation of the sine wave function is applied in the y-axial direction to the lattice point for forming resonant-state (rectangular lattice) 12A in the 2D-PC layer 12. Moreover, FIG. 72C shows a conceptual diagram for explaining an aspect that the perturbation of the hole-shape (hole-diameter) modulation of the sine wave function is applied in the y-axial direction to the lattice point for forming resonant-state (rectangular lattice).

Moreover, the wave number space corresponding to the Fourier transform of the real space in FIG. 72A is expressed as shown in FIG. 73A, and the wave number space corresponding to the Fourier transform of the real space in FIG. 72B is expressed as shown in FIG. 73B. The wave number vector $k_{f\uparrow}$ and the diffraction vector $k_{d\uparrow}$ are as shown in FIGS. 73A and 73B.

The dielectric constant of the perturbation term in which the perturbation of the sine wave function is applied to the lattice point for forming resonant-state 12A with respect to the dielectric constant $\epsilon_{0,a}(r_\uparrow)$ of the lattice point for forming resonant-state 12A in the 2D-PC layer 12 can be expressed by the equation, $\epsilon_1(r_\uparrow)\sin(k_{d\uparrow} \cdot r_\uparrow)$.

Accordingly, the dielectric constant $\epsilon'(r_\uparrow)$ of the lattice point for forming perturbation-state 12P in which the perturbation of the sine wave function is applied to the fundamental structure of the lattice point for forming resonant-state 12A in the 2D-PC layer 12 is expressed by the following equation.

$$\epsilon'(r_\uparrow) = \epsilon_{0,a}(r_\uparrow) + \epsilon_{1,a}(r_\uparrow)\sin(k_{d\uparrow} \cdot r_\uparrow) \qquad (8)$$

If the further above-mentioned equation is generalized, it is expressed by the following equation.

$$\epsilon'(r_\uparrow) = \epsilon_{0,a}(r_\uparrow) + \Sigma_i \epsilon_{i,a}(\uparrow)\sin(k_{d,i\uparrow} \cdot r_\uparrow) \qquad (8a)$$

As clearly also from the equation (8a), the superposition is realized if a plurality of the perturbations of sine wave function are applied to the fundamental structure of the lattice point for forming resonant-state 12A in the 2D-PC layer 12 in an arbitrary direction.

Although the lattice point for forming resonant-state 12A and the lattice points for light extraction 12C, e.g. an X-point resonator, are used as different lattices in the comparative example, the surface emission-type laser can be achieved with the simplified structure by introducing the perturbation into the lattice point for forming resonant-state 12A in the 2D-PC layer 12, in the 2D-PC surface emitting laser according to the ninth embodiment. Since only one type of the lattice point for forming resonant-state 12A is used in the ninth embodiment, the fabrication is also extremely easy, compared with the comparative example using two types of the lattice points.

According to the 2D-PC surface emitting laser according to the ninth embodiment, since there is provided the structure in which the perturbation is applied to the refractive index, the size, or the depth of the lattice point for forming resonant-state 12A which forms periodic structure as the crystal lattice in the 2D-PC layer 12, the stable resonant-state can be formed, while being able to fabricate extremely easily the 2D-PC surface emitting laser.

(Refractive Index Modulation)

In the 2D-PC surface emitting laser according to the ninth embodiment, FIG. 74 shows a real space structural example illustrating an aspect that the perturbation of the refractive index modulation of the sine wave function is applied to the lattice point for forming resonant-state (rectangular lattice) 12A in the 2D-PC layer 12. In FIG. 74, the perturbations of the periodic refractive index modulation of the sine wave function are applied in the vertical direction to the arrangement lines $PL_1$, $PL_2$, $PL_3$, . . . . For example, the lattice point for forming perturbation-state $12P_1$ to which the perturbation of the refractive index $n_1$ is applied is arranged on the arrangement line $PL_1$. Similarly, the lattice point for forming perturbation-state $12P_2$ to which the perturbation of the refractive index $n_2$ is applied is arranged on the arrangement line $PL_2$, and the lattice point for forming perturbation-state $12P_3$ to which the perturbation of the refractive index $n_3$ is applied is arranged on the arrangement line $PL_3$.

In the example shown in FIG. 74, the perturbation of periodic dielectric constant modulation is applied in the vertical repeated direction to the arrangement lines $PL_1$, $PL_2$, $PL_3$, . . . , since the square of the refractive index n corresponds to the dielectric constant $\epsilon$.

The dielectric constant of the perturbation term in which the perturbation of the sine wave function is applied to the lattice point for forming resonant-state 12A with respect to the dielectric constant $\epsilon_{0,a}(r_\uparrow)$ of the lattice point for forming resonant-state 12A in the 2D-PC layer 12 can be expressed the equation, $\epsilon_{1,a}(r_\uparrow)\sin(k_{d\uparrow} \cdot r_\uparrow)$.

Accordingly, the dielectric constant $\epsilon'_a(r_\uparrow)$ of the lattice point for forming perturbation-state 12P in which the perturbation of the periodic refractive index modulation of the sine wave function is applied to the fundamental structure of the lattice point for forming resonant-state 12A in the 2D-PC layer 12 is expressed by the following equation.

$$\epsilon'_a(r_\uparrow) = \epsilon_{0,a}(r_\uparrow) + \epsilon_{1,a}(r_\uparrow)\sin(k_{d\uparrow} \cdot r_\uparrow) \qquad (9)$$

The vector $r_\uparrow$ in the equation (9) corresponds to a vector in vertical direction to the arrangement lines $PL_1$, $PL_2$, $PL_3$, . . . , in the example of FIG. 74.

(Hole-Shape (Hole-Diameter) Modulation)

In the 2D-PC surface emitting laser according to the ninth embodiment, FIG. 75 shows a real space structural example illustrating an aspect that the perturbation of the hole-shape (hole-diameter) modulation of the sine wave function is applied to the lattice point for forming resonant-state (rectangular lattice) 12A in the 2D-PC layer 12. In FIG. 75, the perturbations of the periodic hole-shape (hole-diameter) modulation of the sine wave function are applied in the vertical direction to the arrangement lines $PL_1$, $PL_2$, $PL_3$, . . . . For example, the lattice point for forming perturbation-state $12P_1$ to which the perturbation of the hole diameter D1 is applied is arranged on arrangement line $PL_1$. Similarly, the lattice point for forming perturbation-state $12P_2$ to which the perturbation of the hole diameter D2 is applied is arranged on the arrangement line $PL_2$, and The lattice point for forming perturbation-state $12P_3$ to which the perturbation of the hole diameter D3 is applied is arranged on the arrangement line $PL_3$.

The hole diameter of the perturbation term in which the perturbation of the sine wave function is applied to the lattice point for forming resonant-state 12A with respect to the hole diameter $\epsilon_{0,a}(r_\uparrow)$ of the lattice point for forming resonant-state 12A in the 2D-PC layer 12 can be expressed the equation, $d_{1,a}(r_\uparrow)\sin(k_{d\uparrow} \cdot r_\uparrow)$.

Accordingly, the hole diameter $d_a(r_\uparrow)$ of the lattice point for forming perturbation-state 12P in which the perturbation of the periodic hole-shape (hole-diameter) modulation of the sine wave function is applied to the fundamental structure of the lattice point for forming resonant-state 12A in the 2D-PC layer 12 is expressed by the following equation.

$$d_a(r_\uparrow) = d_{0,a}(r_2) + d_{1,a}(r_\uparrow)\sin(k_{d\uparrow} \cdot r_\uparrow) \qquad (10)$$

The vector $r_\uparrow$ in the equation (10) corresponds to a vector in the vertical direction to the arrangement lines $PL_1$, $PL_2$, $PL_3$, . . . , in the example of FIG. 75.

(Hole-Depth Modulation)

In the 2D-PC surface emitting laser according to the ninth embodiment, FIG. 76 shows a real space structural example illustrating an aspect that the perturbation of the hole-depth modulation of the sine wave function is applied to the lattice point for forming resonant-state (rectangular lattice) 12A in the 2D-PC layer 12. In FIG. 76, the perturbations of the periodic hole-depth modulation of the sine wave function are applied in the vertical direction to the arrangement lines $PL_1$, $PL_2$, $PL_3$, . . . . For example, the lattice point for forming perturbation-state $12P_1$ to which the perturbation of the depth H1 is applied is arranged on arrangement line $PL_1$. Similarly, the lattice point for forming perturbation-state $12P_2$ to which the perturbation of the depth H2 is applied is arranged on the arrangement line PL2, and the lattice point for forming perturbation-state $12P_3$ to which the perturbation of the depth H3 is applied is arranged on the arrangement line $PL_3$.

The depth of the perturbation term in which the perturbation of the sine wave function is applied to the lattice point for forming resonant-state 12A with respect to the depth $h_{0,a}(r_\uparrow)$ of the lattice point for forming resonant-state 12A in the 2D-PC layer 12 can be expressed the equation, $h_{1,a}(r_\uparrow) \sin(k_{d\uparrow} \cdot r_\uparrow)$.

Accordingly, the depth $h_a(r_\uparrow)$ of the lattice point for forming perturbation-state 12P in which the perturbation of the periodic hole-depth modulation of the sine wave function is applied to the fundamental structure of the lattice point for forming resonant-state 12A in the 2D-PC layer 12 is expressed by the following equation.

$$h_a(r_\uparrow) = h_{0,a}(r_\uparrow) + h_{1,a}(r_\uparrow)\sin(k_{d\uparrow} \cdot r_\uparrow) \quad (11)$$

(Perturbation of Hole Diameter d: Rectangle Lattice X-Point)

In the 2D-PC surface emitting laser according to the ninth embodiment, FIG. 77 shows a real space structural example illustrating an aspect that the perturbation of the hole-shape (hole-diameter) modulation of the sine wave function is applied in the y-axial direction to the lattice point for forming resonant-state (rectangular lattice X-point) 12A in the 2D-PC layer 12, and FIG. 78 shows the wave number space corresponding to the Fourier transform of the real space in FIG. 77.

With reference to the equation (10), the perturbation term in which the perturbation of the sine wave function is applied to the lattice point for forming resonant-state 12A with respect to the hole diameter $d_0$ of the lattice point for forming resonant-state 12A in the 2D-PC layer 12 can be expressed the equation, $d_1 \sin(k_{d\uparrow} \cdot r_\uparrow)$.

Accordingly, the hole diameter d of the lattice point for forming perturbation-state 12P in which the perturbation of the periodic hole-shape (hole-diameter) modulation of the sine wave function is applied in the x-axial direction to the fundamental structure of the lattice point for forming resonant-state 12A in the 2D-PC layer 12 is expressed by the following equation, with reference to the equation (10).

$$d = d_0 + d_1 \sin(k'_{d\uparrow} \cdot r_\uparrow) \quad (12)$$

Moreover, $k'_{d\uparrow} \cdot r_\uparrow$ is expressed by the following equation.

$$k'_{d\uparrow} \cdot r_\uparrow = (k'_{dx}, k'_{dy})(ma_x, ma_y) = (0, b_y/2 \cdot s)(ma_x, ma_y) = nns \quad (13)$$

In this case, $a_x b_x = a_y b_y = 2n$, and the following equation is realized.

$$d = d_0 + d_1 \sin(nns) \quad (14)$$

Accordingly, the sine wave function $\sin \theta_d$ of the perturbation term is expressed by the following equation, where the beam emitting angle in the medium is $\theta_d$.

$$\sin \theta_d = \Delta k/k = (a_{yc}^{-1} - a_y^{-1})/a_y^{-1} = a_y/a_{yc} - 1 = s - 1 \quad (15)$$

In this case, s is called a perturbation coefficient.

The perturbation coefficient s is expressed by the ratio $(a_y/a_{yc})$ between the lattice constant $a_y$ in the y-axial direction and the lattice constant $a_{yc}$ corresponding to the modulated part $(b_y/2 \cdot s)$ in the y-axial direction.

The product between the refractive index $n_d$ in the medium and the sine wave function $\sin \theta_d$ of the perturbation term is equal to the sine wave function in the atmosphere $\sin \theta_{air}$, where the refractive index in the medium is $n_d$, and the beam emitting angle in the atmosphere is $\theta_{air}$. That is, the following equation is realized.

$$n_d \sin \theta_d = \sin \theta_{air} \quad (16)$$

$$\theta_{air} = \sin^{-1}(n_d \sin \theta_d) = \sin^{-1}(n_d(s-1)) \quad (17)$$

Moreover, in the 2D-PC surface emitting laser according to the ninth embodiment, the numerical computation result of the lattice constant $(a_x, a_y)$, the hole diameter $d_1$, the perturbation coefficient s $(=a_y/a_{yc})$, and the beam emitting angle θ are expressed as shown in FIG. 79 in the case where the perturbation of the hole-shape (hole-diameter) modulation is applied to the lattice point for forming resonant-state (rectangle lattice X-point) 12A in the 2D-PC layer 12 in the y-axial direction. The Lattice constants $(a_x, a_y)$ are (270 nm, 280 nm), the hole diameter $d_0$ of the primitive lattice is 70 nm, and the modulation amplitude $d_1$ is 4 nm. The sample 1 is an example of the perturbation coefficient s=0.96, and the beam emitting angles θ·2θ are 7.6°·15.2°. The sample 2 is an example of the perturbation coefficient s=0.98, and the beam emitting angles θ·2θ are 3.8°·7.6°. The sample 3 is an example of the perturbation coefficients s=0.96, 0.98, and the beam emitting angles θ·2θ are 7.6°·15.2° and 3.8°·7.6°. In the present embodiment, the beam emitting angle θ is defined with the beam emitting angle measured from the z axis in the y-z planar, as shown in FIG. 70B. In the 2D-PC surface emitting laser according to the ninth embodiment, the surface light emission laser beam actually radiated becomes a range of 2θ in the plus/minus direction of the beam emitting angle θ measured from the z axis in the y-z planar from the 2D-PC layer 12.

In the 2D-PC surface emitting laser according to the ninth embodiment, the FFP and the beam emitting angle 2θ in the case of the perturbation coefficient s=0.96 are expressed as shown in FIG. 80A, the FFP and the beam emitting angle 2θ in the case of the perturbation coefficient s=0.98 are expressed as shown in FIG. 80B, and the FFP and the beam emitting angle 2θ in the case of the perturbation coefficients s=0.98, 0.96 are expressed as shown in FIG. 80C, in experimental results in the case of applying the perturbation of hole-shape (hole-diameter) modulation to the lattice point for forming resonant-state (rectangle lattice X-point) in the 2D-PC in the y-axial direction. The results of FIGS. 80A, 80B and 80C respectively correspond to the samples 1, 2 and 3 shown in FIG. 79.

As shown in FIG. 80A, two FFPs corresponding to the sample 1 of FIG. 79 has appeared in the beam emitting angle 2θ=15.8°.

As shown in FIG. 80B, two FFPs corresponding to the sample 2 of FIG. 79 has appeared in the beam emitting angle 2θ=7.7°.

As shown in FIG. 80C, four FFPs in total corresponding to the sample 3 of FIG. 79 has appeared in the beam emitting angles 2θ=7.6° and 15.4°.

Accordingly, the hole diameter d of the lattice point for forming perturbation-state 12P in which perturbation terms $d_1 \sin(nns_1)$ and $d_2 \sin(nns_2)$ of the periodic hole-shape (hole-diameter) modulation of the sine wave function is applied in the x-axial direction to the fundamental structure of the lattice point for forming resonant-state 12A in the 2D-PC layer 12 is expressed by the following equation, with reference to the equation (9), where $s_1$ and $s_2$ are two perturbation coefficients corresponding to the sample 3 shown in FIG. 79

$$d = d_0 + d_1 \sin(nns_1) + d_2 \sin(nns_2) \quad (18)$$

In the 2D-PC surface emitting laser according to the ninth embodiment, the superposition is realized in the hole diameter d of the lattice point for forming perturbation-state 12P in which a plurality of the perturbations are applied to the fundamental structure of the lattice point for forming resonant-state 12A in the 2D-PC layer 12 in the y-axial direction.

Similarly, in the 2D-PC surface emitting laser according to the ninth embodiment, the superposition of a plurality of the arbitrary perturbation terms of is realized also in the lattice point for forming perturbation-state 12P in which the plurality of arbitrary perturbations are applied to the fundamental structure of the lattice point for forming resonant-state 12A in the 2D-PC layer 12.

In the 2D-PC surface emitting laser according to the ninth embodiment, FIG. 81 shows the real space structural example of the lattice point for forming perturbation-state 12P in which the perturbation of hole-shape (hole-diameter) modulation is applied in the y-axial direction to the lattice point for forming resonant-state (rectangular lattice) 12A in the 2D-PC layer 12. In FIG. 81, the perturbations of periodic hole-shape (hole-diameter) modulation of sine wave function are applied in the vertical y-axial direction to the arrangement lines $PL_1$, $PL_2$, $PL_3$, . . . .

For example, the hole diameter d of the lattice point for forming perturbation-state $12P_1$ arranged on the arrangement line $PL_1$ is expressed by the following equation.

$$d = 100 + \sin(0.96\, n \times 0) = 100 \quad (19)$$

Similarly, the hole diameter d of the lattice point for forming perturbation-state $12P_2$ arranged on the arrangement line $PL_2$ is expressed by the following equation.

$$d = 100 + 10 \sin(0.96\, n \times 1) = 101.25 \quad (20)$$

Similarly, the hole diameter d of the lattice point for forming perturbation-state $12P_3$ arranged on the arrangement line $PL_3$ is expressed by the following equation.

$$d = 100 + 10 \sin(0.96\, n \times 2) = 97.51 \quad (21)$$

Moreover, the beam emitting angle $\theta_{air}$ in the atmosphere is obtained as follows.

$$\theta_{air} = \sin^{-1}(n_d \sin \theta_d) = \sin^{-1}(n_d(s-1)) = \sin^{-1}(3.3(0.96-1)) = 7.6° \quad (22)$$

In the 2D-PC surface emitting laser according to the ninth embodiment, FIG. 82 shows a real space structural example illustrating an aspect that the perturbation of the hole-shape (hole-diameter) modulation of the sine wave function is applied in the y-axial direction to the lattice point for forming resonant-state (face-centered rectangle lattice) 12A in the 2D-PC layer 12. In FIG. 82, the perturbations of periodic hole-shape (hole-diameter) modulation of sine wave function are applied in the vertical y-axial direction to the arrangement lines $PL_1$, $PL_2$, $PL_3$, . . . .

For example, the hole diameter d of the lattice point for forming perturbation-state $12P_1$ arranged on the arrangement line $PL_1$ is similarly illustrated as the equation (19), the hole diameter d of the lattice point for forming perturbation-state $12P_2$ arranged on the arrangement line $PL_2$ is similarly illustrated as the equation (20), and the hole diameter d of the lattice point for forming perturbation-state $12P_3$ arranged on the arrangement line $PL_3$ is similarly illustrated as the equation (21).

In the 2D-PC surface emitting laser according to the ninth embodiment, FIG. 83 shows a real space structural example illustrating an aspect that the perturbation of the hole-shape (hole-diameter) modulation of the sine wave function is applied in the y-axial direction to the lattice point for forming resonant-state (square lattice) 12A in the 2D-PC layer 12. In FIG. 83, the perturbations periodic hole-shape (hole-diameter) modulation of sine wave function are applied in the vertical y-axial direction to the arrangement lines $PL_1$, $PL_2$, $PL_3$, . . . .

For example, the hole diameter d of the lattice point for forming perturbation-state $12P_1$ arranged on the arrangement line $PL_1$ is similarly illustrated as the equation (19), the hole diameter d of the lattice point for forming perturbation-state $12P_2$ arranged on the arrangement line $PL_2$ is similarly illustrated as the equation (20), and the hole diameter d of the lattice point for forming perturbation-state $12P_3$ arranged on the arrangement line $PL_3$ is similarly illustrated as the equation (21).

(Emitting Direction and FFP)

In the 2D-PC surface emitting laser according to the comparative example, FIG. 84 schematically shows an FFP of the lattice point for forming resonant-state (square lattice Γ-point (gamma-point)) in the 2D-PC layer 12. More specifically, in the three-dimensional space (x, y, z), the FFP of the beam spread angle $\theta_0$ is obtained from the surface vertical z-axial direction of the 2D-PC layer 12 arranged on the substrate 10. In the present embodiment, the FFP has a small shape in two dimensions of which the beam spread angle $\theta_0$ is approximately 1°. This is a result of occurring theoretically by performing extraction in the surface vertical direction from the two-dimensional large area oscillation of the lattice point for forming resonant-state (square lattice Γ-point (gamma-point)) in the 2D-PC layer 12.

In the 2D-PC surface emitting laser according to the comparative example, FIG. 85 schematically shows an FFP of the lattice point for forming resonant-state (rectangular lattice Γ-point (gamma-point)) in the 2D-PC layer 12. More specifically, in the three-dimensional space (x, y, z), the FFP of the beam spread angle $\theta_0$ is obtained from the surface vertical z-axial direction of the 2D-PC layer 12 arranged on the substrate 10. In the present embodiment, the FFP has a stripe shape or an ellipse in the y-axial direction of which the beam spread angle $\theta_0$ is approximately 5° to approximately 20°.

FIG. 86 schematically shows the FFP in the case of superimposing the lattice point for light extraction on the lattice point for forming resonant-state (square lattice M-point) in the 2D-PC layer (the example shown in FIG. 71), in the 2D-PC surface emitting laser according to the comparative example. More specifically, in the three-dimensional space (x, y, z), the FFP of the beam emitting angle $\theta_{11}$ is obtained from the surface vertical z-axial direction of the 2D-PC layer 12 arranged on the substrate 10. In the present embodiment, the beam emitting angle $\theta_{11}$ can be freely modified from 0° to 90°. Although the emitting beam has a spread width of the spread angle $2\theta_0$, the spread width is small in two dimensions as shown on the plane $P_z$ parallel to the x-y planar, since the angle $\theta_0$ is approximately 1°.

In the 2D-PC surface emitting laser according to the ninth embodiment, FIG. 87 schematically shows an FFP in the case of applying the perturbation in the y-axial direction to the lattice point for forming resonant-state (rectangle lattice X-point) in the 2D-PC layer 12. More specifically, in the three-dimensional space (x, y, z), the FFP of the beam emitting angle $\theta_{22}$ is obtained from the surface vertical z-axial direction of the 2D-PC layer 12 arranged on the substrate 10. In the present embodiment, the beam emitting angle $\theta_{22}$ can be freely modified from 0° to 90°. Although the emitting beam has a spread width of the spread angle $2\theta_3$, the spread width is relatively larger compared with the comparative example shown in FIG. 86 in two dimensions as shown on the plane $P_z$ parallel to the x-y planar, since the angle $\theta_3$ is from approximately 5° to approximately 20°.

(Structure Example of Hole-Depth Modulation)

FIG. 88 shows a schematic planar pattern configuration of the lattice points for forming perturbation-state 12P in which the perturbation of hole-depth modulation is applied in the y-axial direction to the lattice points for forming resonant-state (rectangular lattice) in the 2D-PC layer, in the 2D-PC surface emitting laser according to the ninth embodiment.

Moreover, FIG. 88A shows a schematic cross-sectional structure taken in the line VIII-VIII of FIG. 88, FIG. 88B shows a schematic cross-sectional structure taken in the line IX-IX of FIG. 88, and FIG. 88C shows a schematic cross-sectional structure taken in the line X-X of FIG. 88.

As shown in FIGS. 88 and 89, the hole depth of the lattice point for forming perturbation-state $12P_1$ is expressed with H1, and the hole depth of the lattice point for forming perturbation-state $12P_2$ is expressed with H2, and the hole depth of the lattice point for forming perturbation-state $12P_3$ is expressed with H3, with respect to the hole depth h0 of the lattice point for forming resonant-state.

(Structure Example of Refractive Index Modulation)

FIG. 90 shows a schematic planar pattern configuration of the lattice points for forming perturbation-state 12P in which the perturbation of refractive index modulation is applied in the y-axial direction to the lattice points for forming resonant-state (rectangular lattice) in the 2D-PC layer, in the 2D-PC surface emitting laser according to the ninth embodiment.

Moreover, FIG. 91A shows an example of the refractive index profile in the x-axial direction taken in the line XI-XI of FIG. 90, FIG. 91B shows an example of the refractive index profile in the x-axial direction taken in the line XII-XII of FIG. 90, and FIG. 91C shows an example of the refractive index profile in the x-axial direction taken in the line XIII-XIII of FIG. 90.

As shown in FIGS. 90 and 91, the refractive index of the lattice point for forming perturbation-state $12P_1$ is expressed with $n_1$, the refractive index of the lattice point for forming perturbation-state $12P_2$ is expressed with $n_2$, and the refractive index of the lattice point for forming perturbation-state $12P_3$ is expressed with $n_3$, with respect to the refractive index n0 in the medium in the 2D-PC layer 12.

(Structure Example of Hole-Shape (Hole-Diameter) Modulation)

In the 2D-PC surface emitting laser according to the ninth embodiment, FIG. 92 shows a schematic planar pattern configuration of the lattice point for forming perturbation-state 12P in which the perturbation of hole-shape (hole-diameter) modulation is applied in the y-axial direction to the lattice point for forming resonant-state (rectangular lattice) in the 2D-PC layer 12.

Moreover, FIG. 93A shows a schematic cross-sectional structure taken in the line XVI-XVI of FIG. 92, FIG. 93B shows a schematic cross-sectional structure taken in the line XV-XV of FIG. 92, and FIG. 93C shows a schematic cross-sectional structure taken in the line XVI-XVI of FIG. 92.

As shown in FIGS. 92 and 93, the hole diameter of the lattice point for forming perturbation-state $12P_1$ is expressed with D1, the hole diameter of the lattice point for forming perturbation-state $12P_2$ is expressed with D2, and the hole diameter of the lattice point for forming perturbation-state $12P_3$ is expressed with D3, with respect to the hole shape (hole diameter) $d_0$ of the lattice point for forming resonant-state (rectangular lattice) 12A in the 2D-PC layer 12.

FIG. 94A shows a schematic plane configuration (example of square lattice arrangement) of the lattice point for forming resonant-state 12A in the 2D-PC layer 12 applied to the Γ-point (gamma-point) oscillation, and FIG. 94B shows a relationship between the normalized frequency [unit: c/a] and the wave number vector in the 2D-PC band structure.

In the photonic band structure, a portion of which the inclination is 0 is called a band edge. In the band edge, the photonic crystal functions as an optical resonator, since a group velocity of light becomes 0 and then a standing wave is formed.

In the PC layer 12, the lattice point for forming perturbation-state 12P in which the perturbation is applied to the lattice point for forming resonant-state 12A is used for the diffraction in the surface vertical direction of the PC layer 12.

In the 2D-PC surface emitting laser according to the ninth embodiment, if the oscillation in the M-point band edge of photonic band structure is used, although the periodic structure of photonic crystal has only a function of the resonant-state form for the oscillation, light can be extracted by arranging the lattice point for forming perturbation-state 12P in which the perturbation is applied to the lattice point for forming resonant-state 12A.

In addition, the 2D-PC surface emitting laser according to the ninth embodiment can operate in a single mode stable in a large area. More specifically, in the 2D-PC surface emitting laser according to the ninth embodiment, the single mode is maintainable also in a large area since electromagnetic field distribution is defined by the lattice point for forming resonant-state 12A and the lattice point for forming perturbation-state 12P formed in the PC layer 12. Accordingly, ii is easy to perform processing for collecting a watt-class output laser light into one small point through a lens.

For example, in FIG. 67, the sizes of the PC layer 12 are approximately 700 μm×approximately 700 μm.

Moreover, in the example of the NFP, oscillations can also be achieved from large area oscillations of approximately 100-μm square to super-large area oscillations of an approximately several 100-μm square. Room-temperature continuous oscillations with a wavelength of approximately 950 nm are obtained with Full Width at Half Maximum (FWHM) of approximately 0.16 nm in an oscillation spectrum. An optical power of 2.7 W is obtained by pulse driving of 1 kHz-50 ns in a single mode.

The lattice point for forming resonant-state 12A can be arranged in a pitch of the period of light, for example. For example, supposing that the hole is fulfilled with an air, the pitch of the air/semiconductor is can be arranged in a period of approximately 400 nm in the optical communication band, and can be arranged in a period of approximately 230 nm in the blue light.

Moreover, the diameter and the depth of the lattice point for forming resonant-state 12A currently made as an experiment are respectively approximately 120 nm and approximately 115 nm, for example, and the pitch thereof is approximately 286 nm, for example. Such numerical examples can be appropriately modified in accordance with materials composing the substrate 10 and the active layer 14, materials of the 2D-PC layer 12, the wavelength in the medium, etc.

For example, in the 2D-PC surface emitting laser according to the ninth embodiment to which GaAs/AlGaAs based materials are applied, the wavelength λ in the medium of the 2D-PC layer 12 is from approximately 200 nm to approximately 300 nm, and output laser light wavelengths are from approximately 900 nm to approximately 915 nm.

In addition, if the lattice point for forming perturbation-state 12P is subjected to the refractive index modulation, the lattice point for forming perturbation-state 12P may be filled up with semiconductor layers differing in refractive index, for example. For example, the lattice point for forming perturbation-state 12P may be formed by filling up the GaAs layer with the $Al_xGa_{1-x}As$ layer modulated with the composition ratio x. For example, during a fabricating process for welding the 2D-PC layer 12, if lattice point for forming perturbation-state becomes deformed, it is effective to fill up with the semiconductor layers differing in the refractive index in order to avoid such a deformation.

According to the ninth embodiment, there can be provided the 2D-PC surface emitting laser which can control the beam emitting angle and the beam spread angle and shape of the laser beam, while continuing the stable oscillation with the simplified structure.

TENTH EMBODIMENT

A schematic bird's-eye view structure of a 2D-PC surface emitting laser according to a tenth embodiment is similarly illustrated as FIG. 67.

The 2D-PC surface emitting laser according to an eighth embodiment includes: a substrate 24; a lattice point for forming resonant-state 12A periodically arranged in the PC layer 12, and configured so that a light wave in a band edge in photonic band structure is diffracted in the plane of the PC layer 12; and a lattice point for forming perturbation-state 12P periodically arranged in the PC layer 12, and configured so that the light wave in the band edge of the photonic band structure in the PC layer 12 is diffracted in the plane of the PC layer 12, and diffracted in a surface vertical direction of the PC layer 12.

In the present embodiment, perturbation for diffracting the light wave in the surface vertical direction of the PC layer 12 is applied to a part of the lattice point for forming resonant-state 12A. More specifically, the perturbation for diffracting the light wave in the surface vertical direction of the PC layer 12 is applied to a part of the lattice point for forming resonant-state 12A, and thereby the lattice point for forming perturbation-state 12P is formed.

The lattice point for forming resonant-state 12A to which a perturbation was applied is expressed by a lattice point for forming perturbation-state (perturbation-state-forming lattice) 12P. The lattice point for forming perturbation-state 12P is arranged in the PC layer 12.

Moreover, the perturbation applied to the lattice point for forming perturbation-state is periodic modulation. The periodic modulation may be refractive index modulation, may be hole-diameter modulation, or may be hole-depth modulation. Furthermore, the periodic modulation may be the hole-depth modulation and the hole-depth modulation.

In the 2D-PC surface emitting laser according to the tenth embodiment, a square lattice, a rectangular lattice, a face-centered rectangle lattice, a triangular lattice, etc. are applicable as a lattice pattern of the lattice point for forming resonant-state 12A.

In the 2D-PC surface emitting laser according to the tenth embodiment, various band edge oscillations can be achieved by applying the perturbation to the lattice point for forming resonant-state 12A which forms the periodic structure in the PC layer 12. For example, Γ-point (gamma-point), X point, and J-point oscillations are achieved in the square lattice and the rectangular lattice, and the Γ-point (gamma-point), X point and M-point oscillation are achieved in the face-centered rectangle lattice and the triangular lattice.

In the same manner as FIG. 67, the 2D-PC surface emitting laser according to the tenth embodiment includes: a substrate 24; a first cladding layer 10 disposed on the substrate 24; a second cladding layer 16 disposed on the first cladding layer 10; and an active layer 14 inserted between the first cladding layer 10 and the second cladding layer 16. In the present embodiment, the first cladding layer 10 may be formed of a p type semiconductor layer, and the second cladding layer 16 may be formed of an n type semiconductor layer. The electrical conductivity of the semiconductor layer may be reverse to each other.

Furthermore, in the same manner as FIG. 67, the 2D-PC surface emitting laser according to the tenth embodiment includes: a contact layer 18 arranged on the second cladding layer 16; a window layer 20 disposed on a surface light emission region on the contact layer 18, and configured to extract a laser beam; a window-like upper electrode 22 disposed on the window layer 20; and a lower electrode 26 disposed on a back side surface of the substrate 24.

In the same manner as FIG. 67, the PC layer 12 may be inserted between the first cladding layer 10 and the second cladding layer 16 so as to be adjacent to the active layer 14 in a surface vertical direction of the active layer 14. In the present embodiment, the active layer 14 may be formed of an MQW layer, for example.

Moreover, the PC layer 12 may be inserted between the first cladding layer 10 and the active layer 14, in the same manner as FIG. 67.

Moreover, as shown in FIG. 67, a carrier blocking layer 13 is inserted between the active layer 14 and the PC layer 12 so that carriers may be effectively acquired in the active layer 14 composed of the MQW layer, and a carrier injection from the active layer 14 to the PC layer 12 may be blocked.

Moreover, the PC layer 12 may be inserted between the second cladding layer 16 and the active layer 14.

(M-point Oscillation: Square Lattice)

In the 2D-PC surface emitting laser according to the tenth embodiment, FIG. 95A shows a schematic plane configuration of the lattice point for forming resonant-state 12A and the lattice point for forming perturbation-state 12P in the 2D-PC layer 12 applied to the M-point oscillation. Moreover, FIG. 95B shows a relationship between the normalized frequency and the wave number vector, in the 2D-PC band structure corresponding to FIG. 95A.

In the 2D-PC surface emitting laser according to the tenth embodiment, the lattice point for forming resonant-state 12A for diffracting the light wave in the M-point band edge (near the region Q shown in FIG. 95B) in the photonic band structure in the PC layer 12 is arranged in the square lattice shape, as shown in FIG. 95A, the lattice point for forming perturbation-state 12P is arranged in a face-centered square lattice shape having a lattice constant twice the lattice constant of the square lattice shape, and the pitch in a diagonal direction of the lattice point for forming perturbation-state 12P is equal to a wavelength λ in the medium of the PC layer 12.

(X-point Oscillation: Square Lattice)

In the oscillation in the X-point band edge in the photonic band structure, although the periodic structure of the photonic crystal has only a function of optical amplification for the oscillation, the light can be extracted by disposing periodic structure (perturbation state forming) for diffracting the light in the same plane as the periodic structure.

As shown in FIG. 96A, a schematic plane configuration of the lattice point for forming resonant-state 12A and the lattice point for forming perturbation-state 12P in the 2D-PC layer 12 applied to the X-point oscillation is arranged in a square-lattice shape, in the 2D-PC surface emitting laser according to the tenth embodiment. Moreover, FIG. 96B shows a relationship between the normalized frequency and the wave number vector, in the 2D-PC band structure corresponding to FIG. 96A.

In the 2D-PC surface emitting laser according to the tenth embodiment, the lattice point for forming resonant-state 12A for diffracting the light wave in the X-point band edge (near the region R shown in FIG. 96B) in the photonic band structure in the PC layer 12 is arranged in a first square lattice shape, as shown in FIG. 96A; and the lattice point for forming perturbation-state 12P is arranged in a second square lattice shape having a lattice constant twice the lattice constant of the first square lattice shape, and the lattice point for forming perturbation-state 12P is equal to the wavelength λ in the medium of the PC layer.

(X-point Oscillation: Triangular Lattice)

As shown in FIG. 97A, a schematic plane configuration of the lattice point for forming resonant-state 12A and the lattice point for forming perturbation-state 12P in the 2D-PC layer 12 applied to the X-point oscillation is arranged in a triangular lattice shape, in the 2D-PC surface emitting laser according to the tenth embodiment. Moreover, FIG. 97B shows a relationship between the normalized frequency and the wave number vector, in the 2D-PC band structure corresponding to FIG. 97A.

In the 2D-PC surface emitting laser according to the tenth embodiment, the lattice point for forming resonant-state 12A for diffracting the light wave in the X-point band edge (near the region R shown in FIG. 97B) in the photonic band structure in the PC layer 12 is arranged in a first triangular lattice shape, as shown in FIG. 97A; and the lattice point for forming perturbation-state 12P is arranged in a second triangular-lattice shape twice the pitch of the first triangular lattice, and the height in the planar view of the second triangular lattice is equal to the wavelength λ in the medium of the PC layer 12.

(J-point Oscillation: Triangular Lattice)

In the 2D-PC surface emitting laser according to the tenth embodiment, although the periodic structure of the photonic crystal has only a function of optical amplification for the oscillation, in the oscillation in the J-point band edge in the photonic band structure, the light can be extracted by disposing periodic structure (perturbation state forming) for diffracting the light in the same plane as the periodic structure.

As shown in FIG. 98A, the lattice point for forming resonant-state 12A and the lattice point for forming perturbation-state 12P in the 2D-PC layer 12 applied to the J-point oscillation is arranged in a triangular lattice shape, in the 2D-PC surface emitting laser according to the tenth embodiment. Moreover, FIG. 98B shows a relationship between the normalized frequency and the wave number vector, in the 2D-PC band structure corresponding to FIG. 98A.

In the 2D-PC surface emitting laser according to the tenth embodiment, the lattice point for forming resonant-state 12A for diffracting the light wave in the J-point band edge (near the region S shown in FIG. 98B) in the photonic band structure in the PC layer 12 is arranged in a first triangular lattice shape, as shown in FIG. 98A; and the lattice point for forming perturbation-state 12P is arranged at the pitch of the face-centered triangular lattice 3 times the pitch of the first triangular lattice, and the length of one side of the face-centered triangular lattice is equal to twice the wavelength λ in the medium of the PC layer 12.

(X-point Oscillation: Rectangular Lattice)

As shown in FIG. 99A, a schematic plane configuration of the lattice point for forming resonant-state 12A and the lattice point for forming perturbation-state 12P in the 2D-PC layer 12 applied to the X-point oscillation is arranged in a rectangular lattice shape (example of $a_1 > a_2$), in the 2D-PC surface emitting laser according to the tenth embodiment. Moreover, FIG. 99B shows a relationship between the normalized frequency and the wave number vector, in the 2D-PC band structure corresponding to FIG. 99A.

In the 2D-PC surface emitting laser according to the tenth embodiment, the lattice point for forming resonant-state 12A for diffracting the light wave in the X-point band edge (near the region R shown in FIG. 99B) in the photonic band structure in the PC layer 12 is arranged in a first rectangular lattice shape having the lattice constants $a_1$ and $a_2$, as shown in FIG. 99A; and the lattice point for forming perturbation-state 12P is arranged in a second rectangular-lattice shape differ from the first rectangular lattice shape. In the present embodiment, the lattice constants of the second rectangular lattice is equal to r-times the wavelength λ in the medium and to the wavelength λ in the medium, with respect to the aspect ratio $r = a_1/a_2$ (where $r \neq 1$) defined with the lattice constants $a_1$ and $a_2$ of the first rectangular lattice.

(X-point Oscillation: Rhombic Lattice)

As shown in FIG. 100A, a schematic plane configuration of the lattice point for forming resonant-state 12A and the lattice point for forming perturbation-state 12P in the 2D-PC layer 12 applied to the X-point oscillation is arranged in a rhombic lattice shape, in the 2D-PC surface emitting laser according to the tenth embodiment. Moreover, FIG. 100B shows a relationship between the normalized frequency and the wave number vector, in the 2D-PC band structure corresponding to FIG. 100A.

In the 2D-PC surface emitting laser according to the tenth embodiment, the lattice point for forming resonant-state 12A for diffracting the light wave in the X-point band edge (near the region R shown in FIG. 100B) in the photonic band structure in the PC layer 12 is arranged in a face-centered rectangle lattice shape having the lattice constants $a_1$ and $a_2$, as shown in FIG. 100A; and the lattice point for forming perturbation-state 12P is arranged in a rectangular lattice shape. In the present embodiment, the lattice constants of the rectangular lattice is equal to r-times the wavelength λ in the medium and to the wavelength λ in the medium, with respect to the aspect ratio $r = a_1/a_2$ (where $r \neq 1$) defined with the lattice constants $a_1$ and $a_2$ of the face-centered rectangle lattice.

(X-point Oscillation: Rectangular Lattice)

In the 2D-PC surface emitting laser according to the tenth embodiment, as shown in FIG. 95A, a schematic plane configuration of the lattice point for forming resonant-state 12A and the lattice point for forming perturbation-state 12P in the 2D-PC layer 12 applied to the M-point oscillation are arranged in a rectangular lattice shape (example of $a_1 < a_2$). Moreover, FIG. 101B shows a relationship between the normalized frequency and the wave number, in the 2D-PC band structure corresponding to FIG. 101A.

In the 2D-PC surface emitting laser according to the tenth embodiment, the lattice point for forming resonant-state 12A for diffracting the light wave in the X-point band edge (near the region R shown in FIG. 101B) in the photonic band structure in the PC layer 12 is arranged in a first rectangular lattice shape having the lattice constants $a_1$ and $a_2$, as shown in FIG. 101A; and the lattice point for forming perturbation-state 12P is arranged in a second rectangular-lattice shape differ from the first rectangular lattice shape. In the present embodiment, the lattice constants in the x direction and the y direction of the second rectangular-lattice shape is equal to $a_1$ and the wavelength $\lambda$ in the medium ($=2a_2$) with respect to the lattice constants $a_1$ and $a_2$ in the x direction and the y direction of the first rectangular-lattice shape.

(X-point Oscillation: Rhombic Lattice)

In the 2D-PC surface emitting laser according to the tenth embodiment, a schematic plane configuration of the lattice points for resonator 12A in the 2D-PC layer 12 applied to the X-point oscillation is arranged in a rhombic lattice shape, as shown in FIG. 102A. Moreover, FIG. 102B shows a relationship between the normalized frequency and the wave number, in the 2D-PC band structure corresponding to FIG. 102A.

In the 2D-PC surface emitting laser according to the tenth embodiment, the lattice point for forming resonant-state 12A for diffracting the light wave in the X-point band edge (near the region R shown in FIG. 102B) in the photonic band structure in the PC layer 12 is arranged in a rhombic lattice shape having the lattice constants $a_1$ and $a_2$, as shown in FIG. 102A; and the lattice point for forming perturbation-state 12P is arranged in a rectangular lattice shape. In the present embodiment, the lattice constant of the rectangular lattice is equal to the wavelength $\lambda a_1$ in the medium and the wavelength $\lambda$ in the medium with respect to the lattice constants $a_1$ and $a_2$ of the rhombic lattice.

Other configurations are the same as those of the ninth embodiment.

According to the tenth embodiment, there can be provided the 2D-PC surface emitting laser which can control the beam emitting angle and the beam spread angle and shape of the laser beam, while continuing the stable oscillation with the simplified structure.

(Control of Beam Spread Angle: Resonator Region RP and Perturbation-State Forming Region PP)

The resonator region RP is a region where the lattice point for forming resonant-state 12A is arranged in the PC layer 12, and the perturbation-state forming region PP is a region where the lattice point for forming perturbation-state 12P is arranged in the PC layer 12.

The relationship between the width A, the beam spread angle, and the beam spread region of the perturbation-state forming region PP is illustrated as schematically shown in FIGS. 11A, 11B and 11C, in the 2D-PC surface emitting laser according to the tenth embodiment. More specifically, an example of the width $A_1$, the beam spread angle $\theta_1$, and the beam spread region $30_1$ of the perturbation-state forming region $PP_1$ are similarly illustrated as FIG. 11A, an example of the width $A_2$, the beam spread angle $\theta_2$, and the beam spread region $30_2$ of the perturbation-state forming region $PP_2$ are similarly illustrated as FIG. 11B, and an example of the width $A_3$, the beam spread angle $\theta_3$, and the beam spread region $30_3$ of the perturbation-state forming region $PP_3$ are similarly illustrated as FIG. 11C. In the present embodiment, the beam spread angles $\theta_1$, $\theta_2$ and $\theta_3$ in FIGS. 11A, 11B and 11C are respectively $\theta_a$, $\theta_b$ and $\theta_c$. In the present embodiment, the size relationship between the widths of the perturbation-state forming regions is expressed with $A_1 < A_2 < A_3$, the size of the perturbation-state forming region $PP_1$ is relatively smaller than others, and the size of the perturbation-state forming region $PP_3$ is relatively larger than others. Moreover, $\theta_a > \theta_b > \theta_c$ is satisfied in the size relationship between the beam spread angles specifying the beam spread regions $30_1$, $30_2$, $30_3$.

In the 2D-PC surface emitting laser according to the tenth embodiment, the size relationship between the resonator regions RP corresponding to FIGS. 11A, 11B and 11C is similarly illustrated as FIG. 12A, and the size relationship of the beam spread angles corresponding thereto is similarly illustrated as FIG. 12B. More specifically, the beam spread angle $\theta 0$ becomes smaller as the size of the resonator region RP becomes larger.

In the 2D-PC surface emitting laser according to the comparative example, in the diagram showing the relationship of the size of the resonator region RP in the 2D-PC layer applied to the square lattice $\Gamma$-point (gamma-point) oscillation, an example of the $RP_1$ is similarly illustrated as FIG. 13A, an example of the $RP_2$ is similarly illustrated as FIG. 13B, and an example of the $RP_3$ is similarly illustrated as FIG. 13C.

On the other hand, in the 2D-PC surface emitting laser according to the tenth embodiment, an example of the $RP_1$ and $PP_1$ is similarly illustrated as FIG. 14A, an example of the $RP_2$ and $PP_2$ is similarly illustrated as FIG. 14B, and an example of the $RP_3$ and $PP_3$ is similarly illustrated as FIG. 14C, in the diagram showing the relationship between the size of the resonator region RP and the size of the perturbation-state forming region PP in the 2D-PC layer applied to the X-point oscillation.

The oscillation of the 2D-PC surface emitting laser requires a resonator region having a fixed area or more. Therefore, if the beam spread angle $\theta_0$ is enlarged in the case of the square lattice $\Gamma$-point (gamma-point) oscillation according to the comparative example, the resonator region $RP_A$ required for an oscillation cannot be ensured. More specifically, since the 2D-PC surface emitting laser according to the comparative example uses the square lattice $\Gamma$-point (gamma-point) oscillation, the size of the resonator region RP is equal to the size of the perturbation-state forming region PP in that condition. Accordingly, if the size of the resonator region RP is reduced in order to enlarge the beam spread angle $\theta_0$, It becomes impossible to oscillate in the range of $RP < RP_A$ in the size relationship between the resonator regions RP since the resonator region $RP_A$ required for the oscillation cannot not be ensured, as shown in FIG. 12A.

(Arrangement Relationship Between Perturbation State Forming and Resonator)

In the 2D-PC surface emitting laser according to the modified example 5 of the tenth embodiment, FIG. 103 shows an example of arrangement of the lattice point for forming resonant-state 12A and the lattice point for forming perturbation-state 12P in the resonator region RP and the perturbation-state forming region PP in the 2D-PC layer 12 applied to the X-point oscillation.

In the 2D-PC surface emitting laser related to tenth embodiment, FIG. 104A shows an example of arrangement of the lattice point for forming resonant-state 12A in the PC layer 12. In the present embodiment, the wavelength $\lambda$ in the medium is equal to $2a_2$. Moreover, FIG. 104C shows an example that the lattice point for forming resonant-state 12A and the lattice point for forming perturbation-state 12P are arranged in the same PC layer 12.

In the 2D-PC surface emitting laser related to tenth embodiment, the arrangement relationship between the lattice point for forming perturbation-state 12P and the lattice point for forming resonant-state 12A can be freely set up. The LD characteristics (output, threshold value, etc.) vary depending on the arrangement relationship between the lattice point for forming perturbation-state 12P and the lattice point for forming resonant-state 12A.

The examples shown in FIGS. 103 and 104 are examples of the 2D-PC layer 12 applied to the X-point oscillation, and correspond to the 2D-PC surface emitting laser according to the tenth embodiment.

(Beam Spread Angle Control with Perturbation-State Forming Region PP)

FIG. 105A shows an NFP in the case where the size of the resonator region RP and the size of the perturbation-state forming region PP in the 2D-PC layer applied to the X-point oscillation are nearly equal to each other, in the 2D-PC surface emitting laser according to the tenth embodiment. FIG. 105B shows the beam spread region 30 from the perturbation-state forming region PP, and FIG. 105C shows an example of arrangement of the lattice point for forming resonant-state 12A and the lattice point for forming perturbation-state 12P in the resonator region RP and the perturbation-state forming region PP corresponding to FIG. 105A. In the example shown in FIG. 105C, the perturbation is applied in the y-axial direction to the lattice points for forming resonant-state 12A in the perturbation-state forming region PP, and thereby the lattice points for forming perturbation-state 12P1, 12P2, 12P3 are formed.

Moreover, in the 2D-PC surface emitting laser according to the tenth embodiment, FIG. 106A shows an NFP in the case of the size of the resonator region RP and the size of the perturbation-state forming region PP in the 2D-PC layer 12 applied to the X-point oscillation are different from each other, FIG. 106B shows the beam spread region 30 from the perturbation-state forming region PP, and FIG. 106C shows an example of arrangement of the lattice point for forming resonant-state 12A and the lattice point for forming perturbation-state 12P in the resonator region RP and the perturbation-state forming region PP corresponding to FIG. 106A. In the example shown in FIG. 106C, the perturbation is applied in the y-axial direction to the lattice points for forming resonant-state 12A in the perturbation-state forming region PP, and thereby the lattice points for forming perturbation-state 12P1, 12P2, 12P3 are formed.

More specifically, in the 2D-PC surface emitting laser according to the tenth embodiment, the resonator region RP and the perturbation-state forming region PP can be separately designed, and only the arrangement of the perturbation-state forming region PP ca be modified, thereby variously modifying the beam emitting angle and the beam spread angle of the surface emission-type laser beam, while continuing the stable oscillation.

According to the 2D-PC surface emitting laser according to the tenth embodiment, the perturbation-state forming region PP in which the lattice point for forming perturbation-state 12P is arranged is varied, while maintaining the size of the resonator region RP in which the lattice point for forming resonant-state 12A is arranged, and thereby the beam emitting angle and the beam spread angle of the laser beam can be adjusted, while continuing the stable oscillation.

(Arrangement Relationship Between Perturbation-State Forming Region PP and Resonator Region RP)

In the 2D-PC surface emitting laser according to the tenth embodiment, FIG. 107 shows an example of arrangement of the lattice point for forming resonant-state 12A and the lattice point for forming perturbation-state 12P in the resonator region RP and the perturbation-state forming region PP in the 2D-PC layer 12 applied to the M-point oscillation.

Moreover, in the 2D-PC surface emitting laser according to the tenth embodiment, FIG. 108A shows an example that the perturbation is applied in the y-axial direction to the lattice point for forming resonant-state 12A in the PC layer 12, and the lattice points for forming perturbation-state (12P1, 12P2, 12P3) are arranged periodically.

Moreover, FIG. 108B shows an example that the perturbation is applied in the x-axial direction to the lattice point for forming resonant-state 12A in the PC layer 12, and the lattice points for forming perturbation-state (12P1, 12P2, 12P3) are arranged periodically.

Moreover, FIG. 108C shows an example that the perturbation is applied in a direction inclined at approximately plus 45 degrees from the x-axial direction to the lattice point for forming resonant-state 12A in the PC layer 12, and the lattice points for forming perturbation-state (12P1, 12P2, 12P3) are arranged periodically.

Moreover, FIG. 108D shows an example that the perturbation is applied in a direction inclined at approximately minus 45 degrees from the x-axial direction to the lattice point for forming resonant-state 12A in the PC layer 12, and the lattice points for forming perturbation-state (12P1, 12P2, 12P3) are arranged periodically.

In the 2D-PC surface emitting laser related to tenth embodiment, the arrangement of the lattice point for forming perturbation-state 12P can be freely set up as shown in FIGS. 108A to 108D.

(Beam Shape Control with Perturbation State Forming Arrangement)

In the 2D-PC surface emitting laser according to the tenth embodiment, FIG. 109A shows an NFP in the case of the size of the resonator region RP and the size of the perturbation-state forming region PP in the 2D-PC layer 12 applied to the M-point oscillation are nearly equal to each other, FIG. 109B shows the beam spread region 30 from the perturbation-state forming region PP, and FIG. 109C shows an example of arrangement of the lattice point for forming resonant-state 12A and the lattice point for forming perturbation-state 12P in the resonator region RP and the perturbation-state forming region PP corresponding to FIG. 109A. In the example shown in FIG. 109C, the perturbation is applied in the direction inclined at approximately plus 45 degrees from the x-axial direction to the lattice point for forming resonant-state 12A, and thereby the lattice points for forming perturbation-state 12P1, 12P2, 12P3 are formed.

Moreover, in the 2D-PC surface emitting laser according to the tenth embodiment, FIG. 110A shows an NFP in the case of the size of the resonator region RP and the size of the perturbation-state forming region PP in the 2D-PC layer 12 applied to the M-point oscillation are different from each other, FIG. 110B shows the beam spread region 30 from the perturbation-state forming region PP, and FIG. 110C shows an example of arrangement of the lattice point for forming resonant-state 12A and the lattice point for forming perturbation-state 12P in the resonator region RP and the perturbation-state forming region PP corresponding to FIG. 110A. In the example shown in FIG. 110C, the perturbation is applied in the direction inclined at approximately plus 45 degrees from the y-axial direction to the lattice points for forming resonant-state 12A in the perturbation-state forming region PP, and thereby the lattice points for forming perturbation-state 12P1, 12P2, 12P3 are formed.

More specifically, in the 2D-PC surface emitting laser according to the tenth embodiment, the resonator and the perturbation-state formation can be designed separately, and the beam shape of the surface emission-type laser beam can be modified variously by modifying only the arrangement of the perturbation-state formation, while continuing the stable oscillation.

According to the 2D-PC surface emitting laser according to the tenth embodiment, the size and the shape of the light emitting surface of laser beam can be adjusted by varying the perturbation-state forming region PP in which the lattice point for forming perturbation-state 12P is arranged while continuing the stable oscillation, maintaining the size of the resonator region RP in which the lattice points for forming resonant-state 12A is arranged.

(Example of Generation of Other Various Beams)

In the 2D-PC surface emitting laser according to the tenth embodiment, the NFP in the case where a relatively large circular perturbation-state forming region PP is arranged in the resonator region RP of the 2D-PC layer 12 applied to the M-point oscillation is similarly illustrated as FIG. 19A, and the FFP corresponding to FIG. 19A, is similarly illustrated as FIG. 19B. In the present embodiment, the coupler region CP shown in FIG. 19A corresponds to the perturbation-state forming region PP. The same applies hereafter.

Moreover, the NFP in the case of having a relatively small circular perturbation-state forming region PP in the resonator region RP is similarly illustrated as FIG. 20A, and the FFP corresponding to FIG. 20A is similarly illustrated as FIG. 20B.

Moreover, the NFP in the case of having a relatively micro circular perturbation-state forming region PP in the resonator region RP is similarly illustrated as FIG. 21A, and the FFP corresponding to FIG. 21A is similarly illustrated as FIG. 21B.

Moreover, the NFP in the case of having a relatively large elliptic perturbation-state forming region PP in the resonator region RP is similarly illustrated as FIG. 22A, and the FFP corresponding to FIG. 22A is similarly illustrated as FIG. 22B.

Moreover, the NFP in the case where a plurality of relatively small circular perturbation-state forming region PP is arranged in the resonator region RP is similarly illustrated as FIG. 23A, and the FFP corresponding to FIG. 23A is similarly illustrated as FIG. 23B.

Moreover, the NFP in the case of having two elliptic perturbation-state forming region PP perpendicularly intersecting with each other in the resonator region RP is similarly illustrated as FIG. 24A, and the FFP corresponding to FIG. 24A is similarly illustrated as FIG. 24B.

Moreover, the NFP in the case of having three elliptic perturbation-state forming region PP intersecting at 60 degrees with each other in the resonator region RP is similarly illustrated as FIG. 25A, and the FFP corresponding to FIG. 25A is similarly illustrated as FIG. 25B.

Moreover, the NFP in the case of having two elliptic perturbation-state forming region PP intersecting at 120 degrees with each other in the resonator region RP is similarly illustrated as FIG. 26A, and the FFP corresponding to FIG. 26A is similarly illustrated as FIG. 26B.

Moreover, the NFP in the case of having five elliptic perturbation-state forming region PP intersecting at 72 degrees with each other in the resonator region RP is similarly illustrated as FIG. 27A, and the FFP corresponding to FIG. 27A is similarly illustrated as FIG. 27B.

According to the 2D-PC surface emitting laser according to the tenth embodiment, as shown in FIGS. 19-27, it is possible to adjust the size and the shape of the light emitting surface of laser beams by relatively varying the size of the perturbation-state forming region PP, while maintaining the size of the oscillation region, in the oscillation of the M-point band edge in the photonic band structure. As an example of the size of NFP, various sizes of the NFP, e.g., several tens of μm square, several hundred of μm square, 1 mm square, can be formed, and the FFP corresponding thereto can also be formed in the same manner as the NFP.

According to the 2D-PC surface emitting laser according to the tenth embodiment, since the beam spread angle $\theta_0$ and the shape of laser beam are determined with the size and the shape of the light emitting surface of laser beam, the beam spread angle and the shape of laser beam can be controlled. As the periodic structure for optical amplification is maintained, the oscillation can be performed even if varying the size and the shape of the perturbation-state forming region PP.

Since the beam spread angle $\theta_0$ and the shape of the laser beam are determined with the size and the shape of the light emitting surface, when extending the beam spread angle $\theta_0$ of laser beam, for example, only the size of the perturbation-state forming region PP may be made small relatively, while the size of the resonator region RP of optical amplification is maintained in that condition. Moreover, when the shape of laser beam is made into a rectangle, only the shape of perturbation-state forming region PP may also be made into a rectangle.

In particular, since the 2D-PC surface emitting laser according to the tenth embodiment can control the beam emitting angle, the beam spread angle, and the shape of the laser beam, various shapes as shown in FIGS. 49-57 can be used for lens-free markers etc.

ELEVENTH EMBODIMENT (Two-dimensional Cell Array)

FIG. 111 shows a structural example of two-dimensional cell array for achieving high power output, in a 2D-PC surface emitting laser according to an eleventh embodiment. More specifically, cells 32 of the 2D-PC surface emitting laser according to the ninth and tenth embodiments may be two-dimensionally arranged on a substrate 100, thereby forming two-dimensional cell array. In an example that twenty-one cells 32 are two-dimensionally arranged, thereby forming two-dimensional cell array, a 2D-PC surface emitting laser having high output power equal to or greater than 35 W with a current value approximately 50 A can be obtained in 1-kHz and 50-ns pulse driving.

In the example shown in FIG. 111, a cell having different area ratio between the perturbation-state forming region PP and the resonator region RP may be arranged in each cell 32. A plurality of the cells 32 of which the area ratios between the perturbation-state forming region PP and the resonator region RP are different from each other are arranged on the same substrate 100 to be selectively driven, and thereby there can be provided a high-output multifunctional 2D-PC surface light emission laser array which can control the beam spread angle and the shape of laser beam.

FIG. 112A shows a two-dimensional cell arrayed structural example that a basic pattern $T_0$ of the lattice point for forming resonant-state 12A is arranged in the 2D-PC layer 12 on a first cladding layer, and perturbation patterns $T_1$, $T_2$, $T_3$, $T_4$ of rectangular-shaped perturbation-state forming regions PP1, PP2, PP3, PP4 are arranged in the 2D-PC layer 12, in the 2D-PC surface emitting laser according to the eleventh embodiment. Moreover, FIG. 112B shows a two-dimensional cell arrayed structural example that the basic pattern $T_0$ of the lattice point for forming resonant-state 12A is arranged in the 2D-PC layer 12 on the first cladding layer, and the perturbation patterns $T_1$, $T_2$, $T_3$, $T_4$ of hexagon-shaped perturbation-state forming regions PP1, PP2, PP3, PP4 are arranged in the 2D-PC layer.

In the example shown in FIGS. 112A and 112B, the plurality of the perturbation patterns are arranged, and thereby there can be provided a high-output multifunctional 2D-PC surface light emission laser array which can control the beam emitting angle, the beam spread angle, and the shape of laser beam.

In the 2D-PC surface emitting laser according to the eleventh embodiment, a two-dimensional cell arrayed structural example that a plurality of chips CH1, CH2, CH3, CH4 each having the configuration shown in FIG. 112B are arranged on the same substrate 100 is illustrated as shown in FIG. 113.

In the example shown in FIG. 113, the plurality of the chips CH1, CH2, CH3, CH4 which have a plurality of perturbation patterns $T_1$, $T_2$, $T_3$ are arranged on the same substrate 100 to be selectively driven, and thereby there can be provided a high-output multifunctional 2D-PC surface light emission laser array which can control the beam spread angle and the shape of laser beam.

Moreover, in the 2D-PC surface emitting laser according to the eleventh embodiment, a two-dimensional cell arrayed structural example that the plurality of the chips CH1, CH2, CH3, CH4 of which FFPs (FFP1, FFP2, FFP3, FFP4) are different from each other are arranged on the same substrate 100 is illustrated as shown an FIG. 114.

In the example shown in FIG. 114, the plurality of the chips CH1, CH2, CH3, CH4 of which the FFPs (FFP1, FFP2, FFP3, FFP4) are different from each other are arranged on the same substrate 100 to be selectively driven, and thereby there can be provided a high-output multifunctional 2D-PC surface light emission laser array which can control the beam spread angle and the shape of laser beam.

As mentioned above, according to the present invention, there can be provided the 2D-PC surface emitting laser which can control the beam emitting angle and the beam spread angle and shape of the laser beam, while continuing the stable oscillation with the simplified structure.

OTHER EMBODIMENTS

The present invention has been described by the first to eleventh embodiments, as a disclosure including associated description and drawings to be construed as illustrative, not restrictive. This disclosure makes clear a variety of alternative embodiments, working examples, and operational techniques for those skilled in the art.

Such being the case, the present invention covers a variety of embodiments, whether described or not. Therefore, the technical scope of the present invention is determined from the invention specifying items related to the claims reasonable from the above description.

What is claimed is:

1. A two-dimensional photonic crystal surface emitting laser comprising:
a substrate;
a first cladding layer disposed on the substrate;
a second cladding layer disposed on the first cladding layer;
an active layer inserted between the first cladding layer and the second cladding layer;
a photonic crystal layer; and
a lattice point for forming resonant-state arranged in the photonic crystal layer, the lattice point for forming resonant-state configured so that a light wave in a band edge in photonic band structure in the photonic crystal layer is diffracted in a plane of the photonic crystal layer, and is diffracted in a surface vertical direction of the photonic crystal layer, wherein
perturbation for diffracting the light wave in the surface vertical direction of the photonic crystal layer is applied to the lattice point for forming resonant-state, and
a plurality of the lattice points for forming resonant-state having at least two kinds of different sizes are arranged in the photonic crystal layer.

2. The two-dimensional photonic crystal surface emitting laser according to claim 1, wherein the perturbation applied to the lattice point for forming resonant-state is periodic modulation.

3. The two-dimensional photonic crystal surface emitting laser according to claim 2, wherein the periodic modulation is refractive index modulation.

4. The two-dimensional photonic crystal surface emitting laser according to claim 2, wherein the periodic modulation is hole-diameter modulation.

5. The two-dimensional photonic crystal surface emitting laser according to claim 2, wherein the periodic modulation is hole-depth modulation.

6. The two-dimensional photonic crystal surface emitting laser according to claim 2, wherein the periodic modulation is hole-diameter and hole-depth modulation.

7. The two-dimensional photonic crystal surface emitting laser according to claim 1, wherein the lattice point for forming resonant-state is arranged in any one selected from the group consisting of a square lattice, a rectangular lattice, a face-centered rectangle lattice, and a triangular lattice.

8. The two-dimensional photonic crystal surface emitting laser according to claim 1, wherein the lattice point for forming resonant-state is arranged in a square lattice or a rectangular lattice, and can diffract the light wave in a $\Gamma$ point, an X point, or an M point in the photonic band structure of the photonic crystal layer in the surface vertical direction of the photonic crystal layer.

9. The two-dimensional photonic crystal surface emitting laser according to claim 1, wherein the lattice point for forming resonant-state is arranged in a face-centered rectangle lattice or a triangular lattice, and can diffract the light wave in a $\Gamma$ point, an X point, or an J point in the photonic band structure of the photonic crystal layer in the surface vertical direction of the photonic crystal layer.

10. The two-dimensional photonic crystal surface emitting laser according to claim 1, wherein the photonic crystal layer is inserted between the first cladding layer and the second cladding layer so as to be adjacent to the active layer in a surface vertical direction of the active layer.

11. The two-dimensional photonic crystal surface emitting laser according to claim 1, wherein the photonic crystal layer is inserted between the first cladding layer and the active layer.

12. The two-dimensional photonic crystal surface emitting laser according to 10 claim 1, wherein the photonic crystal layer is inserted between the second cladding layer and the active layer.

13. The two-dimensional photonic crystal surface emitting laser according to claim 1, wherein a plurality of perturbations are applied to the lattice point for forming resonant-state.

14. The two-dimensional photonic crystal surface emitting laser according to claim 13, wherein the plurality of the perturbations are applied in an arbitrary direction.

15. The two-dimensional photonic crystal surface emitting laser according to claim 13, wherein the plurality of the perturbations are superposed to be applied the lattice point for forming resonant-state.

16. A two-dimensional photonic crystal surface emitting laser comprising:
- a substrate;
- a first cladding layer disposed on the substrate;
- a second cladding layer disposed on the first cladding layer;
- an active layer inserted between the first cladding layer and the second cladding layer;
- a photonic crystal layer; and
- a lattice point for forming resonant-state of a rectangular lattice arranged in the photonic crystal layer, the lattice point for forming resonant-state configured so that a light wave in a X-point band edge in photonic band structure in the photonic crystal layer is diffracted in a plane of the photonic crystal layer, and is diffracted in a surface vertical direction of the photonic crystal layer, wherein perturbation for diffracting the light wave in the surface vertical direction of the photonic crystal layer is applied to the lattice point for forming resonant-state, and a length of one side $a_2$ of the rectangular lattice is equal to ½ a wavelength in the medium where lattice constants of the rectangular lattice are $a_1$ and $a_2$.

17. A two-dimensional photonic crystal surface emitting laser comprising:
- a substrate;
- a first cladding layer disposed on the substrate;
- a second cladding layer disposed on the first cladding layer;
- an active layer inserted between the first cladding layer and the second cladding layer;
- a photonic crystal layer;
- a lattice point for forming resonant-state of a rectangular lattice arranged in the photonic crystal layer, the lattice point for forming resonant-state configured so that a light wave in an X-point band edge in photonic band structure in the photonic crystal layer is diffracted in a plane of the photonic crystal layer; and
- a lattice point for forming perturbation-state configured so that the light wave in the X-point band edge in the photonic band structure in the photonic crystal layer is diffracted to a surface vertical direction of the photonic crystal layer, wherein perturbation for diffracting the light wave in the surface vertical direction of the photonic crystal layer is applied to a part of the lattice point for forming resonant-state, and thereby the lattice point for forming perturbation-state is formed, and a length of one side $a_2$ of the rectangular lattice is equal to ½ a wavelength in the medium where lattice constants of the rectangular lattice are $a_1$ and $a_2$.

18. The two-dimensional photonic crystal surface emitting laser according to claim 1, wherein
the plurality of the lattice points for forming resonant-state having the different sizes have a same depth.

* * * * *